United States Patent [19]

Saitoh et al.

[11] Patent Number: 5,327,221
[45] Date of Patent: Jul. 5, 1994

[54] DEVICE FOR DETECTING POSITIONAL RELATIONSHIP BETWEEN TWO OBJECTS

[75] Inventors: Kenji Saitoh, Yokohama; Masakazu Matsugu, Atsugi; Shigeyuki Suda, Yokohama; Yukichi Niwa, Narashino; Ryo Kuroda, Atsugi; Noriyuki Nose, Machida; Minoru Yoshii, Tokyo; Naoto Abe, Isehara; Mitsutoshi Ohwada, Yokohama, all of Japan

[73] Assignee: Canon Kabushiki Kaisha, Tokyo, Japan

[21] Appl. No.: 919,380

[22] Filed: Jul. 29, 1992

Related U.S. Application Data

[63] Continuation of Ser. No. 851,110, Mar. 16, 1992, abandoned, which is a continuation of Ser. No. 754,304, Sep. 4, 1991, abandoned, which is a continuation of Ser. No. 311,180, Feb. 15, 1989, abandoned, which is a continuation-in-part of Ser. No. 271,601, Nov. 15, 1988, abandoned.

[30] Foreign Application Priority Data

| Feb. 16, 1988 | [JP] | Japan | 63-033202 |
| Feb. 16, 1988 | [JP] | Japan | 63-033205 |
| Feb. 16, 1988 | [JP] | Japan | 63-033206 |
| Feb. 16, 1988 | [JP] | Japan | 63-033208 |
| Feb. 16, 1988 | [JP] | Japan | 63-033209 |
| Sep. 5, 1988 | [JP] | Japan | 63-221535 |
| Sep. 5, 1988 | [JP] | Japan | 63-221536 |
| Sep. 9, 1988 | [JP] | Japan | 63-226003 |
| Sep. 9, 1988 | [JP] | Japan | 63-226004 |
| Sep. 9, 1988 | [JP] | Japan | 63-226005 |
| Sep. 9, 1988 | [JP] | Japan | 63-226007 |

[51] Int. Cl.⁵ .................................................. G01B 9/02
[52] U.S. Cl. .................................... 356/355; 356/356; 356/363
[58] Field of Search ................ 356/355, 356, 363, 401

[56] References Cited

U.S. PATENT DOCUMENTS

| 4,037,969 | 7/1977 | Feldman et al. . |
| 4,360,273 | 11/1982 | Thaxter .................. 356/354 |
| 4,371,264 | 2/1983 | Lacombat et al. . |
| 4,398,824 | 8/1983 | Feldman et al. .......... 356/401 |
| 4,514,858 | 4/1985 | Novak . |
| 4,631,416 | 12/1986 | Trutna, Jr. . |
| 4,725,737 | 2/1988 | Nakata et al. ........... 356/401 X |
| 4,815,854 | 3/1989 | Tanaka et al. ........... 356/363 X |
| 4,838,693 | 6/1989 | Uchida et al. ........... 356/363 X |

FOREIGN PATENT DOCUMENTS 56-157033 12/1981 Japan .
61-111402 5/1986 Japan .

OTHER PUBLICATIONS

M. Feldman, et al. "Application of Zone Plates to Alignment in X-Ray Lithography", Optical Engineering, Mar.–Apr. 1983, vol. 22, No. 2, pp. 203–207.

Primary Examiner—Samuel A. Turner
Attorney, Agent, or Firm—Fitzpatrick, Cella, Harper & Scinto

[57] ABSTRACT

A device for detecting the positional relationship between first and second objects in a predetermined direction includes a light source for emitting light in a direction to the first or second object, and a first detecting portion for detecting the position of incidence of a first light deflected by the first and second objects, wherein the position of incidence of the first light upon the first detecting portion is changeable with a change in the positional relationship between the first and second objects in the predetermined direction. A second detecting portion detects the position of incidence of a second light deflected by at least one of the first and second objects, wherein the state of the position of incidence of the second light resulting from a change in the positional relationship between the first and second objects, in the predetermined direction differs from that of the first light. On the basis of the detection by the first and second detecting portions, the positional relationship between the first and second objects is detected without being affected by an inclination thereof.

15 Claims, 86 Drawing Sheets

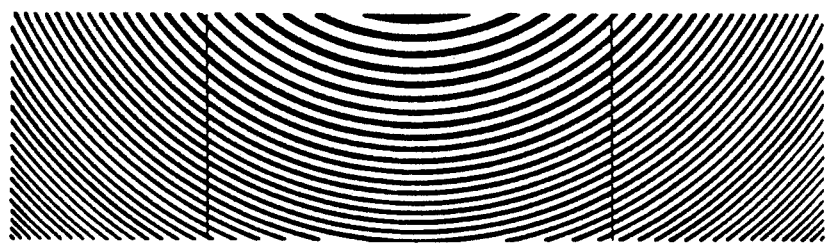
FIG.16A1
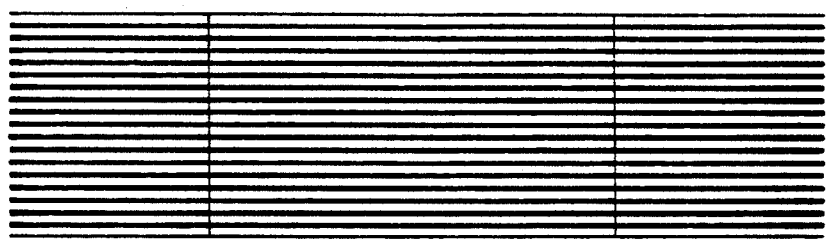
FIG.16A2
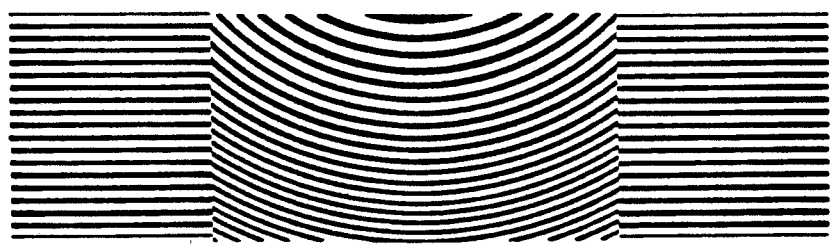
FIG.16A3

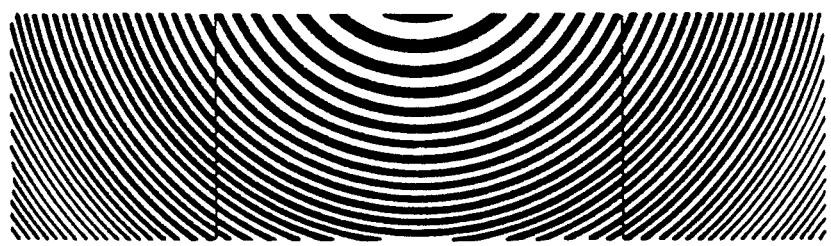
FIG.16B1
FIG.16B2
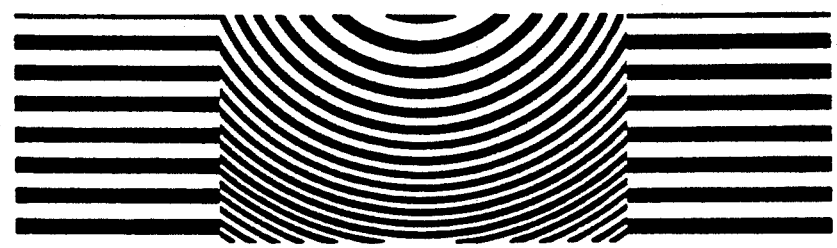
FIG.16B3

FIG.22A

| A | R |
|---|---|
| R | A |

FIG.22B

| A | R | A | R |
|---|---|---|---|
| R | A | R | A |

FIG.22C

| A | R | A | R | A | R |
|---|---|---|---|---|---|
| R | A | R | A | R | A |

FIG.22D

| A | R | A | R |
|---|---|---|---|
| R | A | R | A |
| A | R | A | R |

FIG.22E

| A | R | A | R | A | R |
|---|---|---|---|---|---|
| R | A | R | A | R | A |
| A | R | A | R | A | R |

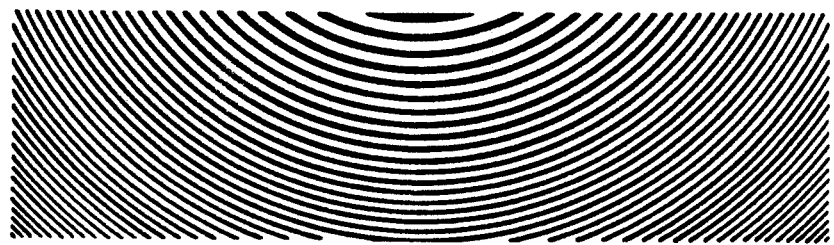
FIG. 29A1
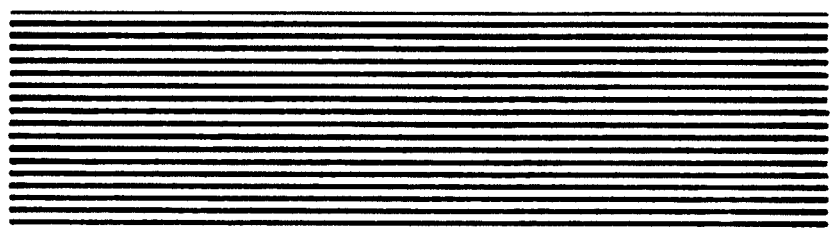
FIG. 29A2
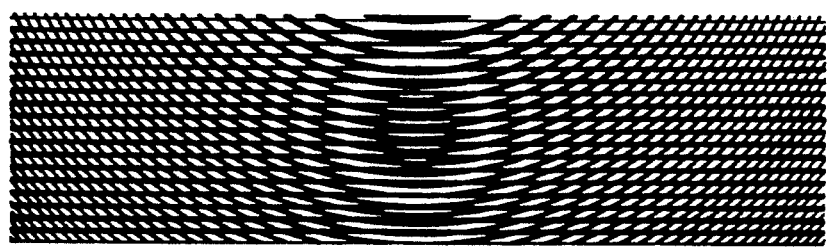
FIG. 29A3

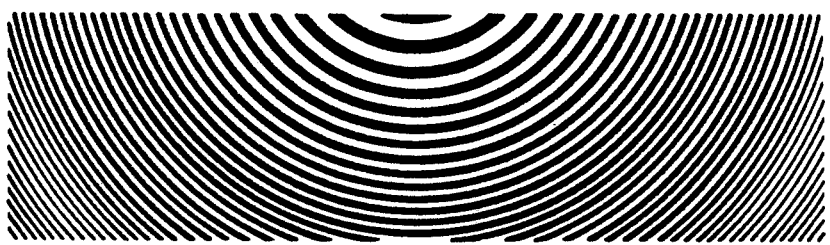
FIG. 29B1
FIG. 29B2
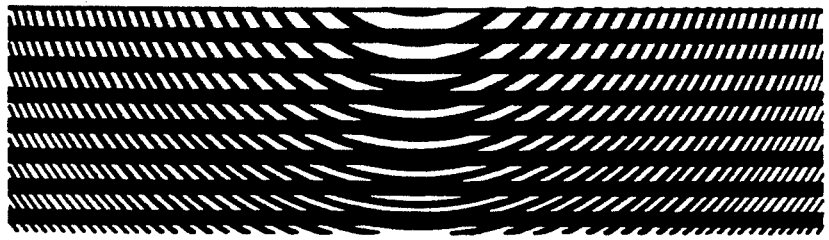
FIG. 29B3

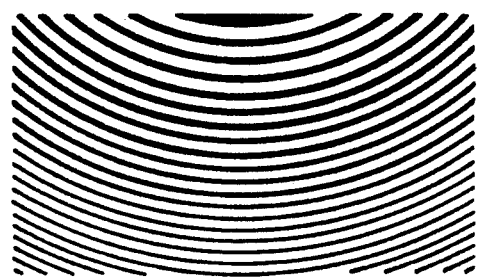
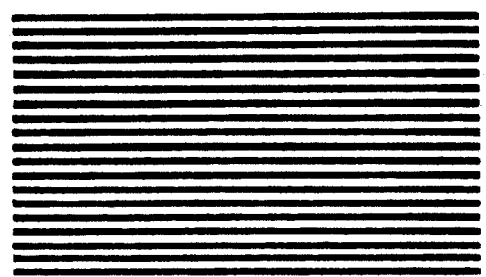
FIG. 35A  FIG. 35B
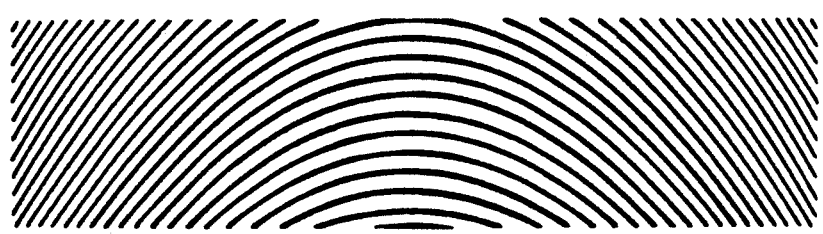
FIG. 35C

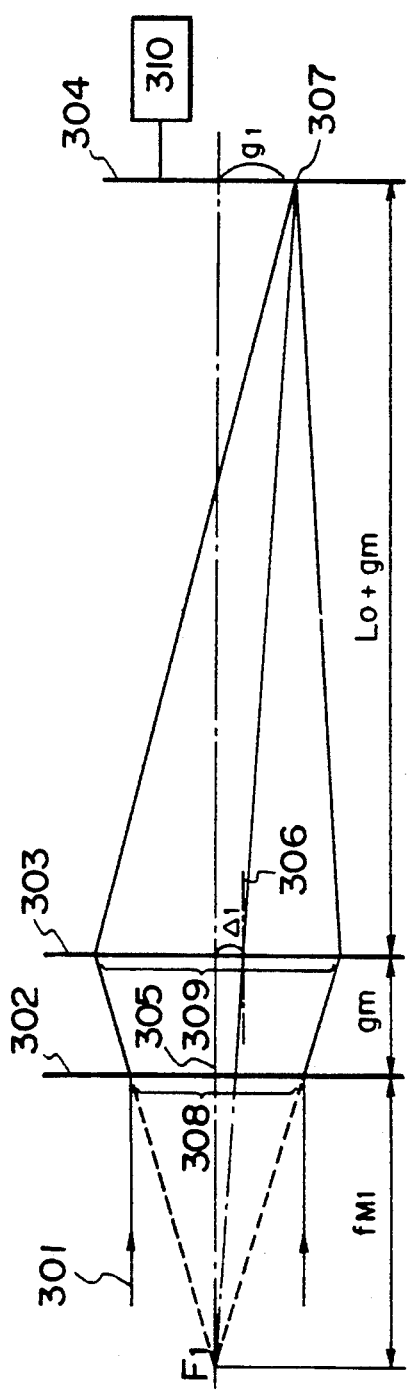
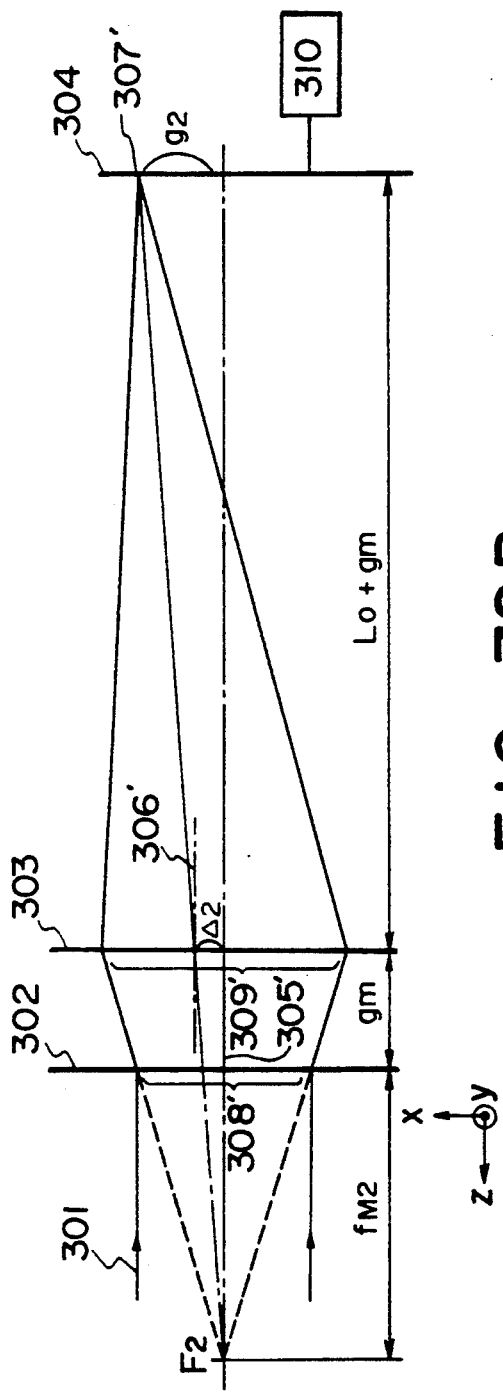
FIG. 79A
FIG. 79B

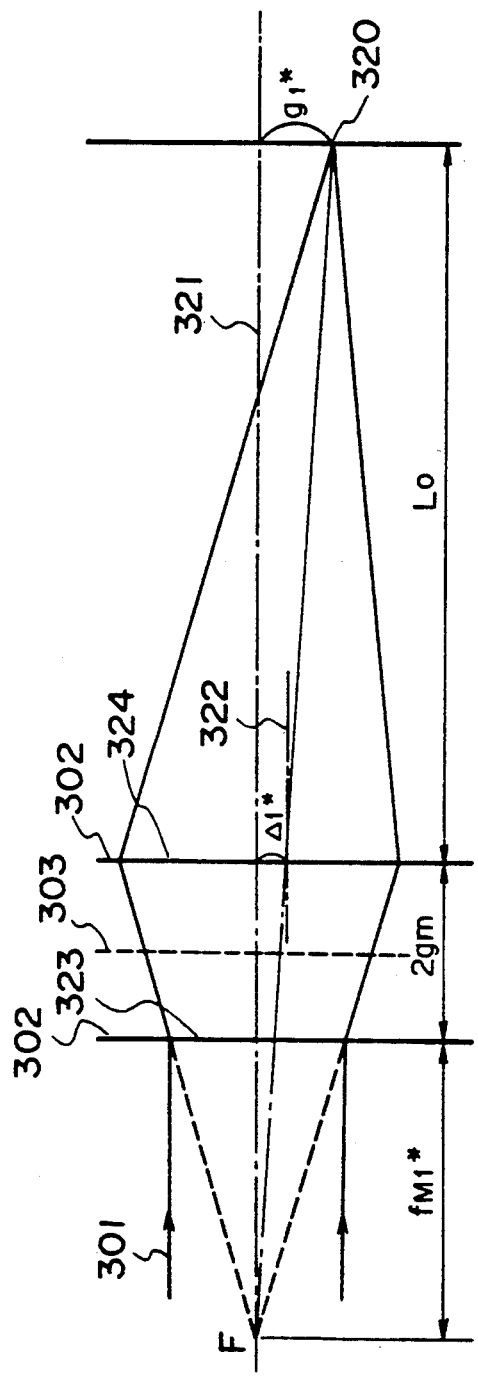
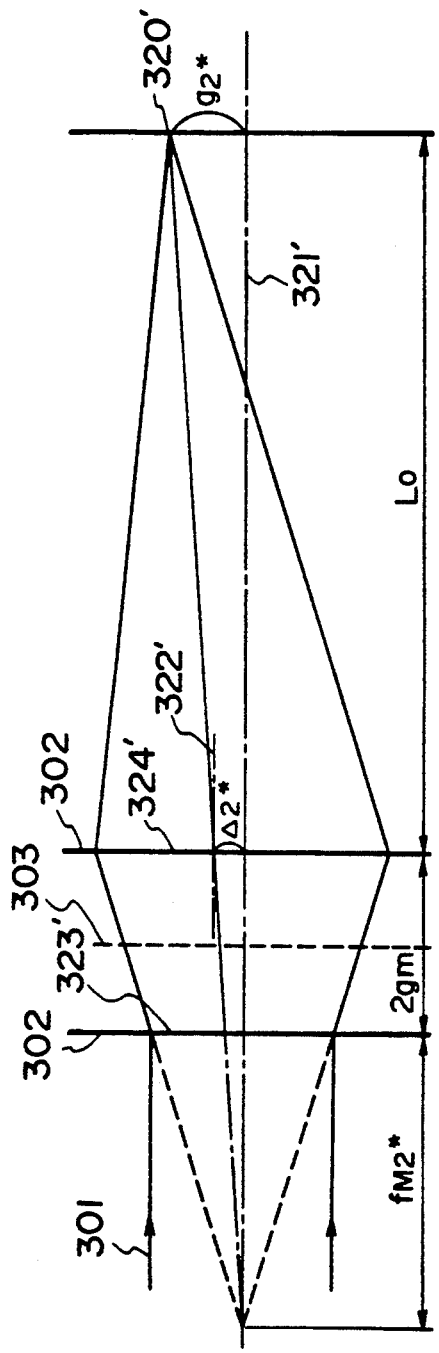
FIG. 89A
FIG. 89B

DEVICE FOR DETECTING POSITIONAL RELATIONSHIP BETWEEN TWO OBJECTS

This application is a continuation of application Ser. No. 07/851,110 filed Mar. 16, 1992, now abandoned, which was a continuation of application Ser. No. 07/754,304 filed Sep. 4, 1991, now abandoned, which was a continuation of application Ser. No. 311,180 filed Feb. 15, 1989, now abandoned, which was a continuation-in-part of application Ser. No. 07/271,601 filed Nov. 15, 1988, now abandoned.

FIELD OF THE INVENTION AND RELATED ART

This invention relates generally to an alignment system for correctly positioning an object. More particularly, the invention is concerned with a position detecting method and apparatus suitably usable in a semiconductor microcircuit device manufacturing exposure apparatus for lithographically transferring a fine electronic circuit pattern formed on the surface of a first object (original) such as a mask or reticle (hereinafter simply "mask") onto the surface of a second object (workpiece) such as a wafer, for positioning or aligning the mask with respect to the wafer.

In exposure apparatuses for use in the manufacture of semiconductor devices, the relative alignment of a mask and a wafer is one important factor for ensuring improved performance. Particularly, as for alignment systems employed in recent exposure apparatuses, submicron alignment accuracies or more strict accuracies are required in consideration of the demand for a higher degree of integration of semiconductor devices.

In many types of alignment systems, features called "alignment patterns" are provided on a mask and a wafer and, by utilizing positional information obtainable from these patterns, the mask and wafer are aligned. As for the manner of executing the alignment, as an example there is a method wherein the amount of relative deviation of these alignment patterns is detected on the basis of image processing. Another method is proposed in U.S. Pat. Nos. 4,037,969 and 4,514,858 and Japanese Laid-Open Patent Application, Laid-Open No. Sho 56-157033, wherein so-called zone plates are used as alignment patterns upon which light is projected and wherein the positions of light spots formed on a predetermined plane by light from the illuminated zone plates are detected.

Generally, an alignment method utilizing a zone plate is relatively insensitive to any defect in an alignment pattern and therefore assures relatively high alignment accuracies, as compared with an alignment method simply using a traditional alignment pattern.

FIG. 1 is a schematic view of a known type alignment system utilizing zone plates.

In FIG. 1, parallel light emanating from a light source 72 passes through a half mirror 74 and is focused at a point 78 by a condensing lens 76. Thereafter, the light illuminates a mask alignment pattern 68a on a mask 68 and an alignment pattern 60a on a wafer 60 which is placed on a support table 62. Each of these alignment patterns 68a and 60a is provided by a reflection type zone plate and functions to form a spot of focused light on a plane perpendicular to an optical axis which contains the point 78. The amount of relative deviation of the positions of these light spots formed on that plane is detected, by directing the focused beams to a detection plane 82 by means of the condensing lens 76 and another lens 80.

In accordance with an output signal from the detector 82, a control circuit 84 actuates a driving circuit 64 to relatively align the mask 68 relative the wafer 60.

FIG. 2 illustrates an imaging relationship of lights from the mask alignment pattern 68a and the wafer alignment pattern 60a shown in FIG. 1.

In FIG. 2, a portion of the light divergently advancing from the point 78 is reflectively diffracted by the mask alignment pattern 68a and forms a spot 78a of focused light at or adjacent to the point 78, the spot representing the mask position. Another portion of the light passes through the mask 68 in the form of a zero-th order transmission light and is projected upon the wafer alignment pattern 60a on the wafer 60 surface with its wavefront being unchanged. The incident light is reflectively diffracted by the wafer alignment pattern 60a and then passes again through the mask 68 in the form of a zero-th order transmission light, and finally is focused in the neighborhood of the point 78 to form a spot 78b of focused light, representing the wafer position. In the illustrated example, when the light diffracted by the wafer 60 forms a spot, the mask 68 functions merely as a transparent member.

The position of the spot 78b formed by the wafer alignment pattern 60a in the described manner represents a deviation $\Delta\sigma'$, in the plane perpendicular to the optical axis containing the point 78, of an amount corresponding to the amount of deviation $\Delta\sigma$ of the wafer 60 with respect to the mask 68.

The inventors of the subject application have found a specific problem peculiar to this alignment method. Namely, in this method, if a wafer surface is inclined with respect to a mask surface, a certain reference surface such as the surface of a mask holder in a semiconductor device manufacturing exposure apparatus, or a ground surface on which the exposure apparatus is placed, there occurs a shift of the position of center of gravity of light incident upon a sensor. Such a shift results in an alignment error.

FIG. 3 shows such a shift of the position of the center of gravity of light upon a detecting surface 127 in the case where a wafer 60 is inclined by an angle $\theta$. Assuming now that an alignment light passing through a mask is incident on the wafer 60 in the manner as shown in FIG. 3, and if there is an average surface inclination of an angle $\theta$ at the location of a wafer alignment mark 60', then the position of the center of gravity of light on the detecting surface 127 is at a point $P\theta$ which is displaced by an amount $\Delta\delta\theta$ from the point Po of a spot of focused light to be defined where no inclination occurs. This can be expressed by an equation:

$$\Delta\delta\theta = bw \cdot \tan 2\theta$$

Assuming now that
(i) $\theta \approx 10^{-4}$ (rad) (a change of 100Å per a size 100 microns of a mark)
(ii) bw = 18.7 mm,
then, $$\Delta\delta\theta = 18.7 \times 10^{+3} \times 2 \times 10^{-4} = 3.74 \text{ (micron)}$$

Namely, there occurs an alignment error of 3.74 microns, and this means that the mask and the wafer can not be aligned with a precision higher than that value.

FIG. 4 is a schematic view of a gap measuring device as proposed in Japanese Laid-Open Patent Application, Laid-Open No. Sho 61-111402. In this example, a mask M (first object) and a wafer W (second object) are disposed opposed to each other, and by using a lens L1 a light is focused at a point Ps which is between the mask M and the wafer W.

In this case, the light is reflected by the mask M surface and by the wafer W surface, and the reflected lights are projected and focused by another lens L2 at points $P_W$ and $P_M$ on a screen S surface. The gap or interval between the mask M and the wafer W can be measured by detecting the interval between the light spots $P_W$ and $P_M$ on the screen S surface.

The illustrated device can correctly measure the interval between the mask M and the wafer W if they are parallel to each other. If, however, one of them is inclined (for example, the mask M is inclined as depicted by a broken line so that the parallel relationship is not maintained), the point of incidence of light upon the screen S surface shifts from the point $P_M$ to a point $P_N$, resulting in a measurement error.

SUMMARY OF THE INVENTION

An object of the present invention is to provide a device for detecting the positional relationship between two, first and second objects by which device high-precision alignment of the first and second objects, such as a mask and a wafer, is assured.

Another object of the present invention is to provide a device for detecting the positional relationship between two, first and second objects by which device the interval or spacing between the first and second objects, such as a mask and a wafer, can be measured with high precision.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 16A1-16A3 and 16B1-16B3 exemplify a mask mark pattern and a wafer mark pattern, respectively, usable in the FIG. 12 embodiment.

FIGS. 22A-22E are representations showing another form of the division of a mark, which can be adopted in the FIG. 20A embodiment.

FIGS. 29A1-29A3 and 29B1-29B3 exemplify a mask mark pattern and a wafer mark pattern, respectively, usable in the FIG. 25 embodiment.

FIGS. 35A–35C exemplify patterns of a first alignment mark, a first reference mark and a second alignment mark, respectively, usable in the FIG. 33 embodiment.

FIGS. 79A and 79B are principle views of a 40th embodiment.

FIGS. 89A and 89B are principle views of the 45th embodiment.

DESCRIPTION OF THE PREFERRED EMBODIMENTS

Figure 5:
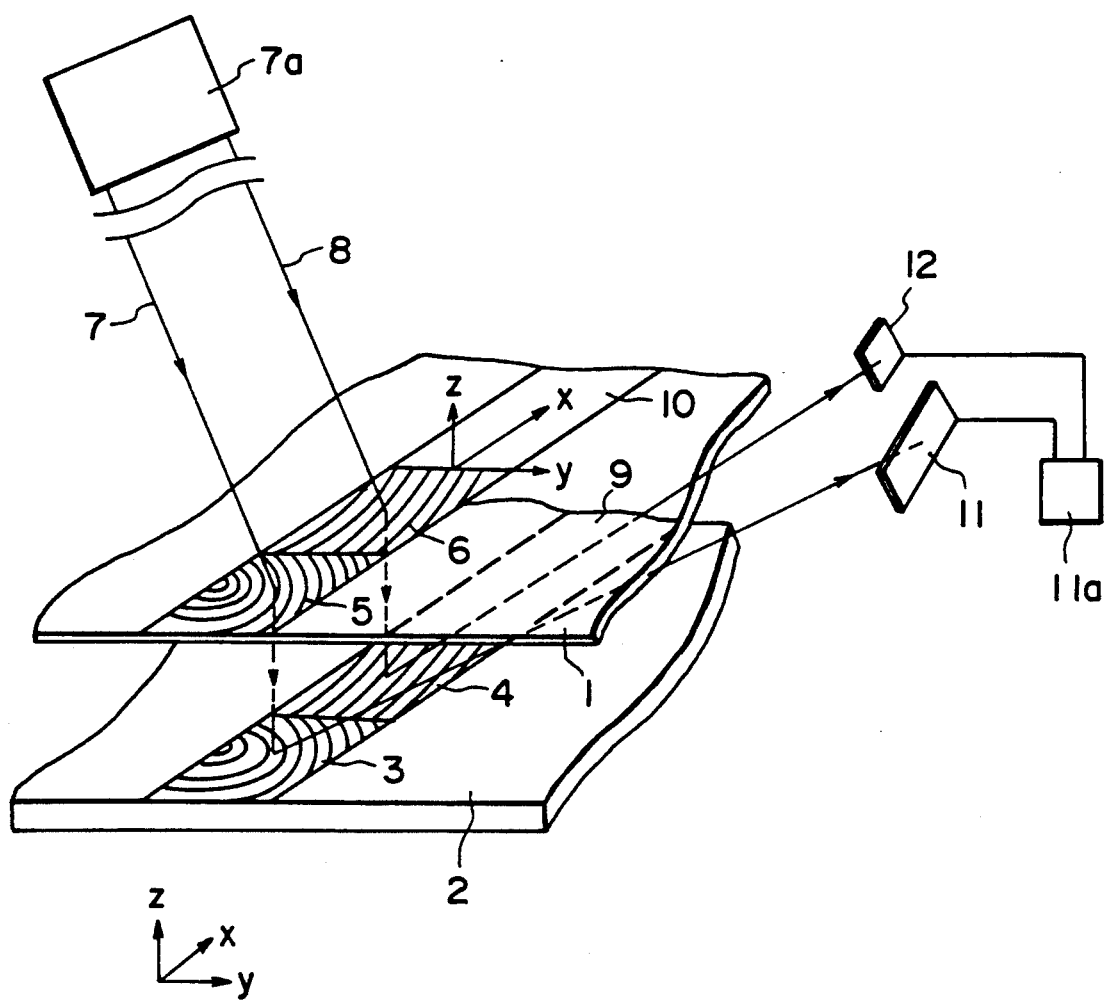
FIG. 5 is a schematic view showing a major portion of a first embodiment of the present invention.

Referring now to FIG. 5 which is a schematic view showing a major portion of a first embodiment of the present invention, a first object 1 is a mask, for example, and a second object 2 is a wafer, for example, which is to be aligned with the mask 1. First and second alignment marks 5 and 3 are provided on the mask 1 surface and the wafer 2 surface, respectively. First and second reference marks 6 and 4 are provided on the mask 1 surface and the wafer 2 surface, respectively, at positions adjacent to the first and second alignment marks 5 and 3, respectively. The first and second alignment marks 3 and 5 and the first reference mark 6 each is formed by a grating lens such as a Fresnel zone plate, for example. The second reference mark 6 is formed by a straight grating having a regular pitch. These marks are provided on scribe lines 9 and 10, respectively, which are defined on the mask 1 surface and the wafer 2 surface, respectively. Alignment light 7 and reference light 8 emanate from a light source 7a accommodated in an alignment head which is not shown. Each of these lights is collimated into parallel light of a predetermined beam diameter, by means of a collimator (not shown).

In this embodiment, examples that can be used as a light source are: a light source such as a semiconductor laser, a He-Ne laser, an Ar laser or otherwise that can emit a coherent light; and a light source such as a light-emitting diode or otherwise that can emit an incoherent light. Sensors (photoreceptors) 11 and 12 function as first and second detecting means, respectively, and are adapted to receive the alignment light and the reference light 8, respectively. Each of these sensors may comprise a one-dimensional CCD sensor, for example. The one-dimensional CCD sensor is disposed so that the direction in which its sensing elements are arrayed is correlated with the direction with respect to which any positional deviation is to be detected.

In this embodiment, the alignment light 7 and the reference light 8 are incident upon the first alignment mark 5 and the first reference mark 6, respectively, on the mask 1 surface, each at a predetermined angle. The incident lights are transmissively diffracted and then are reflectively diffracted by the second alignment mark 3 and the second reference mark 4 on the wafer 2 surface, respectively. These reflectively diffracted lights are finally incident upon the sensor 11 surface and the sensor 12 surface, respectively. Each of these sensors 11 and 12 is operable to detect the position of the center of gravity of the alignment light or the reference light, being projected on its surface. By using output signals of these sensors 11 and 12, the relative position of the mask 1 and the wafer 2 in a direction parallel to the scribe lines 9 and 10 (i.e. in the x direction) is detected.

The term "center of gravity of light" means such a point that, when in the cross-section of the light a position vector of each point in the section is multiplied by the light intensity of that point and the thus obtained products are integrated over the entire section, the integrated value has a "zero vector".

As an alternative, such a point at which a light intensity distribution has a peak may be used as a representative.

A description will now be provided of the first and second alignment marks 5 and 3 and the first and second reference marks 6 and 4 used in this embodiment.

The alignment marks 3 and 5 and the reference mark 6 are provided by Fresnel zone plates (or grating lenses) having different focal lengths. On the other hand, the reference mark 4 is formed by a straight grating having no lens function but is operable merely to deflect light. Each mark has a size of 140 microns in the lengthwise direction of the scribe line and 50 microns in the widthwise direction (y direction) of the scribe line.

In this embodiment, both the alignment light 7 and the reference light 8 are incident on the mask 1 at an angle of incidence of 10 degrees, with the projection upon the mask 1 surface being perpendicular to the scribe line direction (x direction).

The alignment light 7 and the reference light 8 incident on the mask 1 with a predetermined angle are influenced by the lens functions of the grating lenses 5 and 6, respectively, each being transformed into a convergent or divergent light which is emitted from the mask 1 so that its chief ray has a predetermined angle with respect to the normal of the mask 1.

The alignment light 7 and the reference light 8 having been transmissively diffracted by the first alignment mark 5 and the first reference mark 6, respectively, are focused at points on the wafer 2 surface which are at distances of 238.0 microns and 20.107 microns vertically below these marks. The alignment mark 5 and the reference mark 6, in this case, have focal lengths of 268 microns and 20.137 microns. Also, the mask 1 and the wafer 2 are spaced by a distance 30 microns.

The light transmissively diffracted by the alignment mark 5 is influenced by a concave or convex lens function of the second alignment mark 3 on the wafer 2 surface, and is collected at a point on the sensor 11 surface (first detecting means). On this sensor 11 surface, at this time, the light is incident with any relative positional deviation (i.e. any misalignment of the axes) of the marks 5 and 3 being magnified, with a result of corresponding shift of the position of the center of gravity of the incident light.

The present embodiment is so set that, when the mask 1 and the wafer 2 have no relative positional deviation (i.e. when the alignment marks 5 and 3 on the mask 1 and the wafer 2 just provide a coaxial system), the chief ray of the alignment light emitting from the wafer 2 has an angle of emission of 5 degrees, and the projection of the emitted light on the wafer 2 surface extends perpendicularly to the widthwise direction (y direction) of the scribe line and, additionally, the emitted light is focused on the sensor 11 surface which is disposed at a predetermined position, for example, at a height of 20 mm from the wafer 2 surface.

On the other hand, the light transmissively diffracted by the first reference mark is simply deflected by the second reference mark 4 on the wafer 2 surface and emanates therefrom with an angle of emission of 8 degrees and with the projection upon the wafer 2 surface being perpendicular to the widthwise direction of the scribe line, and finally it is focused at a point on the surface of the sensor 12 (second detecting means).

As regards the reference light coming by way of the reference marks 6 and 4, the position of the center of gravity of such a light incident upon the sensor 12 surface is constantly fixed, even if the relative position of the mask 1 and the wafer 2 changes.

It will be understood from the foregoing that, in this embodiment, the grating lens of the first reference mark 6 provided on the mask 1 surface has a relatively long focal length, from the passage of the reference light through the mask 1 surface to the impingement on the sensor 12 surface of the reference light being deflected by the wafer 2 surface.

If there occurs a relative positional deviation between the mask and the wafer, the optical axes of the grating lenses 5 and 3 shift relative to each other whereby a relative deviation is presented between these optical axes. In that case, the position of incidence upon the wafer grating lens 3 of the alignment light coming from the mask grating lens 5 is also displaced. As a result, the alignment light reflectively diffracted by the wafer grating lens 3 is emitted therefrom with its chief ray emanating at a varied emission angle. This causes displacement of the position of the focus of the alignment light upon the sensor 11 surface, the displacement corresponding to the positional deviation between the mask and the wafer.

On the other hand, the reference light coming from the mask grating lens 6 and impinging upon the straight grating 4 on the wafer emanates from the grating 4 at a constant or fixed angle. While any positional deviation between the mask and the wafer causes a similar displacement of the position of incidence of the reference light upon the wafer grating 4, it does not cause a change in the angle of emission of the reference light from the wafer grating 4. In the mask-to-wafer alignment, in most cases the mask is held fixed to the apparatus. Therefore, the reference light coming from the mask grating lens 6 is reflected by the wafer at a position which is unchangeable with respect to the mask position. As a result, the position of incidence of the reference light upon the sensor 12 surface is unchangeable, even if the mask and the wafer are displaced relative to each other.

It will be understood from the foregoing that the interval between the spots formed on the sensor 11 surface and the sensor 12 surface by the focused alignment light and the focused reference light, respectively, represents the amount of positional deviation between the mask and the wafer.

The above-described principle is used in this embodiment. More specifically, in the present embodiment, the reference interval between these two spots as formed on the sensors by the alignment light and the reference light when the mask and the wafer are exactly in alignment with each other is predetected. Then, upon actual alignment or position detecting operation for actually aligning the mask and the wafer made in preparation for the exposure (printing), a current interval between the spots of the alignment light and the reference light formed at that time is detected. From any difference between the detected current interval and the reference interval, the relative positional deviation between the mask and the wafer can be detected. This is made in the CPU 11a.

The above-described reference interval can easily be determined by calculation, using the design values concerning the alignment pattern and the reference patterns, for example. Of course, it may be determined on the basis of a trial printing accompanied by measurement.

As an example, first and second alignment marks 5 and 3 and a first reference mark 6 (grating lens) usable in this embodiment can be prepared in the following manner.

First, the marks 5 and 6 for a mask are designed so that, when a parallel light of a predetermined beam diameter is incident thereupon at a predetermined angle, the light is collected at a predetermined position. Usually, a pattern of a grating lens may be that of an interference fringe which can be formed on a lens surface in the case where mutually coherent light sources are disposed at a light source position (object point) and the position of an image point. Assume, a coordinate system is defined on a mask 1 surface, such as shown in FIG. 5. The origin is at the middle of the width of the scribe line, the x axis is in the direction of the scribe line, the y axis is in the widthwise direction and the z axis is in the direction of the normal of the mask 1 surface. Equations regarding a group of curved lines of such a grating lens by which a parallel light, having been incident thereon with an angle $\alpha$ with respect to the normal of the mask surface 1 and with the projection being perpendicular to the scribe line direction, is imaged after being transmissively diffracted by the mark of the mask, at the position of a converging point $(x_1, y_1, z_1)$, can be expressed in the following manner, with the position of each grating line being denoted by x and y:

$$y \sin \alpha + P1(x,y) - P2 = m\lambda/2 \tag{1}$$

$$P1(x,y) = \sqrt{(x - x_1)^2 + (y - y_1)^2 + z_1^2}$$

$$P2 = \sqrt{x_1^2 + y_1^2 + z_1^2}$$

wherein $\lambda$ is the wavelength of the alignment light m is an integral number.

Assuming now that a chief ray is a ray incident with an angle $\alpha$ and passing through the origin on the mask surface 1 and then impinging upon a convergent point $(x_1, y_1, z_1)$, then the right side of equation (1) shows that, depending on the value of m, the optical path length is "$\lambda x\, m/2$" times longer (shorter) than that for the chief ray; and the left side denotes the difference in length, with respect to the optical path of the chief ray, of the optical path of such a ray that passes a point (x, y, 0) on the mask and then impinges on the point $(x_1, y_1, z_1)$.

Figure 6A:
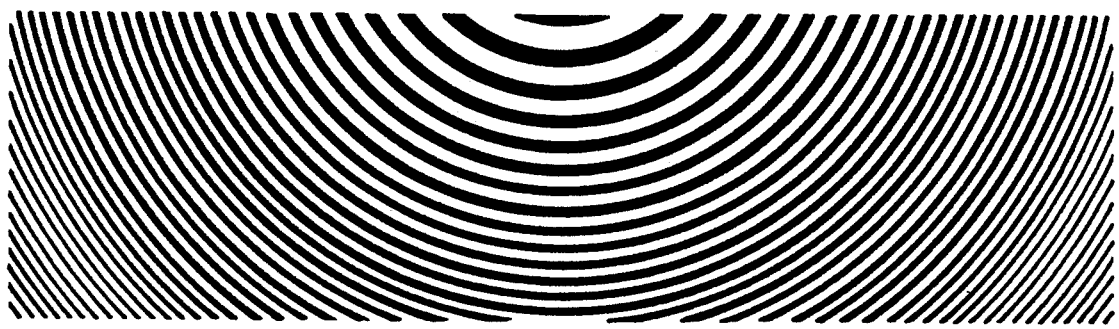
FIGS. 6A and 6B exemplify patterns of a first alignment mark and a first reference mark, respectively, usable in the first embodiment.
Figure 6B:
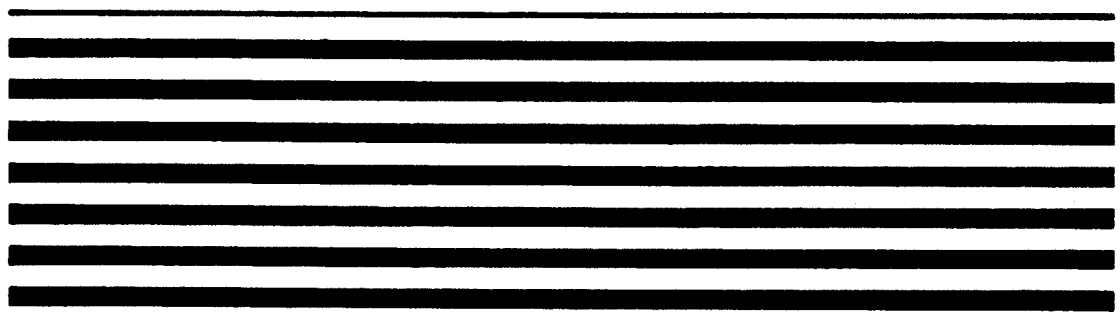

FIG. 6A exemplifies a first alignment mark on a mask 1, and FIG. 6B exemplifies a first reference mark on the same mask 1.

On the other hand, a grating lens 3 to be provided on a wafer 2 is designed so as to collect, at a predetermined position (on the sensor surface), a spherical wave emanating from a predetermined point light source. Where the gap between a mask 1 and a wafer 2 at the time of exposure (pattern transfer) is denoted by g, then such a point light source can be expressed by:

$$(x_1, y_1, z_1-g)$$

wherein y is a variable.

Assuming now that the mask 1 and the wafer 2 are to be aligned with respect to the x-axis or y-axis direction and that, upon completion of alignment, the alignment light is focused at a point ($x_2$, $y_2$, $z_2$) on the sensor surface, then equations regarding a group of curved lines of a grating lens of a wafer can be expressed, in the coordinate system defined hereinbefore, as follows:

$$\sqrt{(x-x_2)^2+(y-y_2)^2+z_2^2} - \sqrt{(x-x_1)^2+(y-y_1)^2+(z_1-g)^2} = \sqrt{x_2^2+y_2^2+z_2^2} - \sqrt{x_1^2+y_1^2+z_1^2} \qquad (2)$$

Equation (2) is such an equation that satisfies a condition under which, assuming that the wafer surface is "z=−g" and that the chief ray is such a ray that passes the origin on the mask surface and a point (0, 0, −g) on the wafer surface and additionally a point ($x_2$, $y_2$, $z_2$) on the sensor surface, the difference in length between the path of the chief ray and the path of a ray passing the grating (x, y, −g) on the wafer surface becomes equal to a multiple, by an integral number, of a half wavelength.

As an alternative grating lens which can be used in the present invention, use may be made of such a grating lens by which parallel light, incident at an angle α with respect to the normal of a mask 1 surface and with the projection thereof being perpendicular to the scribe line direction, and being transmissively diffracted at a point (x, y, 0) by an alignment mark of the mask, is imaged linearly at the position of a convergent point ($x_1$, y, $z_1$). Where the position on the grating is representing by x and y, the design equations are:

$$y \sin \alpha + P1(x) - P2 = m\lambda/2 \qquad (3)$$

$$P1(x) = \sqrt{(x-x_1)^2 + z_1^2}$$

$$P2 = \sqrt{x_1^2 + z_1^2}$$

wherein λ is the wavelength of the alignment light and m is an integral number.

Assuming now that a chief ray is such a ray incident at an angle α and passing through the origin on the mask surface 1 and then impinging upon a convergent point ($x_1$, y, $z_1$), then the right side of equation (3) shows that, depending on the value of m, the optical path length is "λx m/2" times longer (shorter) than that for the chief ray; and the left side denotes the difference in length, with respect to the optical path of the chief ray, of the optical path of such a ray that passes a point (x, y, 0) on the mask and then impinges on the point ($x_1$, y, $z_1$).

In equation (3), the light passing through the mask 1 at the point y is not influenced, at the imaging point, by a lens function with respect to the y direction.

On the other hand, a grating lens 3 to be provided on a wafer 2 is designed so as to collect, at a predetermined position (on the sensor surface), a spherical wave emanating from a predetermined linear light source. Where the gap between a mask 1 and a wafer 2 at the time of exposure (pattern transfer) is denoted by g, then each point on the linear light source can be expressed by:

$$(x_1, y_1, z_1-g)$$

Assuming now that the mask 1 and the wafer 2 are to be aligned with respect to the x-axis direction and that, upon completion of alignment, the alignment light is focused at a point ($x_2$, y, $z_2$) on the sensor surface, then equations regarding a group of curved lines of a grating lens of a wafer can be expressed, in the coordinate system defined hereinbefore, as follows:

$$\sqrt{(x-x_2)^2+z_2^2} - \sqrt{(x-x_1)^2+(z_1-g)^2} = \sqrt{x_2^2+z_2^2} - \sqrt{x_1^2+z_1^2} \qquad (4)$$

Equation (4) is such an equation that satisfies a condition under which, assuming that the wafer surface is "z=−g" and that the chief ray is such a ray that passes the origin on the mask surface and a point (0, 0, −g) on the wafer surface and additionally a point ($z_2$, y, $z_2$) on the sensor surface, the difference in length between the path of the chief ray and the path of a ray passing the grating (x, y, −g) on the wafer surface becomes equal to a multiple, by an integral number, of a half wavelength.

Figure 7A:
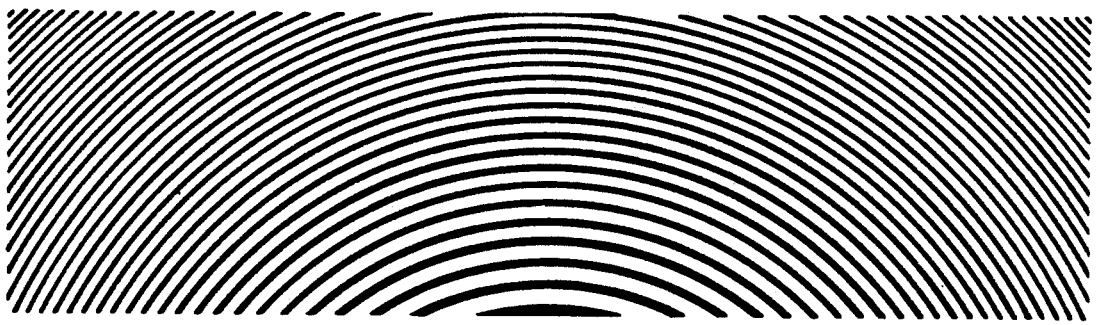
FIGS. 7A and 7B exemplify patterns of a second alignment mark and a second reference mark, respectively, usable in the first embodiment.
Figure 7B:
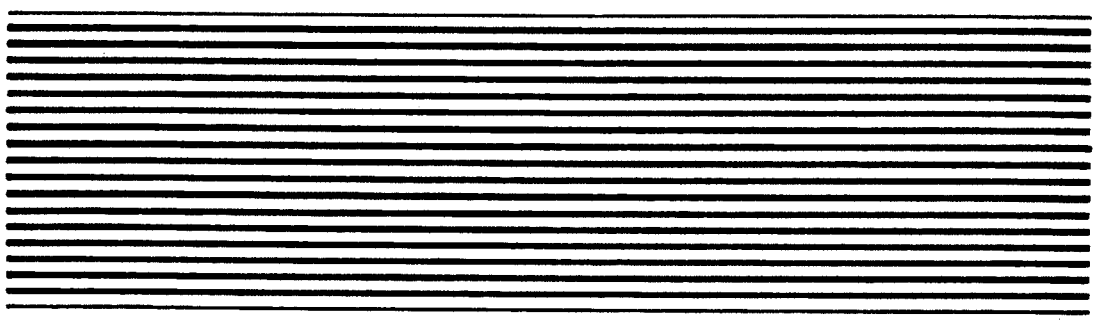

FIG. 7A illustrates a second alignment mark on a wafer 2, and FIG. 7B illustrates a second reference mark on the wafer.

Generally, a zone plate (grating lens) for a mask can be formed as an amplitude type grating element of "0 and 1" in which two regions, a region (transparent portion) that can transmit light and a region (light blocking portion) which does not transmit light, are formed alternately. On the other hand, a zone plate for a wafer can be formed as a phase grating pattern having a rectangular section, for example. The fact that, in equations (1) and (2), each line of a grating is defined at a position which corresponds to a multiple, by an integral number, of a half wavelength with regard to the chief ray, means that the linewidth ratio of the transparent portion and the light blocking portion is 1:1 in the case of the grating lens on a mask 1, and that the line and space ratio of rectangular grating is 1:1 in the case of the grating lens on the wafer 2.

As a specific example, a grating lens on a mask 1 was formed by transferring, onto an organic thin film of polyimide, a grating lens pattern of a reticle prepared by use of electron beam exposure technique.

On the other hand, a mark on a wafer 1 was formed by preparing on a mask a pattern to be printed on a wafer and then by transferring the pattern by use of a lithographic process.

A description will now be provided of the relationship between a signal light (alignment light) and a reference light to be incident on a sensor (detecting means) which may comprise an accumulation type one-dimensional CCD sensor, for example.

In this embodiment, the reference light and the signal light (for alignment) emanate from the wafer surface at angles 8 degrees and 5 degrees, respectively, with respect to the normal of the wafer surface and with the projection, upon the wafer surface, being orthogonal to the scribe line direction. The spatial disposition of the sensors 11 and 12 is so set that, upon completion of alignment, a light is incident on a corresponding sensor substantially at the middle position.

The sensors 11 and 12 have a spacing of 2 mm between their centers, and are mounted to a common base plate, made of Si, at a precision of about 0.1 micron. The Si base plate on which the sensors 11 and 12 are mounted, is disposed so that its normal extends substantially in parallel to a bisector for the angle of emission of the alignment light and the angle of emission of the reference light, when the mask and the wafer have no relative positional deviation.

As regards the size of the sensors 11 and 12, the sensor 11 for the signal light is 1 mm in width and 6 mm in length, whereas the sensor 12 for the reference light is 1 mm in width and 1 mm in length. Each picture element (pixel) has a size of $25 \times 500$ microns.

Each sensor is operable to measure the position of the center of gravity of incident light, and output signals from the sensor is processed so as to be standardized with regard to the total light quantity over the whole light-receiving region. By this, even if the output power of a light source for alignment changes slightly, the measured value as outputted from the sensor system exactly represents the position of the center of gravity. Although the resolution of the sensor, for the position of the center of gravity, may depend on the power of the alignment light, it was 0.2 micron where a semiconductor laser having a power of 50 mW and a wavelength 0.83 micron was used, by way of example.

In a design example for a grating lens of a mask and a grating lens of a wafer, to be used in the present embodiment, the center of gravity of the signal light displaces along the sensor surface, with the positional deviation between the mask and the wafer being magnified by $\times 100$. Therefore, a positional deviation of 0.01 micron between the mask and the wafer results in an effective displacement of the center of gravity on the sensor surface through 1 micron. The sensor system can measure such a displacement with a resolution of 0.2 micron.

If, in this embodiment, the wafer 2 surface is inclined within an x-z plane by an amount 1 mrad, there occurs on the sensor 11 a displacement of about 40 microns of the center of gravity of the signal light. On the other hand, the reference light 8 and the signal light 7 have symmetrical projections and, additionally, travel along respective optical paths having the same length. Therefore, on the sensor 12, there occurs displacement of the center of gravity of the reference light 8 as exactly the same as the signal light. Thus, by processing signals from the sensors, in a central processing unit (CPU) 11a of the sensor system, so as to detect and output a difference between those signals representing the positions of the effective centers of the gravities, the output signal from the sensor system does not change even if the wafer surface is inclined within the x-z plane.

If, on the other hand, the wafer is inclined within a y-z plane, both the signal light and the reference light causes displacement of the center of gravity in a direction (widthwise direction) perpendicular to the lengthwise direction (the direction of array of elements) of the sensor (one-dimensional CCD sensor). However, such a displacement is in the direction which is perpendicular to the direction of displacement of the center of gravity of light resulting from the positional deviation (which is just to be detected). Therefore, without the reference light, no practical alignment error occurs.

Further, where the alignment head which may contain an alignment light source, a light projecting lens system and sensors, is shifted relatively to a mask and wafer system (for example, if the head is displaced by 5 microns in the x direction relatively to a mask), there occurs an effective displacement of the center of gravity of the signal light, on the sensor 11 surface, by an amount of 4.98 microns. In this connection, also the center of gravity of the reference light displaces on the sensor 12 by an amount 4.98 microns, as exactly the same as the signal light. Similarly, a deviation of 10 microns between the mask surface and the head, in the z direction, results in a displacement, through 10 microns, of the center of gravity of light upon each of the signal-light sensing sensor 11 and the reference-light sensing sensor 12.

Therefore, no change occurs in the final output of the sensor system, namely, in the differential signal representing the difference between an output concerning the position of the center of gravity of the signal light and an output concerning the center of gravity of the reference light.

It will be readily understood that any change in the position in respect to the y-axis direction does not result in an essential alignment error, even when a reference light is not used.

It is not always necessary that the alignment marks 3 and 5 and the reference mark 6 are set to have different focal lengths as in the present embodiment. For example, the alignment marks 3 and 5 may have the same focal length.

Figure 8:
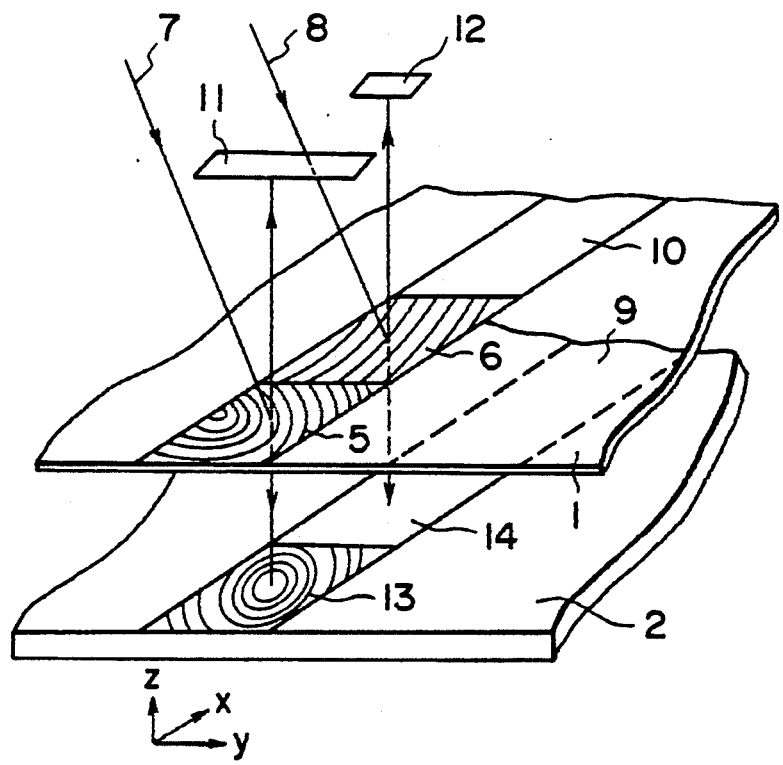
FIG. 8 is a schematic view showing a major portion of a second embodiment of the present invention.

FIG. 8 is a schematic view of a second embodiment of the present invention. In this embodiment, as a reference light setting means, like in the first embodiment shown in FIG. 5, a first reference mark 6 formed by a predetermined grating lens and a second reference mark 14 formed by a plain reflecting surface, are used.

First alignment mark 5 and first reference mark 6, which are formed by juxtaposed grating lenses provided on a mask 1 surface, are so set that, as in the first embodiment, lights 7 and 8 incident at a predetermined angle with respect to the normal of the mask 1 surface are collected at positions which are at distances of 238.0 microns and 20.2 mm vertically below the mask 1 surface.

On the other hand, a second alignment mark 13 provided on a wafer 2 surface is formed by a grating lens which is symmetrical with respect to a normal of the mask 1 surface and, more specifically, it is provided by a Fresnel zone plate having a focal length of 239.4 microns for the alignment purpose. A plain reflection surface is juxtaposed thereto as a second reference mark 14.

Similar to the first embodiment, the first and second alignment marks 5 and 13 and the first and second reference marks 6 and 14 each has a size of 140 microns in the direction of a scribe line 9 or 10 and 50 microns in the widthwise direction (y direction) of the scribe line.

In this embodiment, a spherical wave having been transmissively diffracted by the first alignment mark 5 on the mask 1 surface is reflectively diffracted by the second alignment mark 13 on the wafer 2 surface and, thereafter, it passes through the mask 1 surface as a "zero-th" order diffraction light, the transmitted light being detected by a sensor 11 as an alignment light (signal light).

Thus, upon completion of the mask-to-wafer alignment, the chief ray of the signal light is reflected by the wafer surface vertically upwardly and, after passing through the mask surface as a "zero-th" order light, it impinges on the sensor 11 disposed right above the mask surface.

Since the mark 14 on the wafer, for the reference light, is plain, the spherical wave as transmissively diffracted by the grating lens 6 on the mask surface, for the reference light, is not influenced by any lens function of a grating lens, as in the first embodiment, but is simply reflected and impinges on a sensor 12 disposed vertically upwardly of the mask (or wafer). As a consequence, even if there is a positional deviation between the mask and the wafer, the reference light 8 impinges on the sensor 12, constantly at the same position of center of gravity. Basic optical paths of the signal light and the reference light are parallel to each other and have the same length. Therefore, by an inclination of the wafer surface, the signal light and the reference light produce, on the sensors, exactly the same displacement of the center of gravity. Similarly, even when the position of the alignment head changes, there occurs no relative shift of the center of gravity between the signal light and the reference light.

In the second embodiment, as a result of the provision of a plain mark 14 on the wafer for the reference light, the quantity of light that can reach the sensor 12 is increased remarkably, as compared with that as attainable with the grating mark of the first embodiment. In the first embodiment, the quantity of light is determined by the reflection factor of the wafer surface and, additionally, by the diffraction efficiency of the grating (which is of an order of 5%). In the second embodiment, as compared therewith, there occurs no attenuation of the light quantity due to the factor of the diffraction efficiency of the grating.

In the present embodiment, a light quantity of 0.8 mW is attainable on the sensor surface, which is about twenty times higher than that in the first embodiment.

On the other hand, the signal light receiving grating lens 13 on the wafer has a symmetrical structure with respect to a normal of the wafer surface, passing through the center of the mark, and, by the reflection at the wafer surface, the chief ray of the signal light goes backwardly along a direction perpendicular to the mask or wafer surface. Thus, as compared with the case of a grating element of the first embodiment, as having a function for deflecting and emitting light from the wafer surface with inclination and having a lens power, the diffraction efficiency can be increased.

The diffraction efficiency of the mark on the wafer surface is 5% in the first embodiment, but in the second embodiment it is increased to 20% and 0.2 mW. The total quantity of the signal light that reaches the sensor surface is increased to about four times higher than that in the first embodiment.

In this embodiment, the reference light receiving mark on the wafer surface is plain and, additionally, a signal light receiving mark on the wafer surface is formed by a symmetrical grating lens. By doing so, the quantity of light that can reach the sensor is increased remarkably. As a result, the signal-to-noise ratio of the sensor increases, and the resolution for the measurement of the position of center of gravity increases to 0.1 micron. Further, the accumulation time of the sensor is shortened to 10 msec which is a quarter ($\frac{1}{4}$) of that in the first embodiment. Also, the measuring time for alignment is shortened to a quarter, with a result of further improvement in the total throughput of the exposure system.

Figure 9:
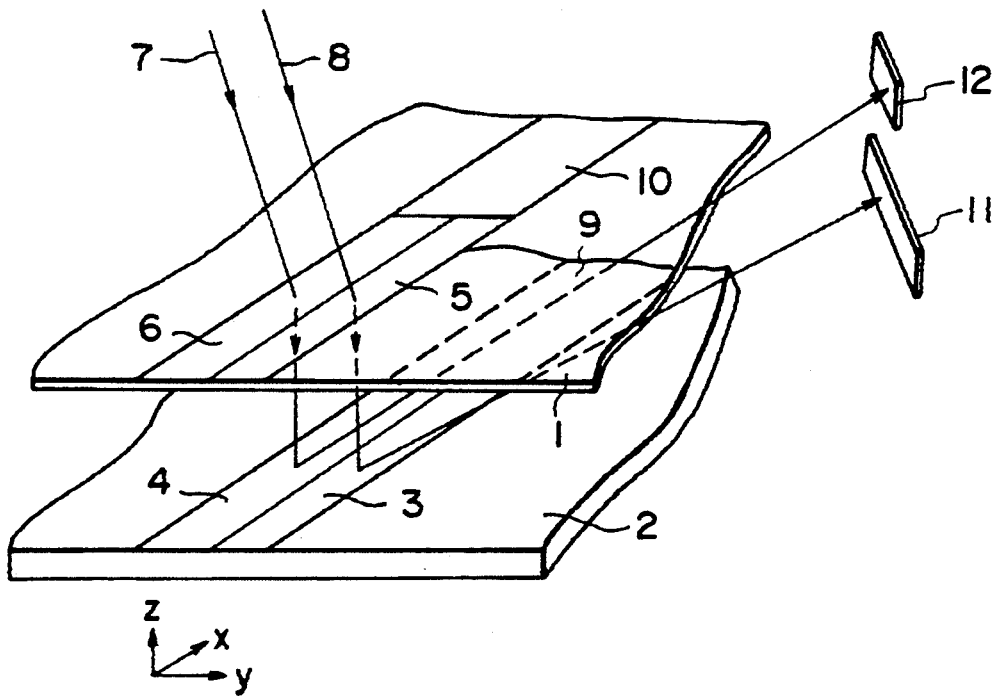
FIG. 9 is a schematic view showing a major portion of a third embodiment.

FIG. 9 is a schematic view of a third embodiment of the present invention. In this embodiment, like the first embodiment shown in FIG. 5, as a reference light setting means, a first reference mark 6 formed by a predetermined grating lens and a second reference mark 4 formed by a straight grating having no lens function and being operable to simply deflect a light, are used.

Grating lenses 5 and 6 juxtaposed to each other on a mask surface are so set that, as in the first embodiment, those lights incident at a predetermined angle with respect to the normal of the mask surface are collected at positions which are at distances 238.0 microns and 20.2 mm vertically below the mask surface.

In this embodiment, the first alignment mark 5 and the first reference mark 6 are juxtaposed in the widthwise direction (y direction) of a scribe line 10, and a second alignment mark 4 and a second reference mark 3 are juxtaposed in the same widthwise direction of a scribe line 9.

The present embodiment is so set that, when the mask 1 and the wafer 2 have no relative positional deviation (i.e. when the alignment marks 5 and 3 on the mask 1 and the wafer 2 just provide a coaxial system), the chief ray of the alignment light emitting from the wafer 2 has an angle of emission of 5 degrees, and the projection of the emitted light on the wafer 2 surface extends perpendicularly to the widthwise direction (y direction) of the scribe line and, additionally, the emitted light is focused on the sensor 11 surface which is disposed at a predetermined position, for example, at a height of 20 mm from the wafer 2 surface.

On the other hand, the light transmissively diffracted by the first reference mark is simply deflected by the second reference mark 4 on the wafer 2 surface and emanates therefrom with an angle of emission of 8 degrees and with the projection upon the wafer 2 surface being inclined with respect to the widthwise direction of the scribe line, and finally it is focused at a point on the surface of the sensor 12 (second detecting means).

As regards the reference light coming by way of the reference marks 6 and 4, the position of the center of gravity of such a light incident upon the sensor 12 surface is constantly fixed, even if the relative position of the mask 1 and the wafer 2 changes.

It will be understood from the foregoing that, in this embodiment, the grating lens of the first reference mark 6 provided on the mask 1 surface has a relatively long focal length, from the passage of the reference light through the mask 1 surface to the impingement on the sensor 12 surface of the reference light being deflected by the wafer 2 surface.

In this embodiment, the straight grating 4 of the second reference mark is inclined with respect to the scribe line.

In this embodiment, the sensors 11 and 12 for the signal light and the reference light are so set as to be symmetrical with respect to a bisector concerning the emission angles 5 degrees and 8 degrees of these lights from the wafer surface. Also, the sensors 11 and 12 are formed on a common base plate which is set so that the base plate extends orthogonally to the bisector of the emission angles of the two lights from the wafer (namely, it defines an angle of 6.5 degrees with respect to the mask or wafer surface). As a result, the signal light and the reference light emanating from the wafer surface have a symmetrical projection with respect to the sensor base plate and, additionally, they have the same optical path length. Therefore, any inclination of the wafer surface produces an exactly the same displacement of the center of gravity on the sensor surface, for the signal light and the reference light. Similarly, any change in the position of the alignment head does not produce any relative displacement of the center of gravity, between the signal light and the reference light.

The marks 5 and 3 for the signal light and the marks 6 and 4 for the reference light each has a size of 280 microns in the direction of the scribe line and 40 microns in the widthwise direction of the scribe line. Also, the alignment is made with respect to the direction of the scribe line.

In the third embodiment, the marks are arrayed in the widthwise direction of the scribe line. As a result, this embodiment has the following advantageous features as compared with the first and second embodiments.

In the first and second embodiments, a mark for the signal light and a mark for the reference light are arrayed in the direction of the scribe line. The region in which alignment marks are to be set is limited to a certain area (for example, 280×80 microns) on the scribe line. As a result, it is not easy to obtain such a lens as having a focal length in a certain range and having superior imaging performance. For example, comparing a case where a region of 280×80 microns is uniformly divided in the scribe line direction and a lens is prepared by using a region of 140×80 microns with a case where the region is divided in the widthwise direction and a lens is prepared by using a region of 280×40 microns, there is a difference, about twice, in the number of lines of the grating in the scribe line direction. Usually, the imaging performance (resolution) of a zone plate is better with a larger number of gratings and a smaller size of a minimum ring width.

Where marks are arrayed in the widthwise direction of the scribe line and the alignment is made by using a lens power in the scribe line direction perpendicular thereto, distortion of light on the sensor is reduced by the reduction in wavefront aberration and, therefore, the resolution and the precision can be improved easily.

Figure 1:
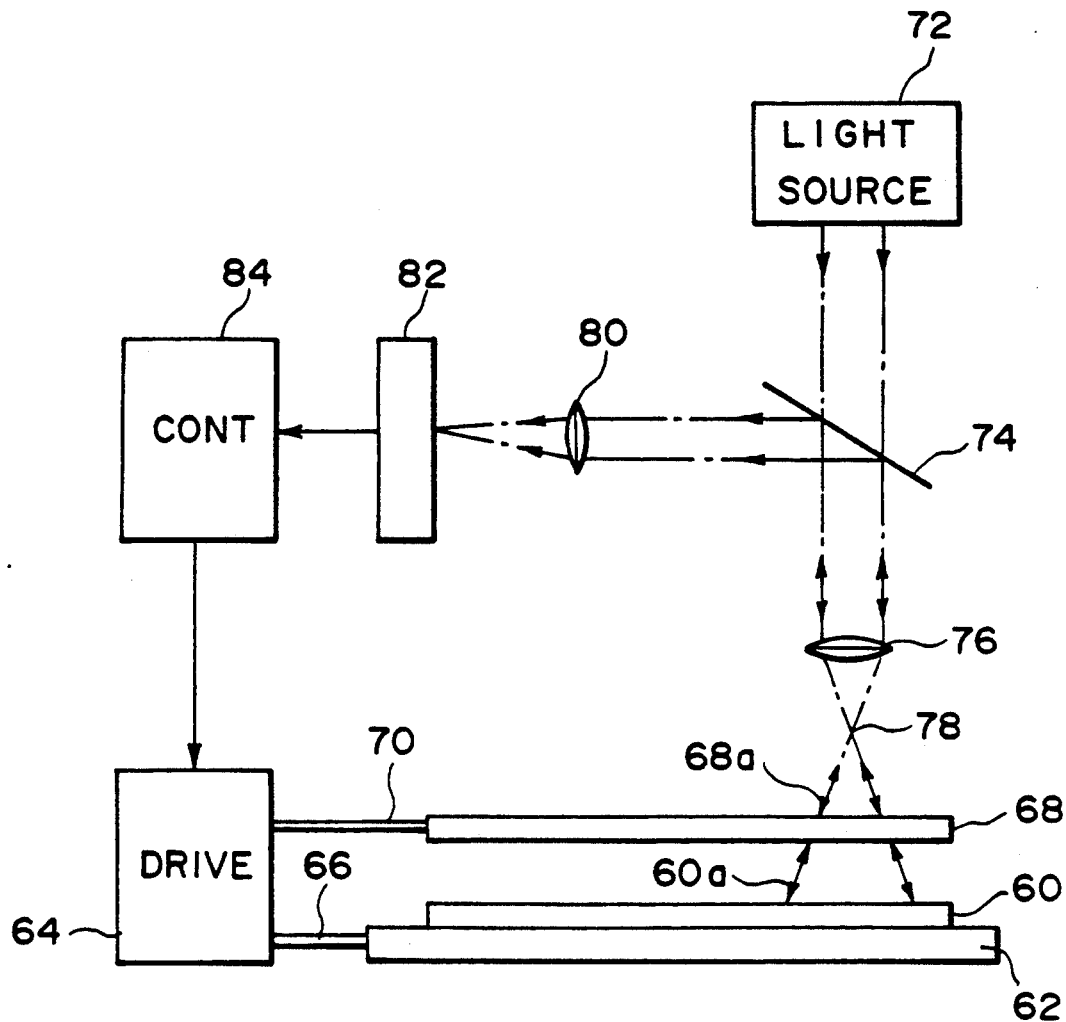
FIGS. 1-3 illustrate a known type position detecting device and a problem peculiar thereto.
Figure 2:
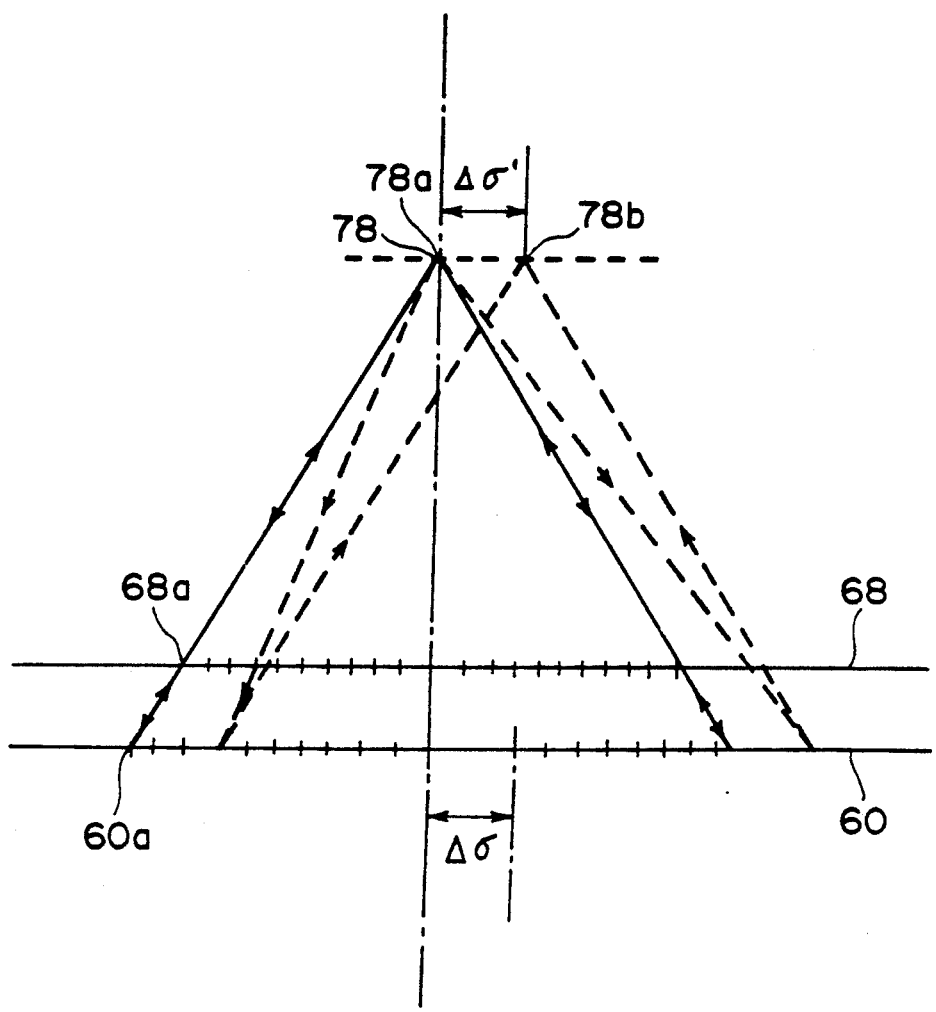
Figure 3:
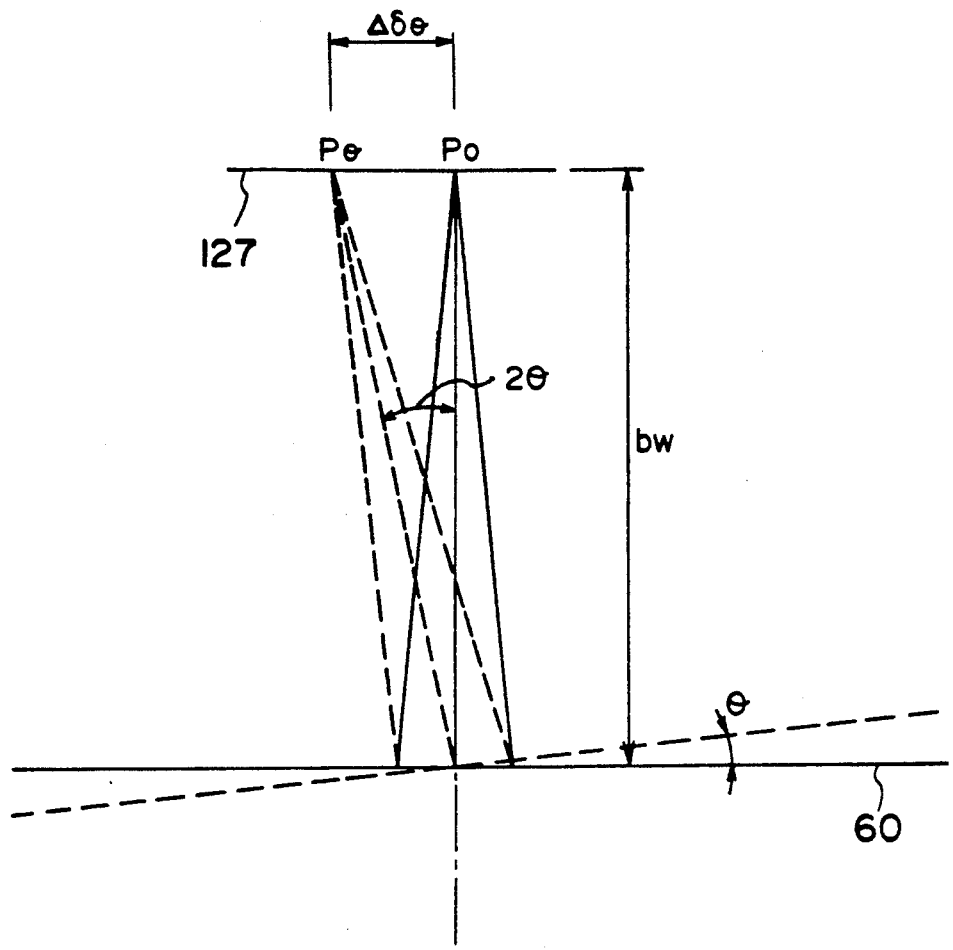
Figure 4:
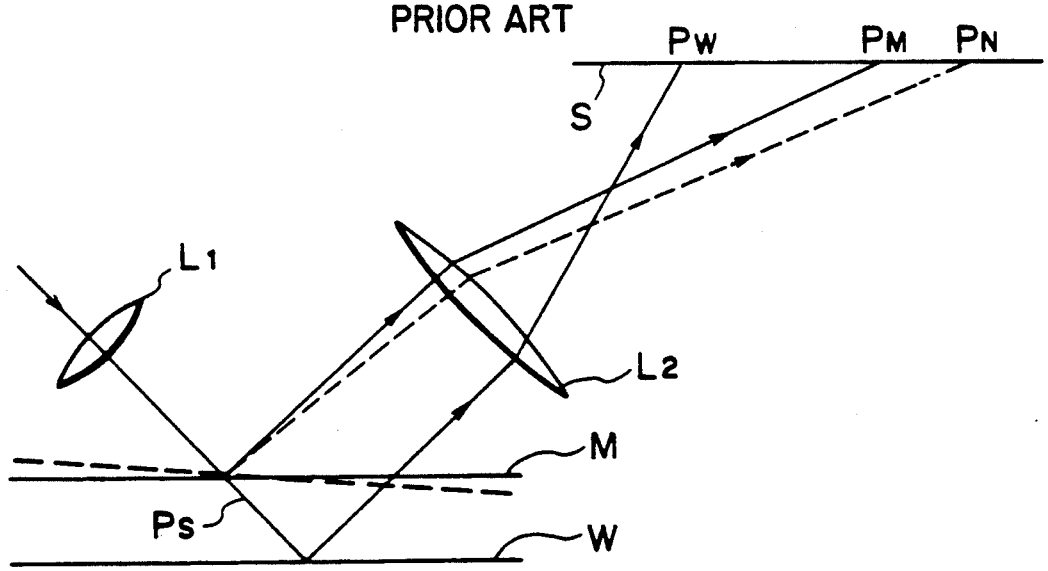
FIG. 4 illustrates the principle of a known type gap measuring device.
Figure 10:
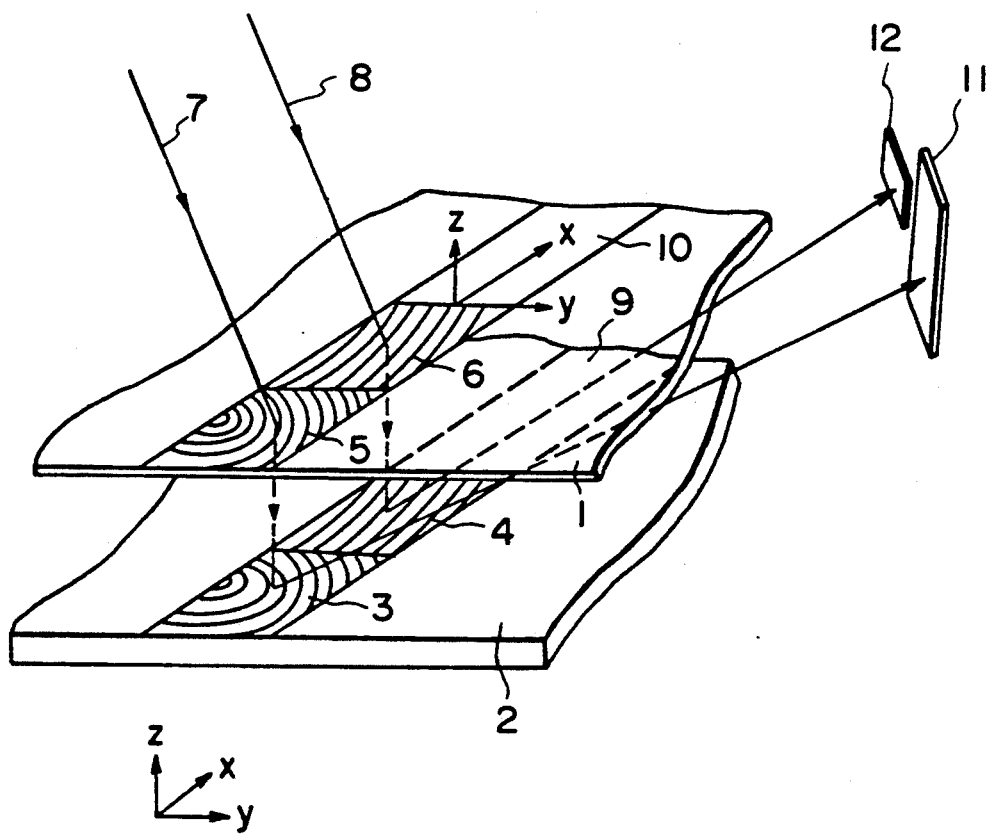
FIG. 10 is a schematic view showing a major portion of a fourth embodiment.

FIG. 10 is a schematic view of a fourth embodiment of the present invention. In this Figure, same reference numerals as of the FIG. 1 embodiment shown in FIG. 5 are assigned to corresponding elements.

A description will now be provided of first and second alignment marks 5 and 3 and first and second reference marks 6 and 4 used in this embodiment.

The alignment marks 3 and 5 and the reference mark 6 are provided by Fresnel zone plates (or grating lenses) having different focal lengths. On the other hand, the reference mark 4 is formed by a straight grating having no lens function but being operable merely to deflect light. Each mark has a size of 140 microns in the lengthwise direction of the scribe line and 50 microns in the widthwise direction (y direction) of the scribe line.

In this embodiment, both the alignment light 7 and the reference light 8 are incident on the mask 1 at an angle of incidence of 10 degrees, with the projection upon the mask 1 surface being perpendicular to the scribe line direction (x direction).

The alignment light 7 and the reference light 8 incident on the mask 1 with a predetermined angle are influenced by the lens functions of the grating lenses 5 and 6, respectively, each being transformed into a convergent or divergent light which is emitted from the mask 1 so that its chief ray has a predetermined angle with respect to the normal of the mask 1.

The alignment light 7 and the reference light 8, having been transmissively diffracted by the first alignment mark 5 and the first reference mark 6, respectively, are collected at points on the wafer 2 surface which are at distances of 238.0 microns and 20.107 microns vertically below these marks. The alignment mark 5 and the reference mark 6, in this case, have focal lengths of 268 microns and 20.137 microns. Also, the mask 1 and the wafer 2 are spaced by a distance 30 microns.

The light transmissively diffracted by the alignment mark 5 is influenced by a concave or convex lens function of the second alignment mark 3 on the wafer 2 surface, and is focused at a point on the sensor 11 surface (first detecting means). On this sensor 11 surface, at this time, the light is incident with any relative positional deviation (i.e. any misalignment of the axes) of tee alignment marks 5 and 3 being magnified, with the result of a corresponding shift of the position of the center of gravity of the incident light.

The present embodiment is so set that, when the mask 1 and the wafer 2 have no relative positional deviation (i.e. when the alignment marks 5 and 3 on the mask 1 and the wafer 2 just provide a coaxial system), the chief ray of the alignment light emitting from the wafer 2 has an angle of emission of 5 degrees, and the projection of the emitted light on the wafer 2 surface extends with an angle 2 degrees to the widthwise direction (y direction) of the scribe line and, additionally, the emitted light is focused on the sensor 11 surface which is disposed at a predetermined position, for example, at a height of 20 mm from the wafer 2 surface.

On the other hand, the light transmissively diffracted by the first reference mark is simply deflected by the second reference mark 4 on the wafer 2 surface and emanates therefrom with an angle of emission of 5 degrees and with the projection upon the wafer 2 surface having an angle −2 degrees to the widthwise direction of the scribe line, and finally it is focused at a point on the surface of the sensor 12 (second detecting means).

As regards the reference light coming by way of the reference marks 6 and 4, the position of the center of gravity of such a light incident upon the sensor 12 surface is constantly fixed, even if the relative position of the mask 1 and the wafer 2 changes.

It will be understood from the foregoing that, in this embodiment, the grating lens of the first reference mark 6 provided on the mask 1 surface has a relatively long focal length, from the passage of the reference light through the mask 1 surface to the impingement on the sensor 12 surface of the reference light being deflected by the wafer 2 surface.

In this embodiment, the straight grating 4 of the second reference mark is inclined with respect to the scribe line.

Also, the one-dimensional sensors 11 and 12 for detecting the positional deviation are formed on a common base plate, as in the first embodiment, which base plate is so set that a normal to the surface of the base plate is coincident with a bisector of the emission angles of the signal light and the reference light from the wafer.

Also, the mark for the reference light and the mark for the signal light are set in accordance with equations (1) and (2) having been described with reference to the first embodiment.

As a result of this, any inclination of the wafer surface and any change in the position of the alignment head relative to the mask-wafer system, can be cancelled by a signal from the sensor, receiving the reference light, as representing the position of the center of gravity and by a signal from the sensor, receiving the signal light, as representing the center of gravity of that light. Therefore, substantially the same positional deviation detecting performance as obtainable with the first embodiment is obtained.

In these embodiments, alignment marks are so disposed that correct alignment is discriminated when an alignment mark of a wafer is exactly positioned right underneath an alignment mark of a mask. However, in a direction perpendicular to the direction with respect to which any positional deviation is to be detected, the alignment mark of the mask and the alignment mark of the wafer may be set with deviation. For example, in the case where, as in the third embodiment shown in FIG. 9, any positional deviation between a mask and a wafer is to be detected with respect to the direction of a scribe line on a mask, an alignment mark of a wafer may be provided with its minor direction deviated in the y direction, wherein the scribe line extends in the x direction. By disposing an alignment mark of a wafer in that manner, the angle of incidence of light having been emitted from an alignment head and impinging on the mask surface, can be made small, with the result that the grating pitch can be made larger than the wavelength ($\lambda=0.83$ micron) of the alignment light. Therefore, the manufacture of alignment marks can be facilitated.

Also, it is not always necessary to use sensors of one-dimensional type, as in the first to fourth embodiments, for the detection of the positional deviation. Two-dimensional gravity position detecting sensor such as, for example, a two-dimensional CCD sensor, may be used.

Figure 11:
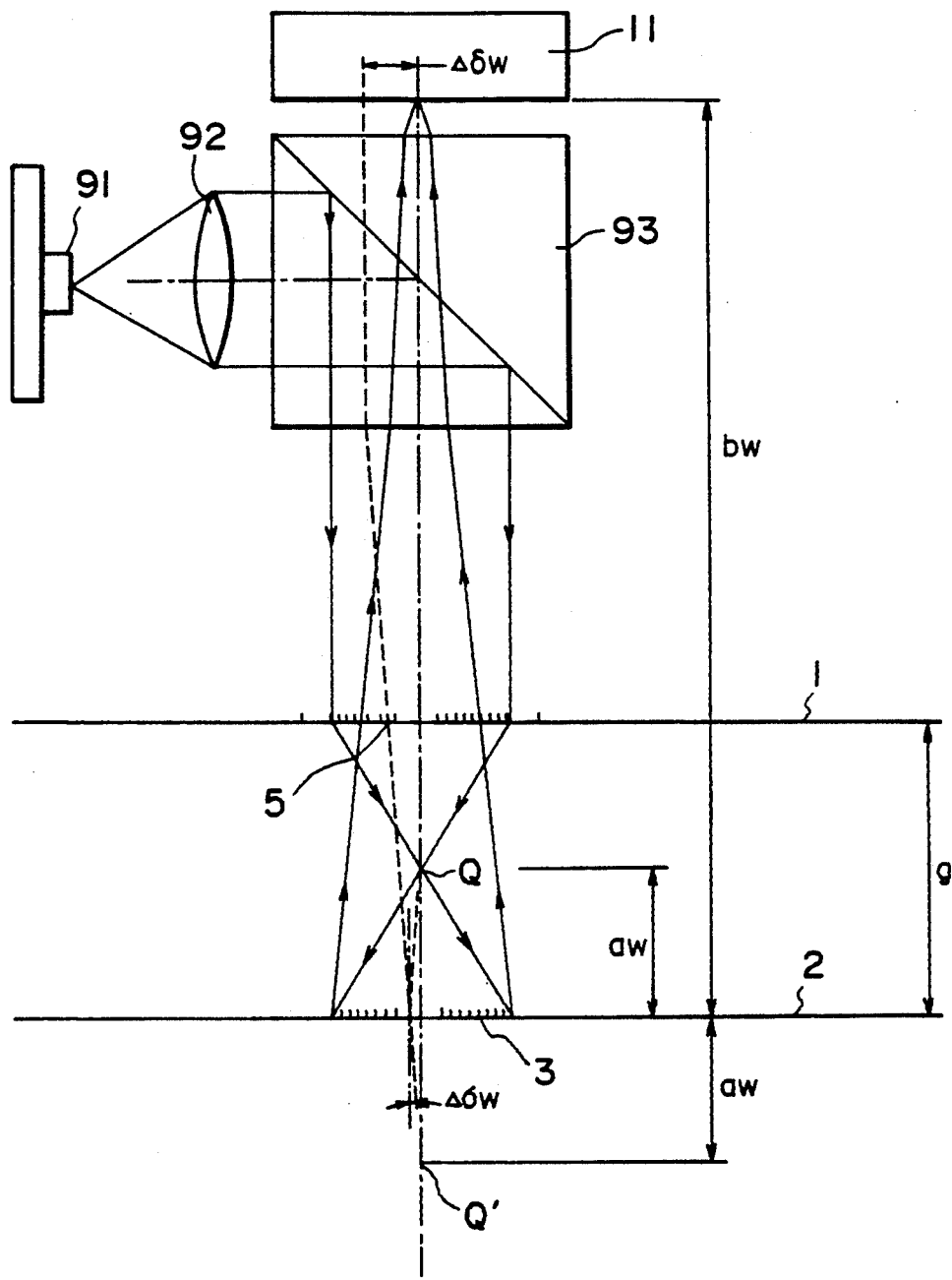
FIG. 11 is a schematic section showing a major portion of a fifth embodiment.

FIG. 11 is a schematic view of a fifth embodiment of the present invention. This embodiment is specifically concerned with an alignment system, usable in a semiconductor device manufacturing exposure apparatus of so-called "proximity type", for aligning a mask and a wafer. Particularly, only those portions of the apparatus related to an alignment light are illustrated and will be described below.

In FIG. 11, the same reference numerals are assigned to those elements corresponding to the elements shown in FIG. 5. In FIG. 11, a mask 1 and a wafer 2 correspond respectively to a first and second objects which are to be aligned relative to each other. A mask alignment pattern 5 provided on the mask 1 surface corresponds to a first physical optic element, while a wafer alignment pattern 3 provided on the wafer 2 surface corresponds to a reflection type second physical optic element.

In this example, light emanating from a light source 91 is collimated into parallel light by means of a lens system 92, and the collimated light after passing a half mirror 93 illuminates the mask alignment pattern 5. The mask alignment pattern 5 is formed by a zone plate having a function for focusing the received light at a point Q which is in front of the wafer. The light focused at the point Q advances divergently and impinges on the wafer alignment pattern 3. The wafer alignment pattern 3 is formed by a reflection type zone plate by which the incident light is reflected and focused, after passing the mask and the half mirror 93, upon a detecting surface 11. Thus, an alignment signal is obtained. A reference signal by a reference light is obtainable in a similar manner.

As described, it is within the scope of the present invention to use an optical arrangement having a half mirror.

In some embodiments to be described below, an alignment mark and a reference mark are formed alternately in sections defined by dividing one and the same region and, by doing so, the adverse effect of any inclination of an alignment mark area can be excluded effectively to ensure accurate position detection.

Figure 12:
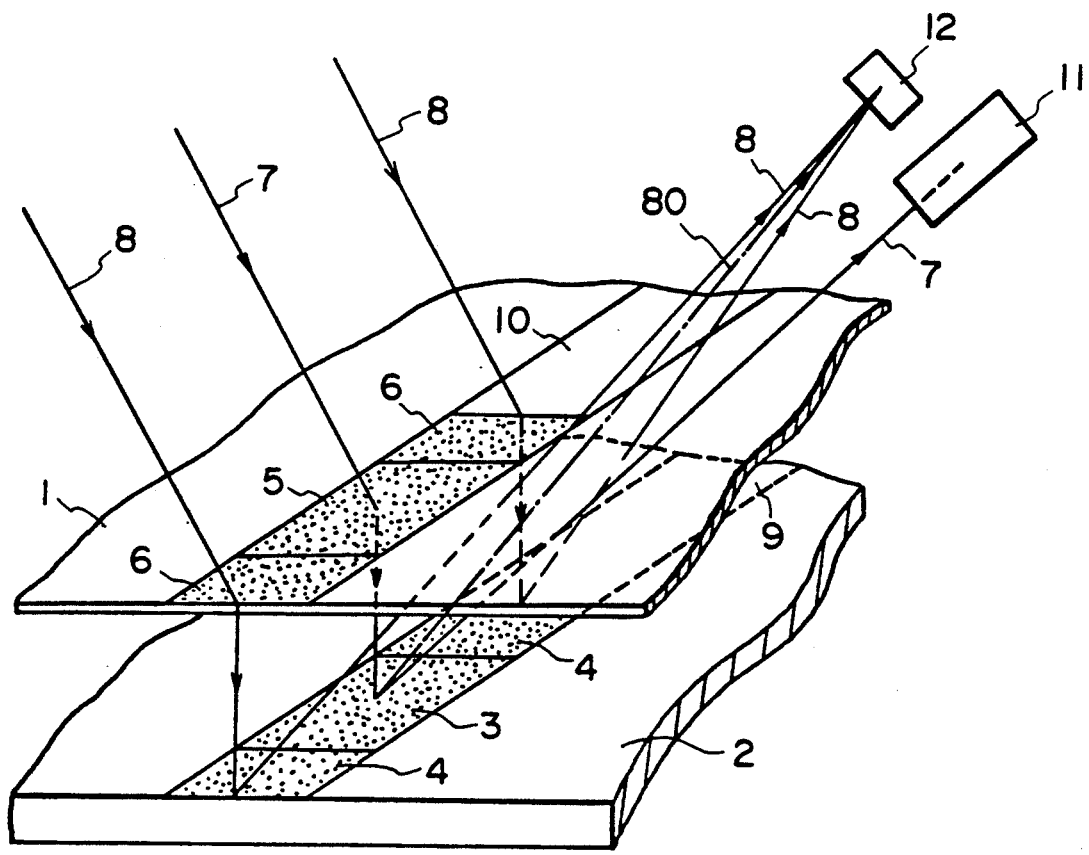
FIG. 12 is a schematic view showing a major portion of a sixth embodiment.

FIG. 12 is a schematic section showing a major portion of a sixth embodiment of the present invention. In this embodiment, first and second reference marks each is formed by two separated sections which are provided on both sides of an alignment mark 5 or 3.

In this embodiment, alignment light 7 and reference light 8 are incident upon the first alignment mark 5 and a first reference mark 6, respectively, on a mask 1 surface, each at a predetermined angle. The incident lights are transmissively diffracted by these marks and then are reflectively diffracted by a second alignment mark 3 and a second reference mark 4 on a wafer 2 surface, respectively. These reflectively diffracted lights are finally incident upon a sensor 11 surface and a sensor 12 surface, respectively. Each of these sensors 11 and 12 is operable to detect the position of the center of gravity of the alignment light or the reference light, being projected on its surface. By using output signals of these sensors 11 and 12, the relative position of the mask 1 and the wafer 2 in a direction parallel to the scribe lines 9 and 10 (i.e. in the x direction) is detected.

In FIG. 12, reference numeral 80 denotes a center line for two reference lights 8 from the two reference mark sections 6.

A description will now be provided of the first and second alignment marks 5 and 3 and the first and second reference marks 6 and 4 used in this embodiment.

The alignment marks 3 and 5 and the reference marks 6 and 4 are provided by Fresnel zone plates (or grating lenses) having different focal lengths and are defined in an area-division fashion. Each mark has a size of 180 microns in the lengthwise direction of the scribe line and 50 microns in the widthwise direction (y direction) of the scribe line.

In this embodiment, both the alignment light 7 and the reference light 8 are incident on the mask 1 at an angle of incidence of 17.5 degrees, with the projection upon the mask 1 surface being perpendicular to the scribe line direction (x direction).

The alignment light 7 and the reference light 8 incident on the mask 1 with a predetermined angle are influenced by the lens functions of the grating lenses 5 and 6, respectively, each being transformed into a convergent or divergent light which is emitted from the mask 1 so that its chief ray has a predetermined angle with respect to the normal of the mask 1.

The alignment light 7 and the reference light 8 having been transmissively diffracted by the first alignment mark 5 and the first reference mark 6, respectively, are collected at points on the wafer 2 surface which are at distances of 217 microns and 18.7 mm vertically below these marks. Also, the mask 1 and the wafer 2 are spaced by a distance 30 microns.

The light transmissively diffracted by the alignment mark 5 is influenced by a lens function of the second alignment mark 3 on the wafer 2 surface, and is collected at a point on the sensor 11 surface (first detecting means). On this sensor 11 surface, at this time, the light is incident with any relative positional deviation (i.e. any misalignment of the axes) of the marks 5 and 3 being magnified, with the result of a corresponding shift of the position of the center of gravity of the incident light.

The present embodiment is so set that, when the mask 1 and the wafer 2 have no relative positional deviation (i.e. when the alignment marks 5 and 3 on the mask 1 and the wafer 2 just provide a coaxial system), the chief ray of the alignment light emitting from the wafer 2 has an angle of emission of 13 degrees, and the emitted light is focused on the sensor 11 surface which is disposed at a predetermined position, for example, at a height of 18.7 mm from the wafer 2 surface.

On the other hand, the light transmissively diffracted by the first reference mark is simply deflected by the second reference mark 4 on the wafer 2 surface and emanates therefrom with an angle of emission of 7 degrees, and finally it is focused at a point on the surface of the sensor 12 (second detecting means).

As regards the reference light coming by way of the reference marks 6 and 4, the position of the center of gravity of such a light incident upon the sensor 12 surface is constantly fixed, even if the relative position of the mask 1 and the wafer 2 changes.

Figure 13:
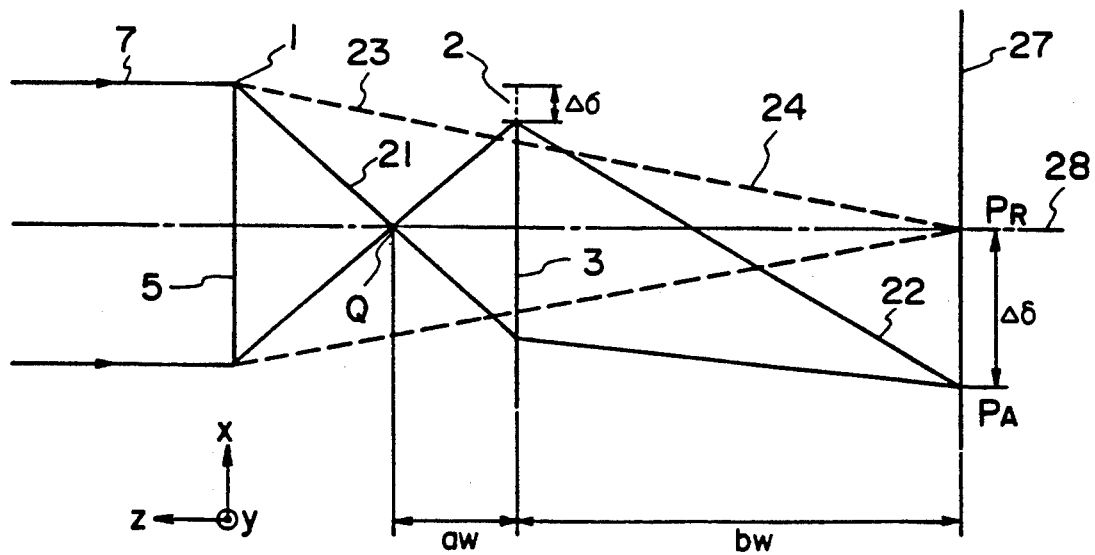
FIG. 13 is a principle view of an optical arrangement adopted in the FIG. 12 embodiment.

FIG. 13 is a representation for explicating a fundamental principle of the optical arrangement adopted in the sixth embodiment shown in FIG. 12.

This figure illustrates the manner of diffraction of light rays as viewed in the y direction, the illustration being made by depicting the Fresnel zone plate 3 of the wafer 2 as a transmissively diffracting element which is equivalent to a reflectively diffracting type. Actually, the lights as illustrated on the right side of the wafer 2, in this figure, emanate in the direction opposite to the illustrated, in regard to the z-direction component.

In FIG. 13, first and second alignment marks 5 and 3 such as zone plates, for example, are provided on first and second objects 1 and 2 with respect to which any relative positional deviation is to be evaluated. Light 7 is projected upon the first alignment mark 5 and light 21 emanating therefrom impinges on the second alignment mark 3. Light 22 emanating from the second alignment mark 3 is converged upon a light detecting surface 27 of a detector which may be a position sensor, for example.

In the FIG. 13 example, there occurs upon the detecting surface 27 a deviation $\Delta\delta$ of the center of gravity of light, corresponding to the amount $\Delta\sigma$ of relative positional deviation of the first and second objects 1 and 2.

In the FIG. 13 example, the position on the detecting surface 27 of the center of gravity of light as depicted by broken lines 24 is used as a reference, and the deviation $\Delta\delta$ of the light depicted by solid lines 22, upon the detecting surface 27 is detected to thereby determine the relative positional deviation of the first and second objects 1 and 2.

Figure 14:
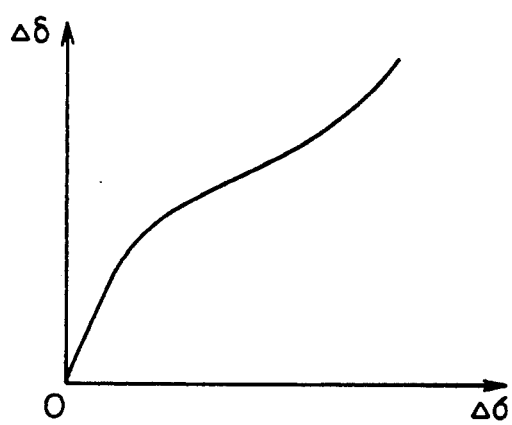
FIG. 14 is a graph showing the relationship between a positional deviation and a displacement of the center of gravity of light.

FIG. 14 illustrates the relationship between the relative positional deviation $\Delta\sigma$ of the first and second objects 1 and 2 and a deviation or displacement $\Delta\delta$ of the center of gravity of light upon the detecting surface 27.

In this embodiment of the present invention, the above-described fundamental principle is utilized to detect the relative position of a first and second objects.

Where the first alignment mark 5 is taken as a reference and when the second alignment mark 3 is deviated by an amount $\Delta\sigma$ in a direction parallel to the first alignment mark 5, then the deviation $\Delta\delta$ of the center of gravity of the light spot upon the detecting surface 27 can be given by the following equation:

$$\Delta\delta = \Delta\sigma \times (bw/aw + 1) \tag{5}$$

Namely, the deviation $\Delta\delta$ of the center of gravity is magnified at an enlarging magnification which is equal to "bw/aw+1".

If, as an example, aw=0.5 mm and bw=50 mm, the deviation $\Delta\delta$ of the center of gravity is magnified by 101 (one hundred and one) times larger, in accordance with equation (5).

Figure 15:
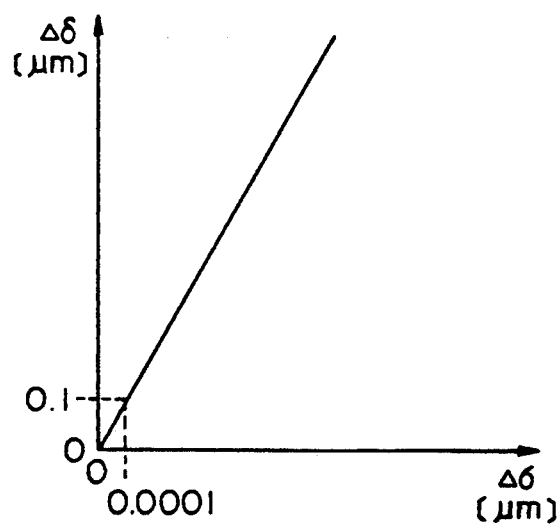
FIG. 15 is a graph showing the relationship between a positional deviation and a displacement of the center of gravity of light, in the FIG. 12 embodiment.

It will be readily understood from equation (5) that the deviation $\Delta\delta$ of the center of gravity an the positional deviation $\Delta\sigma$ at that time are in a proportional relationship such as depicted in FIG. 15. If the detector 8 has a resolution of 0.1 micron, a position resolution of an order of 0.001 micron is obtainable with regard to the positional deviation $\Delta\sigma$.

By moving the second object on the basis of the thus determined positional deviation $\Delta\sigma$, the first and second object can be aligned with high precision.

An alignment process to be adopted in this embodiment of the present invention may be such as follows.

In a first example the relationship of a deviation signal $\Delta\delta s$ representing the deviation of center of gravity of light on the detecting surface 27 of the detector, with respect to the positional deviation $\Delta\sigma$ between two objects, is predetected and a curve showing that relationship is determined preparatorily. Then, from the value of the deviation signal $\Delta\delta s$, the positional deviation $\Delta\sigma$ between these objects is detected and, thereafter, the first or second object is displaced by an amount corresponding to the detected positional deviation $\Delta\sigma$.

In a second example, from a deviation signal $\Delta\delta s$ representing the deviation of center of gravity and outputted from the detector, the direction that cancels the positional deviation $\Delta\sigma$ is detected. In this direction, the first or second object is displaced, and the above-described process is repeated until the positional deviation $\Delta\delta$ comes into a tolerable range.

First and second alignment marks 5 and 3 and a first reference mark 6 (grating lens) usable in this embodiment can be prepared in the following manner.

First, the marks 5 and 6 for a mask are designed so that, when parallel light of a predetermined beam diameter is incident thereupon at a predetermined angle, the light is collected at a predetermined position. Usually, a pattern of a grating lens may be that of an interference fringe which can be formed on a lens surface in an occasion where mutually coherent light sources are disposed at a light source position (object point) and the position of an image point. Assume a coordinate system is defined on a mask 1 surface, such as shown in FIG. 12. The origin is at the middle of the width of the scribe line, the x axis is in the direction of the scribe line, the y axis is in the widthwise direction and the z axis is in the direction of the normal of the mask 1 surface. Equations regarding a group of curved lines of such a grating lens by which a parallel light, having been incident thereon with an angle $\alpha$ with respect to the normal of the mask surface 1 and with the projection being perpendicular to the scribe line direction, is imaged after being transmissively diffracted by the mark of the mask, at the position of a converging point $(x_1, y_1, z_1)$, can be expressed in the following manner, with the position of each grating being denoted by x and y:

$$y \sin \alpha + P1(x,y) - P2 = m\lambda/2 \quad (1)$$

$$P1(x,y) = \sqrt{(x - x_1)^2 + (y - y_1)^2 + z_1^2}$$

$$P2 = \sqrt{x_1^2 + y_1^2 + z_1^2}$$

wherein $\lambda$ is the wavelength of the alignment light and m is an integral number.

Assuming now that a chief ray is a ray incident at an angle $\alpha$ and passing through the origin on the mask surface 1 and then impinging upon a convergent point $(x_1, y_1, z_1)$, then the right side of equation (1) shows that, depending on the value of m, the optical path length is "$\lambda \times m/2$" times longer (shorter) than that for the chief ray; and the left side denotes the difference in length, with respect to the optical path of the chief ray, of the optical path of such a ray that passes a point (x, y, 0) on the mask and then impinges on the point $(x_1, y_1, z_1)$.

On the other hand, a grating lens 3 to be provided on a wafer 2 is designed so as to collect, at a predetermined position (on the sensor surface), a spherical wave emanating from a predetermined point light source. Where the gap between a mask 1 and a wafer 2 at the time of exposure (pattern transfer) is denoted by g, then such a point light source can be expressed by:

$$x_1, y_1, z_1 - g)$$

wherein y is a variable.

Assuming now that the mask 1 and the wafer 2 are to be aligned with respect to the x-axis or y-axis direction and that, upon completion of alignment, the alignment light is focused at a point $(x_2, y_2, z_2)$ on the sensor surface, then equations regarding a group of curved lines of a grating lens of a wafer can be expressed, in the coordinate system defined hereinbefore, as follows:

$$\sqrt{(x - x_2)^2 + (y - y_2)^2 + z_2^2} - \quad (2)$$

$$\sqrt{(x - x_1)^2 + (y - y_1)^2 + (z_1 - g)^2} =$$

$$\sqrt{x_2^2 + y_2^2 + z_2^2} - \sqrt{x_1^2 + y_1^2 + z_1^2}$$

Equation (2) is such an equation that satisfies a condition under which, assuming that the wafer surface is "z = −g" and that the chief ray is such a ray that passes the origin on the mask surface and a point (0, 0, −g) on the wafer surface and additionally a point $(x_2, y_2, z_2)$ on the sensor surface, the difference in length between the path of the chief ray and the path of a ray passing the grating (x, y, −g) on the wafer surface becomes equal to a multiple, by an integral number, of a half wavelength.

In the described manner, a pattern specifically for the alignment and another pattern specifically for the reference are overlaid to provide one alignment mark.

FIGS. 16A1-16A3 and 16B1-16B3 exemplify patterns of marks on a mask surface and a wafer surface, usable in this embodiment.

In these Figures, patterns (A1) and (B1) are those to be provided on a mask and a wafer for alignment detecting purpose. Patterns (A2) and (B2) are those to be provided on the mask and a wafer for reference taking purpose. Pattern (A3) are such a pattern as formed by area-dividing the patterns (A1) and (A2) and by combining appropriate portions of these patterns to form a single mark pattern that provides a first alignment mark and a first reference mark. Pattern (B3) is formed by area-dividing the patterns (B1) and (B2) and by combining appropriate portions of these patterns to form a single mark pattern, that provides a second alignment mark and a reference mark.

Generally, a zone plate (grating lens) for a mask can be formed as an amplitude type grating element of "0 and 1" in which two regions, a region (transparent portion) that can transmit light and a region (light blocking portion) which does not transmit light, are formed alternately. On the other hand, a zone plate for a wafer can be formed as a phase grating pattern having a rectangular section, for example. The fact that, in equations (1) and (2), each line of a grating is defined at a position which corresponds to a multiple, by an integral number, of a half wavelength with regard to the chief ray, means that the linewidth ratio of the transparent portion and the light blocking portion is 1:1 in the case of the grating lens on a mask 1, and that the line and space ratio of rectangular grating is 1:1 in the case of the grating lens on the wafer 2.

As a specific example, a grating lens on a mask 1 was formed by transferring, onto an organic thin film of polyimide, a grating lens pattern of a reticle prepared by use of electron beam exposure technique.

On the other hand, a mark on a wafer 1 was formed by preparing on a mask a pattern to be printed on a wafer and then by transferring the pattern by use of a lithographic process.

A description will now be provided of the relationship between a signal light (alignment light) and a reference light to be incident on a sensor (detecting means) which may comprise an accumulation type one-dimensional CCD sensor, for example.

In this embodiment, the reference light and the signal light (for alignment) emanate from the wafer surface at angles 7 degrees and 13 degrees, respectively, with respect to the normal of the wafer surface. The spatial disposition of the sensors 11 and 12 is so set that, upon completion of alignment, a light is incident on a corresponding sensor substantially at the middle position.

The sensors 11 and 12 have a spacing of 1.965 mm between their centers, and are mounted to a common base plate, made of Si, at a precision of about 0.1 micron. The Si base plate on which the sensors 11 and 12 are mounted, is disposed so that its normal extends substantially in parallel to a bisector for the angle of emission of the alignment light and the angle of emission of the reference light.

As regards the size of the sensors 11 and 12, the sensor 11 for the signal light is 1 mm in width and 6 mm in length, whereas the sensor 12 for the reference light is 1 mm in width and 1 mm in length. Each picture element (pixel) has a size of 25×500 microns.

Each sensor is operable to measure the position of the center of gravity of incident light, and output signals from the sensor is processed so as to be standardized with regard to the total light quantity over the whole light-receiving region. By this, even if the output power of a light source for alignment changes slightly, the measured value as outputted from the sensor system exactly represents the position of the center of gravity. Although the resolution of the sensor, for the position of the center of gravity, may depend on the power of the alignment light, it was 0.2 micron where a semiconductor laser having a power of 50 mW and a wavelength 0.83 micron was used, by way of example.

In a design example for a grating lens of a mask and a grating lens of a wafer, to be used in the present embodiment, the center of gravity of the signal light displaces along the sensor surface, with the positional deviation between the mask and the wafer being magnified by ×100. Therefore, a positional deviation of 0.01 micron between the mask and the wafer results in an effective displacement of the center of gravity on the sensor surface through 1 micron. The sensor system can measure such a displacement with a resolution of 0.2 micron.

If, in this embodiment, the wafer 2 surface is inclined within an x-z plane by an amount 1 mrad, there occurs on the sensor 11 a displacement of about 37.4 microns of the center of gravity of the signal light. On the other hand, thee occurs a similar angular change in the reference light 8. Therefore, on the sensor 12, there occurs displacement of the center of gravity of the reference light as exactly the same as the signal light. Thus, by processing signals from the sensors so as to detect and output a difference between those signals representing the positions of the effective centers of the gravities, the output signal from the sensor system does not change even if the wafer surface is inclined within the x-z plane.

Also, even if the wafer is inclined within a y-z plane, both the signal light and the reference light causes shift of the center of gravity. Accordingly, a minute inclination of an order of 1 mrad does not result in an effective alignment error.

Further, even when an alignment head containing therein an alignment light source, a light projecting lens system and sensors, is displaced relative to the mask-wafer system, particularly for the displacement in the x direction, an alignment error can be avoided in principle by projecting light substantially uniformly upon a region including a portion around the mark area.

Similarly, by arranging the light projecting system so that parallel light impinges on the mask, any variation between the mask surface and the head, in the z direction, can be treated as an equivalence of the displacement in the x direction as described, and therefore, an alignment error can be avoided in principle.

Further, any displacement in the y-axis direction results in an integral shifts of the signal light and the reference light and, therefore, does not cause an alignment error.

Next, a description will be provided of an error which may result from warping of the mark base plate used in the embodiment.

In the sixth embodiment, the alignment mark and the reference mark are area-divided and they are so set that their centers coincide with each other. As a consequence, if the mark base plate warps, the effect thereof is averaged and does not result in an error.

More specifically, the warping of the mark base plate can be analyzed into an inclination component and a curvature component. As regards the inclination, the alignment signal and the reference signal are influenced in the same way, as described, and therefore the inclination does not cause effective errors. As regards the curvature, the orientations of light rays from the marks are deflected in opposite directions and, as a result, the position of the center of gravity of light on the sensor surface does not change. Therefore, no effective error occurs.

Figure 17A:
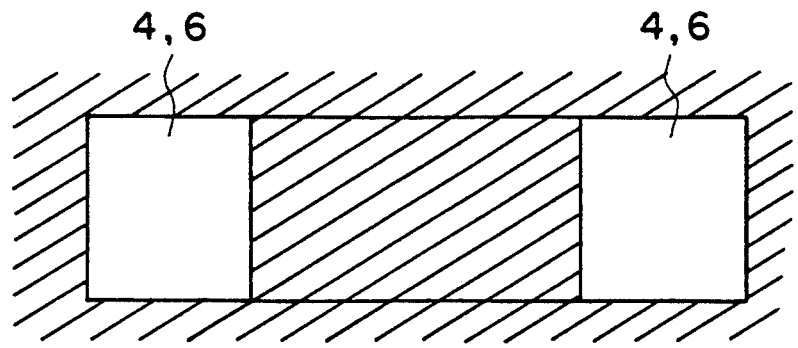
FIGS. 17A-17C are representations for explicating an example of an intensity distribution of a point image, in the FIG. 12 embodiment.
Figure 17B:
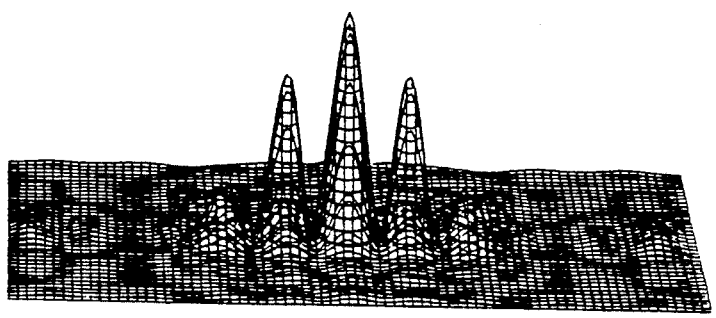
Figure 17C:
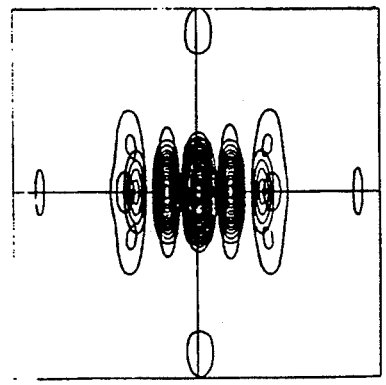

FIGS. 17A–17C are representations for explicating an intensity distribution of a point image formed by a reference mark such as shown in FIG. 12. Of these Figures, FIG. 17A illustrates the regions of the reference marks 4 and 6, and FIG. 17B is a birds-eye view of an intensity distribution of a point image formed by the reference marks. FIG. 17C is a contour map. It is seen in these Figures that due to the effect of diffraction, there are relatively large peaks on both sides. However, the center of gravity of light as a whole is substantially the same as that in the case of an ordinary rectangular aperture and thus no error results.

Figure 18A:
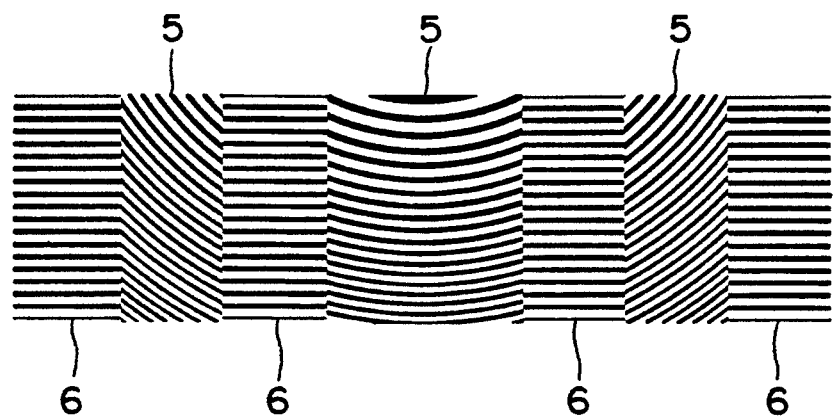
FIGS. 18A and 18B exemplify a mask mark pattern and a wafer mark pattern, respectively, usable in the FIG. 12 embodiment.
Figure 18B:
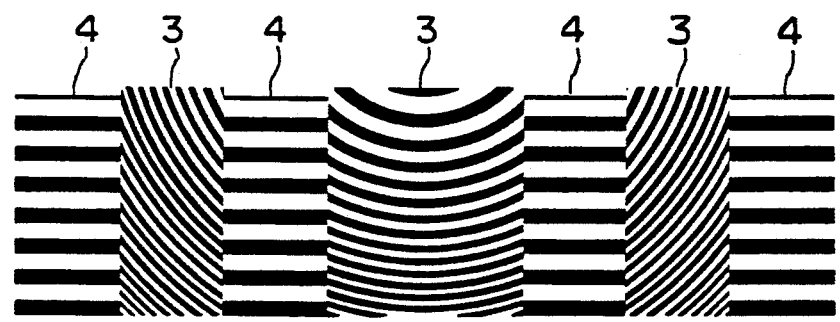

FIGS. 18A and 18B schematically illustrates an example in which the number of division of each mark is increased. More specifically, FIG. 18A shows a mask mark pattern while FIG. 18B shows a wafer mark pattern. In FIG. 18A, a signal light receiving mark is divided into three sections, whereas a reference light receiving mark is divided into four sections. Thus, in the present embodiment, each mark can be divided into a desired number of sections.

It is not always necessary in this embodiment that each mark is divided into plural sections having the same width.

Figure 19A:
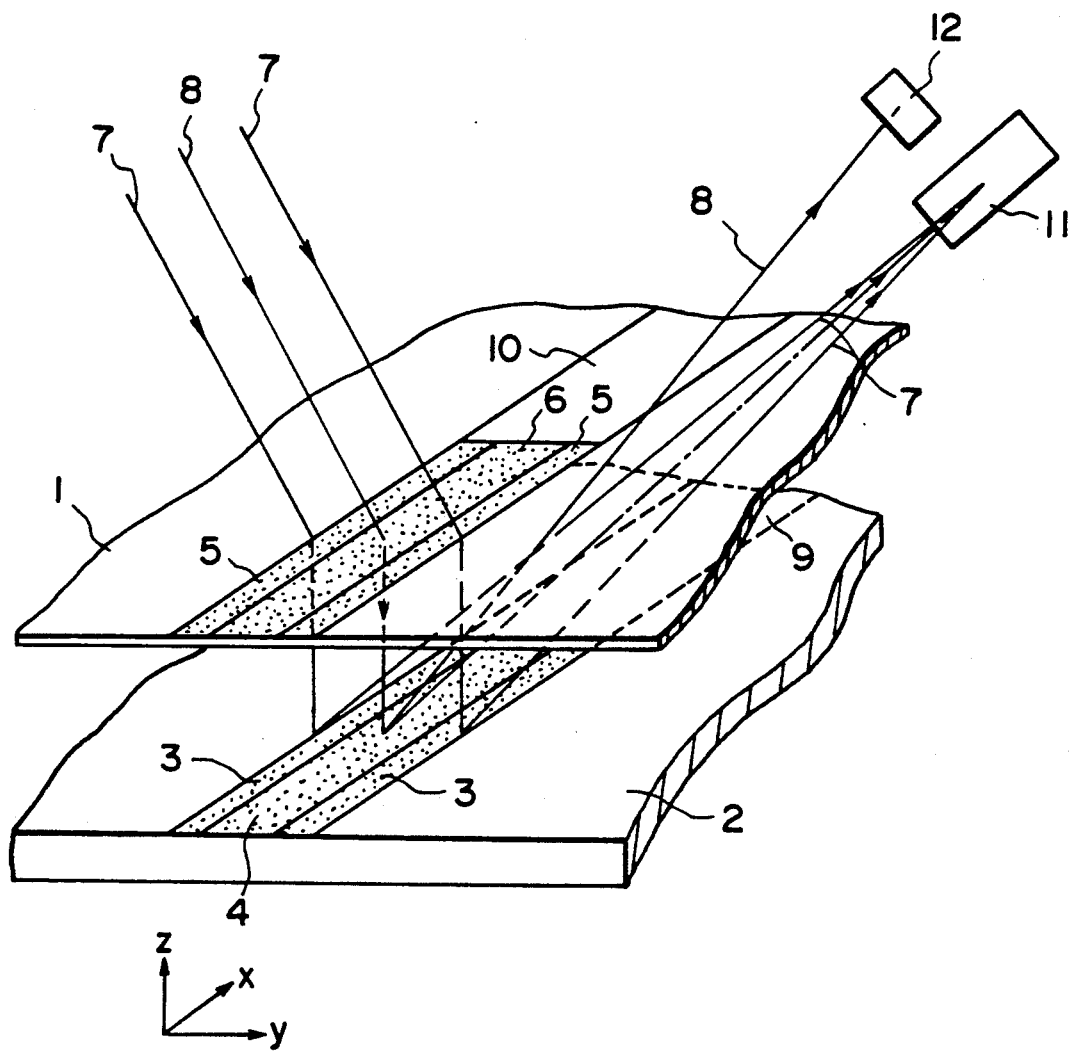
FIG. 19A is a schematic view showing a major portion of a seventh embodiment.
Figure 20A:
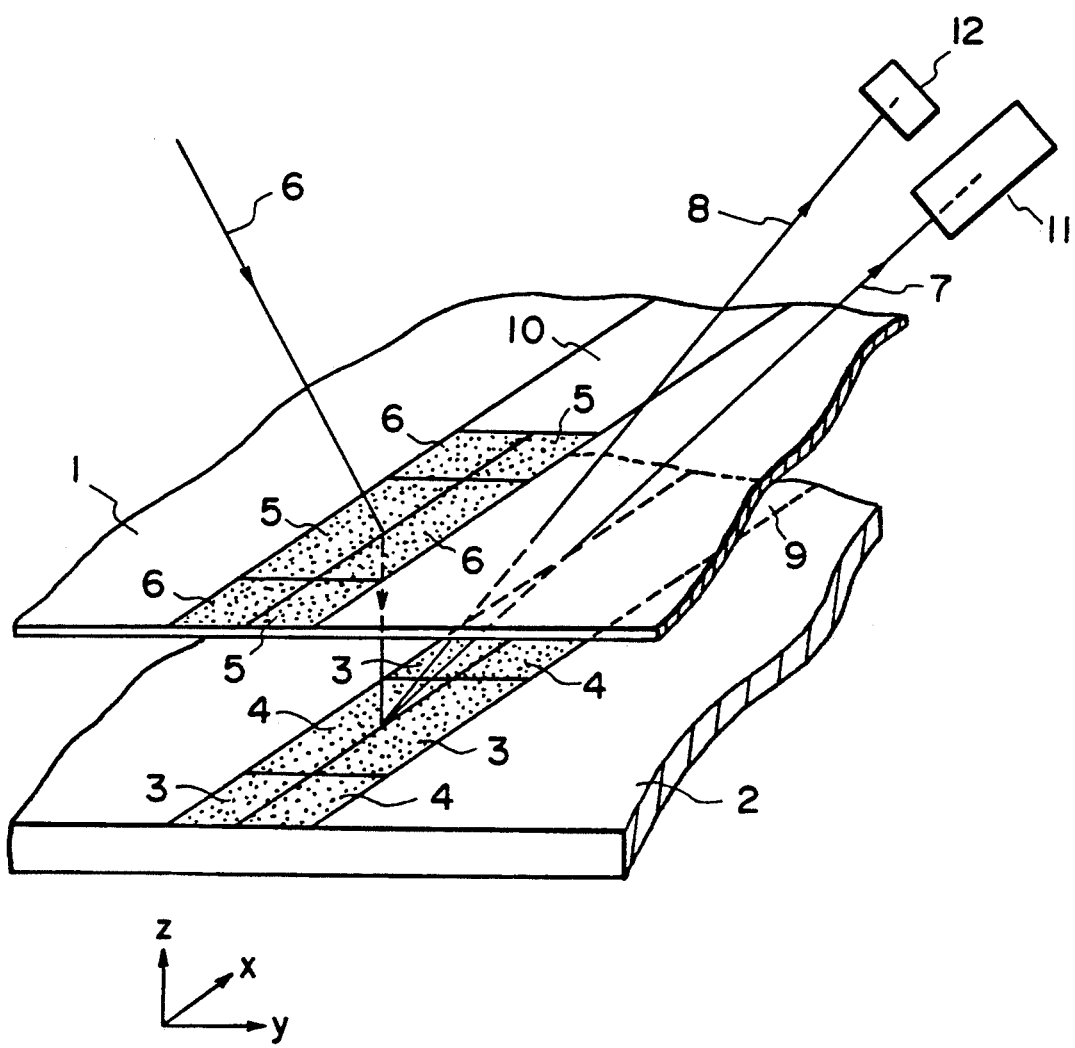
FIG. 20A is a schematic view showing a major portion of an eighth embodiment.
Figure 23A:
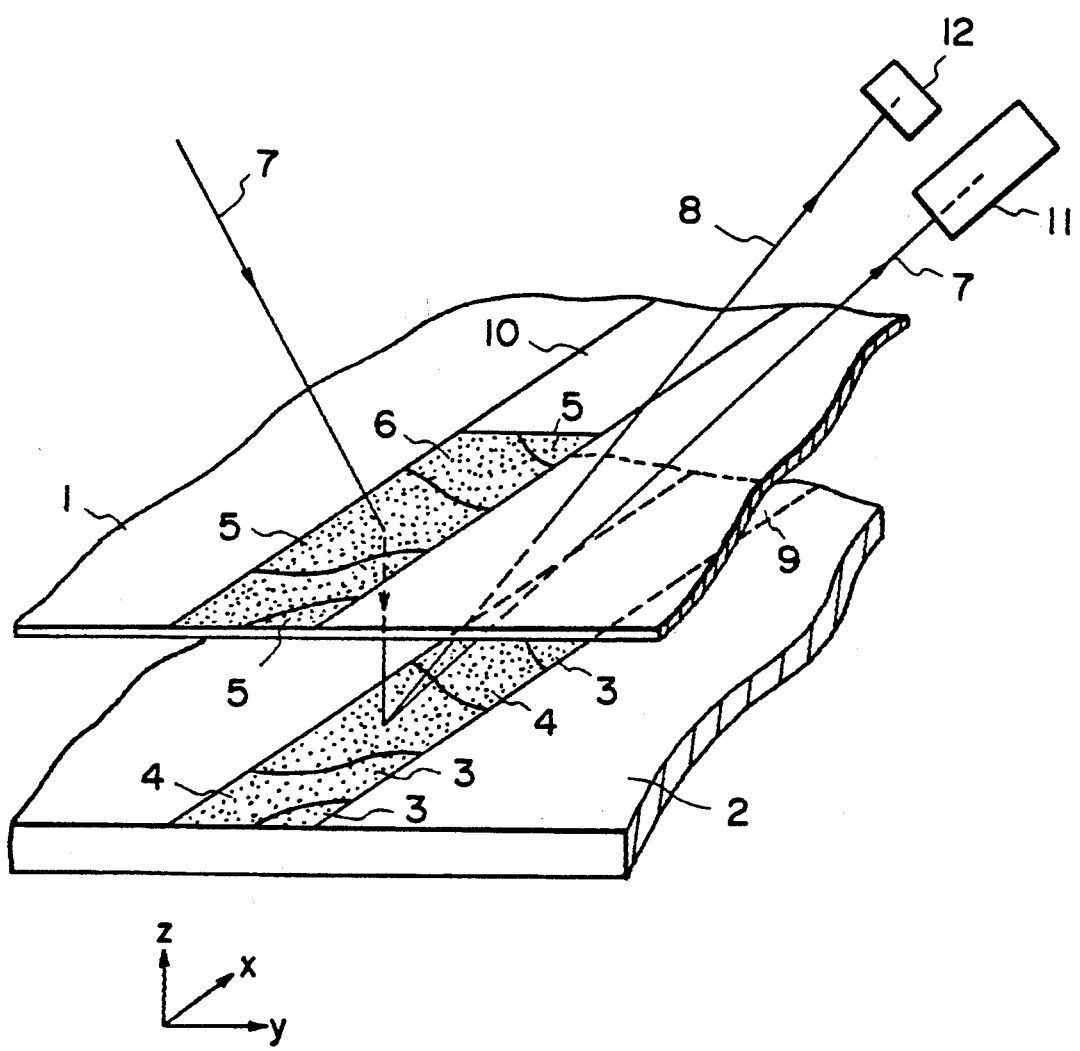
FIG. 23A is a schematic view showing a major portion of a ninth embodiment.

FIGS. 19A, 20A and 23A are schematic views showing optical arrangements of a seventh, eighth and ninth embodiments of the present invention. In these Figures, those elements corresponding to the elements shown in FIG. 12 are denoted by same reference numerals.

Figure 19B:
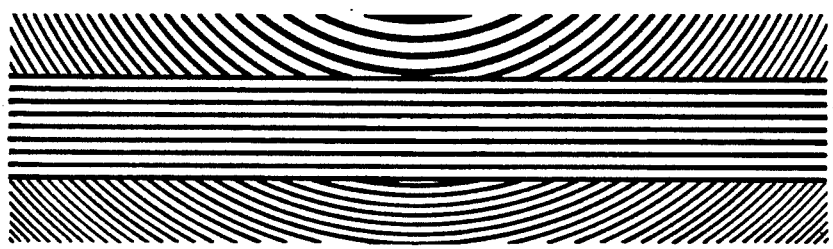
FIGS. 19B and 19C exemplify a mask mark pattern and a wafer mark pattern, usable in the FIG. 19A embodiment.
Figure 19C:
Figure 20B:
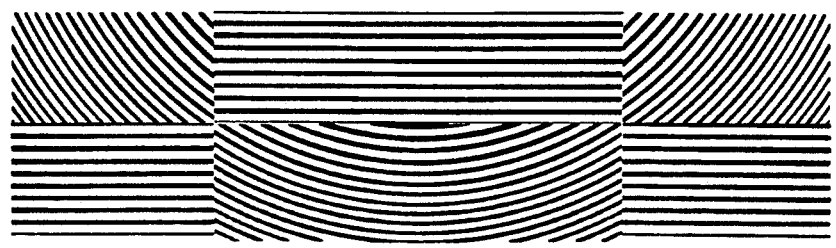
FIGS. 20B and 20C exemplify a mask mark pattern and a wafer mark pattern, usable in the FIG. 20A embodiment.
Figure 20C:
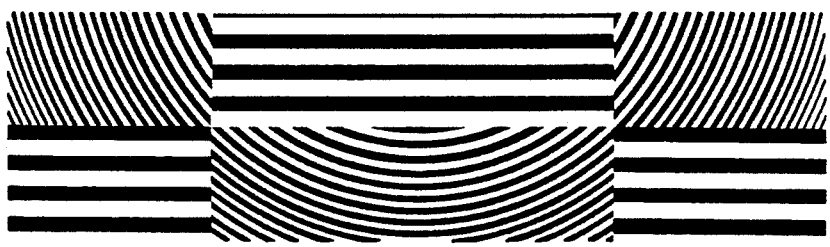
Figure 23B:
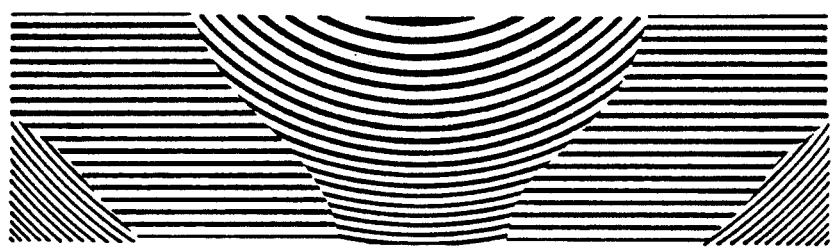
FIGS. 23B and 23C exemplify a mask mark pattern and a wafer mark pattern, usable in the FIG. 23A embodiment.
Figure 23C:
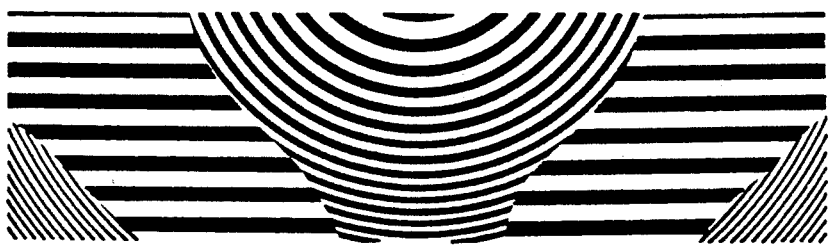

Each of FIGS. 19A, 20A and 23A is a perspective view. FIGS. 19B, 20B and 23B each shows a mark pattern provided on a mask. FIGS. 19C, 20C and 23C each shows a mark pattern provided on a wafer.

In the seventh, eighth and ninth embodiments, lights are incident on a first alignment mark 5 and a first reference mark 6 both of which are provided on a mask 1 surface. These lights are transmissively diffracted by the marks and impinge on a second alignment mark 3 and a second reference mark 4, respectively, both being provided on a wafer 2 surface. These lights are diffractively reflected and thereafter they are incident on sensors 11 and 12 (first and second detecting means). The described structure is the same as the sixth embodiment shown in FIG. 12.

The seventh, eighth and ninth embodiments differ from the sixth embodiment in the manner of dividing the mark pattern on the mask 1 surface and the mark pattern on the wafer 2 surface.

In the seventh embodiment shown in FIGS. 19A–19C, the alignment mark and the reference mark on the mask 1 surface and the wafer 2 surface each is divided in the widthwise direction (y direction) of a scribe line 9 or 10.

In the eighth embodiment shown in FIGS. 20A–20C, the dividing methods adopted in the embodiments shown in FIGS. 12 and 19A–19C are combined and each mark is divided to provide a mark region of diced pattern as a whole.

Figure 21A:
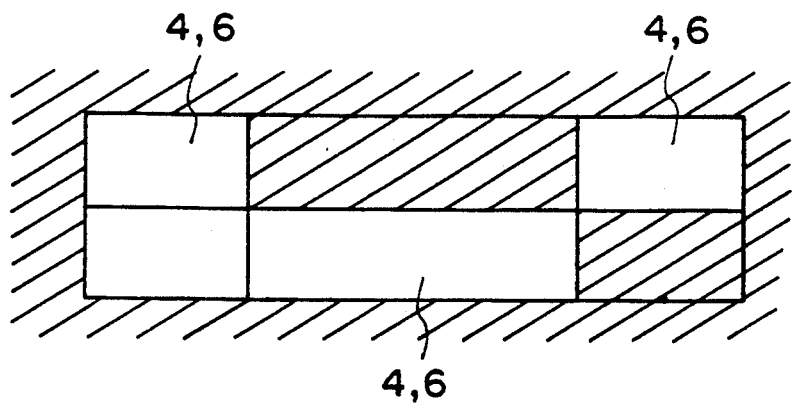
FIGS. 21A-21C are representations for explicating an example of an intensity distribution of a point image, in the FIG. 20A embodiment.
Figure 21B:
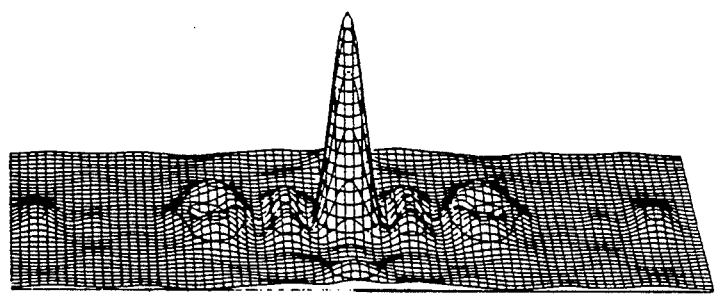
Figure 21C:
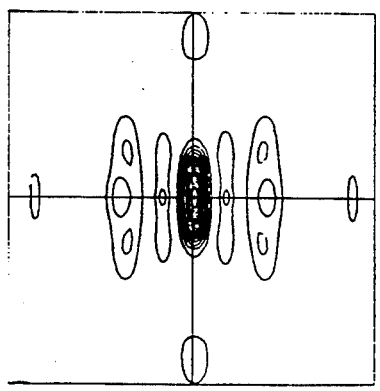

FIG. 21A shows areas for reference marks 4 and 6 in the divided regions, as defined when a mark region is divided to provide a diced pattern as the case of FIGS. 20A–20C. FIG. 21B is a birds-eye view of an intensity distribution of a point image formed by these reference marks. FIG. 21C is a contour map.

In the point image distribution such as shown in FIG. 21B, the center of gravity of light as a whole is substantially the same as that in the case of a rectangular aperture, and thus no error results.

FIGS. 22A-22E illustrates examples (A)-(E) in which the number of division and the manner of division of a mark region are variable within the scope of the present invention. In these examples, reference character A denotes a signal region for alignment and reference character R denotes a reference region for the reference light.

While in these embodiments the mark region is divided in the direction of a scribe line and in a direction perpendicular thereto, the mark region may of course be divided at a desired angle.

In the ninth embodiment shown in FIGS. 23A-23C, for the division of a mark region, the signal region and the reference region are divided into plural sections by curved lines.

In this embodiment, the number of division is increased with an increase in the number of zones or rings (lines) of a mark pattern, to thereby control the zone density of each divided section.

Figure 24:
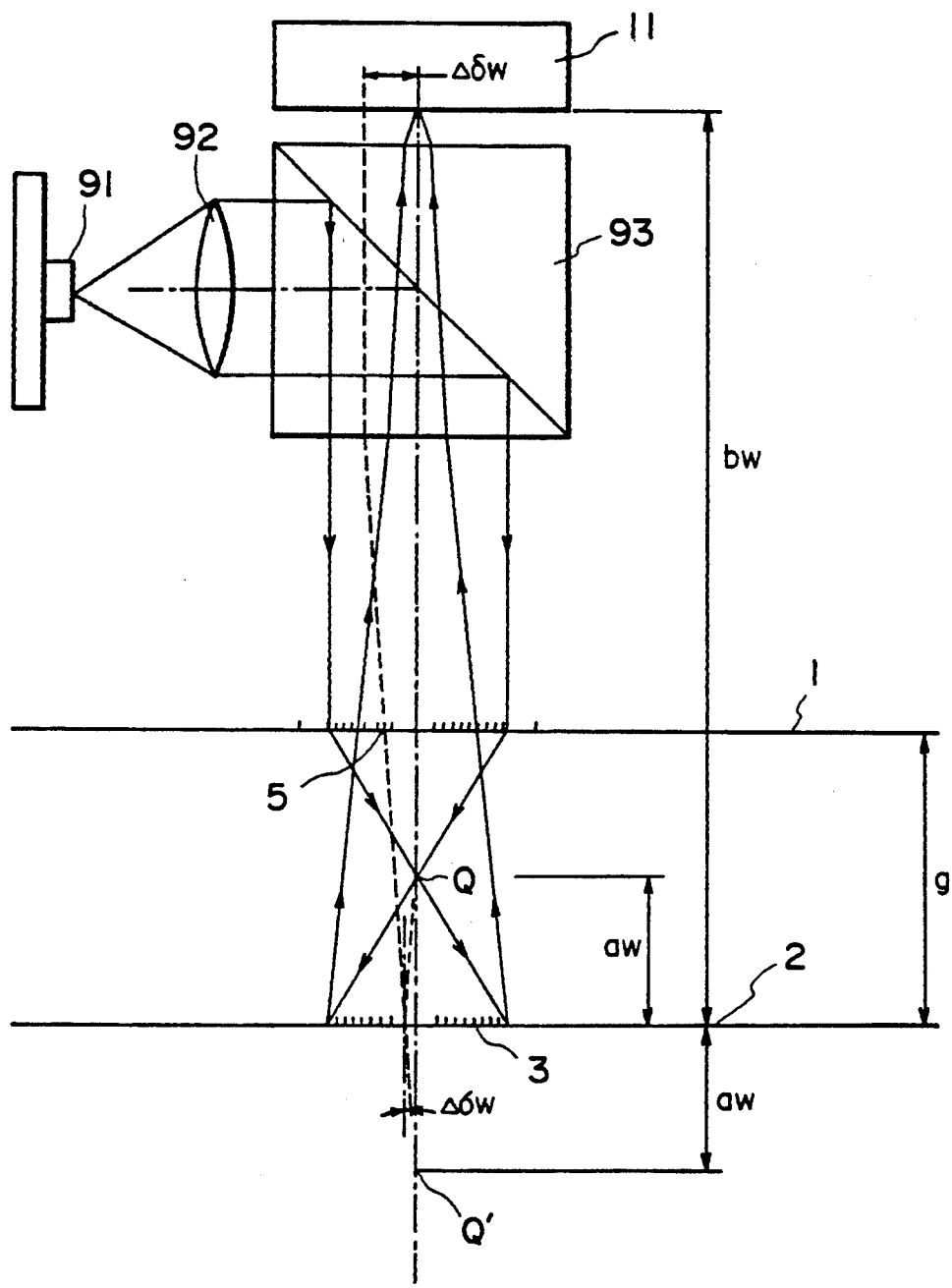
FIG. 24 is a schematic section showing a major portion of a tenth embodiment.

FIG. 24 is a schematic view of a tenth embodiment of the present invention. This embodiment is specifically concerned with an alignment system, usable in a semiconductor device manufacturing exposure apparatus of so-called "proximity type", for aligning a mask and a wafer. Particularly, only those portions of the apparatus related to an alignment light are illustrated and will be described below.

In FIG. 24, the same reference numerals are assigned to those elements corresponding to the elements shown in FIG. 12. In FIG. 24, a mask 1 and a wafer 2 correspond respectively to a first and second objects which are to be aligned relative to each other. A mask alignment pattern 5 provided on the mask 1 surface corresponds to a first physical optic element, while a wafer alignment pattern 3 provided on the wafer 2 surface corresponds to a reflection type second physical optic element.

In this example, light emanating from a light source 91 is collimated into a parallel light by means of a lens system 92, and the collimated light after passing a half mirror 93 illuminates the mask alignment pattern 5. The mask alignment pattern 5 is formed by a zone plate having a function for focusing the received light at a point Q which is in front of the wafer. The light focused at the point Q advances divergently and impinges on the wafer alignment pattern 3. The wafer alignment pattern 3 is formed by a reflection type zone plate by which the incident light is reflected and focused, after passing the mask and the half mirror 93, upon a detecting surface 11. Thus, an alignment signal is obtained. A reference signal by a reference light is obtainable in a similar manner.

The manner of disposition of the alignment marks and the reference marks in this embodiment may be the same as that in one of the sixth to ninth embodiments described hereinbefore. It is to be noted here that in the sixth to ninth embodiments the manner of disposing the alignment marks 3 and 5 and the reference marks 4 and 6 may be inverted.

In some embodiments to be described below, at least one of plural diffraction lights caused by an alignment mark is used as an alignment light while another diffraction light is used as a reference light and, by using these two lights, high-precision position detection free from the effect of inclination is ensured. More particularly, in these embodiments, a plurality of physical optic element patterns effective to produce diffraction lights of different emission angles are superposed one upon another to provide a single alignment mark.

Figure 25:
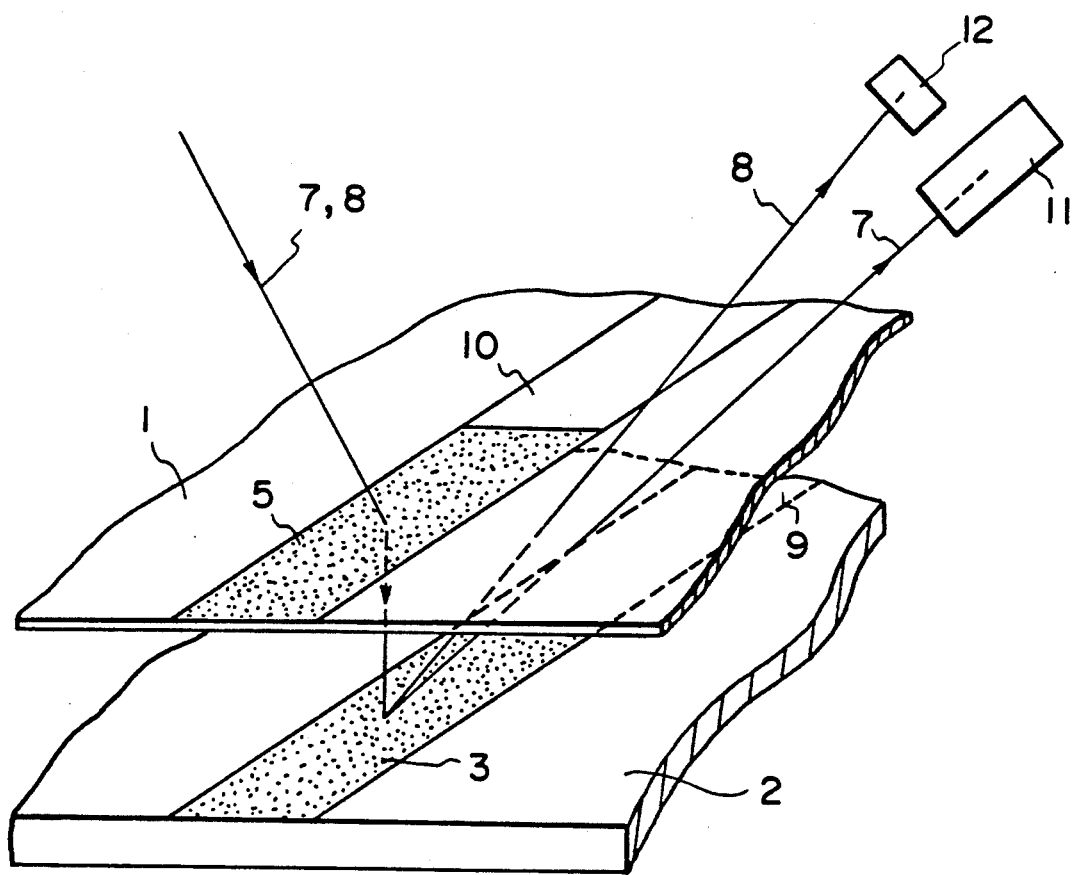
FIG. 25 is a sectional view showing a major portion of an eleventh embodiment.

FIG. 25 is a schematic view showing a major portion of an eleventh embodiment of the present invention.

In this embodiment, light is incident on a first alignment mark 5, provided on a mask 1 surface, at a predetermined angle. The incident light is transmissively diffracted whereby plural diffraction lights are produced. Of these diffraction lights, predetermined two diffraction lights (only their chief rays are illustrated and, therefore, they are superposed in the illustration) are then reflectively diffracted by a second alignment mark 3 provided on a wafer 2 surface, and they are incident on a sensor 11 surface and a sensor 12 surface, respectively. Each of the sensors 11 and 12 detects the position of the center of gravity of alignment light 7 or reference light 8 incident thereupon. By using output signals from the sensors 11 and 12, the mask 1 and the wafer 2 can be aligned with each other with respect to the direction of a scribe line 9 or 10 (i.e., x direction).

The first and second alignment marks 5 and 3 used in this embodiment will now be explained.

Each of the alignment marks 3 and 5 is provided by a plurality of Fresnel zone plates (or grating lenses) which are overlaid one upon another. Each zone plate has a predetermined focal length. Each mark has a size which is 180 microns in the scribe line direction and 50 microns in the widthwise direction (y direction) of the scribe line.

In this embodiment, the light 6 is incident on the mask 1 at an incidence angle of 17.5 degrees, with its projection upon the mask 1 surface being perpendicular to the scribe line direction (x direction).

The light 6 thus incident on the mask 1 with a predetermined angle is influenced by a diffracting action and a lens action of the grating lens 5, whereby it is transformed into a plurality of diffracted convergent or divergent lights which emanate from the mask 1 with the chief ray advancing at a predetermined angle with respect to the normal of the mask 1.

The plural diffraction lights having been transmissively diffracted by the first alignment mark 5, for example, an alignment light 7 and a reference light 8, are focused at points which are at distances 217 microns and 18.7 mm vertically below the wafer 2 surface. At this time, the mask 1 and the wafer 2 are spaced by an interval of 30 microns.

Of the plural diffraction lights transmissively diffracted by the alignment mark 5, the alignment light is influenced by a lens action of the second alignment mark 3 on the wafer 2 surface, and it is collected at a point on the surface of the sensor 11 (first detecting means). At this time, on the sensor 11 surface, the light is incident with the positional deviation between the alignment marks 5 and 3 (namely, the deviation between the optical axes thereof) being magnified. Thus, the position of the center of gravity of the incident light is shifted accordingly.

The present embodiment is so set that, when the mask 1 and the wafer 2 have no relative positional deviation (i.e. when the alignment marks 5 and 3 on the mask 1 and the wafer 2 just provide a coaxial system), the chief ray of the alignment light emitting from the wafer 2 has an angle of emission of 13 degrees, and the emitted light is focused on the sensor 11 surface which is disposed at a predetermined position, for example, at a height of 18.7 mm from the wafer 2 surface.

On the other hand, the reference light of the lights transmissively diffracted by the alignment mark 5 is simply deflected by the second alignment mark 3 on the wafer 2 surface and emanates therefrom with an angle of emission of 7 degrees, and finally it is focused on the surface of the sensor 12 (second detecting means).

At this time, the reference light is not influenced by a lens action of the second alignment mark 3. Therefore, even if the relative position of the mask 1 and the wafer 2 changes, the position of the center of gravity of the light incident on the sensor 12 surface is unchanged, constantly.

It is to be noted here that, in this embodiment, the optical arrangement may be modified so that only one diffraction light of a predetermined order, from the first alignment mark 5, is directed to the second alignment mark 3 and two diffraction lights, of plural diffraction lights caused thereby, are treated as an alignment light 7 and a reference light 8 and are directed to the sensors 11 and 12, respectively.

Figure 26:
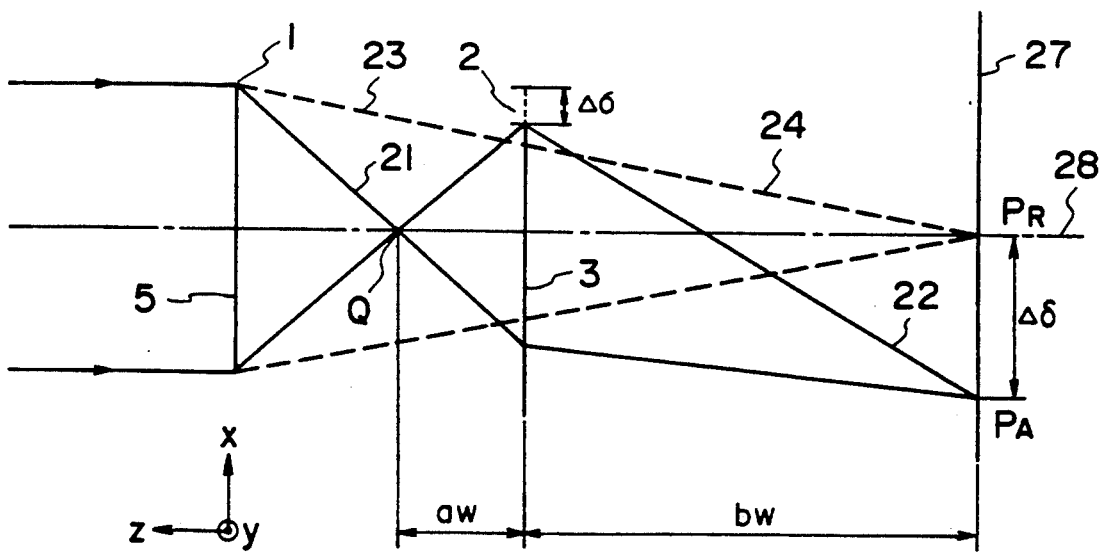
FIG. 26 is a principle view of an optical arrangement adopted in the eleventh embodiment.

FIG. 26 is a representation for explicating the fundamental principle of the optical arrangement adopted in the eleventh embodiment shown in FIG. 25.

This figure illustrates the manner of diffraction of light rays as viewed in the y direction, the illustration being made by depicting the Fresnel zone plate 3 of the wafer 2 as a transmissively diffracting element which is equivalent to a reflectively diffracting type. Actually, the lights as illustrated on the right side of the wafer 2, in this figure, emanate in the direction opposite to the illustrated, in regard to the z-direction component.

In FIG. 26, first and second alignment marks 5 and 3 such as zone plates, for example, are provided on first and second objects 1 and 2 with respect to which any relative positional deviation is to be evaluated. Light is projected upon the first alignment mark 5 and light 21 emanating therefrom impinges on the second alignment mark 3. Light 22 emanating from the second alignment mark 3 is converged upon a light detecting surface 27 of a detector which may be a position sensor, for example.

In the FIG. 26 example, there occurs upon the detecting surface 27 a deviation $\Delta\delta$ of the center of gravity of light, corresponding to the amount $\Delta\sigma$ of relative positional deviation of the first and second objects 1 and 2.

In the FIG. 26 example, the position on the detecting surface 27 of the center of gravity of light as depicted by broken lines 24 is used as a reference, and the deviation $\Delta\delta$ of the light depicted by solid lines 22, upon the detecting surface 27 is detected to thereby determine the relative positional deviation $\delta\sigma$ of the first and second objects 1 and 2.

Figure 27:
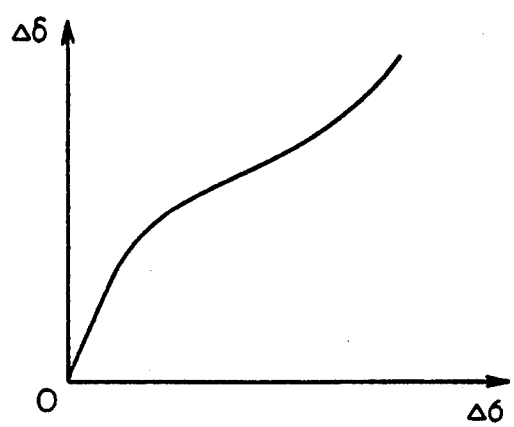
FIG. 27 is a graph showing the relationship between a positional deviation and a displacement of the center of gravity of light.

FIG. 27 illustrates the relationship between the relative positional deviation $\Delta\sigma$ of the first and second objects 1 and 2 and a deviation or displacement $\Delta\delta$ of the center of gravity of light upon the detecting surface 27.

In this embodiment of the present invention, the above-described fundamental principle is utilized to detect the relative position of a first and second objects.

Where the first alignment mark 5 is taken as a reference and when the second alignment mark 3 is deviated by an amount $\Delta\sigma$ in a direction parallel to the first alignment mark 5, then the deviation $\Delta\delta$ of the center of gravity of the light spot upon the detecting surface 27 can be given by the following equation:

$$\Delta\delta = \Delta\sigma \times (bw/aw + 1) \quad (5)$$

Namely, the deviation $\Delta\delta$ of the center of gravity is magnified at an enlarging magnification which is equal to "$bw/aw + 1$".

If, as an example, $aw = 0.5$ mm and $bw = 50$ mm, the deviation $\Delta\delta$ of the center of gravity is magnified by 101 (one hundred and one) times larger, in accordance with equation (5).

Figure 28:
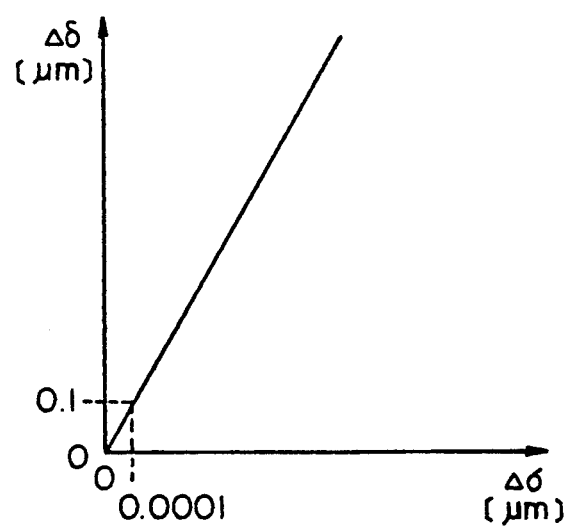
FIG. 28 is a graph showing the relationship between a positional deviation and a displacement of the center of gravity of light, in the FIG. 26 embodiment.

It will be readily understood from equation (5) that the deviation $\Delta\delta$ of the center of gravity and the positional deviation $\Delta\sigma$ at that time are in a proportional relationship such as depicted in FIG. 28. If the detector 8 has a resolution of 0.1 micron a position resolution of an order of 0.001 micron is obtainable with regard to the positional deviation $\Delta\sigma$.

By moving the second object on the basis of the thus determined positional deviation $\Delta\sigma$, the first and second object can be aligned with high precision.

An alignment process to be adopted in this embodiment of the present invention may be such as follows:

In a first example, the relationship of a deviation signal $\Delta\delta s$ representing the deviation of center of gravity of light on the detecting surface 27 of the detector, with respect to the positional deviation $\Delta\sigma$ between two objects, is predetected and a curve showing that relationship is determined preparatorily. Then, from the value of the deviation signal $\Delta\delta s$, the positional deviation $\Delta\sigma$ between these objects is detected and, thereafter, the first or second object is displaced by an amount corresponding to the detected positional deviation $\Delta\sigma$.

In a second example, from a deviation signal $\Delta\delta s$ representing the deviation of center of gravity and outputted from the detector, the direction that cancels the positional deviation $\Delta\sigma$ is detected. In this direction, the first or second object is displaced, and the above-described process is repeated until the positional deviation $\Delta\sigma$ comes into a tolerable range.

First and second alignment marks 5 and 3 (grating lens) usable in this embodiment can be prepared, for example, in the following manner.

First, the mark 5 for a mask are designed so that, when parallel light of a predetermined beam diameter is incident thereupon at a predetermined angle, the light is collected at a predetermined position. Usually, a pattern of a grating lens may be that of an interference fringe which can be formed on a lens surface in the case where mutually coherent light sources are disposed at a light source position (object point) and the position of an image point. Assume, a coordinate system is defined on a mask 1 surface, such as shown in FIG. 25. The origin is at the middle of the width of the scribe line, the x axis is in the direction of the scribe line, the y axis is in the widthwise direction and the z axis is in the direction of the normal of the mask 1 surface. Equations regarding a group of curved lines of such a grating lens by which a parallel light, having been incident thereon with an angle $\alpha$ with respect to the normal of the mask surface 1 and with the projection being perpendicular to the scribe line direction, is imaged after being transmissively diffracted by the mark of the mask, at the position of a converging point $(x_1, y_1, z_1)$, can be expressed in the following manner, with the position of each grating line being denoted by x and y:

$$y \sin \alpha + P1(x,y) - P2 = m\lambda/2 \quad (1)$$

$$P1(x,y) = \sqrt{(x - x_1)^2 + (y - y_1)^2 + z_1^2}$$

$$P_2 = \sqrt{x_1^2 + y_1^2 + z_1^2}$$

wherein $\lambda$ is the wavelength of the alignment light and m is an integral number.

Assuming now that a chief ray is such a ray being incident with an angle $\alpha$ and passing through the origin on the mask surface 1 and then impinging upon a convergent point $(x_1, y_1, z_1)$, then the right side of equation (1) shows that, depending on the value of m, the optical path length is "$\lambda \times m/2$" times longer (shorter) than that for the chief ray; and the left side denotes the difference in length, with respect to the optical path of the chief ray, of the optical path of such a ray that passes a point $(x, y, 0)$ on the mask and then impinges on the point $(x_1, y_1, z_1)$.

On the other hand, a grating lens 3 to be provided on a wafer 2 is designed so as to collect, at a predetermined position (on the sensor surface), a spherical wave emanating from a predetermined point light source. Where the gap between a mask 1 and a wafer 2 at the time of exposure (pattern transfer) is denoted by g, then such a point light source can be expressed by:

$$(x_1, y_1, z_1-g)$$

wherein y is a variable.

Assuming now that the mask 1 and the wafer 2 are to be aligned with respect to the x-axis or y-axis direction and that, upon completion of alignment, the alignment light is collected at a point $(x_2, y_2, z_2)$ on the sensor surface, then equations regarding a group of curved lines of a grating lens of a wafer can be expressed, in the coordinate system defined hereinbefore, as follows:

$$\sqrt{(x-x_2)^2 + (y-y_2)^2 + z_2^2} - \sqrt{(x-x_1)^2 + (y-y_1)^2 + (z_1-g)^2} = \sqrt{x_2^2 + y_2^2 + z_2^2} - \sqrt{x_1^2 + y_1^2 + z_1^2} \quad (2)$$

Equation (2) is such an equation that satisfies a condition under which, assuming that the wafer surface is "$z = -g$" and that the chief ray is such a ray that passes the origin on the mask surface and a point $(0, 0, -g)$ on the wafer surface and additionally a point $(x_2, y_2, z_2)$ on the sensor surface, the difference in length between the path of the chief ray and the path of a ray passing the grating lens $(x, y, -g)$ on the wafer surface becomes equal to a multiple, by an integral number, of a half wavelength.

Those patterns for detecting alignment and for taking a reference, as determined in the described manner, are superposed one upon another to provide one alignment mark.

FIGS. 29A1-29A3 and 29B1-29B3 illustrate patterns of a first alignment mark to be provided on a mask and a second alignment mark to be provided on a wafer, respectively, which are usable in this embodiment.

In these figures, patterns (A1) and (B1) are alignment patterns for a mask and a wafer, respectively. Patterns (A2) and (B2) are reference patterns for the mask and the wafer. Pattern (A3) is such a pattern as formed by superposing the patterns (A1) and (A2) and this provides a first alignment mark. Pattern (B3) is such a pattern as formed by superposing the patterns (B1) and (B2) and it provides a second alignment mark.

Generally, a zone plate (grating lens) for a mask can be formed as an amplitude type grating element of "0 and 1" in which two regions, a region (transparent portion) that can transmit light and a region (light blocking portion) which does not transmit light, are formed alternately. On the other hand, a zone plate for a wafer can be formed as a phase grating pattern having a rectangular section, for example. The fact that, in equations (1) and (2), each ring or line of a grating is defined at a position which corresponds to a multiple, by an integral number, of a half wavelength with regard to the chief ray, means that the linewidth ratio of the transparent portion and the light blocking portion is 1:1 in the case of the grating lens on a mask 1, and that the line and space ratio of rectangular grating is 1:1 in the case of the grating lens on the wafer 2.

As a specific example, a grating lens on a mask 1 was formed by transferring, onto an organic thin film of polyimide, a grating lens pattern of a reticle prepared by use of electron beam exposure technique.

On the other hand, a mark on a wafer 1 was formed by preparing on a mask a pattern to be printed on a wafer and then by transferring the pattern by use of a lithographic process.

A description will now be provided of the relationship between a signal light (alignment light) and a reference light to be incident on a sensor (detecting means) which may comprise an accumulation type one-dimensional CCD sensor, for example.

In this embodiment, the reference light and the signal light (for alignment) emanate from the wafer surface at angles 7 degrees and 13 degrees, respectively, with respect to the normal of the wafer surface. The spatial disposition of the sensors 11 and 12 is so set that, upon completion of alignment, a light is incident on a corresponding sensor substantially at the middle position.

The sensors 11 and 12 have a spacing of 1.965 mm between their centers, and are mounted to a common base plate, made of Si, at a precision of about 0.1 micron. The Si base plate on which the sensors 11 and 12 are mounted, is disposed so that its normal extends substantially in parallel to a bisector for the angle of emission of the alignment light and the angle of emission of the reference light, when the mask and the wafer have no relative positional deviation.

As regards the size of the sensors 11 and 12, the sensor 11 for the signal light is 1 mm in width and 6 mm in length, whereas the sensor 12 for the reference light is 1 mm in width and 1 mm in length. Each picture element (pixel) has a size of $25 \times 500$ microns.

Each sensor is operable to measure the position of the center of gravity of incident light, and output signals from the sensor is processed so as to be standardized with regard to the total light quantity over the whole light-receiving region. By this, even if the output power of a light source for alignment changes slightly, the measured value as outputted from the sensor system exactly represents the position of the center of gravity. Although the resolution of the sensor, for the position of the center of gravity, may depend on the power of the alignment light, it was 0.2 micron where a semiconductor laser having a power of 50 mW and a wavelength 0.83 micron was used, by way of example.

In a design example for a grating lens of a mask and a grating lens of a wafer, to be used in the present embodiment, the center of gravity of the signal light displaces along the sensor surface, with the positional deviation between the mask and the wafer being magnified by ×100. Therefore, a positional deviation of 0.01 micron between the mask and the wafer results in an effective displacement of the center of gravity on the sensor surface through 1 micron. The sensor system can measure such a displacement with a resolution of 0.2 micron.

If, in this embodiment, the wafer 2 surface is inclined within an x-z plane by an amount 1 mrad, there occurs on the sensor 11 a displacement of about 37.4 microns of the center of gravity of the signal light. On the other hand, there occurs a similar angular shift of the reference light 8. Therefore, on the sensor 12, there occurs displacement of the center of gravity of the reference light as exactly the same as the signal light. Thus, by processing signals from the sensors so as to detect and output a difference between those signals representing the positions of the effective centers of the gravities, the output signal from the sensor system does not change even if the wafer surface is inclined within the x-z plane.

Also, even if the wafer is inclined within a y-z plane, both the signal light and the reference light causes shift of the center of gravity. Accordingly, a minute inclination of an order of 1 mrad does not result in an effective alignment error.

Further, even when an alignment head containing therein an alignment light source, a light projecting lens system and sensors, is displaces relative to the mask-wafer system, particularly for the displacement in the x direction, the alignment error can be avoided in principle by projecting light substantially uniformly upon a region including a portion around the mark area.

Similarly, by arranging the light projecting system so that a parallel light impinges on the mask, any variation between the mask surface and the head, in the z direction, can be treated as an equivalence of the displacement in the x direction as described, and therefore, an alignment error can be avoided in principle.

Further, any displacement in the y-axis direction results in an integral shifts of the signal light and the reference light and, therefore, does not cause an alignment error.

Next, as regards the effect of any inclination of the mark base plate, since in the eleventh embodiment the marks for the signal light and the reference light are set exactly in the same region, average inclination of the mark base plate is the same. As a result, the inclination does not have an influence.

Figure 30A:
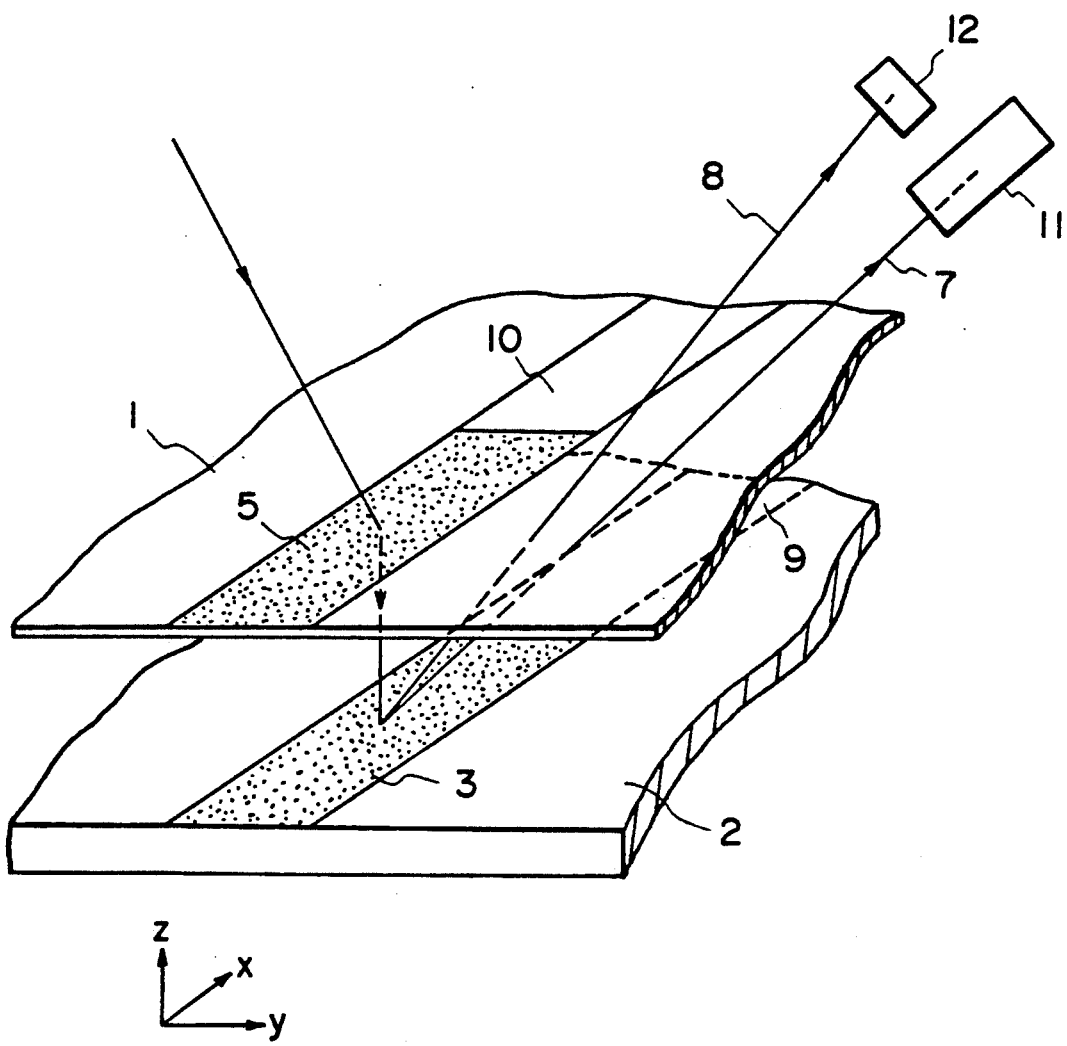
FIG. 30A is a schematic view showing a major portion of a twelfth embodiment.
Figure 31A:
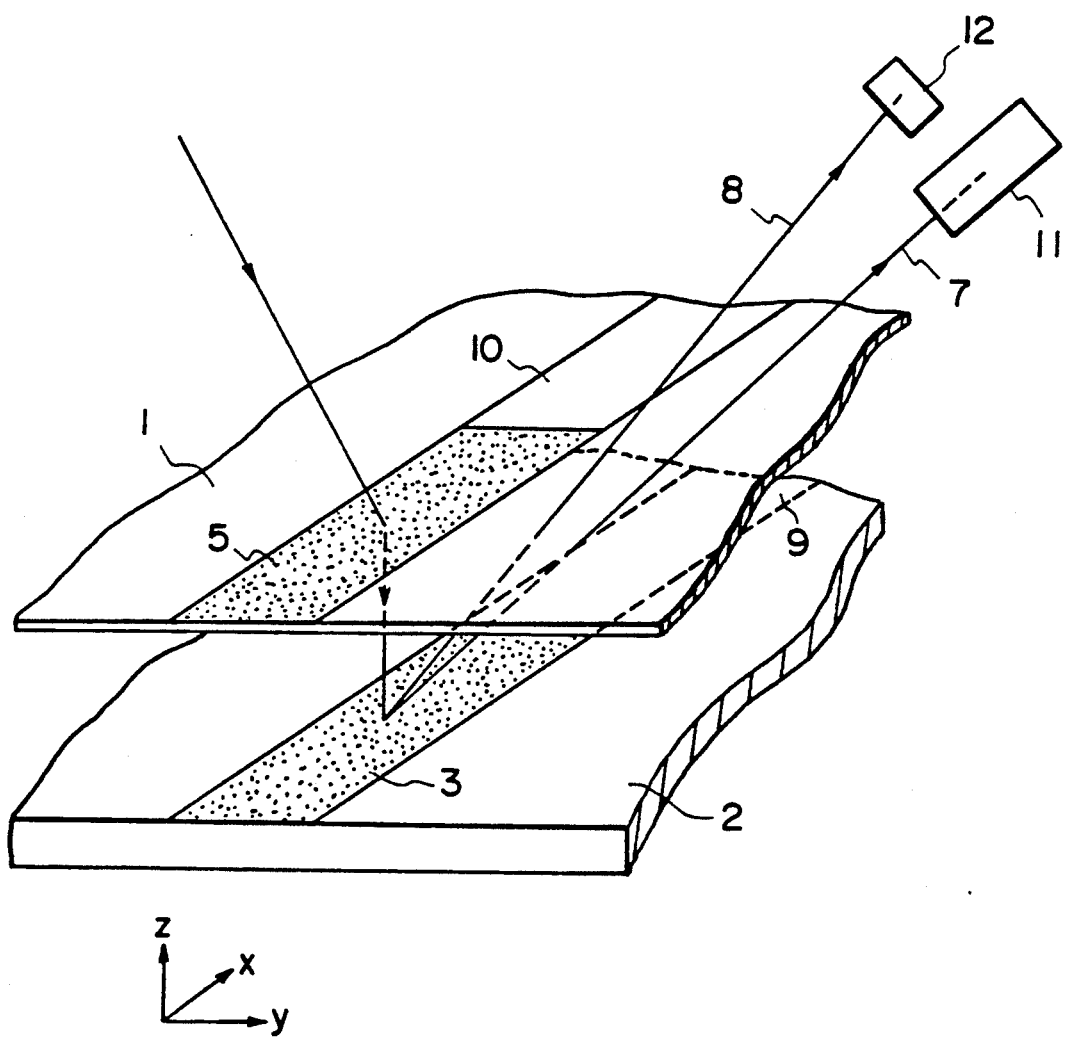
FIG. 31A is a schematic view showing a major portion of a thirteenth embodiment.

FIGS. 30A and 31A are schematic views of twelfth and thirteenth embodiments of the present invention. In these embodiments, light is incident upon a first alignment mark 5 on a mask 1 surface and is diffracted thereby. Then, the light is incident upon a second alignment mark 3 on a wafer 2 surface, and an alignment light 7 and a reference light 8 emanating from the second alignment mark 3 are received by sensors 11 and 12, respectively. This is the same as that in the eleventh embodiment shown in FIG. 25.

In the twelfth embodiment shown in FIG. 30A, the linewidth ratio of a light blocking portion and a light transmitting portion of each grating constituting the first or second alignment mark 5 or 3, is set to 1:2 and thus the light transmitting portion is enlarged.

Figure 30B:
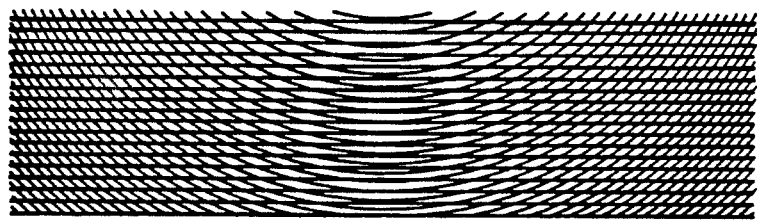
FIGS. 30B and 30C exemplify a mask mark pattern and a wafer mark pattern, respectively, usable in the FIG. 30A embodiment.
Figure 30C:
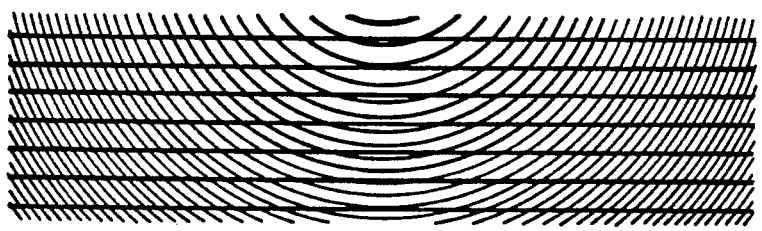

FIG. 30B illustrates a pattern for a first alignment mark to be provided on a mask, while FIG. 30C illustrates a pattern for a second alignment mark to be provided on a wafer.

In the thirteenth embodiment shown in FIG. 31A, gratings constituting the first and second alignment marks 5 and 3 are different in the ratio of the light blocking portion and the light transmitting portion. In the first alignment mark 5, the linewidth ratio of the light blocking portion and the light transmitting portion is 1:1, whereas in the second alignment mark 3 the linewidth ratio of the light blocking portion and the light transmitting portion is 1:2.

Figure 31B:
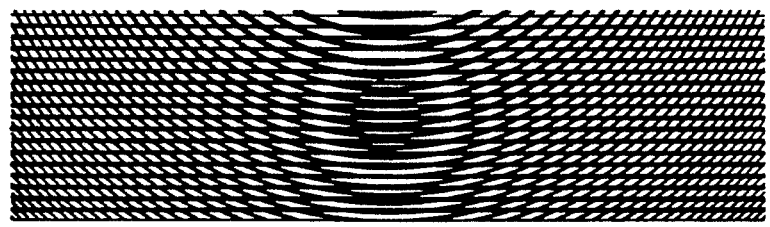
FIGS. 31B and 31C exemplify a mask mark pattern and a wafer mark pattern, respectively, usable in the FIG. 31A embodiment.
Figure 31C:
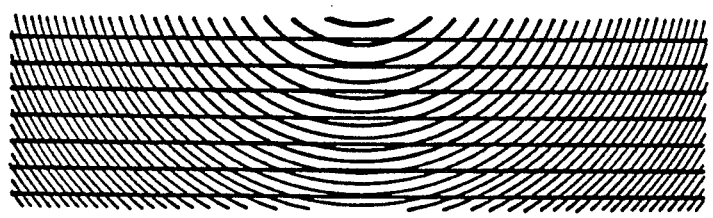

FIG. 31B illustrates a pattern for a first alignment mark, while 31C illustrates a pattern for a second alignment mark to be provided on a wafer.

Figure 32:
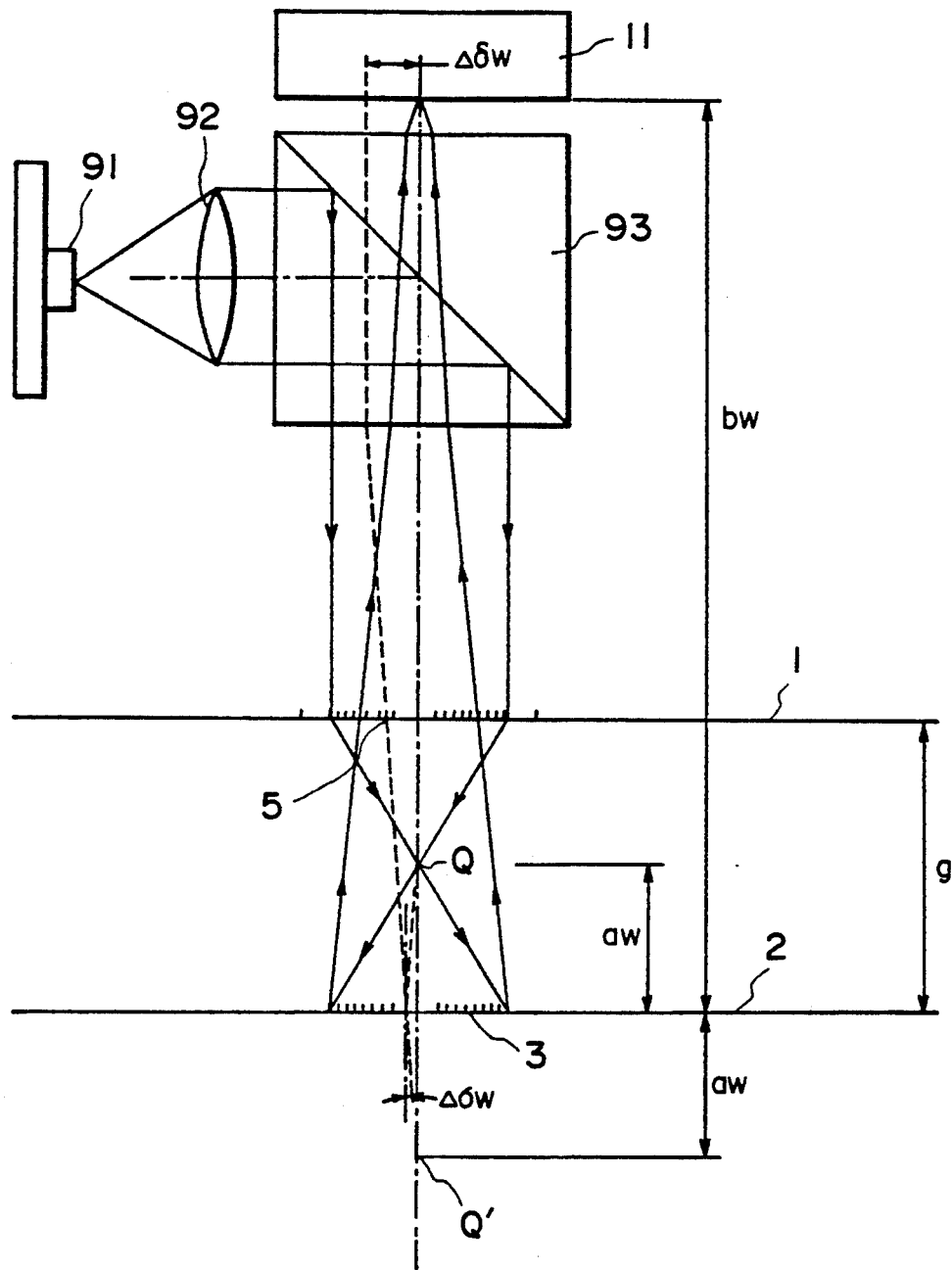
FIG. 32 is a schematic section showing a major portion of a fourteenth embodiment.

FIG. 32 is a schematic view of a fourteenth embodiment of the present invention. This embodiment is specifically concerned with an alignment system, usable in a semiconductor device manufacturing exposure apparatus of so-called "proximity type", for aligning a mask and a wafer. Particularly, only those portions of the apparatus related to an alignment light are illustrated and will be described below.

In FIG. 32, the same reference numerals are assigned to those elements corresponding to the elements shown in FIG. 25. In FIG. 32, a mask 1 and a wafer 2 correspond respectively to a first and second objects which are to be aligned relatively to each other. A mask alignment pattern 5 provided on the mask 1 surface corresponds to a first physical optic element, while a wafer alignment pattern 3 provided on the wafer 2 surface corresponds to a reflection type second physical optic element.

In this example, light emanating from a light source 91 is collimated into parallel light by means of a lens system 92, and the collimated light after passing a half mirror 93 illuminates the mask alignment pattern 5. The mask alignment pattern 5 is formed by a zone plate having a function for focusing the received light at a point Q which is in front of the wafer. The light focused at the point Q advances divergently and impinges on the wafer alignment pattern 3. The wafer alignment pattern 3 is formed by a reflection type zone plate by which the incident light is reflected and focused, after passing the mask and the half mirror 93, upon a detecting surface 11. Thus, an alignment signal is obtained. A reference signal by a reference light is obtainable in a similar manner.

In this embodiment, each alignment mark pattern may be superposed upon a reference mark pattern, as in the cases of the eleventh to thirteenth embodiments described hereinbefore.

In some embodiments to be described below, a light regularly or specularly reflected by a wafer is used as a reference light to ensure high-precision position detection free from any effect of inclination.

Figure 33:
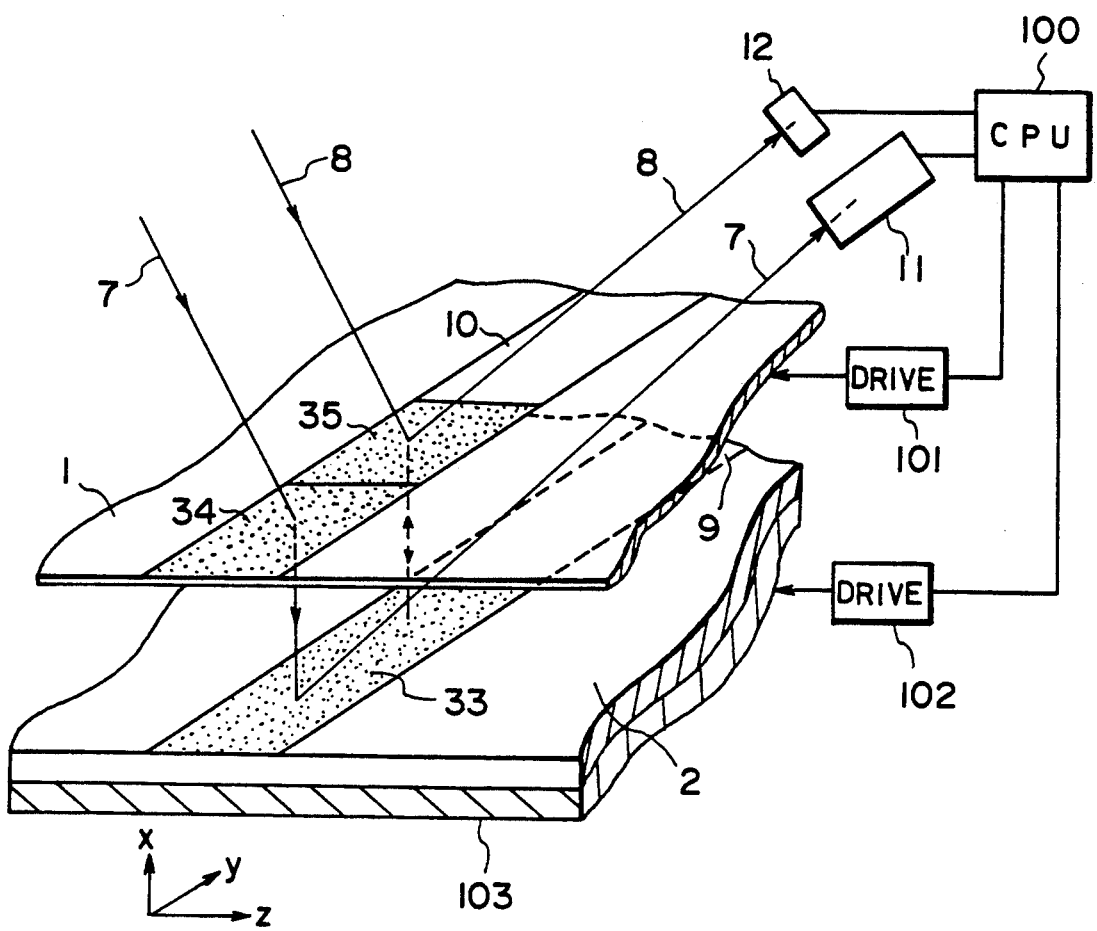
FIG. 33 is a schematic view showing a major portion of a fifteenth embodiment.

FIG. 33 is a schematic view showing a major portion of a fifteenth embodiment of the present invention.

In this example, first and second alignment marks 34 and 33 are provided on a mask 1 surface and a wafer 2 surface, respectively. First reference mark 35 is juxtaposed to the first alignment mark 34 on the mask 1 surface. The first and second alignment marks 34 and 33 and the first reference mark 35 each is formed by a grating lens such as a Fresnel zone plate, for example, and is provided on scribe lines 9 and 10 on the mask 1 surface and the wafer 2 surface, respectively. Reference numeral 7 denotes an alignment light (signal light), and reference numeral 8 denotes a reference light. These lights 7 and 8 are emitted by a light source disposed within an alignment head, not shown, and each light is collimated into a parallel light of a predetermined beam diameter. Denoted at 100 is a central processing unit (CPU); denoted at 101, a mask driving mechanism; denoted at 102, a wafer stage driving mechanism; and denoted at 103, a wafer stage. Similar mask driving mechanism, wafer stage driving mechanism and wafer stage may be provided in other embodiments having been described hereinbefore or to be described later.

In this embodiment, the alignment light 7 and the reference light 8 are incident on the first alignment mark 34 and the first reference mark 35, respectively, each at a predetermined angle of incidence, and they are transmissively diffracted by the marks. Of the two lights, the alignment light 7 is reflectively diffracted by the second alignment mark 33 on the wafer 2 surface and then is received by a sensor 11.

On the other hand, the reference light 8 is simply reflected (i.e. zero-th order reflection) by the second alignment mark 33 and goes along its oncoming path and impinges on the first reference mark 35 by which it is diffracted. Thereafter, it is received by a sensor 12.

Each of the sensors 11 and 12 detects the position of the center of gravity of the alignment light or reference light incident thereupon. By using output signals from the sensors 11 and 12, the mask 1 and the wafer 2 can be aligned with each other with respect to the direction (x direction) of a scribe line 9 or 10.

A description will now be provided of the first and second alignment marks 34 and 33 and the first reference mark 35 used in this embodiment.

The alignment marks 33 and 35 and the reference mark 35 are provided by Fresnel zone plates (or grating lenses) having different focal lengths. Each of the first alignment mark 34 and the first reference mark 35 has a size of 140 microns in the lengthwise direction of the scribe line and 50 microns in the widthwise direction (y direction) of the scribe line.

The second alignment mark 33 has a size of 280 microns in the scribe line direction and 50 microns in the widthwise direction (y direction) of the scribe line.

In this embodiment, both the alignment light 7 and the reference light 8 are incident on the mask 1 at an angle of incidence of 10 degrees, with the projection upon the mask 1 surface being perpendicular to the scribe line direction (x direction).

The alignment light 7 and the reference light 8 incident on the mask 1 with a predetermined angle are influenced by the lens functions of the grating lenses 34 and 35, respectively, each being transformed into a convergent or divergent light which is emitted from the mask 1 so that its chief ray has a predetermined angle with respect to the normal of the mask 1.

The alignment light 7 and the reference light 8 having been transmissively diffracted by the first alignment mark 34 and the first reference mark 35, respectively, are collected at points on the wafer 2 surface which are at distances of 238.0 microns and 20.107 microns vertically below these marks. The alignment mark 34 and the reference mark 36, in this case, have focal length of 268 microns and 20.137 microns. Also, the mask 1 and the wafer 2 are spaced by a distance 30 microns.

The light transmissively diffracted by the alignment mark 34 is influenced by a concave or convex lens function of the second alignment mark 33 on the wafer 2 surface, and is collected at a point on the sensor 11 surface. On this sensor 11 surface, at this time, the light is incident with any relative positional deviation (i.e. any misalignment of the axes) of the alignment marks 34 and 33 being magnified, with a result of corresponding shift of the position of the center of gravity of the incident light, which can be detected by the sensor 11.

The present embodiment is so set that, when the mask 1 and the wafer 2 have no relative positional deviation (i.e. when the alignment marks 34 and 33 on the mask 1 and the wafer 2 just provide a coaxial system), the chief ray of the alignment light emitting from the wafer 2 has an angle of emission of 5 degrees, and the projection of the emitted light on the wafer 2 surface extends perpendicularly to the widthwise direction (y direction) of the scribe line and, additionally, the emitted light is focused on the sensor 11 surface which is disposed at a predetermined position, for example, at a height of 20 mm from the wafer 2 surface.

The enlarging magnification, enlarging the positional deviation, is determined by the power arrangement of the lens functions of the first and second alignment marks 34 and 33 provided on the mask 1 surface and the wafer 2 surface, respectively.

Of the lights caused by the transmissive diffraction by the first reference mark 35, such a component having its chief ray incident perpendicularly upon the wafer 2 surface and specularly reflected (zero-th order reflection) thereby, is again perpendicularly incident on the first reference mark 35 on the mask 1 surface. By this first reference mark 35, it is diffracted again and, of the lights of different orders passing therethrough, a zero-th order light emanates therefrom in the direction of the normal of the mask 1 surface. The chief ray of the first-order diffraction light emanates along the same path of the incident light but in an opposite direction. The second order diffraction light is incident upon a point on the sensor 12 surface, as a reference light 8. Various elements of the present embodiment are set to provide an optical action described above. The separation of the reference light 8 and the signal light 7 on the sensor surface is assured by defining the difference, between these lights, in the angle of emission with respect to the normal of the mask surface.

In this embodiment, as described, the reference light 8 is simply reflected by the wafer 2 surface, and a zero-th order reflection light not having been influenced by a lens action is used for the measurement of any error in the positional deviation measurement resulting from any inclination of a wafer surface, variation in a pickup system or otherwise.

The chief ray of the reference light 8 emanates from the mask 1 surface at an angle of emission of 8 degrees, with its projection being perpendicular to the widthwise direction of the scribe line.

As for the reference light coming from the first reference mark 35, at this time, even if the relative position of the mask 1 and the wafer 2 changes, the position of the center of gravity of light incident on the sensor 12 surface is unchanged, constantly.

In this embodiment, as described, the grating lens for the first reference mark 35 on the mask 1 surface has a relatively long focal length, from the passage of the reference light through the mask 1 surface to the impingement of the same upon the sensor 12 surface after being reflected by the wafer 2 surface.

In this embodiment, as the reference light 8, such a light having been reflected by the wafer 2 surface and having been diffracted, by negative second order diffraction, by the first reference mark 35 on the mask 1 surface is used; whereas as the signal light 7, such a light having been reflectively diffracted, by negative first order diffraction, by the second alignment mark 33 on the wafer 2 surface. However, for these lights, positive second order diffraction light and positive first order diffraction light may be used (those lights emanating toward the light entrance side may be used).

Further, the diffraction order is not limited to the second order and the first order. Other orders except the zero-th order may be used. In that case, the magnification sensitivity of the signal light will be changed accordingly.

The basic algorithm for the alignment of a mask 1 and a wafer 2 (detection and control of lateral displacement) according to this embodiment, will be such as below.

(1) First a light intensity distribution of a positional deviation signal light on the sensor 11 surface is measured. Thereafter, the position $X_S$ of the center of gravity, as defined in the foregoing is detected.

(2) At this time, from the light intensity distribution of the reference light on the sensor 12, the position $X_R$ of the center of gravity of the reference light is detected.

(3) Then, the difference $\Delta\delta_S$ between $X_S$ and $X_R$ is determined and, from the magnification as determined by equation (1), relative positional deviation $\Delta\sigma_1$ between the mask 1 and the wafer 2 is detected.

(4) By using a wafer stage driving mechanism 102, the wafer stage 103 is moved to move the mask 1 or the wafer 2 relatively to the other by an amount corresponding to the relative positional deviation $\Delta\sigma_1$, to thereby correct the positional deviation.

(5) The steps (1)–(3) are repeated to discriminate whether a relative positional deviation $\Delta\sigma_2$ between the mask 1 and the wafer 2 is within the range of a tolerance "$\epsilon_1-\epsilon_2$".

(6) The steps (1)–(5) are repeated, if necessary, until the deviation $\Delta\sigma_2$ comes into the range of tolerance.

Figure 34:
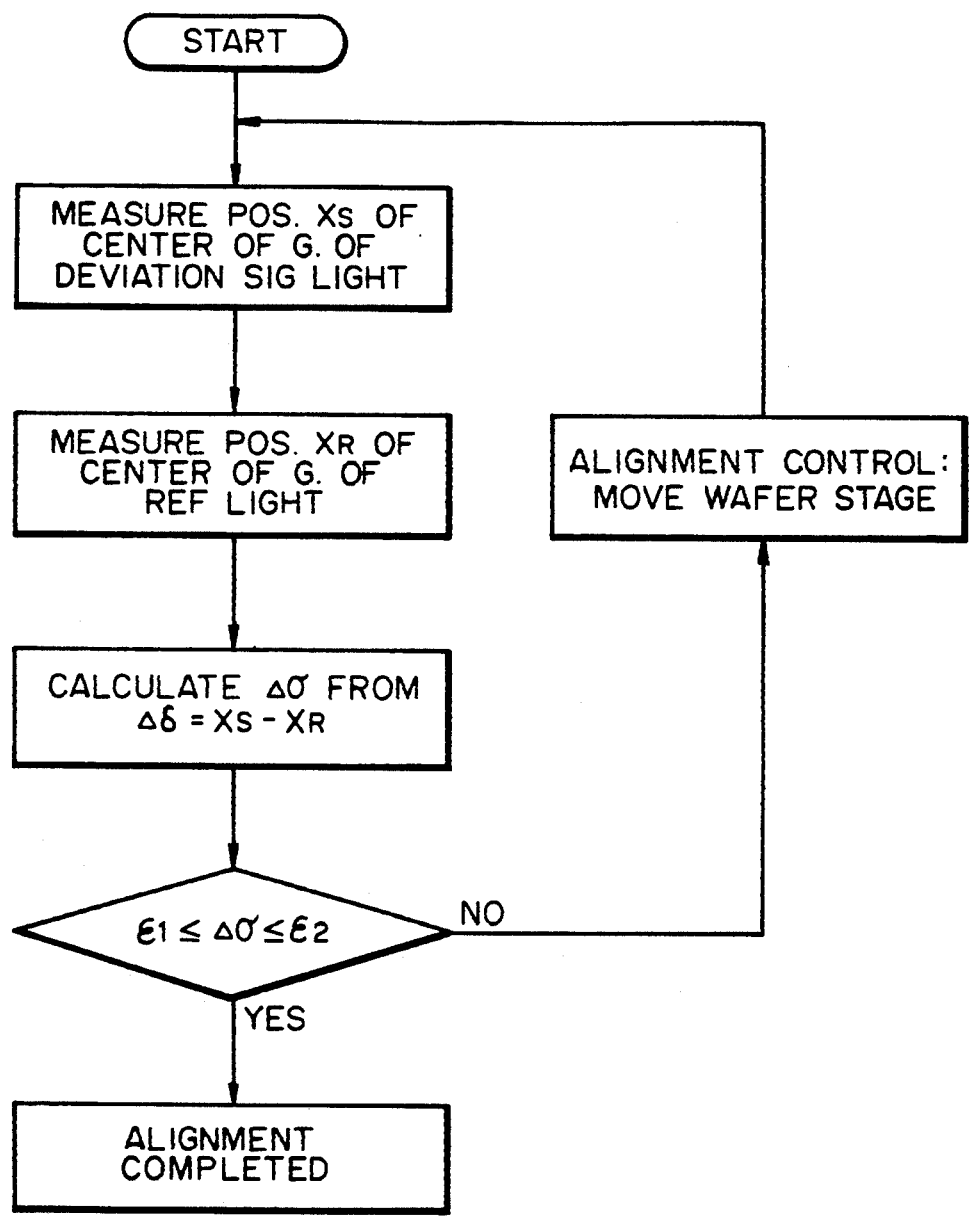
FIG. 34 is a flow chart showing an alignment procedure made in the FIG. 33 embodiment.

The above-described procedure is illustrated in a flow chart of FIG. 34.

Of course, for the correction of the positional deviation, the mask driving mechanism 101 may be used to move the mask 1.

As an example, first and second alignment marks 34 and 33 and a first reference mark 35 (grating lens) usable in this embodiment can be prepared in the following manner.

First, the marks 34 and 35 for a mask are designed so that, when parallel light of a predetermined beam diameter is incident thereupon at a predetermined angle, the light is collected at a predetermined position. Usually, a pattern of a grating lens may be that of an interference fringe which can be formed on a lens surface in an occasion where mutually coherent light sources are disposed at a light source position (object point) and the position of an image point. Assumingly, a coordinate system is defined on a mask 1 surface, such as shown in FIG. 33. The origin is at the middle of the width of the scribe line, the x axis is in the direction of the scribe line, the y axis is in the widthwise direction and the z axis is in the direction of the normal of the mask 1 surface. Equations regarding a group of curved lines of such a grating lens by which a parallel light, having been incident thereon with an angle $\alpha$ with respect to the normal of the mask surface 1 and with the projection being perpendicular to the scribe line direction, is imaged after being transmissively diffracted by the mark of the mask, at the position of a converging point $(x_1, y_1, z_1)$, can be expressed the following manner, with the position of each grating line being denoted by x and y:

$$y \sin \alpha + P1(x,y) - P2 = m\lambda/2 \tag{1}$$

$$P1(x,y) = \sqrt{(x - x_1)^2 + (y - y_1)^2 + z_1^2}$$

$$P2 = \sqrt{x_1^2 + y_1^2 + z_1^2}$$

wherein $\lambda$ is the wavelength of the alignment light and m is an integral number.

Assuming now that a chief ray is such a ray being incident with an angle $\alpha$ and passing through the origin on the mask surface 1 and then impinging upon a convergent point $(x_1, y_1, z_1)$, then the right side of equation (1) shows that, depending on the value of m, the optical path length is "$\lambda \times m/2$" times longer (shorter) than that for the chief ray; and the left side denotes the difference in length, with respect to the optical path of the chief ray, of the optical path of such a ray that passes a point $(x, y, 0)$ on the mask and then impinges on the point $(x_1, y_1, z_1)$.

A first alignment mark 34 to be provided on a mask 1 is exemplified in FIG. 35A, while a first reference mark 35 is exemplified in FIG. 35B.

On the other hand, a grating lens 33 to be provided on a wafer 2 is designed so as to collect, at a predetermined position (on the sensor surface), a spherical wave emanating from a predetermined point light source. Where the gap between a mask 1 and a wafer 2 at the time of exposure (pattern transfer) is denoted by g, then such a point light source can be expressed by:

$$(x_1, y_1, z_1 - g)$$

wherein y is a variable.

Assuming now that the mask 1 and the wafer 2 are to be aligned with respect to the y-axis direction and that, upon completion of alignment, the alignment light is focused at a point $(x_2, y_2, z_2)$ on the sensor surface, then equations regarding a group of curved lines of a grating lens of a wafer can be expressed, in the coordinate system defined hereinbefore, as follows:

$$\sqrt{(x - x_2)^2 + (y - y_2)^2 + z_2^2} - \tag{2}$$

$$\sqrt{(x - x_1)^2 + (y - y_1)^2 + (z_1 - g)^2} =$$

$$\sqrt{x_2^2 + y_2^2 + z_2^2} - \sqrt{x_1^2 + y_1^2 + z_1^2}$$

Equation (2) is such an equation satisfies a condition under which, assuming that the wafer surface is "$z = -g$" and that the chief ray is such a ray that passes the origin on the mask surface and a point $(0, 0, -g)$ on the wafer surface and additionally a point $(x_2, y_2, z_2)$ on the sensor surface, the difference in length between the path of the chief ray and the path of a ray passing the grating lens $(x, y, -g)$ on the wafer surface multiple, by an integral number, of a half wavelength.

A second alignment mark to be provided on a wafer 2 is exemplified in FIG. 35C.

Generally, a zone plate (grating lens) for a mask can be formed as an amplitude type grating element of "0 and 1" in which two regions, a region (transparent portion) that can transmit light and a region (light blocking portion) which does not transmit light, are formed alternately. On the other hand, a zone plate for a wafer can be formed as a phase grating pattern having a rectangular section, for example. The phase grating may be provided, for example, by a pattern having recesses and protrusions made of the same material. The fact that, in equations (1) and (2), each ring of a grating is defined at a position which corresponds to a multiple, by an integral number, of a half wavelength with regard to the chief ray, means that the linewidth ratio of the transparent portion and the light blocking portion is 1:1 in the case of the grating lens on a mask 1, and that the line and space ratio of rectangular grating is 1:1 in the case of the grating lens on the wafer 2.

As a specific example, a grating lens on a mask 1 was formed by transferring, onto an organic thin film of polyimide, a grating lens pattern of a reticle prepared by use of electron beam exposure technique.

On the other hand, a mark on a wafer 1 was formed by preparing on a mask a pattern to be printed on a wafer and then by transferring the pattern by use of a lithographic process.

A description will now be provided of the relationship between a signal light (alignment light) and a reference light to be incident on a sensor (detecting means) which may comprise an accumulation type one-dimensional CCD sensor, for example.

In this embodiment, the reference light and the signal light (for alignment) emanate from the wafer surface at angles 8 degrees and 5 degrees, respectively, with respect to the normal of the wafer surface and with the projection, upon the wafer surface, being orthogonal to the scribe line direction. The spatial disposition of the sensors 11 and 12 is so set that, upon completion of alignment, a light is incident on a corresponding sensor substantially at the middle position.

The sensors 11 and 12 have a spacing of 2 mm between their centers, and are mounted to a common base plate, made of Si, at a precision of about 0.1 micron. The Si base plate on which the sensors 11 and 12 are mounted, is disposed so that its normal extends substantially in parallel to a bisector for the angle of emission of the alignment light and the angle of emission of the reference light, when the mask and the wafer have no relative positional deviation.

As regards the size of the sensors 11 and 12, the sensor 11 for the signal light is 1 mm in width and 6 mm in length, whereas the sensor 12 for the reference light is 1 mm in width and 1 mm in length. Each picture element (pixel) has a size of $25 \times 500$ microns.

Each sensor is operable to measure the position of the center of gravity of incident light, and output signals from the sensor is processed so as to be standardized with regard to the total light quantity over the whole light-receiving region. By this, even if the output power of a light source for alignment changes slightly, the measured value as outputted from the sensor system exactly represents the position of the center of gravity. Although the resolution of the sensor, for the position of the center of gravity, may depend on the power of the alignment light, it was 0.2 micron where a semiconductor laser having a power of 50 mW and a wavelength 0.83 micron was used, by way of example.

In a design example for a grating lens of a mask and a grating lens of a wafer, to be used in the present embodiment, the center of gravity of the signal light displaces along the sensor surface, with the positional deviation between the mask and the wafer being magnified by $\times 100$. Therefore, a positional deviation of 0.01 micron between the mask and the wafer results in an effective displacement of the center of gravity on the sensor surface through 1 micron. The sensor system can measure such a displacement with a resolution of 0.2 micron.

If, in this embodiment, the wafer 2 surface is inclined within an x-z plane by an amount 1 mrad, there occurs on the sensor 11 a displacement of about 40 microns of the center of gravity of the signal light. On the other hand, the reference light 8 and the signal light 7 have symmetrical projections and, additionally, travel along respective optical paths having the same length. Therefore, on the sensor 12, there occurs displacement of the center of gravity of the reference light as exactly the same as the signal light. Thus, by processing signals from the sensors so as to detect and output a difference between those signals representing the positions of the effective centers of the gravities, the output signal from the sensor system does not change even if the wafer surface is inclined within the x-z plane.

If, on the other hand, the wafer is inclined within a y-z plane, both the signal light and the reference light causes displacement of the center of gravity in a direction perpendicular to the lengthwise direction of the sensor. However, such a displacement is in the direction which is perpendicular to the direction of displacement of the center of gravity of light resulting from the positional deviation (which is just to be detected). Therefore, without the reference light, no practical alignment error occurs.

Further, where the alignment head which may contain an alignment light source, a light projecting lens system and sensors, is shifted relative to a mask and wafer system (for example, if the head is displaced by 5 microns in the x direction relatively to a mask), there occurs an effective displacement of the center of gravity of the signal light, on the sensor 11 surface, by an amount of 5 microns. In this connection, also the center of gravity of the reference light displaces on the sensor 12 by an amount 5 microns, as exactly the same as the signal light. Similarly, a deviation of 10 microns between the mask surface and the head, in the z direction, results in a displacement, through 10 microns, of the center of gravity of light upon each of the signal light sensing sensor 11 and the reference light sensing sensor 12.

Therefore, no change occurs in the final output of the sensor system, namely, in the differential signal representing the difference between an output concerning the position of the center of gravity of the signal light and an output concerning the center of gravity of the reference light.

It will be readily understood that any change in the position in respect to the y-axis direction does not result in an essential alignment error, even when a reference light is not used.

It is not always necessary that the alignment marks 33 and 34 and the reference mark 35 are set to have different focal lengths as in the present embodiment. For example, the alignment marks 33 and 34 may have the same focal length.

As described in this embodiment, in order that both the signal light and the reference light make exactly the same displacement of the center of gravity of light, upon the sensor, as a result of any variation factor such as the inclination of the wafer surface, shift of the position of the alignment head or otherwise, it may be necessary that the optical path lengths of the signal light and the reference light to the sensors are substantially equal to each other in the case where the mask and the wafer have substantially no relative positional deviation. For this purpose, this embodiment has constitutional features such as follows.

(1) Two grating lenses having different focal lengths, for the signal light and for the reference light, are provided on a mask surface, each as a physical optic element having a predetermined lens function. On a wafer surface, one grating lens having substantially the same size as of the alignment mark formed on the mask surface and having a focal length is formed for the signal light. As one feature, the reference light is not influenced by the lens functions of both of the alignment marks of the mask and the wafer. In other words, it is influenced by the lens function of one of the marks or, alternatively, it is not influenced by the lens function of any mark.

(2) The reference light receiving sensor and the signal light receiving sensor are provided on a common base plate, and the base plate is disposed so that the normal thereof extends substantially in parallel to the bisector of the emission angles of the signal light and the reference light from the wafer surface at the time when the positional deviation is zero.

(3) Grating lens patterns are designed so that, when the positional deviation is zero, two planes as can be defined respectively by the paths of the two lights emanating from the wafer surface intersect at a right angle with the wafer surface.

It is to be noted here that the above-described features are not the absolute requirements. The feature (2) is merely one example of a structural feature that concerns the sensor arrangement, necessary for producing the same displacement of the center of gravity. As an alternative, sensors may be disposed so that, when the positional deviation is zero, the lights are perpendicularly incident on respective sensor surfaces and so that the optical path lengths from the wafer surface are equal to each other.

As an alternative for the feature (3), grating lens patterns may be designed so that a bisector of the angles of the two optical paths extends perpendicularly to the direction with respect to which any positional deviation is to be detected.

While, in the example described with reference to the flow chart of FIG. 34, the difference or interval between the centers of gravities of the signal light and the reference light upon the sensor surface is zero if there is no relative positional deviation between the mask and the wafer, of course the arrangement may be modified so that upon accomplishment of the mask-to-wafer alignment, there is a certain difference or spacing (which may be considered as a reference spacing), with a tolerance, between the centers of gravities of the signal light and the reference light upon the sensor surface.

Figure 36A:
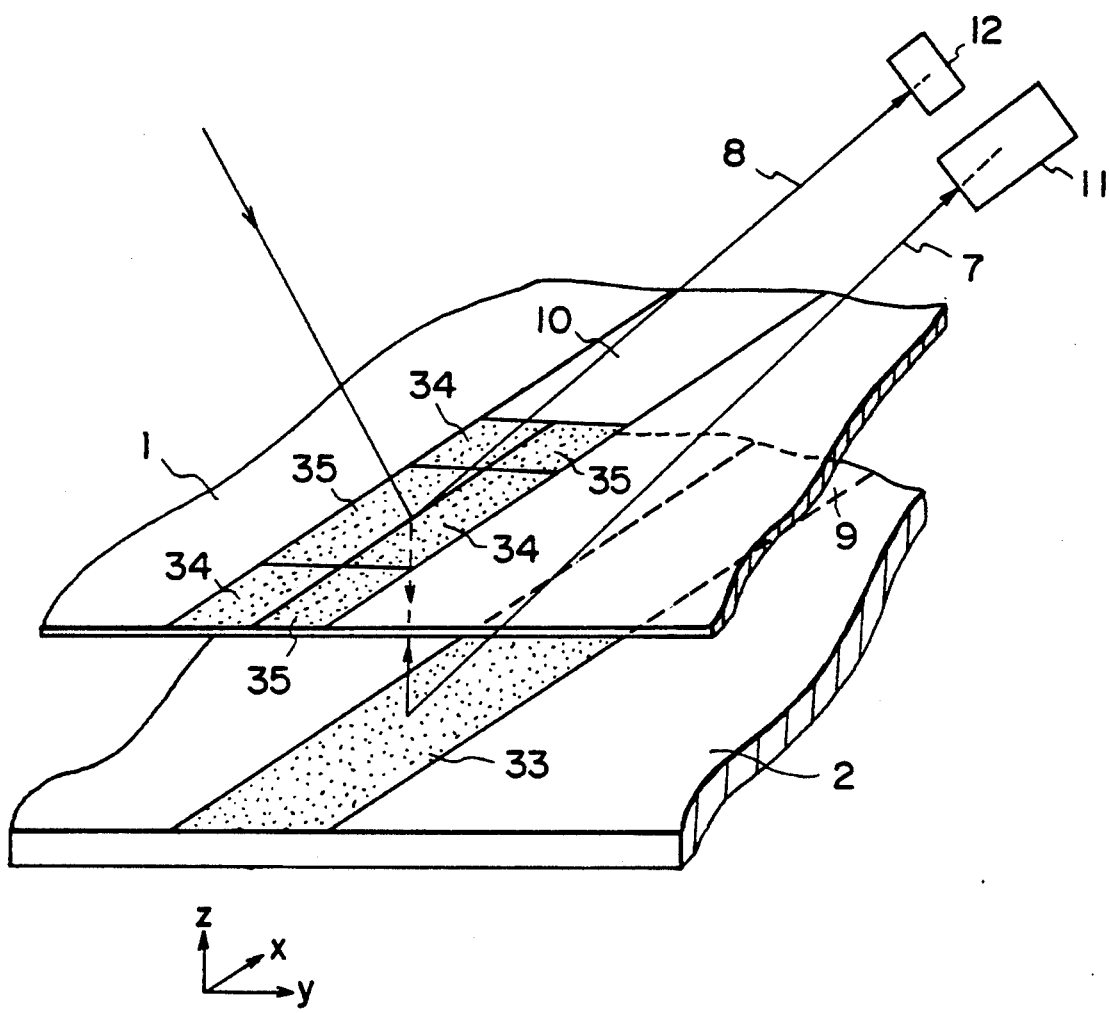
FIG. 36A is a schematic view showing a major portion of a sixteenth embodiment.

FIG. 36A is a schematic view showing a major portion of a sixteenth embodiment of the present invention.

In this figure, the same reference numerals are assigned to those components corresponding to the elements shown in FIG. 33.

In this embodiment, the direction with respect to which any positional deviation is to be detected is in the direction of a scribe line 9 or 10. Also, a first alignment mark and a reference mark each is formed by plural sections.

Figure 36B:
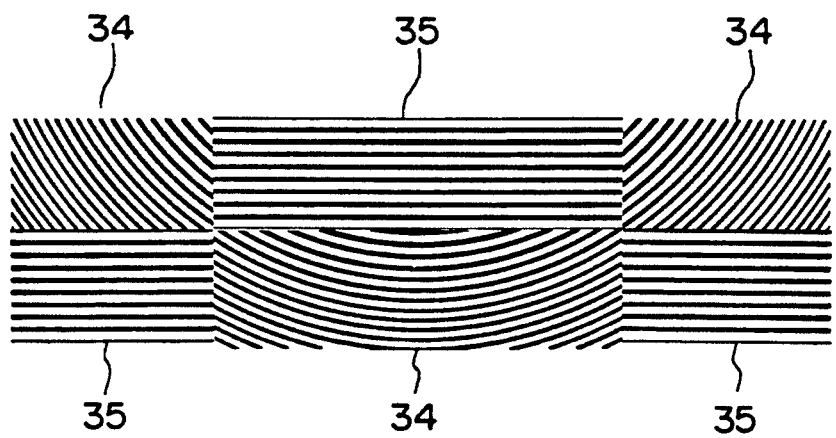
FIGS. 36B and 36C exemplify a mask mark pattern and a wafer mark pattern, respectively, usable in the FIG. 36A embodiment.
Figure 36C:
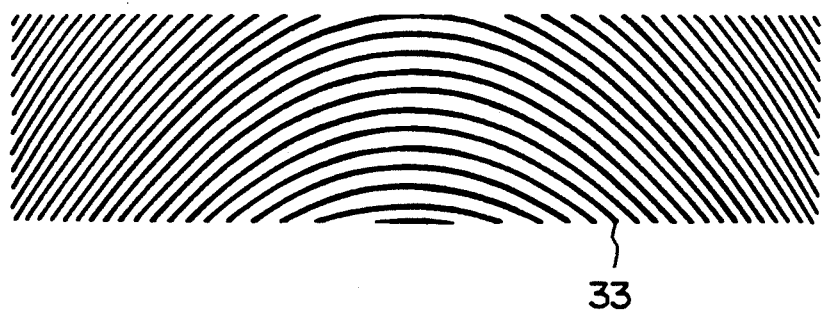

FIG. 36B schematically illustrates a first alignment mark 34 and a reference mark 35 to be provided on a mask 1 surface, while FIG. 36C schematically illustrates a second alignment mark 33 to be provided on a wafer 2 surface.

As a reference light 8, a zero-th order reflectively diffracted light from the wafer 2 surface is used, as in the embodiment shown in FIG. 33.

In this embodiment, only one light 6 is incident on the mask, which light is separated by an alignment mark to provide a signal light and a reference light.

The marks on the mask 1 surface and the wafer 2 surface each has a similar focal length as in the fifteenth embodiment shown in FIG. 33.

In this embodiment, as described, those lights as having been transmissively diffracted by a physical optic element on the mask and having been reflected by substantially the same area on a physical optic element on the wafer surface are detected as the signal light and the reference light. As a result, the effect of any local inclination of a wafer surface portion can be suppressed or avoided on the basis of measurement of the position of the center of gravity of the reference light.

In this embodiment, only a signal light receiving mark is provided on the wafer surface. This leads to simplification of the mark structure and results in reduction of an unwanted diffraction order light component. Additionally, it is possible to prevent undesirable reduction in the quantity of the signal light and the reference light, resulting from the positional deviation.

Figure 37A:
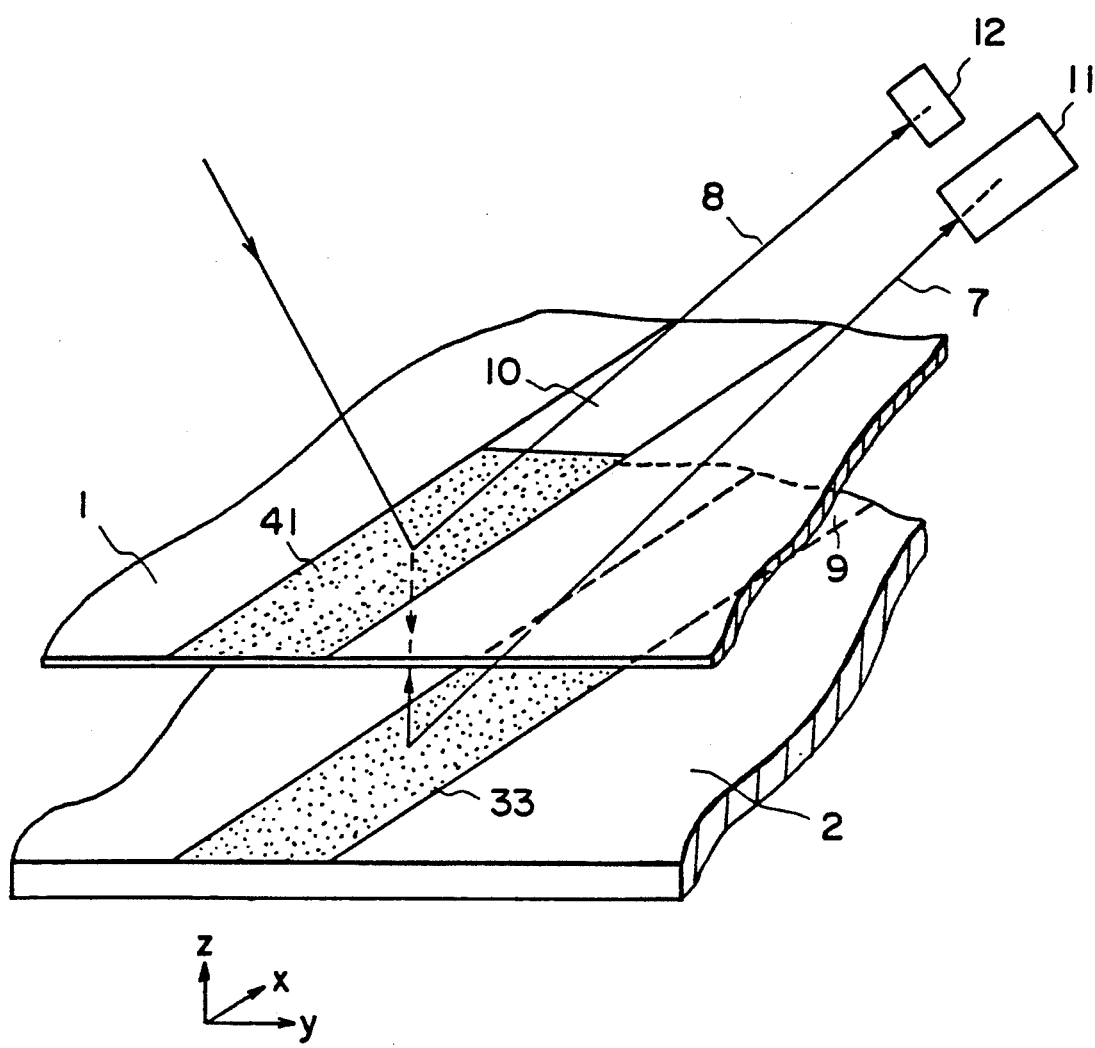
FIG. 37A is a schematic view showing a major portion of a seventeenth embodiment.

FIG. 37A is a schematic view showing a major portion of a seventeenth embodiment of the present invention.

In this Figure, elements corresponding to those in FIG. 33 are denoted by the same reference numerals.

Figure 37B:
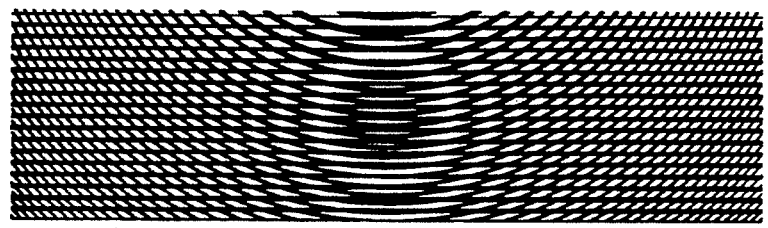
FIGS. 37B and 37C exemplify a mask mark pattern and a wafer mark pattern, usable in the FIG. 37A embodiment.

Positional deviation detecting mark 41 is, as best seen in FIG. 37B, provided by a grating lens pattern for signal light and another grating lens pattern for reference light which are overlaid one upon another to provide a "0 and 1" amplitude transmission type pattern.

Figure 37C:
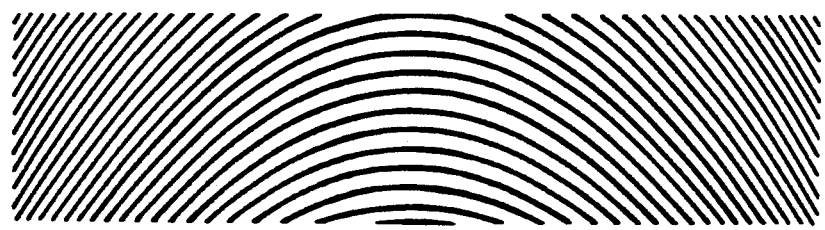

FIG. 37C schematically illustrates a second alignment pattern provided on a wafer 2 surface.

As shown in these figures, only a grating lens pattern for the signal light is formed on the wafer 2 surface. As for the reference light for the detection of any inclination of the wafer surface, a zero-th order reflection light from the wafer 2 surface is used. Namely, the light which is further transmissively diffracted, by the second order diffraction, by the grating lens on the mask surface is received by a reference light receiving sensor 12 disposed within an alignment head, not shown. The power arrangement for individual grating lenses for the signal light and for the reference light may be the same as in the fifteenth embodiment. Substantially the same advantages as attainable in the FIG. 36A embodiment are attainable in this embodiment.

In the fifteenth to seventeenth embodiments, the reference light is reflected, by the zero-th order reflection, by the wafer surface and then is diffracted, by the second order diffraction, by the reference mark on the mask surface and finally is converged on the sensor. Although, in each of these embodiments, the reference light is diffracted by the mark on the mask surface, by an order not less than first order, the invention is not limited to this.

Figure 38A:
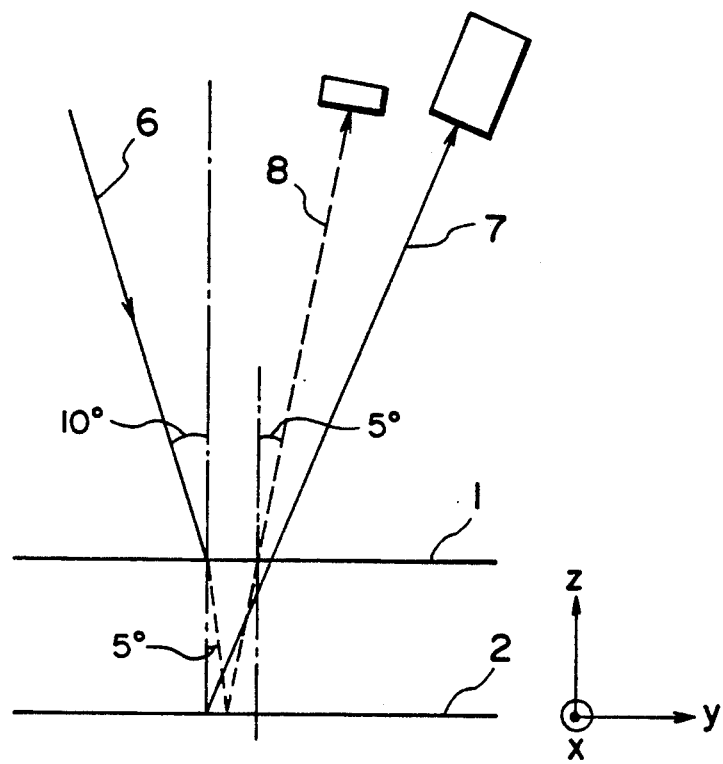
FIGS. 38A and 38B are representations for explicating optical paths to be defined in an eighteenth embodiment.

For example, as illustrated in FIG. 38A, which shows an eighteenth embodiment, the path of the reference light may be such as being diffracted at the first order by a mark on a mask 1 surface and then reflected at the zero-th by a mark on a wafer 2 surface and thereafter transmissively diffracted at the zero-th order by the mask. In that case, the direction with respect to which any positional deviation is to be detected may be in the direction of a scribe line, namely x direction, and a chief ray of a transmitted light as diffracted at the first order by a mark (having a focal length of 20.167 mm) which is provided on the mask surface for the reference light, may have an angle of 5 degrees, in a y-z section, with respect to the normal of the wafer surface and then it is reflected by the mark on the wafer and emanates from the mask surface at an angle of 5 degrees with respect to the normal of the mask surface.

Figure 38B:
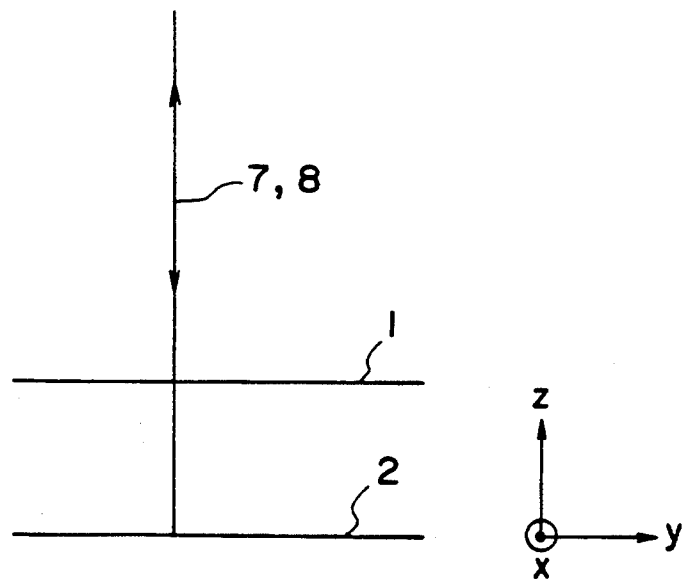

Also, in the x-z section, upon completion of the alignment, both the signal light 7 and the reference light 8 impinge on and emanate from the mask surface and the wafer surface perpendicularly (in the direction of the normal), as best seen in FIG. 38B.

The signal light emanates from the wafer surface at an angle of 16 degrees. The incidence and emission angles of the alignment light, the power arrangement of grating lenses, the size of each mark and so on are substantially the same as those in the fifteenth embodiment.

Figure 39:
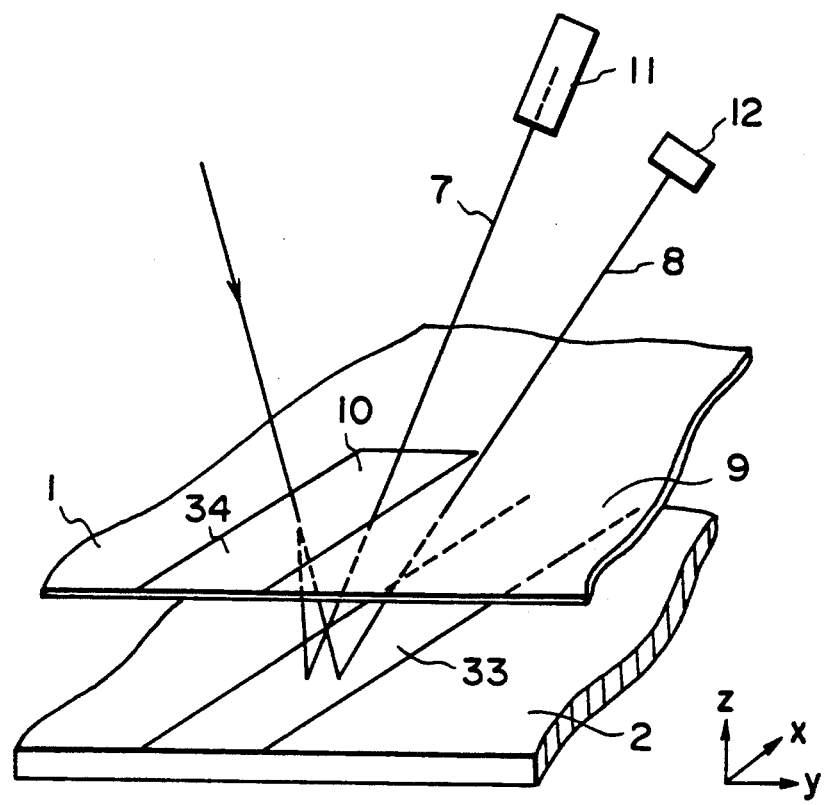
FIG. 39 is a schematic view showing a major portion of a nineteenth embodiment.

FIG. 39 is a schematic view showing a major portion of a nineteenth embodiment of the present invention.

In this figure, elements corresponding to those in FIG. 33 are denoted by same reference numerals.

In this embodiment, the direction with respect to which any positional deviation is to be detected is in the direction of a scribe line (x direction).

Also, in this embodiment, only a mark 34 for an alignment signal light is provided on a mask surface. Further, only a mark 33 for the alignment signal light is provided on a wafer surface. Thus, no specific mark pattern is provided for formation of a reference light. In the direction perpendicular to the scribe line, the set positions of the mask mark and the wafer mark are relatively deviated by a distance 20 microns.

In this embodiment, such a light as having been transmitted, at the zero-th order, through the mark on the mask surface and having been reflected, at the zero-th order, by the mark on the wafer surface is used as a reference light, and a light receiving lens system and a sensor 12 for receiving such a light are provided. Also, as in the fifteenth to eighteenth embodiments described hereinbefore, such an optical arrangement by which light is incident on and emanates from the mask surface with inclination with respect to the normal of he mask surface, is adopted in order to avoid the effect of unwanted diffraction lights.

As a signal light, use is made of such a light as being incident on the mask surface at an angle of 11 degrees, in the y-z plane, with respect to the normal of the mask surface; being thereafter influenced by the lens function and then incident on the wafer surface at an angle of 2 degrees, in the y-z plane, with respect to the normal of the wafer surface; and further being diffracted at the first order by the deviation detecting mark 33 provided on the wafer surface and then emanating therefrom at an angle of 16 degrees, in the y-z plane, with respect to the normal of the wafer surface.

Also, the system is arranged so that, in the x-z projection plane, when the alignment is completed the alignment light is incident on and emanates from the mask surface or the wafer surface perpendicularly thereto. The size of each mark, the power arrangement of grating lenses, the magnification for the detection of positional deviation and so on are substantially the same as those in the fifteenth to eighteenth embodiment.

In some embodiments to be described below, as a reference light, such a light that can be displaced as a result of any change in the relative position of a mask and a wafer, at a magnification different from that for an alignment light, is defined and, by using this, high-precision position detection free from the effect of inclination is ensured.

Figure 40:
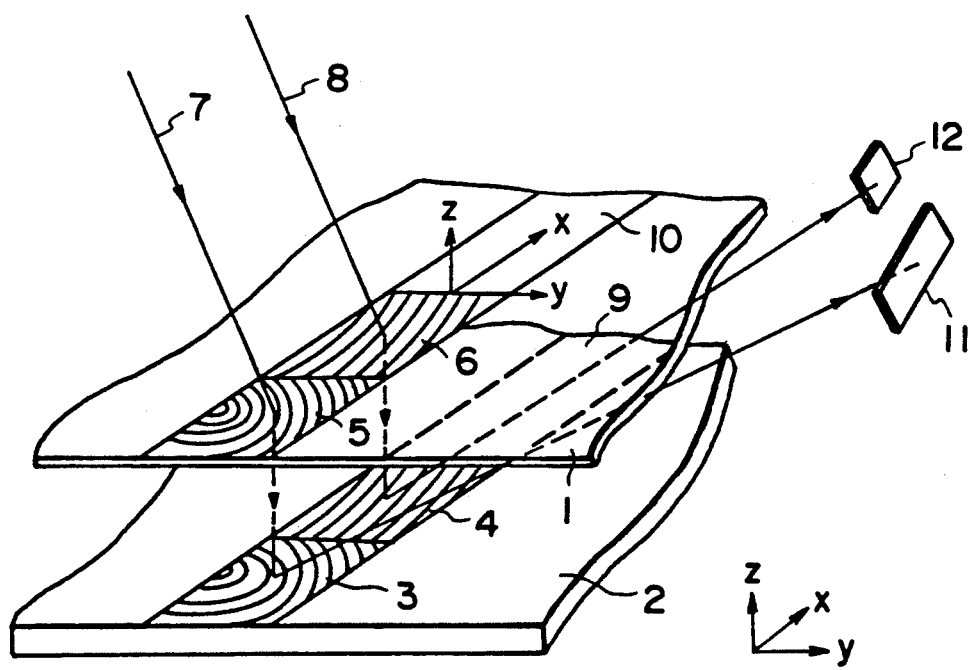
FIG. 40 is a schematic section showing a major portion of a twentieth embodiment.

FIG. 40 is a schematic view showing a major portion of a 20th embodiment of the present invention. In this embodiment, a reference mark 4 also is formed by a grating lens such as a Fresnel zone plate, for example.

In this embodiment, an alignment light 7 and a reference light 8 are incident upon a first alignment mark 5 and a first reference mark 6, respectively, on a mask 1 surface, each at a predetermined angle. The incident lights are transmissively diffracted by these marks and then are reflectively diffracted by a second alignment mark 3 and a second reference mark 4 on a wafer 2 surface, respectively. These reflectively diffracted lights are finally incident upon a sensor 11 surface and a sensor 12 surface, respectively. Each of these sensors 11 and 12 is operable to detect the position of the center of gravity of the alignment light or the reference light, being projected on its surface. By using output signals of these sensors 11 and 12, the mask 1 and the wafer 2 can be aligned with each other.

A description will now be provided of the first and second alignment marks 5 and 3 and the first and second reference marks 6 and 4 used in this embodiment.

The alignment marks 3 and 5 and the reference marks 6 and 4 are provided by Fresnel zone plates (or grating lenses) having different focal lengths. Each mark has a size of 140 microns in the lengthwise direction of the scribe line and 50 microns in the widthwise direction (y direction) of the scribe line.

In this embodiment, both the alignment light 7 and the reference light 8 are incident on the mask 1 at an angle of incidence of 10 degrees, with the projection upon the mask 1 surface being perpendicular to the scribe line direction (x direction).

The alignment light 7 and the reference light 8 incident on the mask 1 with a predetermined angle are influenced by the lens functions of the grating lenses 5 and 6, respectively, each being transformed into a convergent or divergent light which is emitted from the mask 1 so that its chief ray has a predetermined angle with respect to the normal of the mask 1.

The alignment light 7 and the reference light 8 having been transmissively diffracted by the first alignment mark 5 and the first reference mark 6, respectively, are collected at points on the wafer 2 surface which are at distances of 119.0 microns and 238.0 microns vertically below these marks. The alignment mark 5 and the reference mark 6, in this case, have focal lengths of 134 microns and 268 microns. Also, the mask 1 and the wafer 2 are spaced by a distance 30 microns.

The light transmissively diffracted by the alignment mark 5 is influenced by a concave or convex lens function of the second alignment mark 3 on the wafer 2 surface, and is collected at a point on the sensor 11 surface. On this sensor 11 surface, at this time, the light is incident with any relative positional deviation (i.e. any misalignment of the axes) of the alignment marks 5 and 3 being magnified, with a result of corresponding shift of the position of the center of gravity of the incident light.

The present embodiment is so set that, when the mask 1 and the wafer 2 have no relative positional deviation (i.e. when the alignment marks 5 and 3 on the mask 1 and the wafer 2 just provide a coaxial system), the chief ray of the alignment light emitting from the wafer 2 has an angle of emission of 5 degrees, and the projection of the emitted light on the wafer 2 surface extends perpendicularly to the widthwise direction (y direction) of the scribe line and, additionally, the emitted light is focused on the sensor 11 surface which is disposed at a predetermined position, for example, at a height of 20 mm from the wafer 2 surface.

On the other hand, the light transmissively diffracted by the first reference mark is incident on by the second reference mark 4 on the wafer 2 surface and emanates therefrom with an angle of emission of 8 degrees and with the projection upon the wafer 2 surface being perpendicular to the widthwise direction of the scribe line, and finally it is focused at a point on the surface of the sensor 12 (second detecting means). At this time, the lateral shift of the imaging point is magnified by the second reference mark 4 at a magnification different from that for the alignment light.

As an example, first and second alignment marks 5 and 3 and a first reference mark 6 (grating lens) usable in this embodiment can be prepared in the following manner.

First, the marks 5 and 6 for a mask are designed so that, when parallel light of a predetermined beam diameter is incident thereupon at a predetermined angle, the light is collected at a predetermined position. Usually, a pattern of a grating lens may be that of an interference fringe which can be formed on a lens surface in an occasion where mutually coherent light sources are disposed at a light source position (object point) and the position of an image point.

Assumingly, a coordinate system is defined on a mask 1 surface, such as shown in FIG. 40. The origin is at the middle of the width of the scribe line, the x axis is in the direction of the scribe line, the y axis is in the widthwise direction and the z axis is in the direction of the normal of the mask 1 surface. Equations regarding a group of curved lines of such a grating lens by which a parallel light, having been incident thereon with an angle $\alpha$ with respect to the normal of the mask surface 1 and with the projection being perpendicular to the scribe line direction, is imaged after being transmissively diffracted by the mark of the mask, at the position of a converging point $(x_1, y_1, z_1)$, can be expressed in the following manner, with the position of each grating line being denoted by x and y:

$$y \sin \alpha + P1(x,y) - P2 = m\lambda/2 \quad (1)$$

$$P1(x,y) = \sqrt{(x - x_1)^2 + (y - y_1)^2 + z_1^2}$$

$$P2 = \sqrt{x_1^2 + y_1^2 + z_1^2}$$

wherein $\lambda$ is the wavelength of the alignment light and m is an integral number.

Assuming now that a chief ray is a ray incident with an angle $\alpha$ and passing through the origin on the mask surface 1 and then impinging upon a convergent point $(x_1, y_1, z_1)$, then the right side of equation (1) shows that, depending on the value of m, the optical path length is "$\lambda \times m/2$" times longer (shorter) than that for the chief ray; and the left side denotes the difference in length, with respect to the optical path of the chief ray, of the optical path of such a ray that passes a point (x, y, 0) on the mask and then impinges on the point $(x_1, y_1, z_1)$.

Figure 41A:
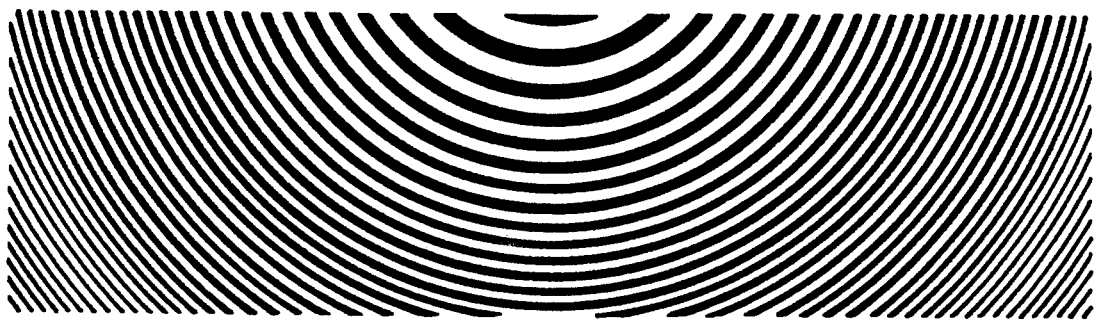
FIGS. 41A and 41B exemplify patterns of a first alignment mark and a first reference mark, respectively, usable in the FIG. 40 embodiment.
Figure 41B:
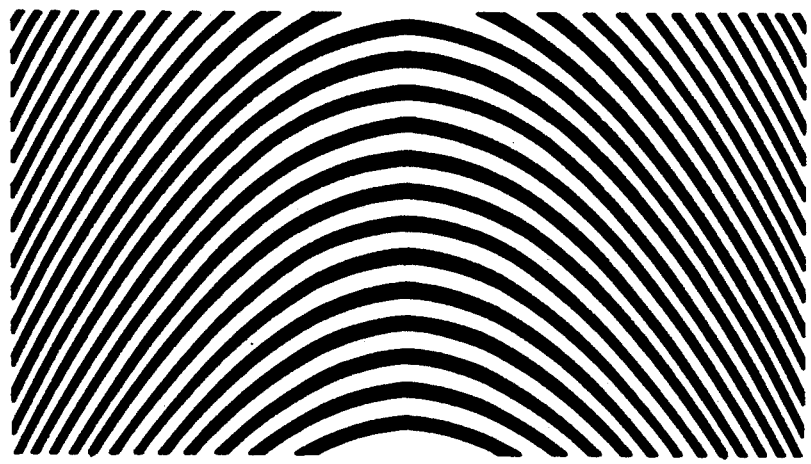

A first alignment mark to be provided on a mask 1 is exemplified in FIG. 41A, and a first reference mark is exemplified in FIG. 41B.

On the other hand, a grating lens to be provided on a wafer 2 is designed so as to collect, at a predetermined position (on the sensor surface), a spherical wave emanating from a predetermined point light source. Where the gap between a mask 1 and a wafer 2 at the time of exposure (pattern transfer) is denoted by g, then such a point light source can be expressed by:

$$(x_1, y_1, z_1 - g)$$

wherein y is a variable.

Assuming now that the mask 1 and the wafer 2 are to be aligned with respect to the x-axis or y-axis direction and that, upon completion of alignment, the alignment light is focused at a point $(x_2, y_2, z_2)$ on the sensor surface, then equations regarding a group of curved lines of a grating lens of a wafer can be expressed, in the coordinate system defined hereinbefore, as follows:

$$\sqrt{(x - x_2)^2 + (y - y_2)^2 + z_2^2} - \sqrt{(x - x_1)^2 + (y - y_1)^2 + (z_1 - g)^2} = \sqrt{x_2^2 + y_2^2 + z_2^2} - \sqrt{x_1^2 + y_1^2 + z_1^2} \quad (2)$$

Equation (2) is such an equation that satisfies a condition under which, assuming that the wafer surface is "$z = -g$" and that the chief ray is such a ray that passes the origin on the mask surface and a point $(0, 0, -g)$ on the wafer surface and additionally a point $(x_2, y_2, z_2)$ on the sensor surface, the difference in length between the path of the chief ray and the path of a ray passing the grating lens $(x, y, -g)$ on the wafer surface becomes equal to a multiple, by an integral number, of a half wavelength.

Figure 42A:
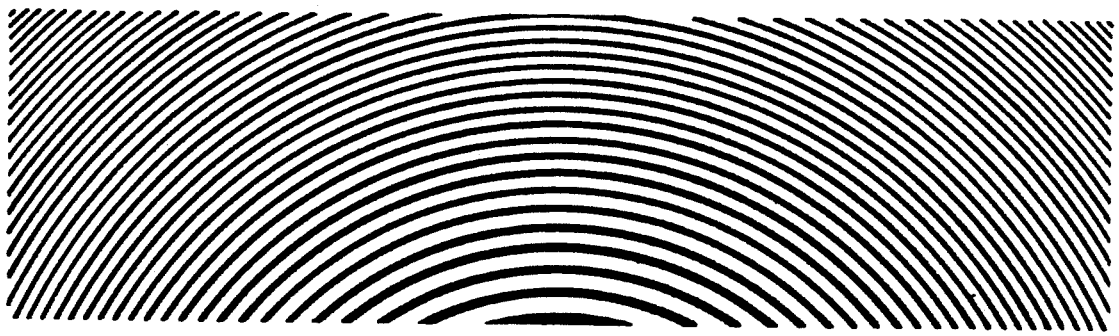
FIGS. 42A and 42B exemplify patterns of a second alignment mark and a second reference mark, respectively, usable in the FIG. 40 embodiment.
Figure 42B:
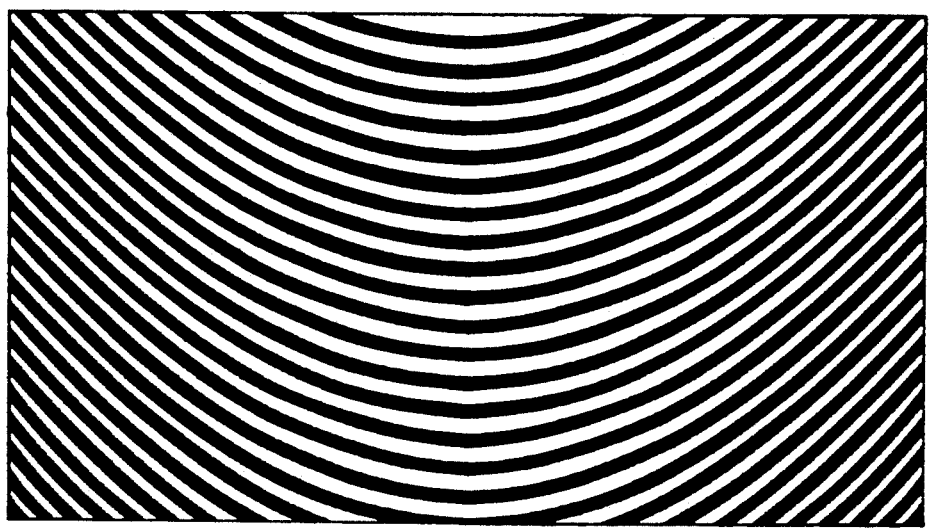

A second alignment mark to be provided on a wafer 2 is exemplified in FIG. 42A, while a second reference mark is exemplified in FIG. 42B.

Generally, a zone plate (grating lens) for a mask can be formed as an amplitude type grating element of "0 and 1" in which two regions, a region (transparent portion) that can transmit light and a region (light blocking portion) which does not transmit light, are formed alternately. On the other hand, a zone plate for a wafer can be formed as a phase grating pattern having a rectangular section, for example. The fact that, in equations (1) and (2), each grating line is defined at a position which corresponds to a multiple, by an integral number, of a half wavelength with regard to the chief ray, means that the linewidth ratio of the transparent portion and the light blocking portion is 1:1 in the case of the grating lens on a mask 1, and that the line and space ratio of rectangular grating is 1:1 in the case of the grating lens on the wafer 2.

As a specific example, a grating lens on a mask 1 was formed by transferring, onto an organic thin film of polyimide, a grating lens pattern of a reticle prepared by use of electron beam exposure technique.

On the other hand, a mark on a wafer 1 was formed by preparing on a mask a pattern to be printed on a wafer and then by transferring the pattern by use of a lithographic process.

A description will now be provided of the relationship between a first signal light (alignment light) and a second signal light (reference light) to be incident on a sensor (detecting means) which may comprise an accumulation type one-dimensional CCD sensor, for example.

In this embodiment, the reference light and the signal light (for alignment) emanate from the wafer surface at angles 8 degrees and 5 degrees, respectively, with respect to the normal of the wafer surface and with the projection, upon the wafer surface, being orthogonal to the scribe line direction. The spatial disposition of the sensors 11 and 12 is so set that, upon completion of alignment, a light is incident on a corresponding sensor substantially at the middle position.

The sensors 11 and 12 have a spacing of 2 mm between their centers, and are mounted to a common base plate, made of Si, at a precision of about 0.1 micron. The Si base plate on which the sensors 11 and 12 are mounted, is disposed so that its normal extends substantially parallel to a bisector for the angle of emission of the alignment light and the angle of emission of the reference light, when the mask and the wafer has no relative positional deviation.

As regards the size of the sensors 11 and 12, the sensor 11 for the signal light is 1 mm in width and 6 mm in length, whereas the sensor 12 for the reference light is 1 mm in width and 1 mm in length. Each picture element (pixel) has a size of 25×500 microns.

Each sensor is operable to measure the position of the center of gravity of incident light, and output signals from the sensor is processed so as to be standardized with regard to the total light quantity over the whole light-receiving region. By this, even if the output power of a light source for alignment changes slightly, the measured value as outputted from the sensor system exactly represents the position of the center of gravity. Although the resolution of the sensor, for the position of the center of gravity, may depend on the power of the alignment light, it was 0.2 micron where a semiconductor laser having a power of 50 mW and a wavelength 0.83 micron was used, by way of example.

In a design example for a grating lens of a mask and a grating lens of a wafer, to be used in the present embodiment, the center of gravity of the signal light displaces along the sensor surface, with the positional deviation between the mask and the wafer being magnified by ×200 in the case of the alignment light and by ×100 in the case of the reference light. Therefore, a positional deviation of 0.01 micron between the mask and the wafer results in an effective displacement of the center of gravity on the sensor surface through 2 microns (alignment light) and through 1 micron (reference light). The sensor system can measure each displacement with a resolution of 0.2 micron.

If, in this embodiment, the wafer 2 surface is inclined within an x-z plane by an amount 1 mrad, there occurs on the sensor 11 a displacement of about 20 microns of the center of gravity of the signal light. On the other hand, the reference light (second signal light) 8 and the signal light 7 have symmetrical projections and, additionally, travel along respective optical paths having the same length. Therefore, on the sensor 12, there occurs displacement of the center of gravity of the reference light 8 as exactly the same as the signal light 7. Thus, by processing signals from the sensors so as to detect and output a difference between those signals representing the positions of the effective centers of the gravity, the output signal from the sensor system does not change even if the wafer surface is inclined within the x-z plane.

If, on the other hand, the wafer is inclined within a y-z plane, both the signal light and the reference light causes displacement of the center of gravity in a (widthwise direction perpendicular to the lengthwise direction of the sensor. However, such a displacement is in the direction which is perpendicular to the direction of displacement of the center of gravity of light resulting from the positional deviation (which is just to be detected). Therefore, without the reference light, no practical alignment error occurs.

Further, where the alignment head which may contain an alignment light source, a light projecting lens system and sensors, is shifted relative to a mask and wafer system (for example, if the head is displaced by 5 microns in the x direction relatively to a mask), there occurs an effective displacement of the center of gravity of the signal light, on the sensor 11 surface, by an amount of 4.98 microns. In this connection, also the center of gravity of the reference light displaces on the sensor 12 by an amount 4.98 microns, as exactly the same as the signal light. Similarly, a deviation of 10 microns between the mask surface and the head, in the z direction, results in a displacement, through 10 microns, of the center of gravity of light upon each of the signal light sensing sensor 11 and the reference light sensing sensor 12.

Therefore, no change occurs in the first output of the sensor system, namely, in the differential signal representing the difference between an output concerning the position of the center of gravity of the signal light and an output concerning the center of gravity of the reference light.

It will be readily understood that any change in the position in respect to the y-axis direction does not result in an essential alignment error, even when a reference light is not used.

Assuming in this embodiment that the position of the center of gravity of the signal light (alignment light) upon the corresponding sensor is $w_1$; the position of the center of gravity of the reference light upon the corresponding sensor is $w_2$; the angle of inclination of the wafer surface at that time to the mask surface is $\Delta\theta$; and the shift of the position of the alignment head is $\Delta 1r = (\Delta x, \Delta y, \Delta z)$: then, the positional deviation x between the mask and the wafer can be expressed in the following equations:

$$w_1 = m \cdot x + c_1 (\Delta\theta, \Delta 1r)$$

$$w_2 = n \cdot x + c_2 (\Delta\theta, \Delta 1r)$$

wherein m and n are enlarging magnifications of the alignment system and the reference system, respectively, for enlarging the positional deviation, and $c_i(\Delta\theta, \Delta 1r)$ is the amount of displacement of the center of gravity of light upon a sensor, resulting from $\Delta\theta$ and $\Delta 1r$. Where the alignment light and the reference light are symmetrical with respect to a normal of the sensor surface and when they have the same optical path length, it follows that:

$$c_1(\Delta\theta, \Delta 1r) = c_2(\Delta\theta, \Delta 1r)$$

Finally, from the relative position of the centers of gravities of the two lights upon the sensors, the positional deviation is determined as follows:

$$x = (w_1 - w_2)/(m - n)$$

In this manner, the error factors, such as the inclination of the wafer surface, shift of the position of the alignment head or otherwise, upon measurement of the position of the gravity of the alignment light, can be removed and, therefore, the positional deviation can be detected correctly and exactly.

Figure 43:
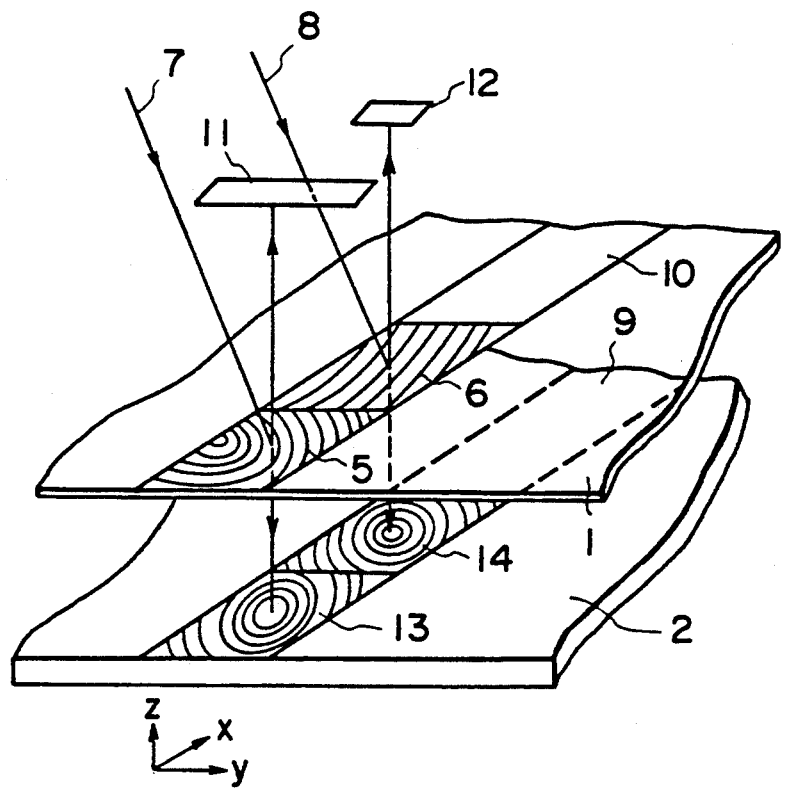
FIG. 43 is a schematic view showing a major portion of a 21st embodiment.

FIG. 43 is a schematic view of a 21st embodiment of the present invention. In this embodiment, as a reference light setting means, like in the 21st embodiment shown in FIG. 40, a first and second reference marks 6 and 14 formed by predetermined grating lenses, are used.

First alignment mark 5 and first reference mark 6, which are formed by juxtaposed grating lenses provided on a mask 1 surface, are so set that, as in the 21st embodiment, lights 7 and 8 incident at a predetermined angle with respect to the normal of the mask 1 surface are collected at positions which are at distances of 238.0 microns and 119.0 mm vertically below the mask 1 surface.

On the other hand, a second alignment mark 13 provided on a wafer 2 surface is formed by a grating lens which is symmetrical with respect to a normal of the mask 1 surface and, more specifically, it is provided by a Fresnel zone plate having a focal length of 239.4 microns for the alignment purpose. Juxtaposed thereto as a second reference mark 14 is a grating lens of symmetrical structure with respect to a normal to the mask 1 surface and having a focal length of 130.0 microns.

In this embodiment, a spherical wave having been transmissively diffracted by the first alignment mark 5 on the mask 1 surface is reflectively diffracted by the second alignment mark 13 on the wafer 2 surface and, thereafter, it passes through the mask 1 surface as a "zero-th" order diffraction light, the transmitted light being detected by a sensor 11 as an alignment light (signal light).

Thus, upon completion of the mask-to-wafer alignment, the chief ray of the signal light is reflected by the wafer surface vertically upwardly and, after passing through the mask surface as a "zero-th" order light, it impinges on the sensor 11 disposed right above the mask surface.

Since the basic paths of the signal light and the reference light are parallel to each other and additionally, they have the same length, the inclination of the wafer surface does produce exactly the same displacement of the center of gravity in both of the signal light and the reference light. Similarly, any shift of the position of the alignment head does not cause any relative displacement of the center of gravity, between the signal light and the reference light.

On the other hand, the grating lens 13 on the wafer has a symmetrical structure with respect to the normal of the wafer surface, passing through the center of the mark, and, by the reflection at the wafer surface, the chief ray of each of the signal light and the reference light goes backwardly along a direction perpendicular to the mask or wafer surface. Thus, as compared with the case of a grating element of the 21st embodiment, as having a function for deflecting and emitting light from the wafer surface with inclination and having a lens power, the diffraction efficiency can be increased.

The diffraction efficiency of the mark on the wafer surface is 5% in the 21st embodiment, but in the 21st embodiment it is increased to 15% and 0.15 mW. The total quantity of the signal light that reaches the sensor surface is increased to about three times higher than that in the 20th embodiment.

As a result, the signal-to-noise ratio of the sensor increases, and the resolution for the measurement of the position of center of gravity increases to 0.1 micron. Also, the measuring time for alignment is shortened to one-third, with a result of further improvement in the total throughput of the exposure system.

Figure 44:
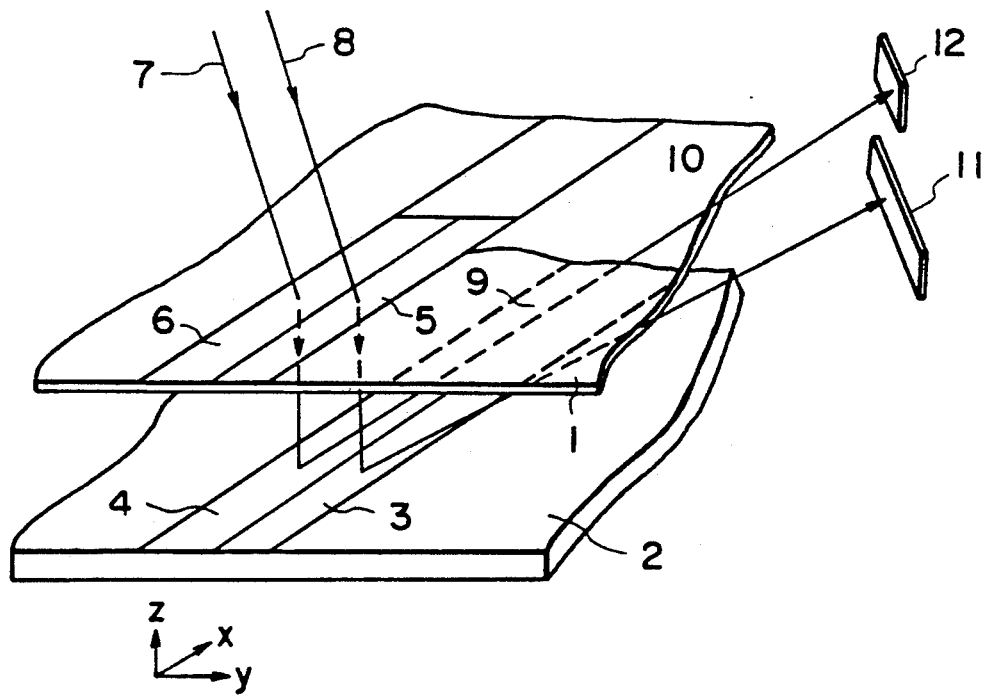
FIG. 44 is a schematic view showing a major portion of a 22nd embodiment.

FIG. 44 is a schematic view of a 22nd embodiment of the present invention. In this embodiment, like the 20th embodiment shown in FIG. 40, as a reference light setting means, a first and second reference marks 6 and 4 formed by predetermined grating lenses, are used.

Grating lenses 5 and 6 juxtaposed to each other on a mask surface are so set that, as in the 20th embodiment, those lights incident at a predetermined angle with respect to the normal of the mask surface are collected at positions which are at distances 119.0 microns and 238.0 mm vertically below the mask surface.

In this embodiment, the first alignment mark 5 and the first reference mark 6 are juxtaposed in the widthwise direction (y direction) of a scribe line 10, and a second alignment mark 4 and a second reference mark 3 are juxtaposed in the same widthwise direction of a scribe line 9.

The present embodiment is so set that, when the mask 1 and the wafer 2 have no relative positional deviation (i.e. when the alignment marks 5 and 3 on the mask 1 and the wafer 2 just provide a coaxial system), the chief ray of the alignment light emitting from the wafer 2 has an angle of emission of 5 degrees, and the projection of the emitted light on the wafer 2 surface extends perpendicularly to the widthwise direction (y direction) of the scribe line and, additionally, the emitted light is focused on a sensor 11 surface which is disposed at a predetermined position, for example, at a height of 20 mm from the wafer 2 surface.

On the other hand, the light transmissively diffracted by the first reference mark 6 is incident upon the second reference mark 4 on the wafer 2 surface and emanates therefrom with an angle of emission of 8 degrees and with the projection upon the wafer 2 surface being perpendicular to the widthwise direction of the scribe line, and finally it is focused at a point on the surface of the sensor 12 (second detecting means). At this time, the lateral shift of the imaging point is magnified by the second reference mark at a magnification different from that for the alignment light.

If, at this time, there is a positional deviation between the mask 1 and the wafer 2, the reference light coming from the reference marks 6 and 4 causes on the sensor 12 surface a displacement of the center of gravity thereof which is magnified by a magnification of $\times 100$ (which is $\times 200$ in the case of the signal light), similarly to the FIG. 40 embodiment.

In this embodiment, the sensors 11 and 12 for the signal light and the reference light are so set as to be symmetrical with respect to a bisector concerning the emission angles 5 degrees and 8 degrees of these lights from the wafer surface. Also, the sensors 11 and 12 are formed on a common base plate which is set so that the base plate extends orthogonally to the bisector of the emission angles of the two lights from the wafer (namely, it defines an angle of 6.5 degrees with respect to the mask or wafer surface). As a result, the signal light and the reference light emanating from the wafer surface have a symmetrical projection with respect to the sensor base plate and, additionally, they have the same optical path length. Therefore, any inclination of the wafer surface produces an exactly the same displacement of the center of gravity on the sensor surface, for the signal light and the reference light. Similarly, any change in the position of the alignment head does not produce any relative displacement of the center of gravity, between the signal light and the reference light.

The marks 5 and 3 for the signal light and the marks 6 and 4 for the reference light each has a size of 280 microns in the direction of the scribe line and 40 microns in the widthwise direction of the scribe line. Also, the alignment is made with respect to the direction of the scribe line.

In the 22nd embodiment, the marks are arrayed in the widthwise direction of the scribe line. As a result, this embodiment has the following advantageous features as compared with the 20th and 21st embodiments.

In the 20th and 21st embodiments, a mark for the signal light and a mark for the reference light are arrayed in the direction of the scribe line. The region in which alignment marks are to be set is limited to a certain area (for example, 280×80 microns) on the scribe line. As a result, it is not so easy to obtain such a lens as having a focal length in a certain range and having superior imaging performance. For example, comparing a case where a region of 280×80 microns is uniformly divided in the scribe line direction and a lens is prepared by using a region of 140×80 microns with a case where the region is divided in the widthwise direction and a lens is prepared by using a region of 280×40 microns, there is a difference, about twice, in the number of grating line in the scribe line direction. Usually, the imaging performance (resolution) of a zone plate is better with a larger number of grating line and a smaller size of a minimum ring width.

Where marks are arrayed in the widthwise direction of the scribe line and the alignment is made by using a lens power in the scribe line direction perpendicular thereto, distortion of light on the sensor is reduced by the reduction in wavefront aberration and, therefore, the resolution and the precision can be improved easily.

Figure 45:
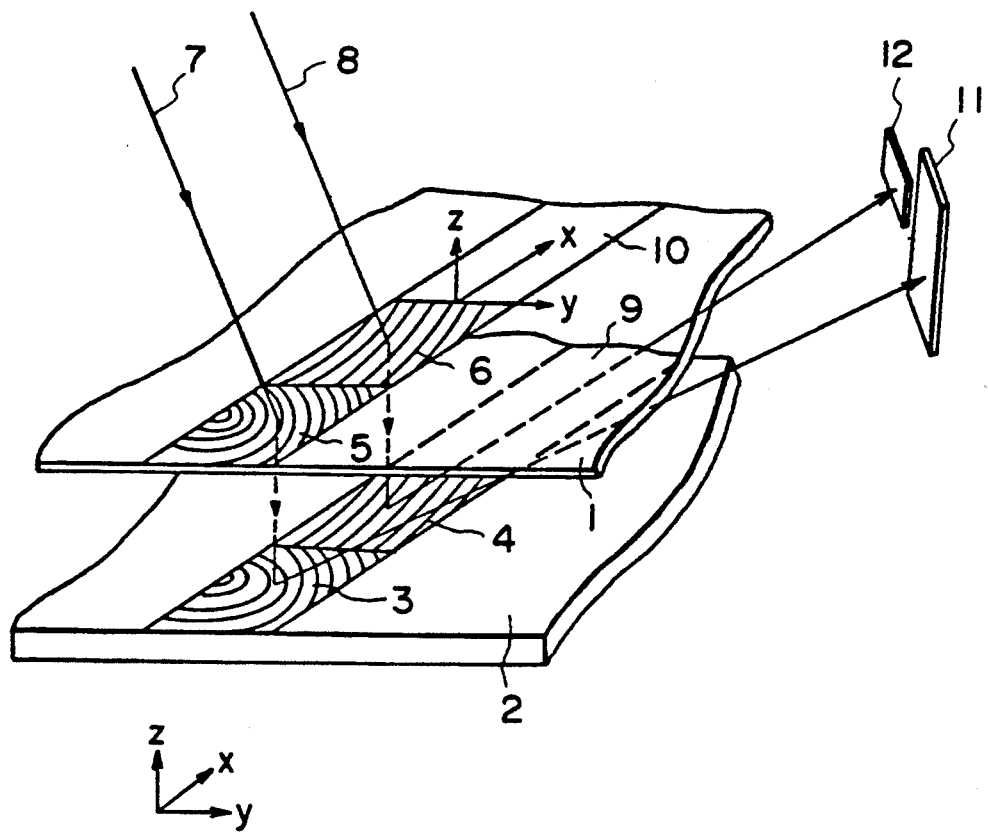
FIG. 45 is a schematic view showing a major portion of a 23rd embodiment.

FIG. 45 is a schematic view of a 23rd embodiment of the present invention. In this figure, elements corresponding to those in the 20th embodiment shown in FIG. 40 are denoted by same reference numerals.

A description will now be provided of a first and second alignment marks 5 and 3 and a first and second reference marks 6 and 4 used in this embodiment.

The alignment marks 3 and 5 and the reference marks 6 and 4 are provided by Fresnel zone plates (or grating lenses) each having a predetermined focal length. Each mark has a size of 140 microns in the lengthwise direction of the scribe line and 50 microns in the widthwise direction (y direction) of the scribe line.

In this embodiment, both the alignment light 7 and the reference light 8 are incident on the mask 1 at an angle of incidence of 10 degrees, with the projection upon the mask 1 surface being perpendicular to the scribe line direction (x direction).

The alignment light 7 and the reference light 8 incident on the mask 1 with a predetermined angle are influenced by the lens functions of the grating lenses 5 and 6, respectively, each being transformed into a convergent or divergent light which is emitted from the mask 1 so that its chief ray has a predetermined angle with respect to the normal of the mask 1.

The alignment light 7 and the reference light 8 having been transmissively diffracted by the first alignment mark 5 and the first reference mark 6, respectively, are collected at points on the wafer 2 surface which are at a distance of 238.0 microns vertically below these marks. The alignment mark 5 and the reference mark 6, in this case, have a focal length of 268 microns. Also, the mask 1 and the wafer 2 are spaced by a distance 30 microns.

The light transmissively diffracted by the alignment mark 5 is influenced by a concave or convex lens function of the second alignment mark 3 on the wafer 2 surface, and is collected at a point on the sensor 11 surface. On this sensor 11 surface, at this time, the light is incident with any relative positional deviation (i.e. any misalignment of the axes) of the alignment marks 5 and 3 being magnified, with a result of corresponding shift of the position of the center of gravity of the incident light.

The present embodiment is so set that, when the mask 1 and the wafer 2 have no relative positional deviation (i.e. when the alignment marks 5 and 3 on the mask 1 and the wafer 2 just provide a coaxial system), the chief ray of the alignment light emitting from the wafer 2 has an angle of emission of 5 degrees, and the projection of the emitted light on the wafer 2 surface extends with an angle 2 degrees to the widthwise direction (y direction) of the scribe line and, additionally, the emitted light is focused on the sensor 11 surface which is disposed at a predetermined position, for example, at a height of 20 mm from the wafer 2 surface.

On the other hand, the light transmissively diffracted by the first reference mark 6 is incident upon the second reference mark 4 on the wafer 2 surface and emanates therefrom with an angle of emission of 8 degrees and with the projection upon the wafer 2 surface extending with an angle −2 degrees to the widthwise direction of the scribe line, and finally it is focused at a point on the surface of the sensor 12 (second detecting means). At this time, the lateral shift of the imaging point is magnified by the second reference mark at a magnification different from that for the alignment light.

As regards the reference light coming by way of the reference marks 6 and 4, the position of the center of gravity of such a light incident upon the sensor 12 surface is constantly fixed, even if the relative position of the mask 1 and the wafer 2 changes.

It will be understood from the foregoing that, in this embodiment, the grating lens of the first reference mark 6 provided on the mask 1 surface has a relatively long focal length, from the passage of the reference light through the mask 1 surface to the impingement on the sensor 12 surface of the reference light being reflected by the wafer 2 surface.

As in the 20th embodiment, the one-dimensional sensors 11 and 12 for the detecting the positional deviation are provided on a common base plate which is disposed so that the normal of the surface of the base plate substantially coincides with a bisector of the emission angles of the signal light and the reference light from the wafer.

Also, each mark for the reference light and each mark for the signal light are set in accordance with equations (1) and (2) described with reference to the 20th embodiment.

As a result of this, any inclination of the wafer surface and any change in the position of the alignment head relative to the mask-wafer system, can be cancelled by a signal from the sensor, receiving the reference light, as representing the position of the center of gravity and by a signal from the sensor, receiving the signal light, as representing the center of gravity of that light. Therefore, substantially the same positional deviation detecting performance as obtainable with the 20th embodiment is obtained.

Figure 46:
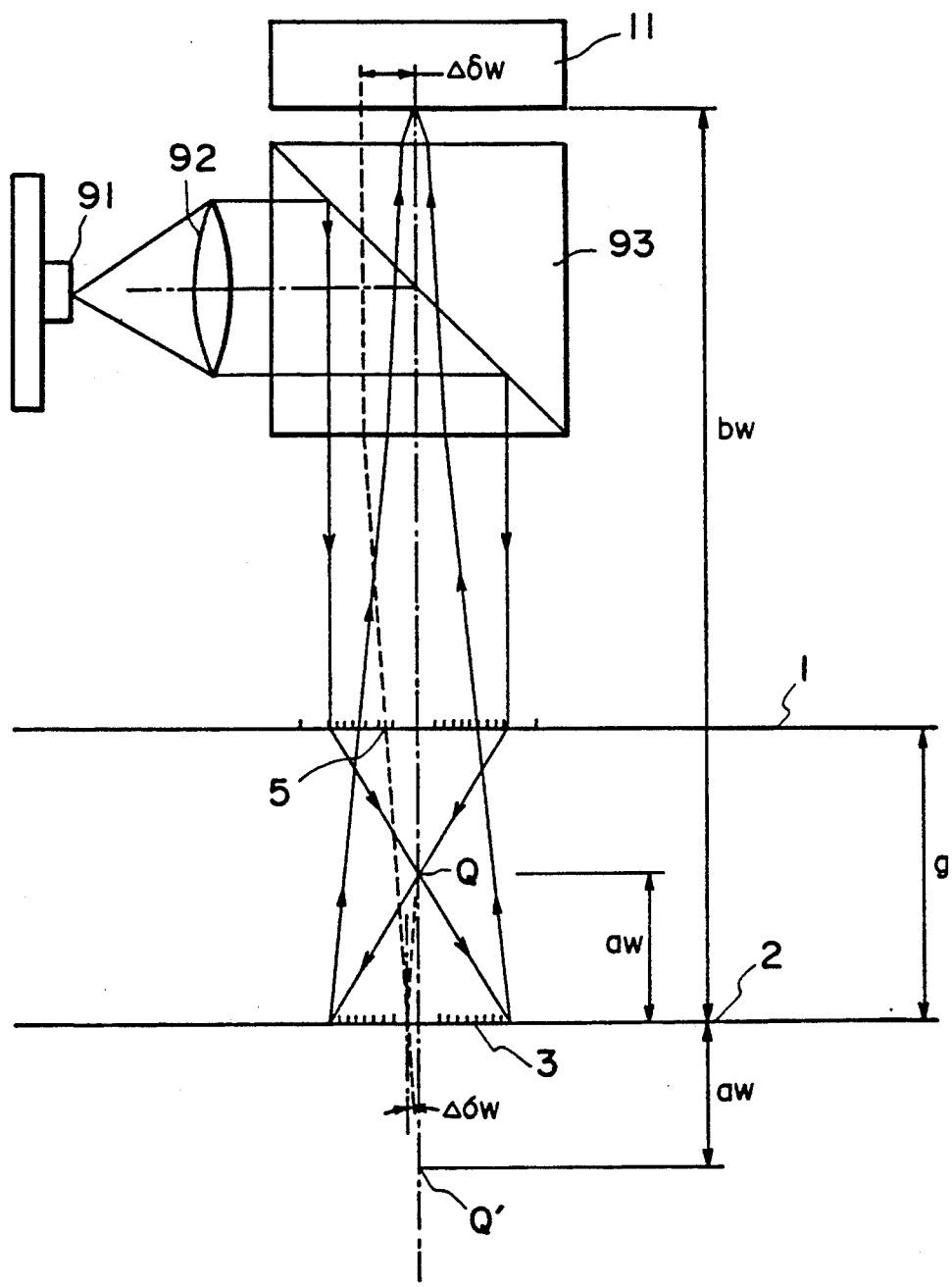
FIG. 46 is a schematic section showing a major portion of a 24th embodiment.

FIG. 46 is a schematic view of a 24th embodiment of the present invention. This embodiment is specifically concerned with an alignment system, usable in a semiconductor device manufacturing exposure apparatus of so-called "proximity type", for aligning a mask and a wafer. Particularly, only those portions of the apparatus related to an alignment light are illustrated and will be described below.

In FIG. 46, the same reference numerals are assigned to those elements corresponding to the elements shown in FIG. 40. In FIG. 46, a mask 1 and a wafer 2 correspond respectively to a first and second objects which are to be aligned relatively to each other. A mask alignment pattern 5 provided on the mask 1 surface corresponds to a first physical optic element, while a wafer alignment pattern 3 provided on the wafer 2 surface corresponds to a reflection type second physical optic element.

In this example, light emanating from a light source 91 is collimated into a parallel light by means of a lens system 92, and the collimated light after passing a half mirror 93 illuminates the mask alignment pattern 5. The mask alignment pattern 5 is formed by a zone plate having a function for focusing the received light at a point Q which is in front of the wafer. The light focused at the point Q advances divergently and impinges on the wafer alignment pattern 3. The wafer alignment pattern 3 is formed by a reflection type zone plate by which the incident light is reflected and focused, after passing the mask and the half mirror 93, upon a detecting surface 11. Thus, an alignment signal is obtained. A reference signal by a reference light is obtainable in a similar manner.

Like the 20th to 23rd embodiments, the reference light in this embodiment is so incident upon the sensor that the position of the center of gravity of the incident light is displaced by an amount which correspond to the positional deviation between the mask and the wafer but which is magnified by the magnification different from that for the alignment light.

In these embodiments, alignment marks are so disposed that correct alignment is discriminated when an alignment mark of a wafer is exactly positioned right underneath an alignment mark of a mask. However, in a direction perpendicular to the direction with respect to which any positional deviation is to be detected, the alignment mark of the mask and the alignment mark of the wafer may be set with deviation. For example, in the case where, as in the 22nd embodiment shown in FIG. 44, any positional deviation between a mask and a wafer is to be detected with respect to the direction of a scribe line on a mask, an alignment mark of a wafer may be provided with its minor direction deviation in the y direction, wherein the scribe line extends in the x direction. By disposing an alignment mark of a wafer in that manner, the angle of incidence of light emitted from an alignment head and impinging on the mask surface, can be made small, with the result that the grating pitch can be made longer than the wavelength ($\lambda=0.83$ micron) of the alignment light. Therefore, the manufacture of alignment marks can be facilitated.

Also, it is not always necessary to use sensors of one-dimensional type, as in the 20th to 23rd embodiments, for the detection of the positional deviation. Two-dimensional gravity position detecting sensor such as, for example, a two-dimensional CCD sensor, may be used.

In the foregoing embodiments, each mark may have a refracting power which can be appropriately selected in accordance with the gap between the first and second objects 1 and 2 and the magnitude of the apertures of the first and second alignment marks or the first and second reference marks.

For example, where the spacing is sufficiently large as compared with the apertures of the first and second alignment marks, a "convex-convex system" is preferable. On the other hand, where the spacing is not sufficiently large as compared with the apertures, a "concave-convex system" such as shown in FIG. 47 or a "convex-concave system" such as shown in FIG. 48 is preferable.

Figure 47:
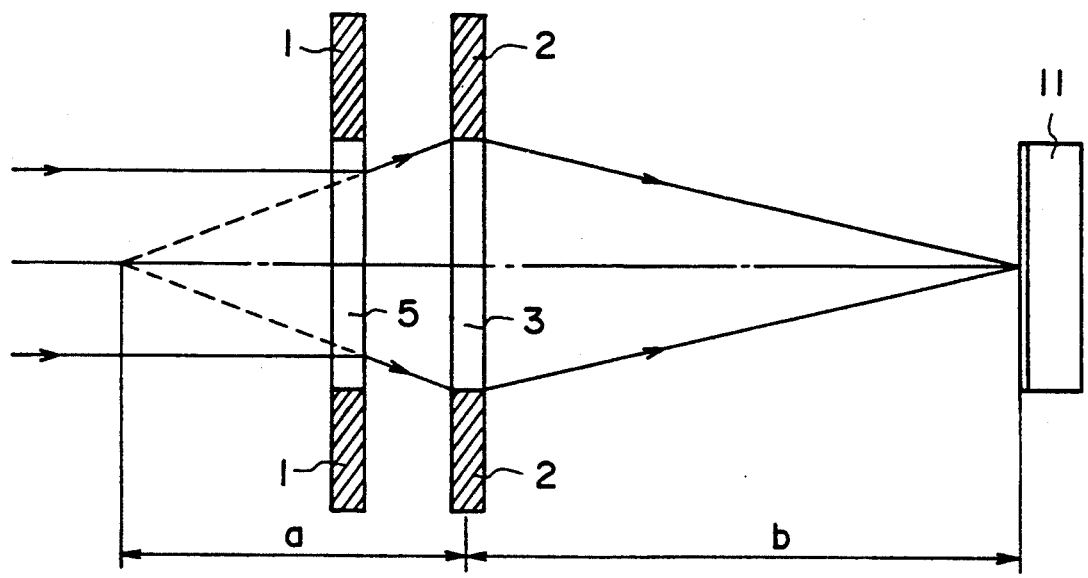
FIG. 47 is a principle view for explicating the manner of diffraction in a case where refracting powers of marks provide a "concave-convex system".

Further, in the case where the aperture of a second alignment mark can be made larger than that of a first alignment mark, as in the FIG. 47 example, a "concave-convex system" such as shown in the same Figure is preferable. On the other hand, where the aperture of a first alignment mark can be made larger than that of a second alignment mark, as in the FIG. 48 example, a "convex-concave system" such as shown in the same Figure is preferable.

Figure 48:
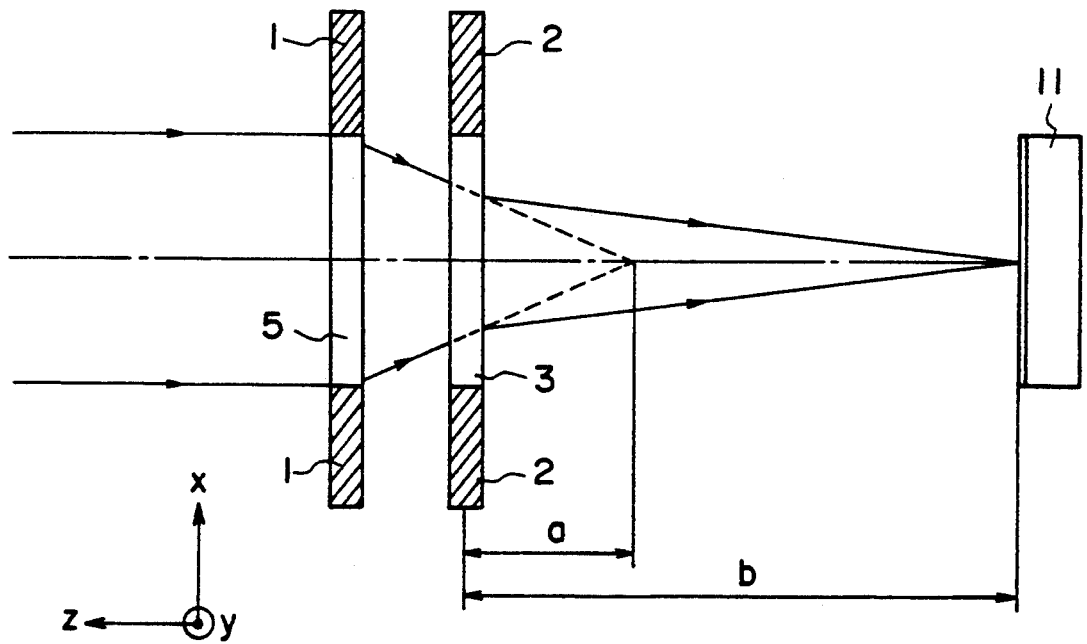
FIG. 48 is a principle view for explicating the manner of diffraction in a case where refracting powers of marks provide a "convex-concave system".

Each of FIGS. 47 and 48 illustrates the manner of diffraction of light rays as viewed in the y direction, the illustration being made by depicting a Fresnel zone plate 3 of a wafer 2 as a transmissively diffracting element which is equivalent to a reflectively diffracting type. Actually, the lights as illustrated on the light side of the wafer 2, in the drawing, emanate in the direction opposite to the illustrated, in regard to the z-direction component.

While in these embodiments a transmission type physical optic element is used for the mask side and a reflection type physical optic element used for the wafer side, the invention is not limited thereto and the objects of the present invention can be accomplished by using any one of transmission type and reflection type physical optic elements, for the mask and the wafer.

In some embodiments to be described below, two lights which are displaceable in opposite directions as a result of a relative positional deviation between a mask and a wafer are used to ensure high-precision position detection free from the effect of inclination.

The principle and basic structure of these embodiments will now be explained, taken in conjunction with FIG. 49. In this Figure, a first object 1 and a second object 2 are provided with alignment marks 5 and 3, respectively, for the purpose of obtaining a first signal light. Similarly, alignment marks 6 and 4 are provided on these objects 1 and 2, for the purpose of obtaining a second signal light. The alignment marks 3–6 each has a function of a physical optic element, having one-dimensional or two-dimensional lens action. Reference numerals 7 and 8 denote the first and second alignment signal lights, respectively. First and second detecting portions 11 and 12 are adapted to detect the first and second signal lights, respectively. For convenience in explanation, these detecting portions are assumed as being disposed at the same optical distance L from the object 2. Also, it is assumed that the interval between the objects 1 and 2 is $\delta$, the focal lengths of the alignment marks 5 and 6 are $f_{a1}$ and $f_{a2}$, the relative positional deviation between the objects 1 and 2 is $\epsilon$, and the displacements of the centers of gravities of the first and second signal lights at that time, from an aligned state, are $S_1$ and $S_2$. Further, for convenience, it is assumed that the alignment light impinging on the object 1 is a plane wave and the signs are such as illustrated.

Each of the displacements $S_1$ and $S_2$ of the centers of the gravities of the signal lights can be detected geometrically as an intersection of a straight line, connecting the focal point $F_1$ ($F_2$) of the alignment mark 5 (6) and the center of the optical axis of the alignment mark 3 (4), with the light receiving surface of the detecting portion 11 (12). Therefore, in order that the displacements $S_1$ and $S_2$ of the centers of gravities of the signal lights resulting from a relative positional deviation between the objects 1 and 2 are in opposite directions, the signs of the optical imaging magnification of the alignment marks 3 and 4 may be set mutually inverse with respect to each other, as will be clear from FIG. 49. Quantitatively, $$S_1 = -(L-f_{a1}+\delta)/(f_{a1}-\delta) \epsilon;$$

$$S_2 = -(L-f_{a2}+\delta)/(f_{a2}-\delta) \epsilon$$

Thus, they can be defined as deviation magnification $\beta_1 = S_1/\epsilon$ and $\beta_2 = S_2/\epsilon$. It is seen therefrom that, to provide deviation magnifications of opposite signs, the following relationship should be satisfied:

$$(L-f_{a1}+\delta)(f_{a2}-\delta)/(L-f_{a2}+\delta)(f_{a1}-\delta) < 0$$

One practically suitable condition is:

$$L >> |f_{a1}|$$

$$f_{a1}/f_{a2} < 0$$

$$|f_{a1}| > \delta$$

$$|f_{a2}| > \delta$$

Namely, the structure is such that, as compared with the focal lengths $f_{a1}$ and $f_{a2}$ of the alignment marks 5 and 6, the distance L to the detecting portion is large but the interval $\delta$ between the objects 1 and 2 is small and, further, one of the alignment marks is formed into a convex lens while the other is formed into a concave lens.

Figure 49:
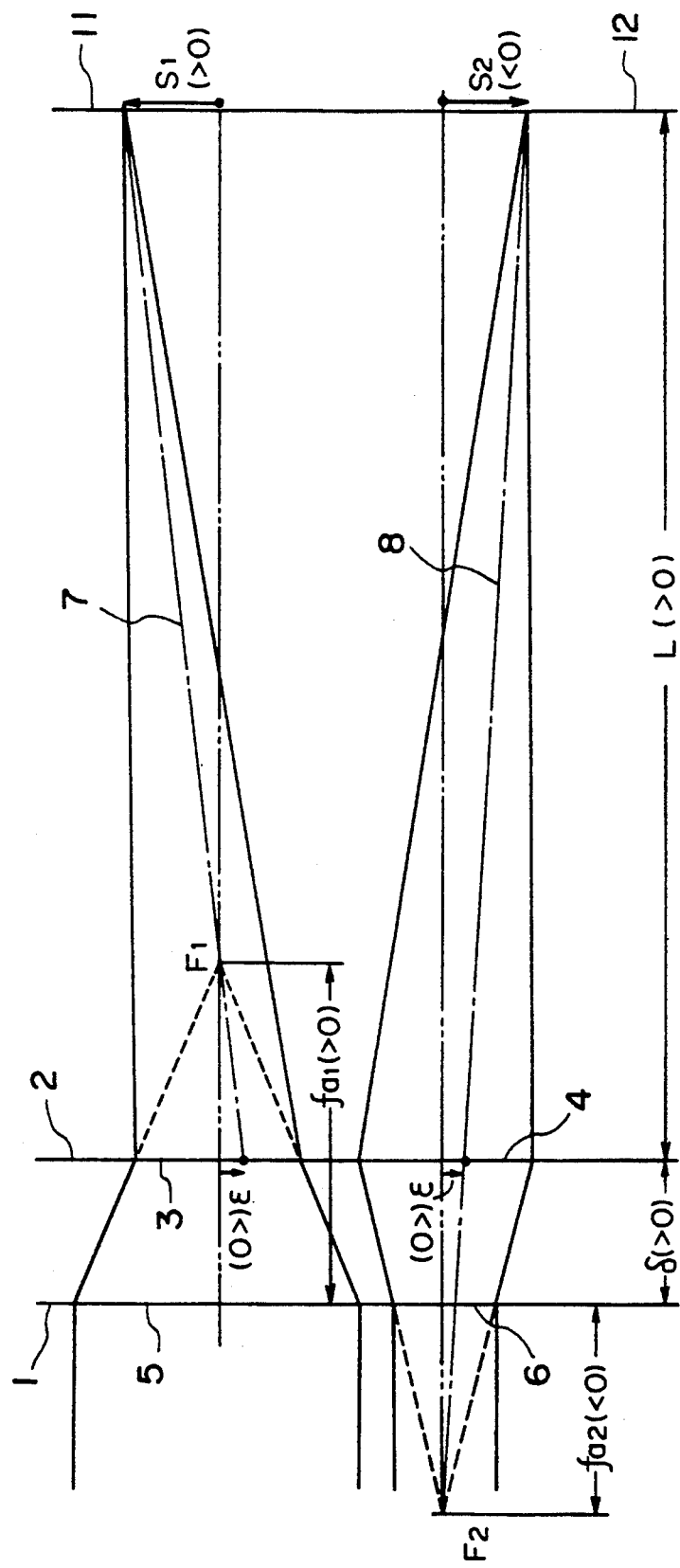
FIG. 49 is a principle view of a 25th embodiment.

In the upper part of FIG. 49, the incident light is transformed into a convergent light by the alignment mark 5 and, before the light reaches its convergent point $F_1$, the light impinges on the alignment mark 3 by which it is imaged upon the first detecting portion 11. The focal length $f_{b1}$ of such an alignment mark 3 is set to satisfy the following lens equation:

$$1/(f_{a1}-\delta)+1/L = -(1/f_{b1})$$

Similarly, in the lower part of FIG. 49, the incident light is transformed by the alignment mark 6 into a divergent light having an origin of divergency at a point $f_2$ which is on the light entrance side. The divergent light is imaged upon the second detecting portion 12 through the alignment mark 4 whose focal length $f_{b2}$ is set to satisfy the following equation:

$$1/(f_{a2}-\delta)+1/L = -(1/f_{b2})$$

Under the described structural conditions, the imaging magnification of the alignment mark 3 to the focus of the alignment mark 5 is positive, as is clear from the drawing. Thus, the displacement $\epsilon$ of the object 2 and the shift $S_1$ of the light spot upon the detecting portion 11 are in opposite directions, and the deviation magnification $\beta_1$ as defined in the foregoing is negative. Similarly, the imaging magnification of the alignment mark 4 to the point image (virtual image) of the alignment mark 6 is negative, and the displacement $\epsilon$ of the object 2 and the shift $S_2$ of the light spot upon the detecting portion 12 are in the same direction and the deviation magnification $\beta_2$ is positive.

As a result, for a relative deviation $\epsilon$ between the objects 1 and 2, the displacements $S_1$ and $S_2$ of the signal lights from one system comprising the alignment marks 5 and 3 and another system comprising the alignment marks 6 and 4, respectively, are in the directions opposite to each other.

Several practical embodiments will now be explained, while using some of the drawings.

Figure 50:
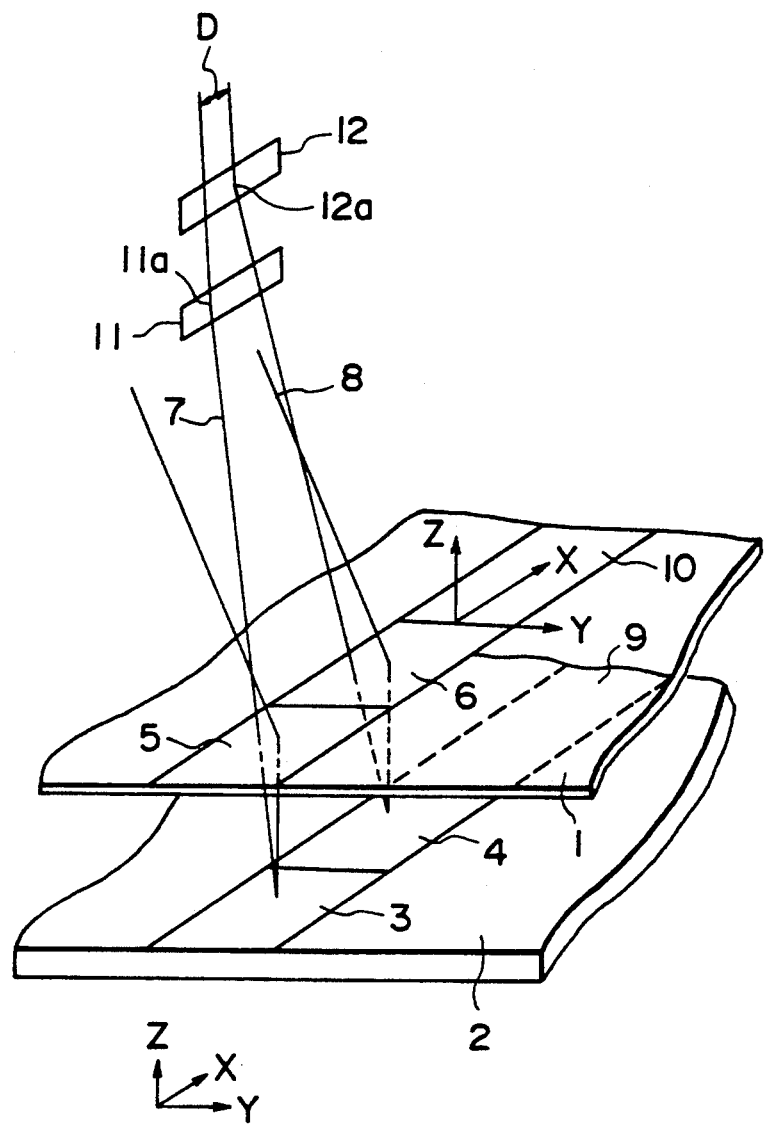
FIG. 50 is a schematic view showing a major portion of the 25th embodiment.

FIG. 50 is a schematic view showing a major portion of a 25th embodiment of the present invention. Like numerals as in FIG. 49 are assigned to corresponding elements.

First object 1 is a mask in this embodiment, and a second object 2 is a wafer to be aligned with the mask 1, in this embodiment. Alignment marks 3, 4, 5 and 6 each is formed by a grating lens such as, for example, a one-dimensional or two-dimensional Fresnel zone plate. The paired alignment marks 3 and 4 and the paired alignment marks 5 and 6 are provided on scribe lines 9 and 10, respectively, defined on the wafer 2 surface and the mask 1 surface, respectively. First light 7 and second light 8, both of which are signal lights, are emitted by a light source disposed within an alignment head, not shown, and each light is collimated into parallel light of a predetermined beam diameter.

In this embodiment, the lights 7 and 8 are incident upon the alignment marks 5 and 6 on the mask 1 surface, each at a predetermined angle. The incident lights are transmissively diffracted by these marks and, thereafter, are reflectively diffracted by the alignment marks 3 and 4 on the wafer 2 surface and, finally, are received by sensors 11 and 12, respectively. Each of these sensors 11 and 12 detects the position of the center of gravity of such an alignment light incident thereupon. By using output signals from the sensors 11 and 12, any positional deviation between the mask 1 and the wafer 2 is detected.

Next, the alignment marks 3-6 will be described.

The alignment marks 3-6 are formed by Fresnel zone plates (or grating lenses) having different focal lengths. Practically suitable size of each mark is 50-300 microns in the direction of the scribe line 9 or 10 and 20-100 microns in the widthwise direction (y direction) of the scribe line.

In this embodiment, each of the lights 7 and 8 is incident on the mask 1 surface at an angle of incidence of about 17.5 degrees with respect to the mask 1, with the projection upon the mask 1 surface being perpendicular to the scribe line direction (x direction).

Each of the alignment lights 7 and 8 incident on the mask 1 at a predetermined angle is influenced by the lens function of the grating lens 5 or 6 and is transformed into a convergent or divergent light which emanates from the mask 1 with its chief ray extending at a predetermined angle with respect to the normal of the mask 1.

The lights 7 and 8 transmissively diffracted by the alignment marks 5 and 6 have a convergent point and an origin of divergency which are at distances 184.7228 microns vertically below from the wafer 2 surface and 188.4545 microns vertically above the wafer 2 surface respectively. The focal lengths of the alignment marks 5 and 6 at this time are 214.7228 microns and −158.4545 microns. Also, the spacing between the mask 1 and the wafer 2 is 30 microns. The first signal light is transmissively diffracted by the alignment mark 5 and then is influenced by a concave lens function of the alignment mark 3 on the wafer 2 surface and, finally, is focused on the sensor 11 surface (first detecting portion). At this time, on this sensor 11 surface, the light is incident with the amount of shift of the position of incidence corresponding to the positional deviation between the alignment marks 5 and 3 in the x direction (namely, the amount of deviation between optical axes of these marks), and with the amount being magnified by a predetermined magnification. The shift of the position of the center of gravity of the incident light is detected by the sensor 11.

This embodiment is arranged such that, when the positional deviation between the mask 1 and the wafer 2 is zero (namely, the alignment mark 5 on the mask 1 and the alignment mark 3 on the wafer 2 just provide a coaxial system), the angle of emission of the chief ray of the alignment light from the wafer 2 is 130 degrees, with the projection of the emitted light upon the wafer 2 surface being perpendicular to the widthwise direction (y direction) of the scribe line, and the emitted light is focused upon the sensor 11 surface which is disposed at a predetermined position, for example, at a height of 18.657 mm from the wafer 2 surface.

The second signal light is transmissively diffracted by the alignment mark 6, and the position of light spot at the imaging point is displaced by the alignment mark 4 on the wafer 2 surface, in a direction different from that of the first signal light. More specifically, the second signal light emanates from the wafer 2 surface at an emission angle 70 degrees, with the projection upon the wafer 2 surface being perpendicular to the widthwise direction of the scribe line, as compared with the first light, and is focused upon the sensor 12 surface (second detecting portion).

With the lens parameters of the alignment marks described above, the displacements of the centers of gravities of the two signal lights upon the detecting portions, each is of a magnitude one hundred (100) times larger than the amount of relative positional deviation between the objects 1 and 2, and additionally they are in opposite directions. That is, the deviation magnifications are $\beta_1 = -100$ and $\beta_2 = +100$. The amounts of displacements of the two lights upon the sensors 11 and 12, in the x direction, provide the amount of alignment error. The interval D between the spots 11a and 12a of the two lights in the x direction, in an occasion where the alignment error is zero, can detected preparatorily and, from any difference of the value of a current interval between the two spots 11a and 12a from the interval D, the alignment error in the x direction can be detected.

The arrangement of the present embodiment by which two signal lights are displaceable in opposite directions, provides various advantages. An example is that, even if the spacing δ between the objects 1 and 2 is set at a relatively rough precision, the deviation magnifications $\beta_1$ and $\beta_2$ necessary for calculation of the positional deviation can be in a mutually compensative relationship in the two optical paths. Namely, in an occasion where, under the above-described lens parameters, the spacing δ between the objects 1 and 2 is enlarged from 30 microns to 33 microns, then $\beta_1$ changes −100 to −101.684, while $\beta_2$ changes from +100 to +98.464. As a result, the overall magnification $|\beta_1| + |\beta_2|$ used for detecting the positional deviation changes from 200 to 200.148. Thus, in terms of proportion, the magnification change is reduced to 0.0741%. This means that, in consideration of the fact that there have occurred changes of 1.68% and 1.53% for the two signals, the magnification change is suppressed to about 1/20. It is seen therefrom that the present embodiment has specific advantages particularly when it is applied to such a system wherein the spacing or gap setting is difficult, because in a direct sense it allows enlargement of a detecting range or improvement of detection accuracy.

Another example is that any error due to the inclination of the objects 2 and 3 can be compensated for in principle.

If, in this embodiment, the wafer surface 2 is inclined by 1 mrad within the x-z plane in FIG. 50, there occurs on the sensor 11 surface a displacement of center of gravity of the first signal light 7, of an amount of about 37.3 microns. On the other hand, the second signal light 8 has a plane of asymmetry with respect to the signal light 7 which plane is parallel to the x-z plane. Additionally, it travels along an optical path which is of the same length as of that for the signal light 7. Thus, on the sensor 12 surface, the second signal light makes exactly the same displacement of center of gravity as the signal light 7. Therefore, by processing in the sensor system the output signals from the sensors so as to output the difference, in the position of the effective center of gravity, between the signals from the sensors, an output signal from the sensor system is unchanged even if the wafer surface is inclined within the x-z plane.

If, on the other hand, the wafer is inclined in the y-z plane, both of the two signal lights 7 and 8 produce displacement of center of gravity in the widthwise direction of the sensor which is perpendicular to the direction in which the sensor elements are arrayed. However, such a displacement is in the direction perpendicular to the direction of the displacement of the center of gravity of light resulting from the positional deviation, which is to be detected by the sensor, and therefore, such a displacement does not result in an effective alignment error.

Further, when the position of the alignment head, containing therein an alignment light, a light projecting lens system and sensors, is shifted relatively to the mask-wafer system, these lights displaces in a one-to-one relationship. For example, displacement of the head in the y direction relative to the mask by 5 microns causes displacement of the effective center of gravity of the signal light upon the sensor 11 by 5 microns, as well as the displacement of the center of gravity of light upon the sensor 12 by exactly the same amount of 5 microns.

Therefore, the final output of the sensor system, namely a signal representing the difference in the center of gravity between the first signal light and the second signal light is unchanged at all.

Also, any change in the position with respect to the z-axis direction does not result in an essential alignment error, if both the two lights are not used.

Figure 51A:
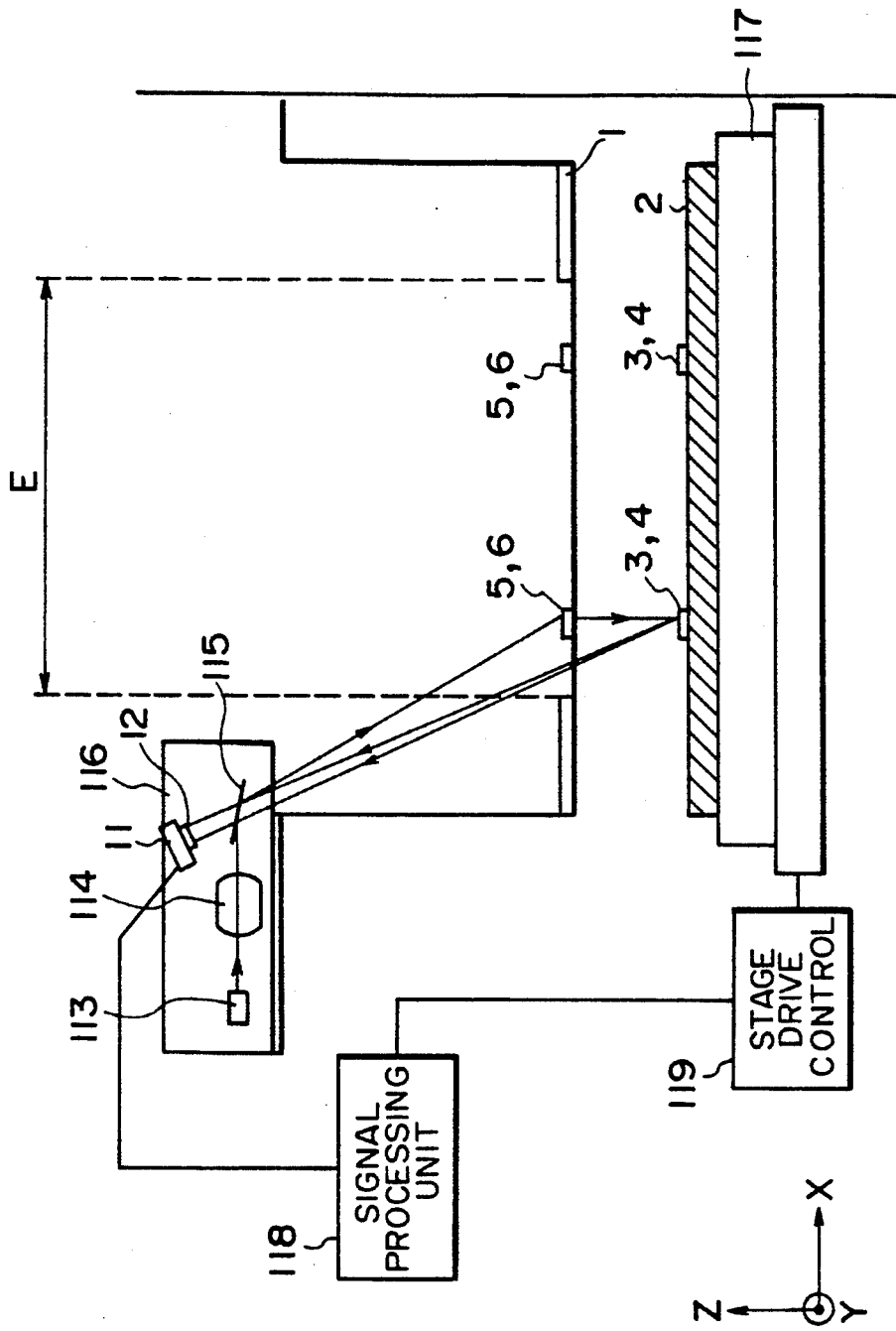
FIG. 51A is a fragmentary and schematic view of a semiconductor device manufacturing exposure apparatus to which the FIG. 50 embodiment is applied.

FIG. 51A illustrates the structure of a portion of a proximity type semiconductor device manufacturing exposure apparatus, where the 25th embodiment is actually applied thereto. Those elements of the FIG. 51A example, not illustrated in FIG. 50, are a light source 113, a collimator lens (or beam diameter changing lens) 114, a projected light deflecting mirror 115, a pickup housing 116, a wafer stage 117, a positional deviation signal processing unit 118 and a wafer stage drive control 119. Reference character E denotes the width or diameter of light used for the exposure. In this embodiment, the relative positional deviation between the mask 1 and the wafer 2 can be detected essentially in the same way as has been described with reference to the 25th embodiment.

An alignment process to be adopted in this embodiment may be such as follows.

In a first example, singles representing the centers of gravities of lights upon the detecting surfaces of the sensors 11 and 12, corresponding to the positional deviation $\Delta\sigma$ between two objects are detected, and in the signal processing unit 118 the positional deviation $\Delta\sigma$ between the objects is detected on the basis of the signals representing the the centers of gravities. Then, the stage drive control 119 operates to move the wafer stage 117 by an amount corresponding to the detected positional deviation $\Delta\sigma$.

In a second example, from the signals outputted by the detectors 11 and 12, the signal processing unit 118 detects such a direction that cancels the positional deviation $\Delta\sigma$. The stage drive control 119 operates to move the wafer stage 117 in that direction, and the above-described operations are repeated until the positional deviation $\Delta\sigma$ comes into a tolerable range.

Figure 51B:
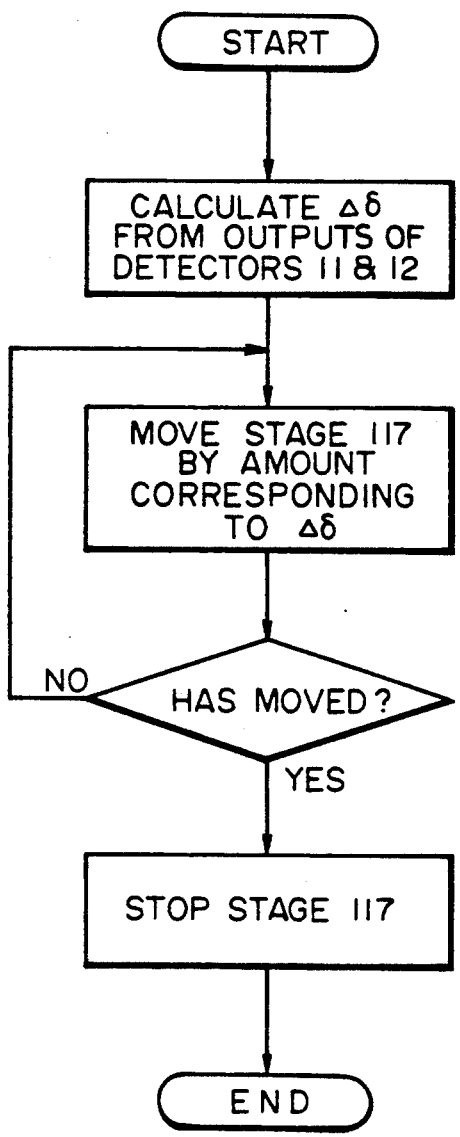
FIGS. 51B and 51C are flow charts, each showing an alignment procedure made in the exposure apparatus of FIG. 51A.
Figure 51C:
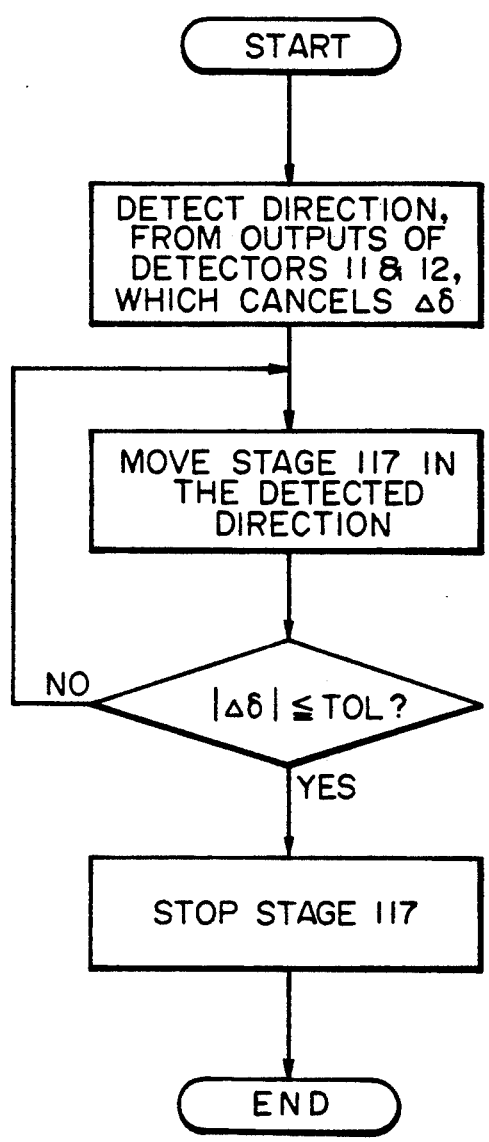

The above-described alignment procedures are illustrated in flow charts of FIGS. 51B and 51C, respectively.

It will be understood from FIG. 51A that the light source 113 projects light from outside of the path of the light for exposure and the sensors 11 and 12, provided outside of the exposure light flux E, receive diffraction lights emanating from the alignment marks 3 and 4 outwardly of the exposure light flux E, for the position detecting purpose.

Thus, with the described structure, it is possible to provide a system in which there is no necessity of retracting the pickup housing 116 at the time of exposure.

Figure 52:
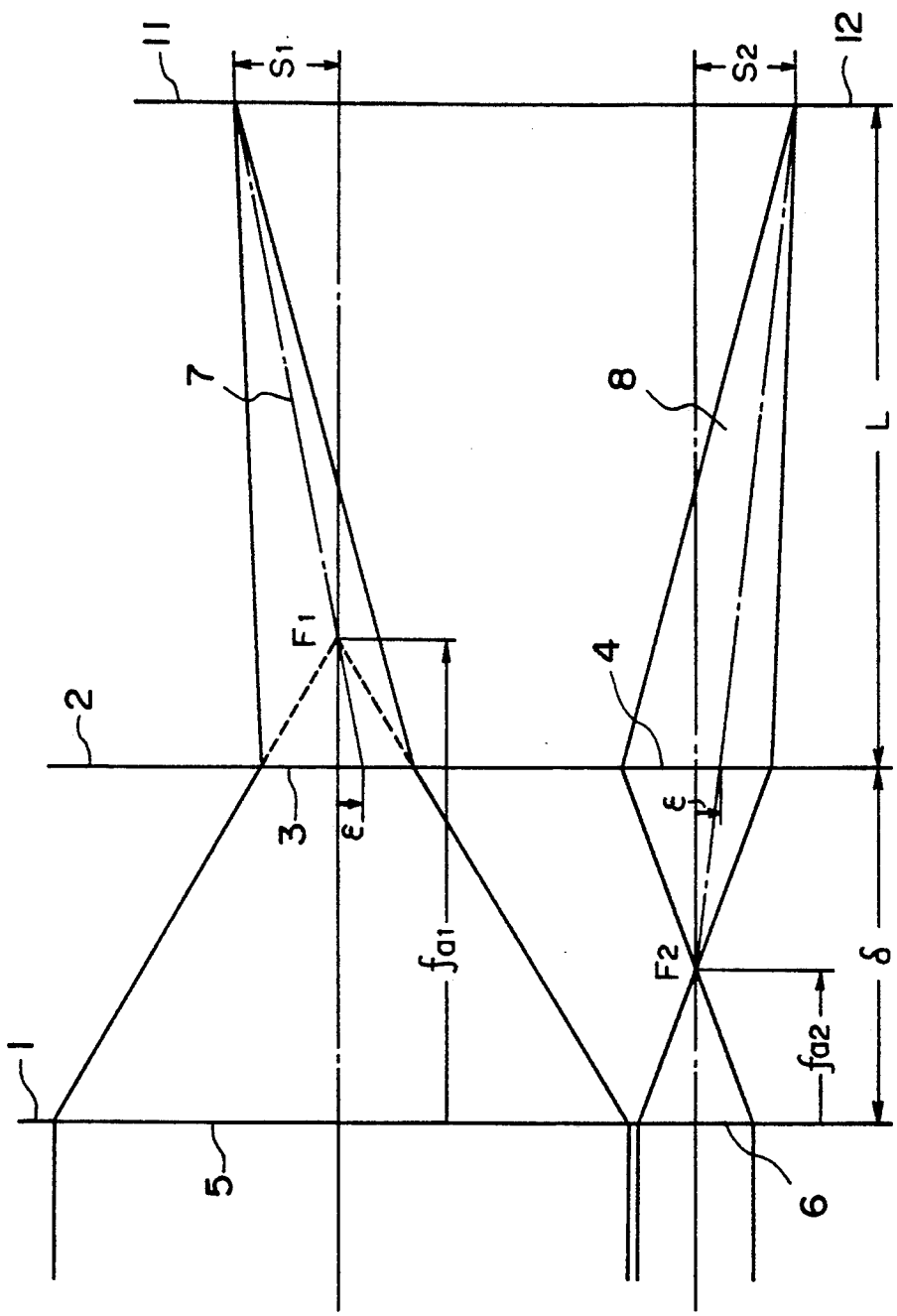
FIG. 52 is a principle view of a 26th embodiment.

In the 25th embodiment, for ensuring deviation magnifications of opposite sides, the alignment marks in the system for the signal light 7 are set to provide a "convex-concave lens system", whereas those in the system for the signal light 8 are set to provide a "concave-convex lens system". However, as illustrated in FIG. 52 (26th embodiment), the system for the signal light 8 may be a "convex-convex system". This arrangement is particularly suitable when the invention is applied to a system wherein the spacing between the objects 1 and 2 is relatively large.

Figure 53:
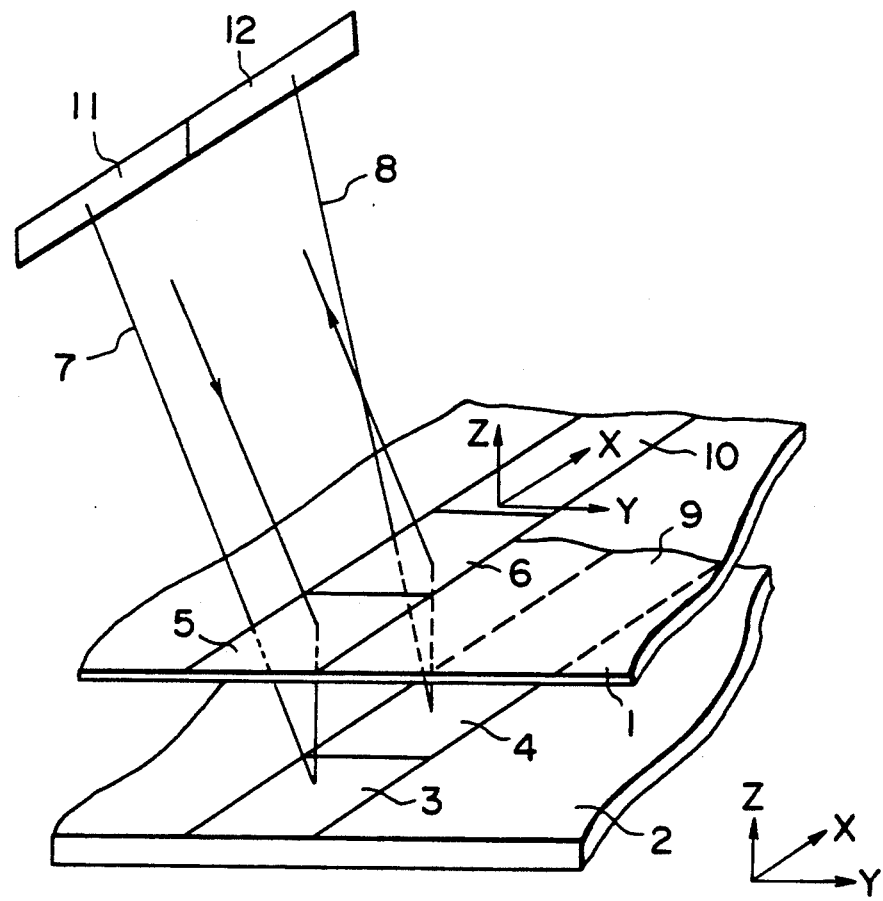
FIG. 53 is a schematic view showing a major portion of a 27th embodiment.

In the 25th embodiment, the two signal lights 7 and 8 are separated. To assure this, the optical arrangement is so structured that, upon accomplishment of alignment, a normal that passes the center of the alignment mark 5(6) on the object 1 and the entering and emanating signal light 7(8) are contained in one and the same plane, while the signal lights 7 and 8 emit at different emission angles of 7 degrees and 13 degrees. More specifically, where the directional cosine of the signal lights emanating from the alignment marks 3 and 4 in the aligned state is expressed by ($\gamma_x$, $\gamma_y$, $\gamma_z$), the signal light 7 can be expressed by (0, $-\sin 7°$, $\cos 7°$) while the signal light 8 can be expressed by (0, $-\sin 13°$, $\cos 13°$), and both $\gamma_x = 0$ (as a matter of course, in the non-aligned state, only the value of $\gamma_x$ changes). This is an advantageous selection under a condition that to set a pupil of a light receiving system in the alignment direction X is difficult but to set the same in a perpendicular direction Z is relatively easy. Alternatively, it is possible to set the arrangement so that the above-described directional cosine in the aligned state is ($\gamma_x$, $\gamma_y$, $\gamma_z$) for the signal light 7 while ($-\gamma_x$, $\gamma_y$, $\gamma_z$) for the signal light 8. In other words, as illustrated in FIG. 53 (27th embodiment), it is possible to obtain two signal lights having different emission angles with respect to the alignment direction X. This is suitable in such a condition that, contrary to the 25th embodiment, to set a pupil of a light receiving system in the alignment direction X is easy but to set the same in the orthogonal direction Z is not easy. Also, since in many cases an unwanted light is included in a plane that contains both the incident light and the normal to the object, the descried is effective to avoid the unwanted light.

Of course, the 25th embodiment and the 27th embodiment may be combined so that different conditions are set for the cosine with respect to the direction of emission of the two signal lights 7 and 8. Further, while in the 25th and 27th embodiments the alignment marks 5 and 6 are juxtaposed in the alignment direction X along the scribe line, they may be juxtaposed in the Y direction, without loss of generality.

According to the 25th to 27th embodiments, the following advantages are attainable, upon alignment of a mask (first object) and a wafer (second object) wherein two series of alignment marks having optical performance described above are provided on the first and second objects, with their deviation magnifications having opposite signs, and wherein the alignment is made by use of lights passing through these marks.

(a) Even if the position of the center of gravity of alignment light shifts due to the inclination of the wafer surface or due to any local inclination such as non-uniformness of an applied resist material or warping caused during the exposure process, detection of relative position of the centers of gravities of the two alignment signal lights ensures correct detection of the positional deviation without being affected by the inclination of the wafer surface.

(b) Even if the position of the center of gravity of alignment signal light upon the sensor changes due to the shift of the position of the alignment head relative to the mask, detection of the relative position of the centers of the gravities of the two alignment signal lights assures correct detection of the positional deviation between the mask and the wafer without being affected by the displacement of the alignment head.

(c) Further, even if the position of the center of gravity of signal light upon the alignment sensor changes in the direction with respect to which the alignment is to be detected, as a result of any change in the gap between the mask and the wafer, detection of the relative position of the centers of gravities of two alignment signal lights ensures correct detection of the positional deviation without being affected by the variation in the gap.

Figure 54B:
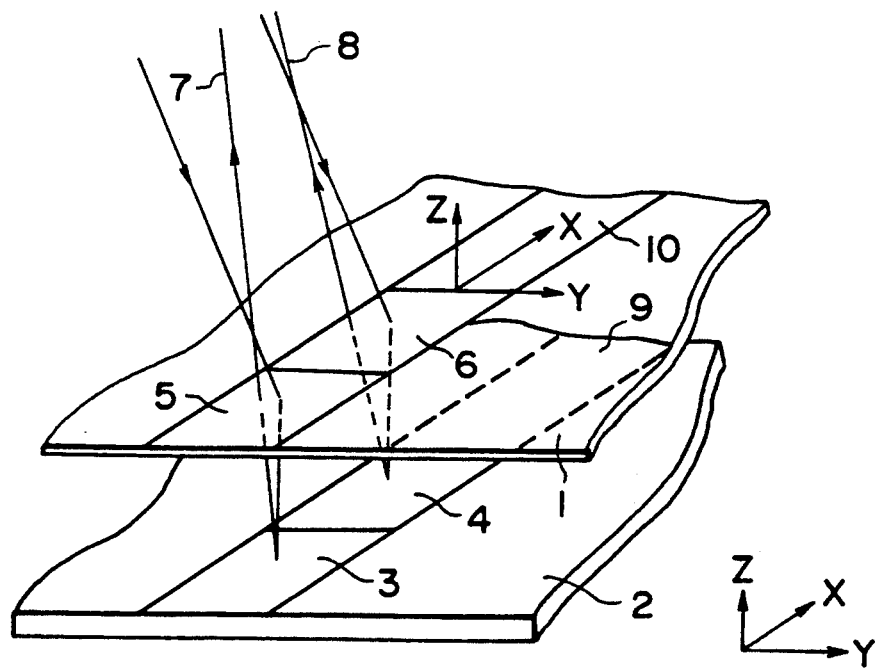
FIGS. 54A and 54B are schematic views, respectively, showing a major portion of a 28th embodiment.
Figure 54A:
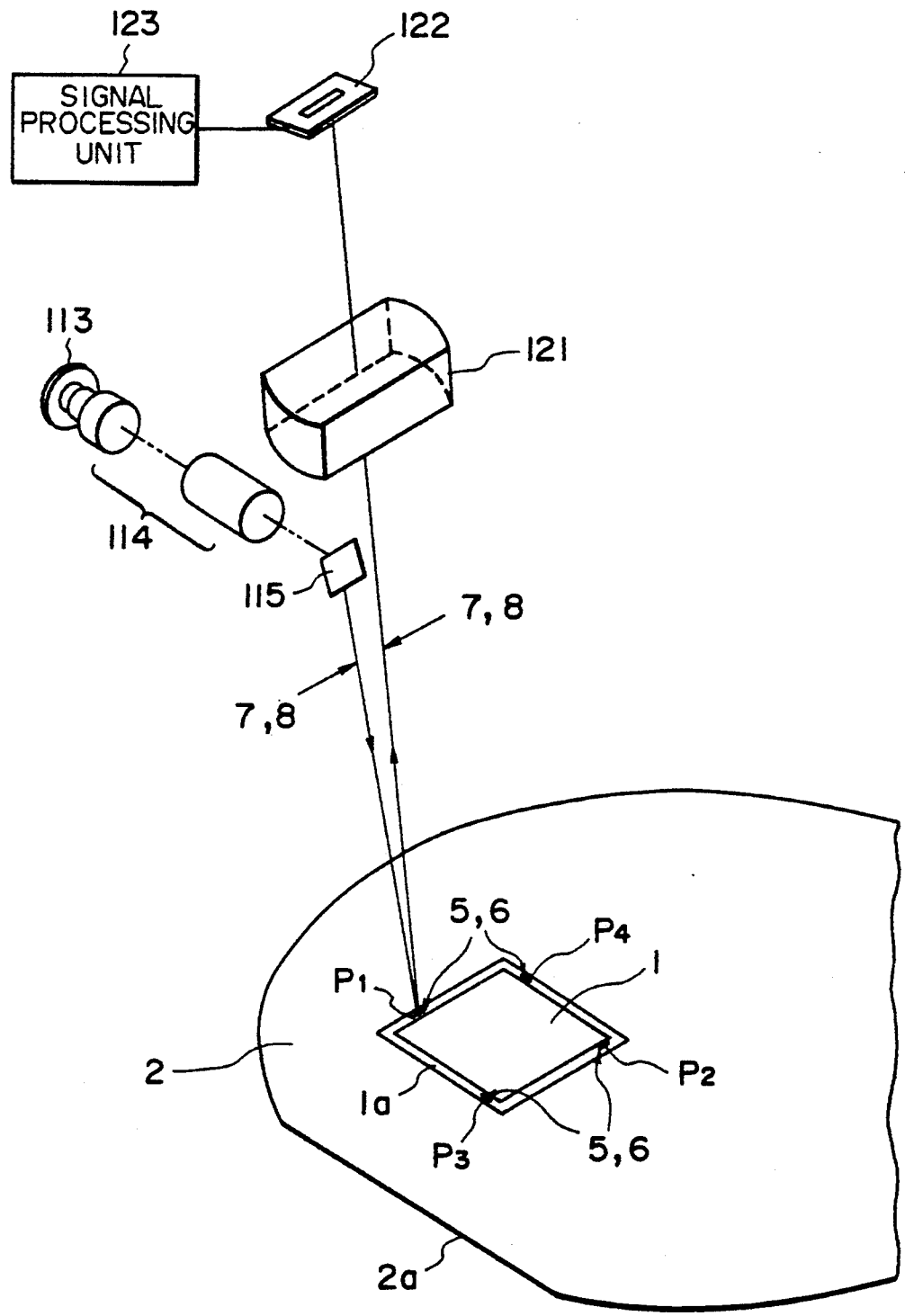

FIG. 54A illustrates the structure of a position detecting device according to a 28th embodiment of the present invention, and FIG. 54B is a schematic view showing a major portion thereof. Elements similar to those in FIG. 50 are denoted by same reference numerals.

In this embodiment, lights (signal lights) 7 and 8 are emitted from a light source 113, each being collimated into a parallel light of a predetermined beam diameter by means of a lens system 114. The optical path is bent or deflected by a mirror 115.

Examples of light source usable in this embodiment are: a light source such as a semiconductor laser, a He-Ne laser, an Ar laser or otherwise that can emit a coherent light; a light source such as a light emitting diode that can emit an incoherent light; and so on.

The first and second detecting portions 11 and 12 in the FIG. 49 example are replaced by one sensor (photoelectric converting element) 122 in this embodiment, which sensor may comprise, for example, a one-dimensional CCD sensor, for receiving the lights 7 and 8.

In this embodiment, the lights 7 and 8 are incident upon alignment marks 5 and 6 on a mask 1 surface, each at a predetermined angle. The incident lights are transmissively diffracted by these marks and, thereafter, are reflectively diffracted by alignment marks 3 and 4 on a wafer 2 surface and, finally, after being converged by a receiving lens 121 they are received by the sensor 122. Signal processing unit 123 receives an output signal from the sensor 122 and operates to detect the position of the center of gravity of such an alignment light incident thereupon. By using the output signal from the sensor 122, the signal processing unit 123 detects any positional deviation between the mask 1 and the wafer 2.

Next, the alignment marks 3-6 will be described.

The alignment marks 3-6 are formed by Fresnel zone plates (or grating lenses) having different focal lengths. Practically suitable size of each mark is 50-300 microns in the direction of a scribe line 9 or 10 and 20-100 microns in the widthwise direction (y direction) of the scribe line.

In this embodiment, each of the lights 7 and 8 is incident on the mask 1 surface at an angle of incidence of about 17.5 degrees with respect to the mask 1, with the projection upon the mask 1 surface being perpendicular to the scribe line direction (x direction).

Each of the alignment lights 7 and 8 incident on the mask 1 at a predetermined angle is influenced by the lens function of the grating lens 5 o 6 and is transformed into a convergent or divergent light which emanates from the mask 1 with its chief ray extending at a predetermined angle with respect to the normal of the mask 1.

The lights 7 and 8 transmissively diffracted by the alignment marks 5 and 6 have a convergent point and an origin of divergency which are vertically below and vertically above the wafer 2 surface, respectively. The focal lengths of the alignment marks 5 and 6 at this time are 214.426 microns and −156.57 microns. Also, the spacing between the mask 1 and the wafer 2 is 30 microns. The first signal light 7 is transmissively diffracted by the alignment mark 5 and then is influenced by a concave lens function of the alignment mark 3 on the wafer 2 surface and, finally, is focused on the sensor 122 surface. At this time, on this sensor 122 surface, the light is incident with the amount of shift of the position of incidence corresponding to the positional deviation between the alignment marks 5 and 3 in the x direction (namely, the amount of deviation between optical axes of these marks), with the amount being magnified by a predetermined magnification. The shift of the position of the center of gravity of the incident light is detected by the sensor 122.

The second signal light 8 is transmissively diffracted by the alignment mark 6 and is reflectively diffracted by the alignment mark 4 on the wafer 2 surface, in a way to displace the spot position to be formed at an imaging point in a direction different from that by the first signal light, and finally it is focused on the sensor 22 surface. As regards the signal light 8, similar to the signal light 7, the displacement of the position of incidence corresponds to the deviation of axes, the amount being magnified.

Assuming now that the position of the light receiving surface of the sensor 122 on which the lights 7 and 8 are focused is at a distance 18.657 mm from the wafer surface or at such position which is equivalent thereto, the deviation magnifications (each=displacement of the position of incidence/the amount of misalignment of axes) can be set to ×100 in absolute value and also can be set in opposite directions (signs). As a result, a relative positional deviation of 0.005 microns between the mask 1 and the wafer 2 in the x direction causes the change in the interval between the positions of the centers of gravities of two lights, namely the interval of light spots, of an amount of 1 micron. The spot interval is detected to determine the positional deviation between the mask 1 and the wafer 2. At this time, where the effective diameter as a lens of the alignment mark is about 200 microns and if a semiconductor laser of a band 0.8 micron is used as a light source, the diameter of the spot on the sensor surface can be set to the order of approximately 200 microns. Thus, this can be easily discriminated by using conventional processing technique.

Preferably, the interval of the two spots in an aligned state, such as at (C), is set to about 1.5-2.5 mm, for example.

Substantially the same advantageous results as in the 25th-27th embodiments are attainable in this embodiment.

Figure 59:
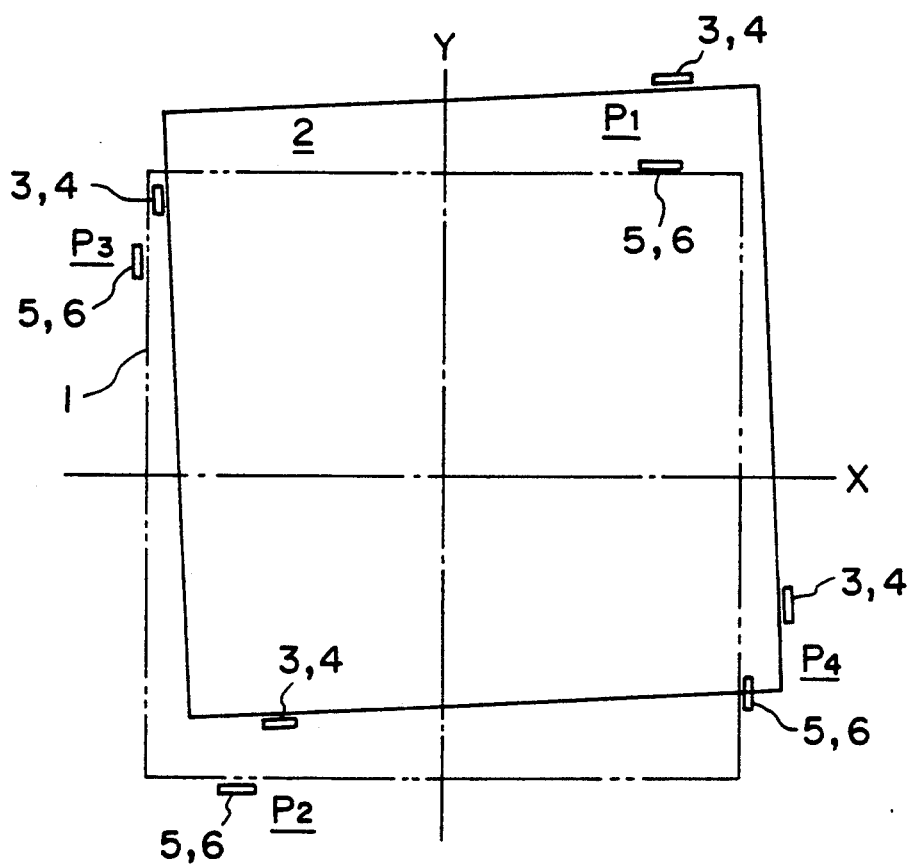
FIG. 59 exemplifies this position of marks in the 28th embodiment.

In this embodiment, as best seen in FIG. 54A and 54B, the alignment marks 3 and 4 (5 and 6) are provided at each of four locations P1, P2, P3 and P4 which are on a scribe line zone that surrounds a rectangular circuit pattern area. Also, at positions corresponding to these four locations, four optical systems each as described and for projecting lights upon these marks and for detecting lights from these marks are set, so as to detect a two-dimensional lateral deviation and a rotation as the positional deviation between the mask and the wafer. This disposition of the marks at this time is exemplified in FIG. 59. Where the device of the present embodiment is used in a semiconductor device manufacturing exposure apparatus, the exposure is made after the detected positional deviation is corrected.

Usually, a wafer 2 is provided with an orientation flat 2a (FIG. 54A) and, by using this, the rotational component can be easily corrected to an order of 30″ at the maximum. Therefore, parallel lateral deviation component is the major component of the deviation.

Figure 55:
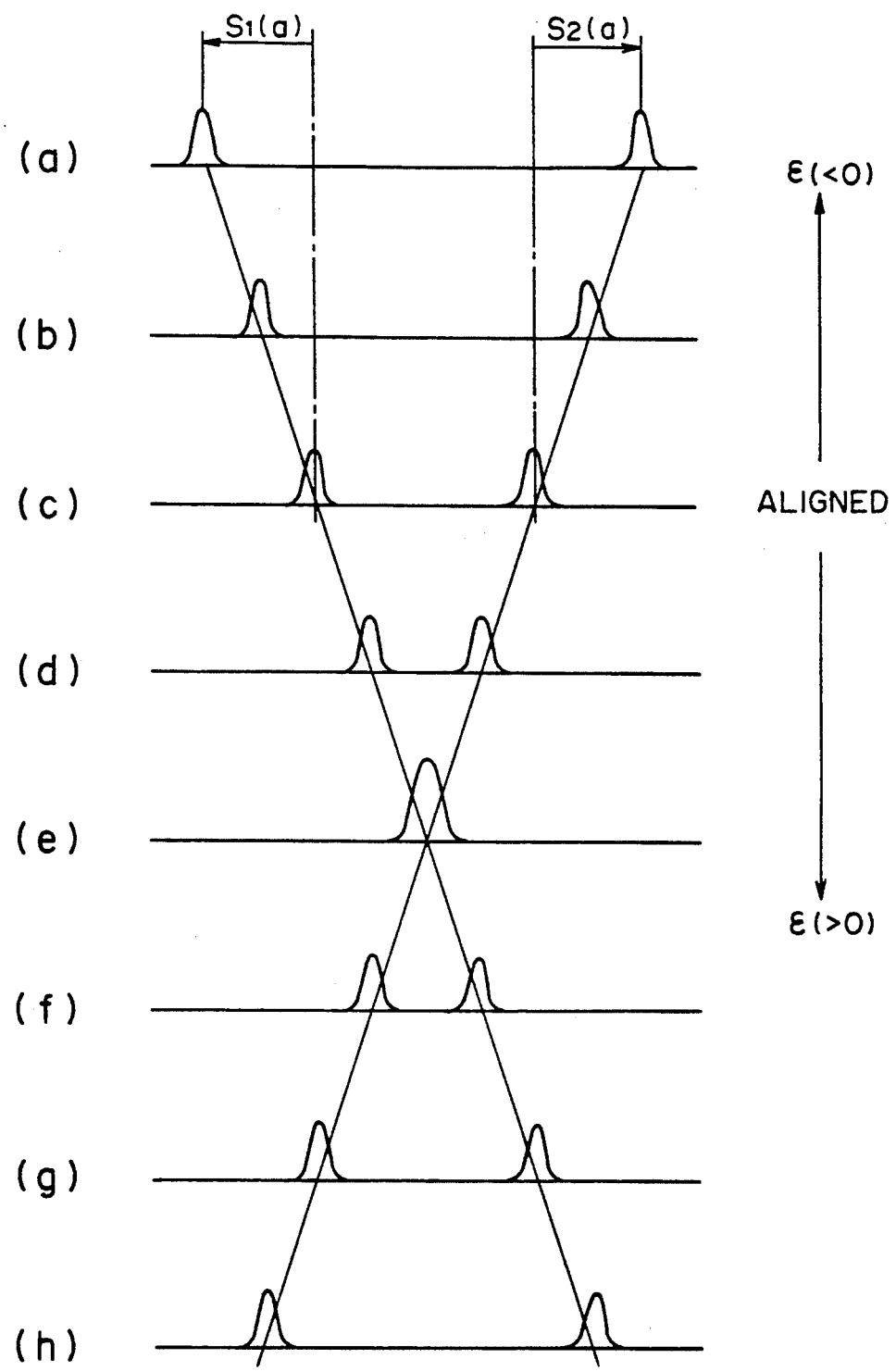
FIGS. 55 and 56 are representations, each for explicating the relationship between a relative deviation and a light intensity distribution on a detecting portion, in the 28th embodiment.

If in the FIG. 49 arrangement the object 1 is spatially fixed and the object 2 is moved downwardly as viewed in the drawing, the interval of the spots on the detecting portion 122 in the aligned state increases. If, on the other hand, the object 2 are moved upwardly in the drawing, the spot interval is narrowed. This is schematically illustrated in FIG. 55. Parts (a)–(h) illustrate a varying light intensity distribution upon the detecting portion in a case where the relative deviation ε between the objects 1 and 2 is monotonously changed. The light intensity distribution in the aligned state in which the objects 1 and 2 is aligned is illustrated at part (c).

It is clear from FIG. 55 that, where the relative deviation is to be detected by using the interval of two spots, the spot interval changes symmetrically on both sides of the state (e). For example, the aligned state (c) and a state (g) of large deviation can not be distinguished from each other, on the basis of the information from one location, e.g. P1.

If, however, two sets of marks are provided at locations P1 and P2, respectively, on the opposite sides of the circuit pattern area wherein all marks are contributable to execute position measurement in one and the same direction and if two corresponding detection systems are arranged to define mutually inversive polarities with respect to the motion of light spots to be formed by these marks, then the true value (actual state of alignment) can be discriminated by examining two detected values each relating to the interval of the light spots formed by associated one set of marks at the location P1 or P2.

Figure 56:
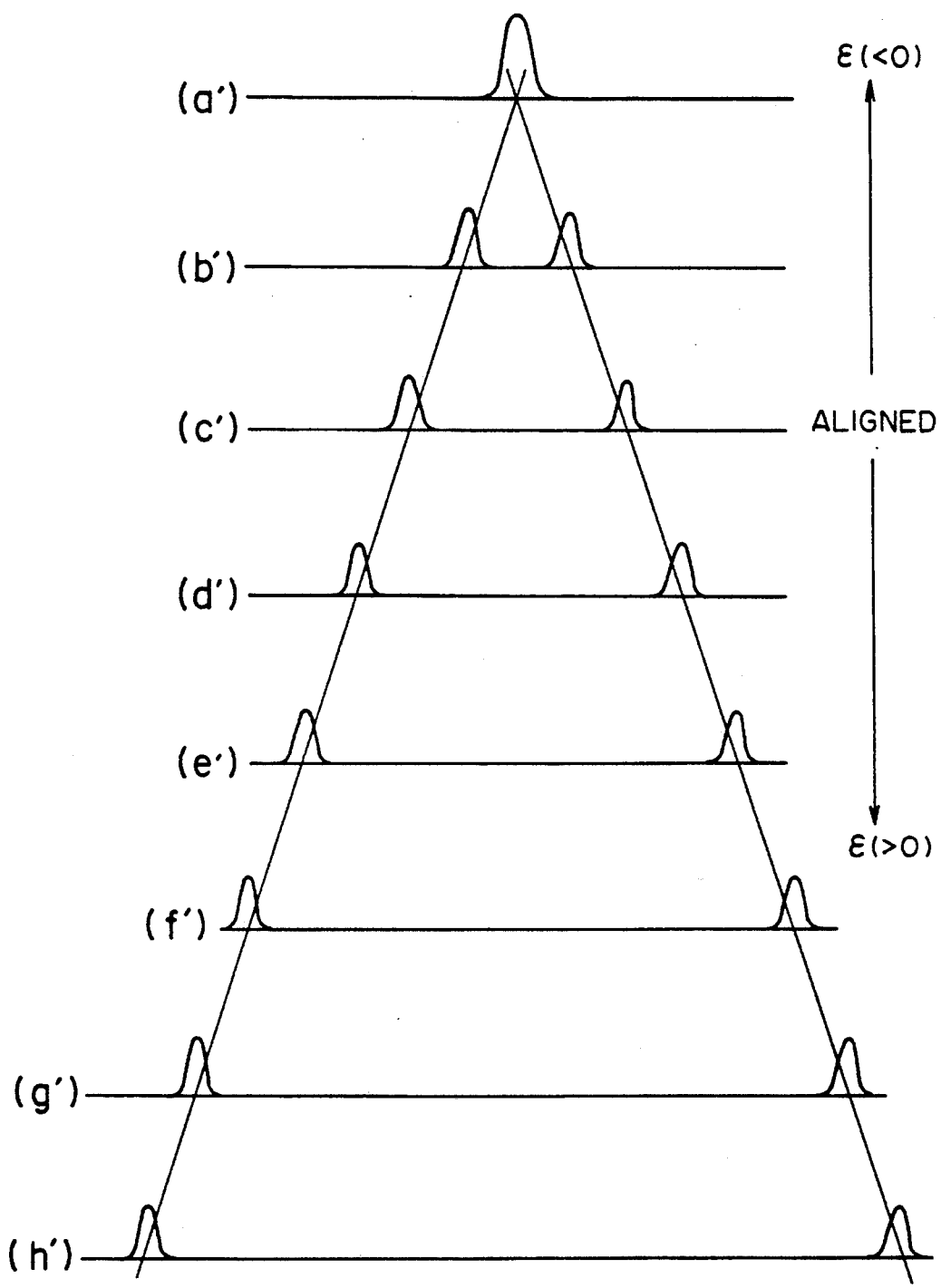
Figure 58:
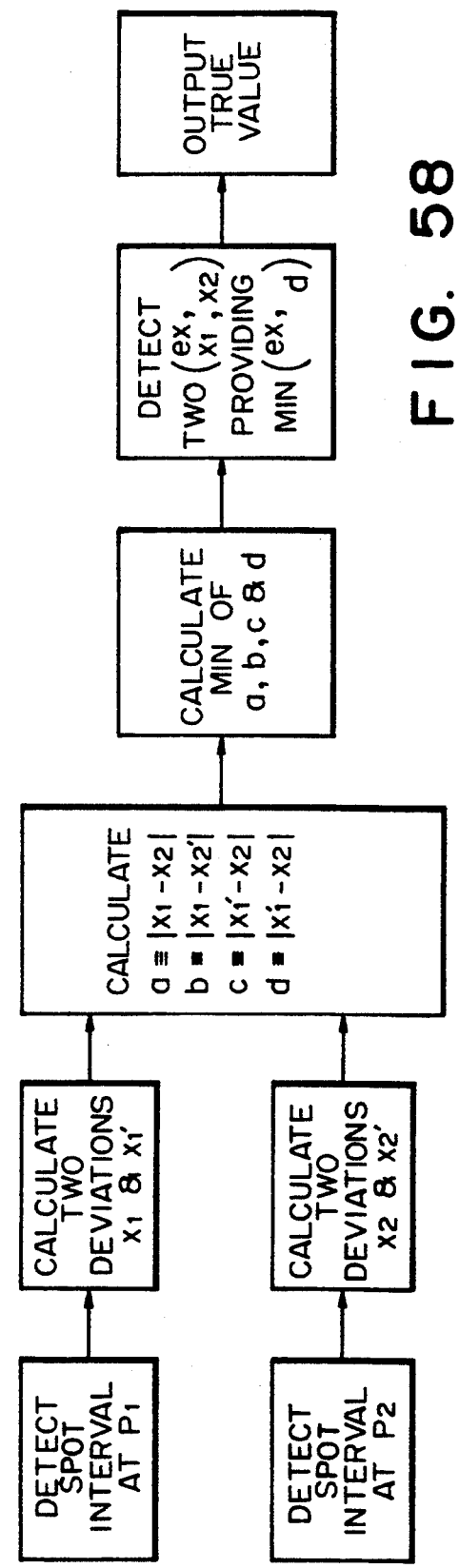
FIG. 58 is a flow chart for explicating calculations to be made for the position detection, in the 28th embodiment.

More specifically, the detection system for the point P1 side may be such that the interval of two spots increases with the deviation between the objects 1 and 2 which is in a certain direction, whereas in the other detection system provided for the point P2 side, the interval of two spots decreases, on the condition that the deviation between the objects 1 and 2 is within a certain range. Such an arrangement can be accomplished simply by shaping the alignment marks at P2 like that in which the optical path for the marks 5 and 3 at the upper part of FIG. 49 and the optical path for the marks 6 and 4 at the lower part are inverted vertically. The action of light spots on the detecting portion resulting therefrom is illustrated in FIG. 56, in relation to FIG. 55. As illustrated in FIG. 55, the difference between the states (c) and (g) can not be discriminated only on the basis of the output of the detection system provided at P1. If, however, the output of the detection system provided at P2 is close to that shown in part (c)' in FIG. 56, it can be discriminated that P1 is in the state of (c). If, as in the state (g)' in FIG. 56, the output is such as can be produced when the spot interval on the sensor surface is large, it can be discriminated that P1 is in the state of (g). This can be plotted in a graph such as shown in FIG. 5. The values from the detection system P1 and the detection system P2, each concerning the spot interval, individually correspond to two different states of deviation, any one of which can not be discriminated if considered singly. If the polarities are mutually inverted, however, only one corresponding deviation can be discriminated, from the outputs of the two detection systems. More specifically, two different values of deviations as can be estimated from one spot interval which can detected by one detection system, are outputted from each detection system, and the differences in overall four combinations of the all four values (x1, x1', x2, x2' in FIG. 58) are calculated. Such a combination of the output values by which the absolute difference is minimum, is discriminated as a true value. The flow of such operation is explanatorily illustrated in FIG. 58.

As a matter of course, for the detection with respect to the direction which is perpendicular to the direction in which the points P1 and P2 play the role of detection, additional two detection systems may be provided at additional two locations P3 and P4, such that the true value of deviation can be detected with respect to the four points, to accomplish detection of the relative position of the objects 1 and 2. In accordance with the result of detection, the mask 1 and the wafer 2 can be aligned by using a well-known type aligning mechanism.

In some embodiments to be described below, a gap measuring light whose position of incidence on a sensor is displaceable with a change in the interval between a mask and a wafer, as well as a reference light whose position of incidence is unchangeable with the change in the interval, are used to ensure high-precision gap or interval measurement without being affected by any inclination.

Figure 60:
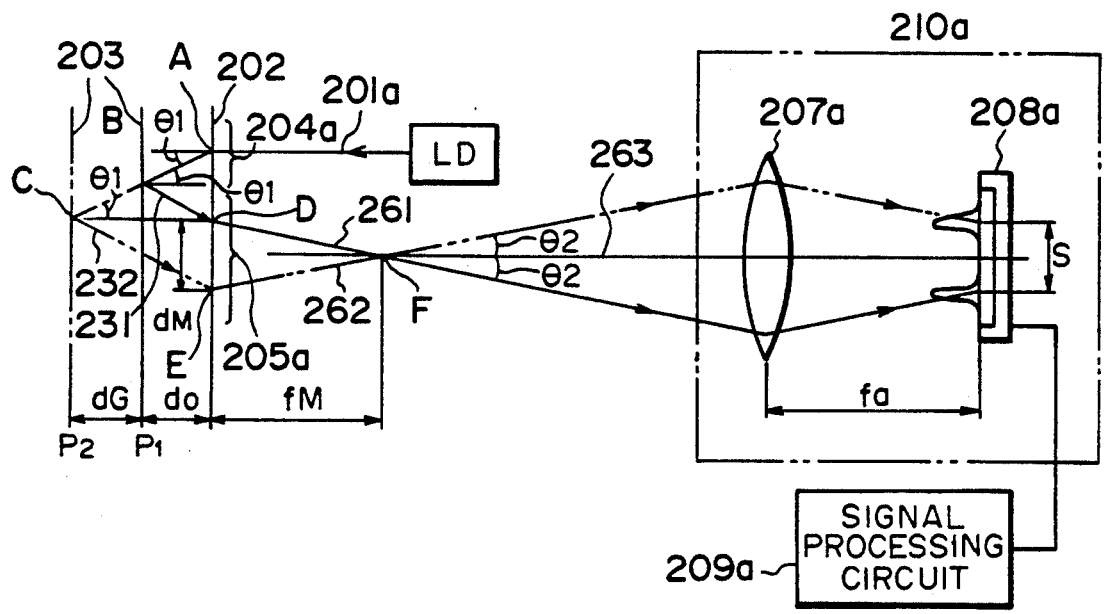
FIG. 60 is a schematic view showing a major portion of a measuring system of a 29th embodiment.
Figure 61:
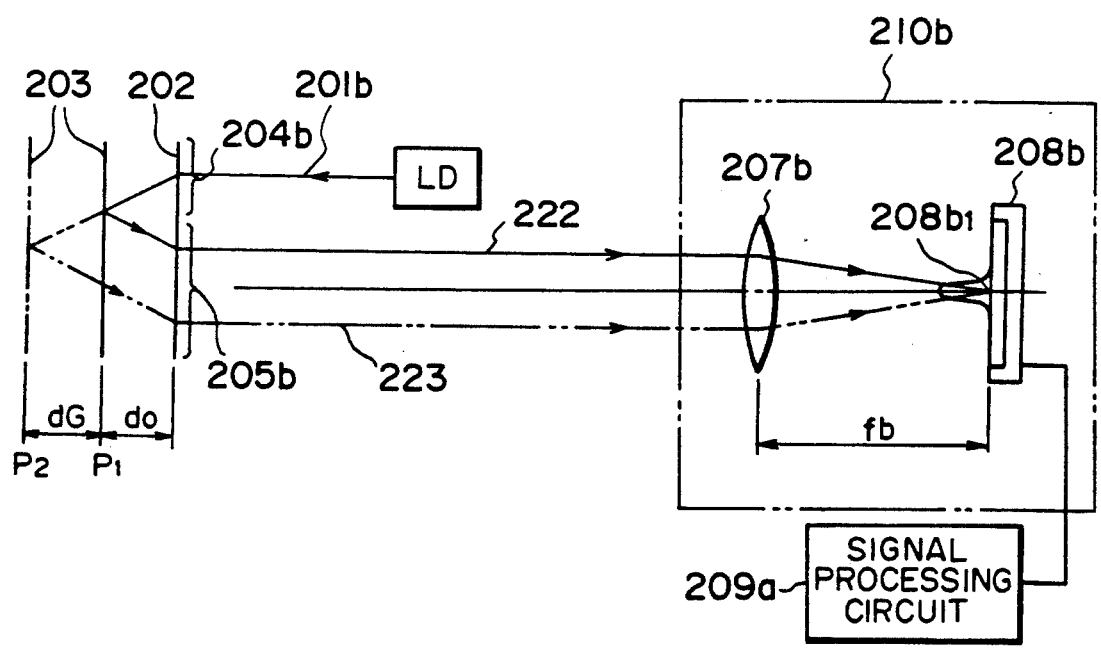
FIG. 61 is a schematic view showing a major portion of a correcting system of the 29th embodiment.

FIGS. 60 and 61 are schematic views, respectively, showing optical arrangements of a measuring system and a correcting system in accordance with a 29th embodiment, in which the invention is applied to a device for measuring the interval between a mask and a wafer, in a semiconductor device manufacturing exposure apparatus.

In this embodiment, the measuring system is such a system for measuring, chiefly, the interval between first and second objects, while the correcting system is such a system for correcting a measurement error due to the inclination of a surface.

In FIGS. 60 and 61, reference numerals 201a and 201b denote lights each from a light source LD such as, for example, a He-Ne laser, a semiconductor laser or otherwise. Of these lights, the light 201a is for the measuring system, while the light 201b is for the correcting system.

First object 202 is a mask, for example, and a second object 203 is a wafer, for example. The mask 202 and the wafer 203 are disposed opposed to each other, as illustrated in FIG. 60, with a spacing $d_0$. Denoted at 204a and 205a are physical optic elements provided in a portion of the mask 202 surface, for light reception and emission in the measuring system. These physical optic elements 204a and 205a each is formed by a diffraction grating or a zone plate, for example. These elements have sizes of about 30×30 microns and 30×60 microns, respectively.

Similarly, denoted at 204b and 205b are physical optic elements provided for light reception and emission in the correcting system. They have sizes of 30×30 microns and 30×60 microns, for example, respectively.

The physical optic element 205a for the light emission in the measuring system has such characteristics that the deflection angle for the emitting light differs depending on the position of incidence of light thereupon and, in this example, it has a diffraction power for focusing an incident parallel light at a distance of 1000 microns. The physical optic element 205b for light emission in the correcting system has such an optical performance that it emanates light at a deflection angle determined in accordance with the angle of incidence of light thereupon, irrespective of position of incidence of light thereupon. Namely, the diffracting power is independent of the position of incidence of light.

Denoted at 207a and 207b are condensing lenses of the measuring system and the correcting system, respectively, which have focal lengths $f_a$ and $f_b$. For example, $f_a = f_b$ = approximately 30 mm.

Denoted at 208a and 208b are light receiving means of the measuring system and the correcting system, respectively, which are disposed at the focal point positions of the condensing lenses 207a and 207b, respectively. Each light receiving means may comprise a line sensor, PSD or otherwise and is adapted to detect the position of light incident thereupon. Signal processing circuit 209a operates to determine the positions of lights incident upon the surfaces of the light receiving means 208a and 208b, by using signals from these light receiving means, and also to detect, by calculation, the spacing $d_0$ between the mask 202 and the wafer 203 and/or the amount of correction in relation to the inclination, which will be described later in detail.

Denoted generally at 210a and 210b are optical probes which contain the condensing lenses 207a and 207b, light receiving means 208a and 208b and, if desired, the signal processing circuits 209a and 209b, respectively. These optical probes are movable relatively to the mask 202 and wafer 203.

The function of the measuring system shown in FIG. 61 will be explained.

It is assumed in this figure that the mask 202 and the wafer 203 are correctly disposed in a parallel relationship.

In this embodiment, the light 201a (whose wavelength $\lambda$ = 830 nm) from a semiconductor laser LD is perpendicularly incident on a point A on the surface of a first Fresnel zone plate (hereinafter simply "FZP") 204a. Then, diffraction light of a predetermined order or orders, diffracted at an angle $\theta 1$ from the first FZP 204a is reflected at a point B (C) on the wafer 203 surface. Of the reflection lights caused thereby, the reflection light 231 is one as obtainable when the mask 203 is located at the position P1 close to the mask 202. The reflection light 232 is one which is obtainable when the wafer 203 is displaced by a distance $d_G$ from the position P1, namely, to the position P2.

Subsequently, the light reflected from the wafer 203 is incident on a point D (E) on the surface of a second Fresnel zone plate (hereinafter simply "FZP") 205a which is provided on the first object 202.

The second FZP 205a has an optical function for changing the emission angle for the emitted diffraction light in accordance with the position of incidence of the light thereupon.

Diffraction light (261, 262) of a predetermined order or orders, diffracted at an angle $\theta 2$ from the second FZP 205a is directed through the condensing lens 207a to the surface of the light receiving means 208a.

The spacing between the mask 202 and the wafer 203 can be detected by calculation, on the basis of detection of the position of light (261, 262) incident upon the light receiving means 208a surface.

In this embodiment, the first and second Fresnel zone plates 204a and 205a provided on the mask 202 each is formed with a preset pitch, and the diffraction angles $\theta$ and $\theta 2$ of the diffraction lights of the predetermined order or orders (for example, ±first order) incident on these plates are detected preparatorily.

The manner of detecting the spacing between the mask 202 and the wafer 203 will now be explained, taken in conjunction with FIG. 60.

As shown in FIG. 60, where the distance to the mask 202 from the intersection F between the diffraction lights 261 and 262 (i.e., the focal length of the physical optic element for the light emission) is denoted by $f_M$, then $$AD = 2d_0 \tan\theta 1$$
$$AE = 2(d_0 + d_G)\tan\theta 1$$
$$\therefore d_M = DE = AE - AD = 2d_G \tan\theta 1 \qquad (6)$$

Also, $$d_M = 2 \cdot f_M \cdot \tan\theta 2 \qquad (7)$$

The amount S of motion of the incident light upon the light receiving means 208a surface is given by:

$$S = 2 \cdot f_a \cdot \tan\theta 2 \qquad (8)$$

Thus, it follows from equations (6), (7) and (8) that $$S = 2 \cdot d_G \cdot f_a / f_M \cdot \tan\theta 1 \qquad (9)$$

The deviation $\Delta_S$ of the incident light upon the light receiving means 208a surface, corresponding to a unit change in the gap between the mask 202 and the wafer 203, namely, the sensitivity $\Delta_S$ is given by:

$$\Delta S = S/d_G = 2 \cdot f_a / f_M \cdot \tan\theta 1 = f_a / f_M \cdot d_M / d_G \qquad (10)$$

In this embodiment, the position S of the light incident upon the light receiving means 208a is detected to thereby determine the distance $d_G$ in accordance with equation (9).

Where the focal length $f_a$ of the condensing lens 207a is 30 mm, and $d_G = 50$ microns, $d_M = 30$ microns and $f_M = 1000$ microns, then from equation (10) the sensitivity $\Delta_S$ in this embodiment is such as follows:

$$\Delta S = 30000/1000 \cdot 30/50 = 18 \ (microns/microns)$$

Thus, for each change of 1 micron in the gap between the mask 202 and the wafer 203, the light (spot) on the light receiving means 208a surface displaces by 18 microns. When a PSD having a position resolution of 0.3 micron is used as the light receiving means 208a, in principle, the gap between the mask 202 and the wafer 203 can be measured with the resolution not greater than 0.02 micron.

In this embodiment, the diffraction light from the second physical optic element 205a, for one particular position of the wafer 203, is incident on the condensing lens 207a at a particular angle with respect to the optical axis 263. Also, the light receiving means 208a is set at the focal point position of the condensing lens 207a. Therefore, the position of incidence of light upon the light receiving means 208a is unchangeable, regardless of which position on the optical axis 263 the optical probe 210 is disposed at and, additionally, even if it is slightly deviated in a direction perpendicular to the optical axis. By this, any measurement error due to the displacement of the optical probe can be suppressed.

It is to be noted here that, in the case where the positional error of the optical probe 210 to some extent is permissible, it is not necessary to dispose the light receiving means 208a exactly at the focal point position of the condensing lens 207a.

Next, the function of the correcting system shown in FIG. 61 will be explained.

Light 201b is incident on the physical optic element 204b provided on the mask 202, for light reception. Diffraction light of a predetermined order or orders, emanating from the physical optic element 204b, is reflected by the wafer 203 surface and, thereafter, is incident on the physical optic element 205b of the mask 202, provided for light emission.

The physical optic element 205b has such optical characteristics that, when parallel light is incident thereon, it emits the light at a certain deflection angle in accordance with the angle of incidence of the light, but independently of the position of incidence of the light.

Figure 63:
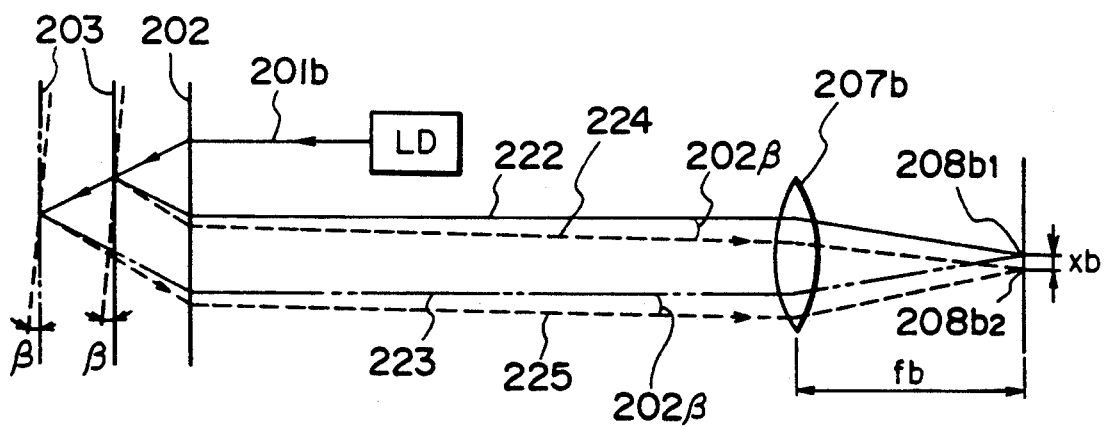
FIG. 63 is a principle view for explicating the optical action in the correcting system of the FIG. 61 example, in the case where an inclination has occurred.

FIG. 63 is a representation explicating the principle of the correcting system. Those lights 222 and 223 as depicted in this Figure by solid lines are the lights incident on the array of light receiving elements 208b in a state where the wafer 203 is not inclined. Those lights 224 and 225 as depicted by broken lines are the lights incident on the same array in a case where the wafer is inclined by $\beta$rad.

If the wafer 203 is not inclined, the lights 222 and 223 emanating from the mask 202 advance in the same direction from the mask 2, regardless of the magnitude of the spacing between the mask 202 and the wafer 203, and are perpendicularly incident on the condensing lens 207b by which they are focused at the focal point position 208b1 which is on the axis of the condensing lens 207b.

If, on the other hand, the wafer 203 is inclined by $\beta$rad, the lights 224 and 225 from the mask 202 are emitted, as shown in FIG. 63, with an inclination of 2$\beta$rad regardless of the magnitude of the spacing between the mask 202 and the wafer 203, and are incident at an angle of 2$\beta$rad with respect to the optical axis of the light receiving lens 207b. Then, they are focused at a point 208b2 which is spaced, by Xb, from the point 208b1 on the array of the light receiving elements 208b, in a direction perpendicular to the optical axis 221.

Where the focal length of the condensing lens 207b is denoted by fb, then $$Xb = fb \cdot \tan 2\beta \approx 2fb \cdot \beta$$

Figure 62:
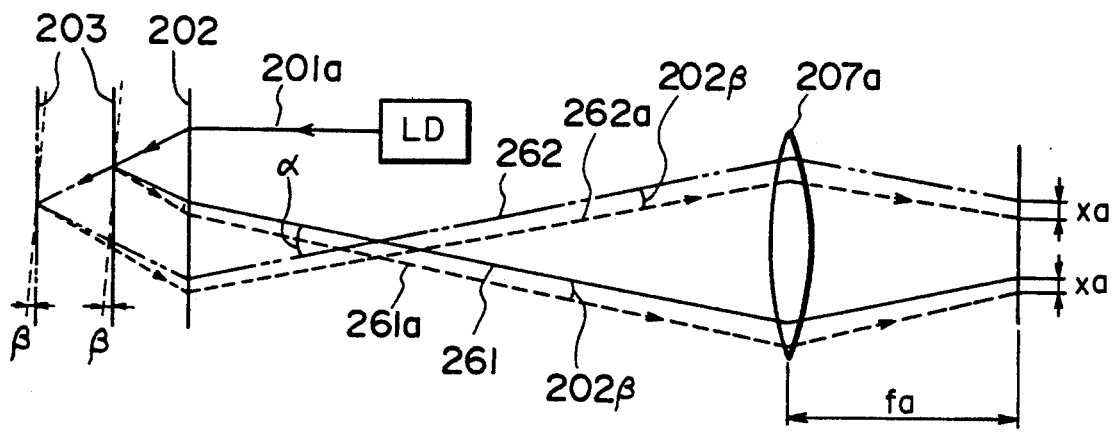
FIG. 62 is a principle view for explicating the optical action in the measuring system of the FIG. 60 example, in the case where an inclination has occurred.

In the measuring system, as depicted by broken lines in FIG. 62, if the wafer 203 is inclined by $\beta$rad, the lights 261a and 261b emit with an inclination of 2$\beta$rad. As a result, a spot is formed at the position which is spaced by Xa from the correct spot position. The distance Xa is given by the following equation:

$$Xa = 2fa \cdot \beta$$

Namely, the correction is made in accordance with the positional information Xb obtainable from the correcting system shown in FIG. 63, that is, $$Xa = fa/fb \cdot Xb$$

In this manner, any inclination error of the mask 202 and the wafer 203 can be corrected, and the surface spacing therebetween can be detected with high precision.

Figure 64:
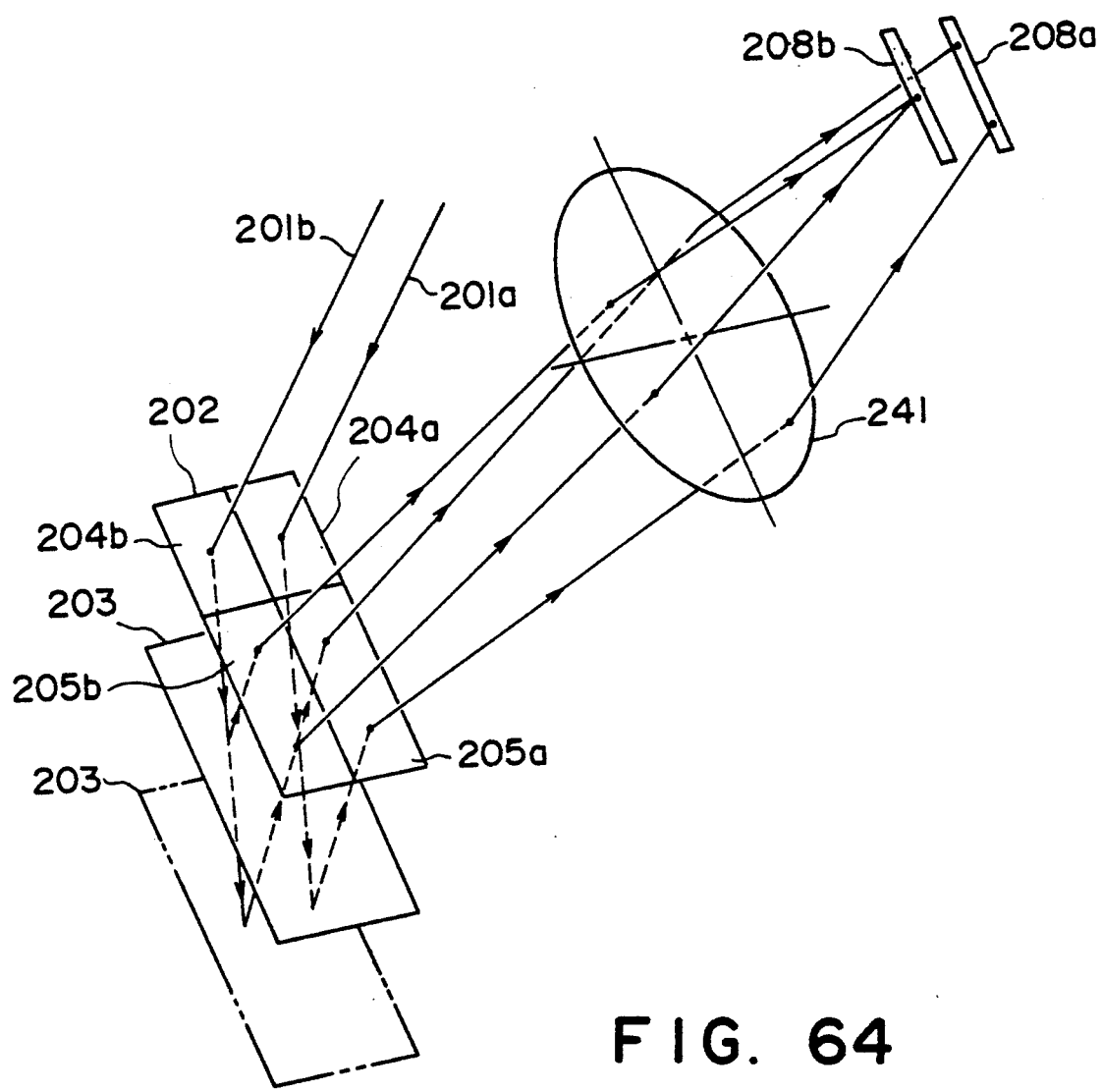
FIG. 64 is a schematic view showing a major portion of a 30th embodiment.

FIG. 64 illustrates a 30th embodiment of the present invention, wherein the condensing lenses 207a and 207b of the measuring system and the correcting system of the foregoing embodiment are replaced by one common condensing lens 241.

Specific numerical examples in the 29th embodiment will be set forth below.

In FIGS. 60-63, it is assumed that the lights 261 and 222 are depicted as the emitted lights in an occasion where the spacing between the mask 202 and the wafer 203 is 50 microns, whereas the lights 262 and 223 are the emitted lights in the case where the spacing is 100 microns.

In the measuring system shown in FIG. 60, the light 261 corresponding to the spacing of 50 microns between the mask 202 and the wafer 203 and the light 262 corresponding to the spacing of 100 microns have a relative deviation on the physical optic element 205a surface of an amount of 30 microns. Therefore, the angle $\alpha$ defined between the lights 261 and 262 is, because the focal length of the physical optic element 205a is 1000 microns, $$\alpha = 2 \cdot \theta 2 = 30/1000 \ (rad)$$

Thus, the deviation S between the lights incident on the array of the light receiving elements 208a is given by:

$$S = fa \cdot \alpha = 30000 \times 3 \times 10^{-2} = 900 \ (micron)$$

That is, there occurs deviation of 18 microns per a gap of 1 micron.

If the position resolution on the array of light receiving elements 208a is 0.3 micron, the resolution $\epsilon$ of measurement of the surface interval is:

$$\epsilon = 0.3/(900/50) = 0.017 \ (micron)$$

When the inclination of the wafer 203 is $\beta$(rad), the displacement X of the spot of light upon the array of light receiving elements 208b surface is "2$\beta$·fa". Therefore, if $$\beta = 1 \times 10^{-4} \ (rad),$$

then, $$X = 2 \times 10^{-4} \times 30000 = 6 \ (microns)$$

Thus, when converted into the surface spacing, there occurs an error of 0.33 micron.

Since the correcting system is arranged so that the light is displaced only by the inclination $\beta$, independently of the surface spacing. Therefore, by detecting the deviation 6 microns of the light spot position on the array of light receiving elements 208b and by using the thus detected value as a correction value, the surface spacing between the mask 202 and the wafer 203 can be measured at high precision, e.g., a precision of 0.02 micron.

Figure 65:
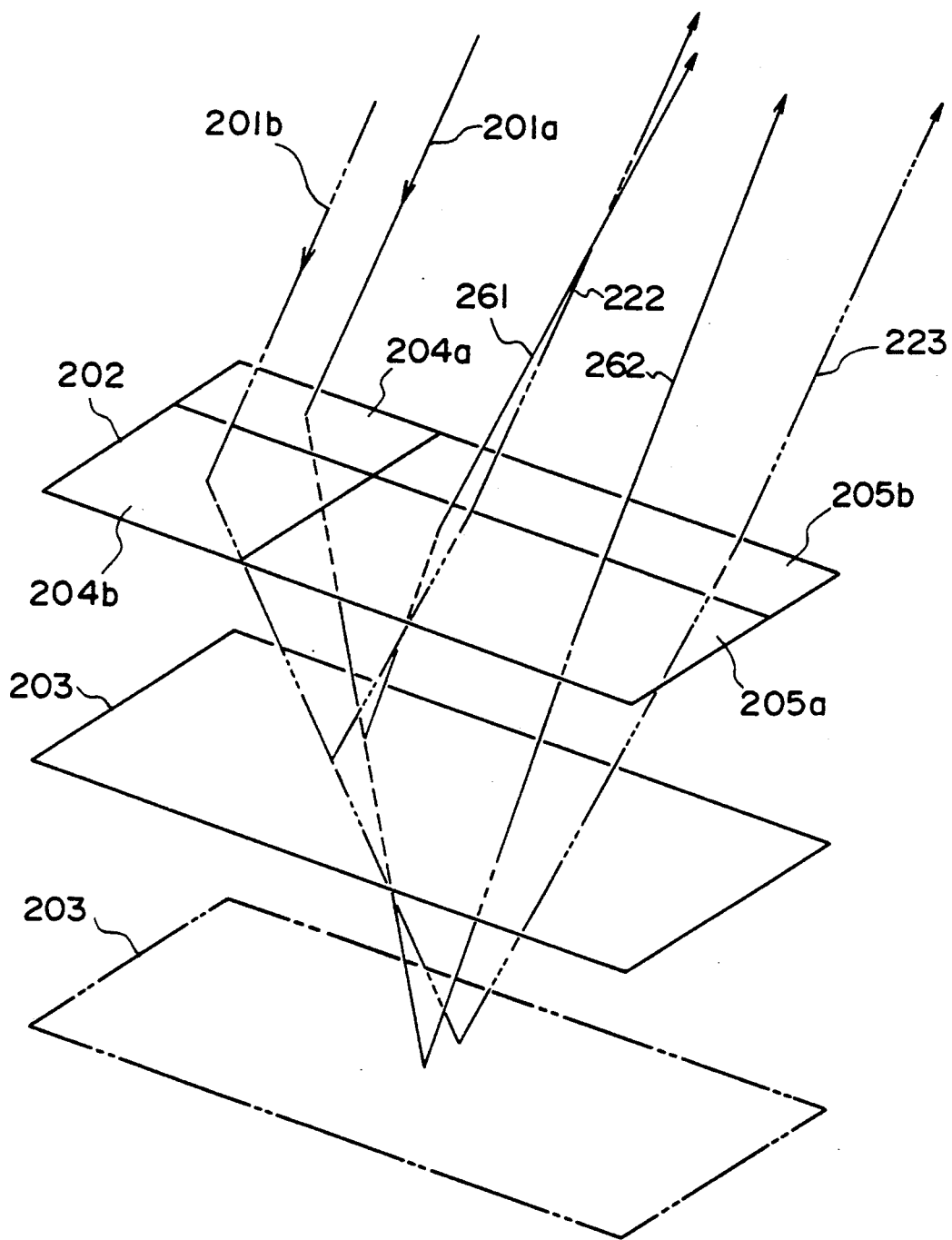
FIG. 65 is a schematic view showing a major portion of a 31st embodiment.

FIG. 65 is a schematic view of a major portion of a 31st embodiment, exemplifying the positional relationship between physical optic elements of a mask 202 and a wafer 203.

As compared with the 29th embodiment shown in FIG. 60, in this embodiment physical optic elements 205a and 205b for light emission of a measuring system and a correcting system are interchanged.

The device as a whole has substantially the same precision and advantageous effects as in the 29th embodiment. Since, however, in this embodiment both of lights 201a and 201b of the measuring system and the correcting system can be reflected by substantially the same region on the wafer 203 surface, high-precision measurement without being affected by any irregularity or swell of the wafer surface, for example, is advantageously attainable.

In these embodiments, the focal length fb of the condensing lens 207b of the correcting system and the focal length fa of the condensing lens 207a of the measuring system may be different from each other. For example, where the focal length fb is twice as large as the focal length fa, the sensitivity for detecting an error resulting from the wafer inclination can be increased twice, without changing the range of measurement of the measuring system. In that case, however, it will be necessary to satisfactorily correct optical aberrations of the condensing lens 207b.

Figure 66:
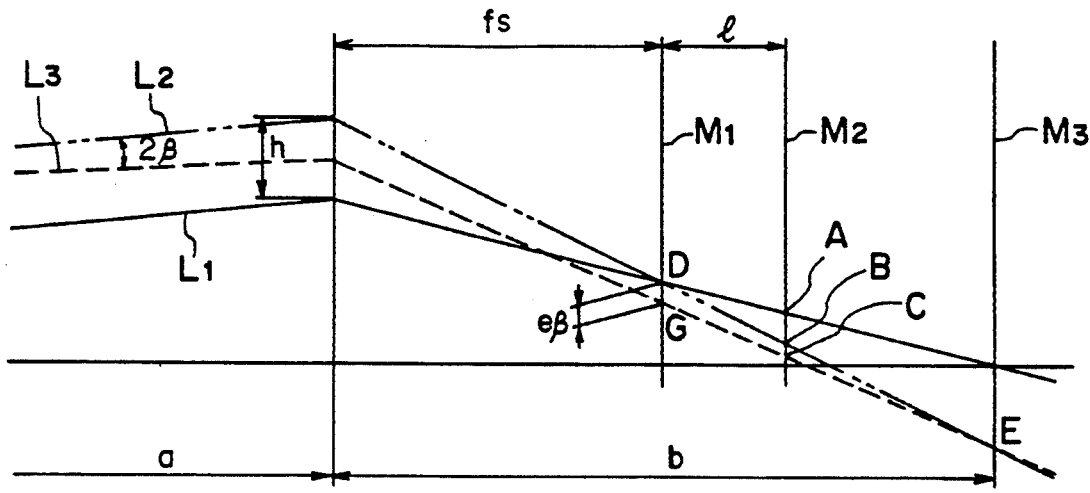
FIGS. 66 and 67 are principle views of a 32nd embodiment.
Figure 67:
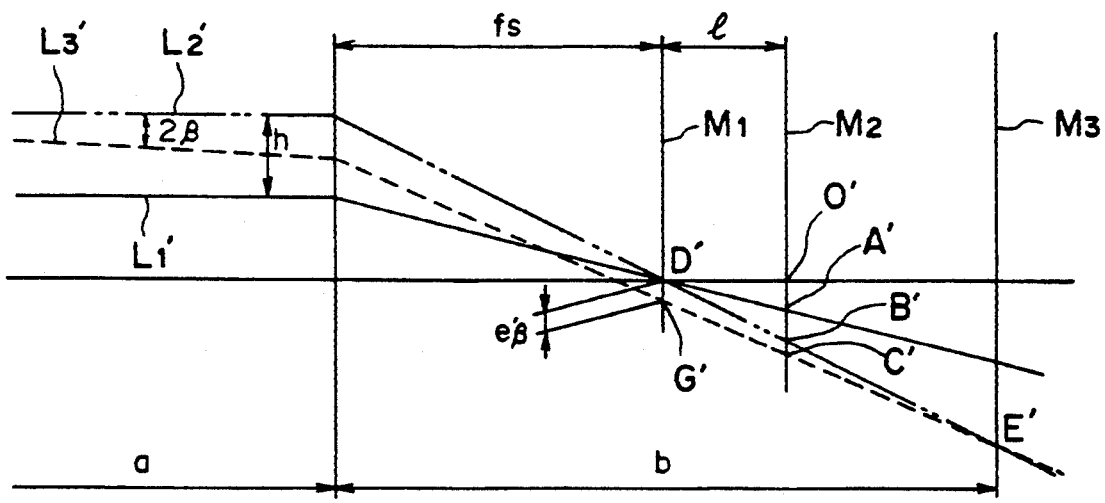

FIGS. 66 and 67 illustrate a 32nd embodiment of the present invention.

In some embodiments just having been described above, a sensor is set at the focal point position of a condensing lens. As compared therewith, in the present embodiment, the sensor may be set at any position as desired, and a description will be provided of the effect of the correcting system in such arrangement.

In that case, there are two factors, i.e. an error in the relative position of the optical probe and the mask and an error of wafer inclination. Therefore, only a single piece of positional information concerning the light spot, from the correcting system, is not sufficient to determine a general solution for the error in the measuring system. In consideration of this, in the present embodiment, the following conditions are set:

Focal length of the condensing lens fa=fb=fs
Sensor position la=lb=l

First, it is assumed in the measuring system of FIG. 66 that D and A denote the points at which light L1 intersects with a focal surface M1 of the condensing lens and a sensor surface M2 in the case where no positional error and no wafer inclination error are present; D, B and E denote the points of intersection at which light L2 in an occasion where there is a positional error h (micron) intersects with the surfaces M1 and M2 and with an imaging plane M3 on which the wafer is imaged (the same point D is defined for the lights L1 and L2 because they are parallel to each other); G, C and E denote the points of intersection at which the light intersects with the surfaces M1, M2 and M3 in a case where there are a positional error h (micron) and a wafer inclination β (rad) (the same point is defined on the image surface M3 because the light is inclined by the wafer surface). Then, the following relations are provided.

Spot deviation due to the error in the relative position of the optical probe is given by:

$$\overline{AB} = h \times l/fs \qquad (11)$$

Spot deviation due to the wafer inclination β (rad) is given by:

$$\overline{BC} = e\beta \times (b-fs-l)/(b-fs) = 2\beta \cdot fs \times (b-fs-l)/(b-fs) \qquad (12)$$

Next, it is assumed in FIG. 67 that D' and A' denote the points of intersection at which light L1' containing no error intersects with the surface M1 and a surface M2; D', B' and E' denote the points of intersection at which light L2' containing a positional error h (micron) intersects with the surfaces M1, M2 and M3; G', C' and E' denote the points of intersection at which light L3 containing a positional error h (micron) and an error due to the wafer inclination β (rad) intersects with the surfaces M1, M2 and M3. Then, the following relations are provided.

Spot deviation due to the error in the relative position of the optical probe is given by:

$$\overline{A'B'} = h \times l/fs \qquad (13)$$

Spot deviation due to the wafer inclination β (rad) is given by:

$$\overline{B'C'} = e'\beta \times (b-fs-l)/(b-fs) = 2\beta \cdot fs \times (b-fs-l)/(b-fs) \qquad (14)$$

It follows from equations (11)–(14) that:

$$\overline{AC} = \overline{AB} + \overline{BC} = \overline{A'B'} + \overline{B'C'} = \overline{A'C'}$$

thus, it is seen that there occurs spot deviations of the same amount in these systems.

It is to be noted that in the correcting system there is produced an addition error $\overline{O'A'}$. This error is of a magnitude that depends on the spacing between the mask and the wafer. The manner of correcting the error $\overline{O'A'}$ by feeding back the measured value containing this error will now be described.

In FIG. 61, similarly to FIG. 60, where the interval between the lights 222 and 223 emanating from the mask surface is denoted by $d_M$, then the following relation is provided:

$$\overline{O'A'_{MAX}} = d_M/2 \times l/fs$$

Assuming now that $d_M$=30 microns, fs=30000 microns and l=10000 microns, then $$\overline{O'A'_{MAX}} = 30/2 \times 10000/30000 = 5 \ (microns)$$

The sensitivity ΔS of this measuring system can be given by:

$$\Delta S = S/d_G = 1/d_G \cdot d_M/f_M \times fs \times (b-fs-l)/(b-fs)$$

Assuming now that $d_G$=50 microns and b=48500 microns, then $$\begin{aligned}\Delta S &= 1/50 \times 30/1000 \times 30000 \times \\ & \quad (48500 - 30000 - 10000)/(48500 - 3000) \\ &= 8.27 \ (micron/micron)\end{aligned}$$

That is, the displacement of the spot on the sensor surface per a spacing 1 micron is 8.27 microns.

Thus, at the maximum, the error that can be caused in the measuring system by $\overline{O'A'}$ is 5/8.27=0.60 (micron)

In other words, the maximum error in the measured value can be considered as ±0.6 micron. By using this measured value, to the contrary, to detect $\overline{O'A'}$, it is seen that, at the maximum, $\overline{O'A'}$ contains the following error:

Max error of $\overline{O'A'}$ = 5/($d_B$/2)×0.6 = 5/25×0.6 = 0.12 (micron)

In the measuring system, this error is merely as much as:

0.12/8.27=0.015 (micron)

As described, by correcting the spot position in the measuring system by using deviation of the spot position in the correcting system (i.e. $\overline{O'C'}$ in FIG. 67) and by re-detecting $\overline{O'A'}$ by using that measured value (containing an error corresponding to $\overline{O'A'}$), it is possible to assure high-precision measurement of the surface spacing even if the sensor position is dislocated from the focal surface of the condensing lens.

In some embodiments to be described later, two lights whose positions of incidence upon sensing means are displaceable in different manners with a change in the gap between a mask and a wafer, are used to ensure high-precision gap measurement without being affected by inclination.

Figure 68:
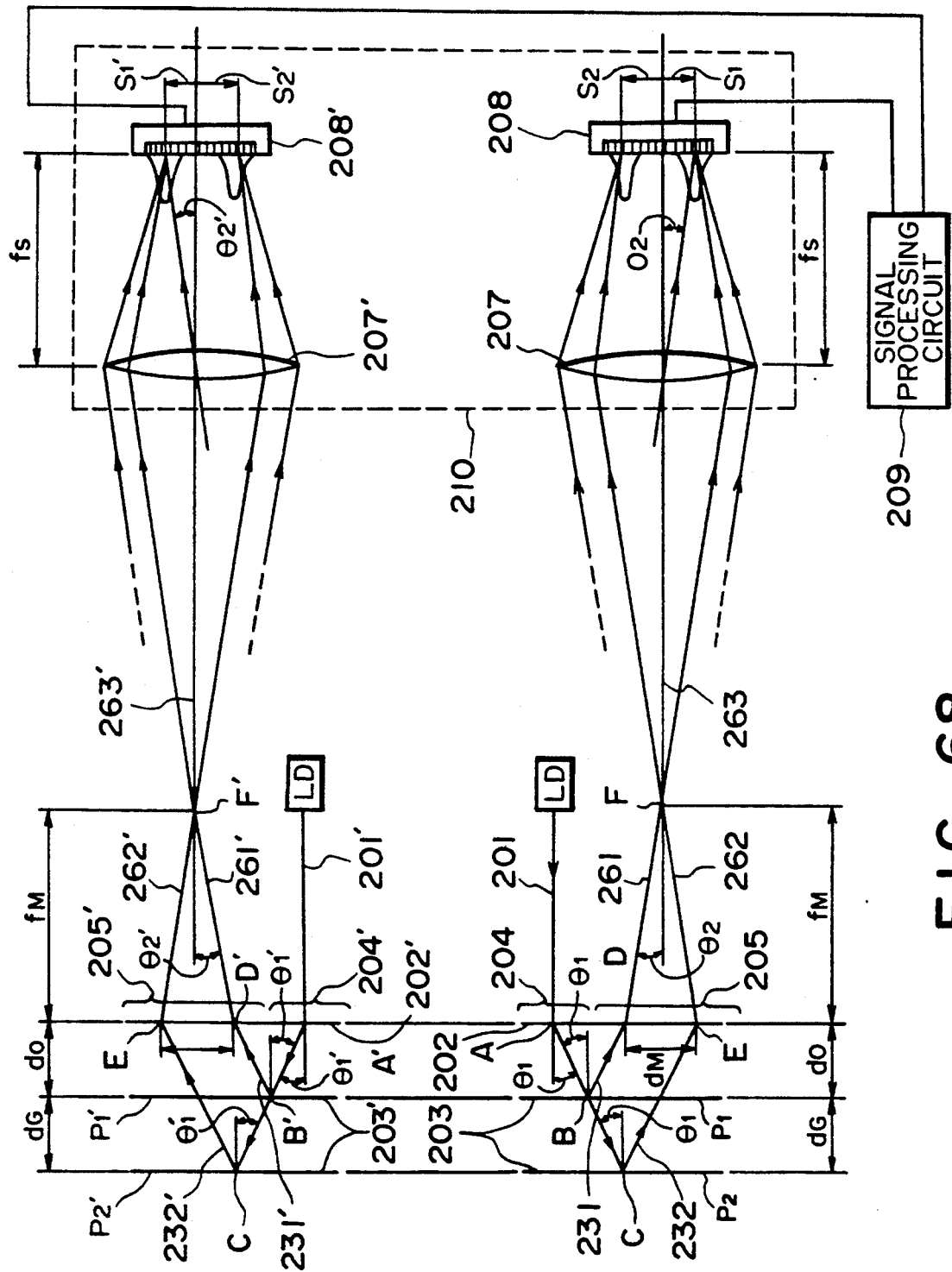
FIG. 68 is a schematic view showing a major portion of a 33rd embodiment.
Figure 69:
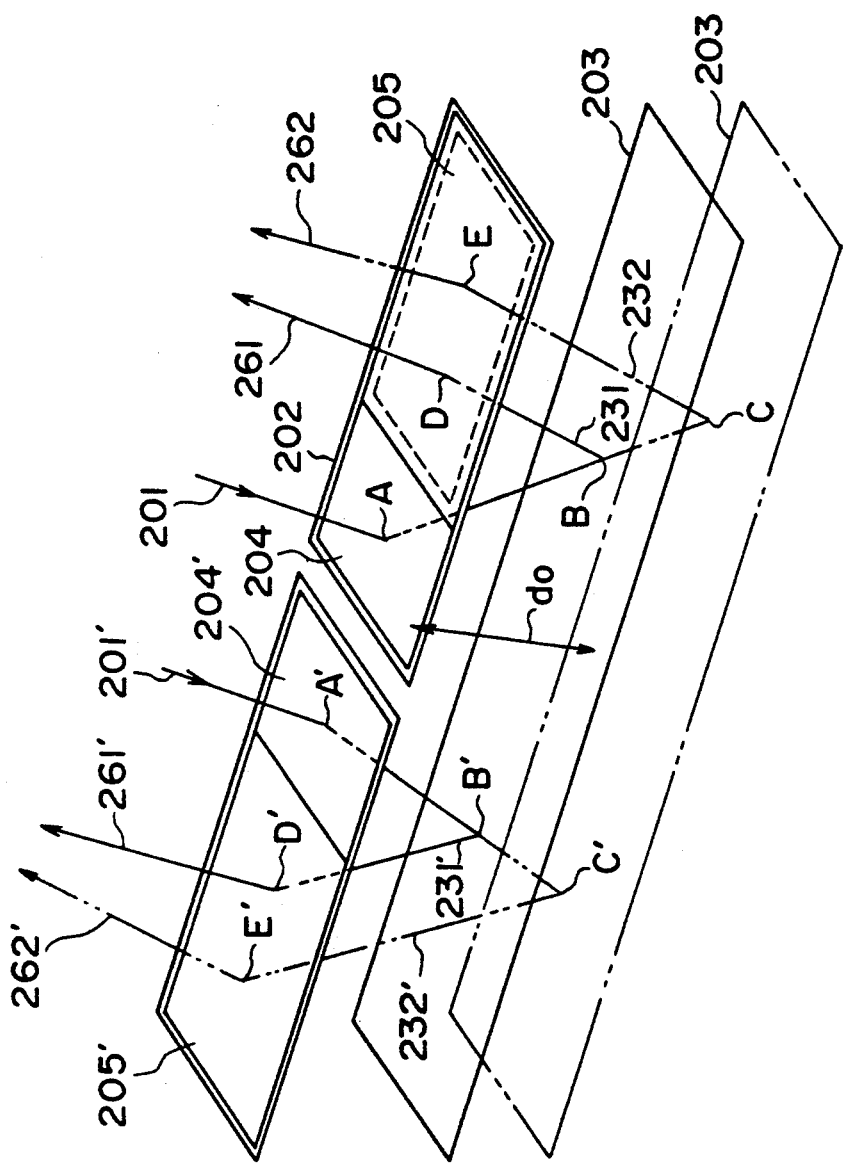
FIG. 69 is a schematic view explicating the optical action in the neighborhood of physical optic elements used in the 33rd embodiment.

FIG. 68 is a schematic view of an optical arrangement of a 33rd embodiment wherein the invention is applied to a device for measuring a gap between a mask and a wafer in a semiconductor device manufacturing exposure apparatus. FIG. 69 is a perspective view showing a portion of the apparatus around physical optic elements used therein.

In these figures, denoted at 201 and 201' are lights from light sources LD each such as a He-Ne laser, a semiconductor laser or otherwise. Denoted at 202 and 202' are portions of a first object which is a mask, in this example; at 203 and 203', portions of a second object which is a wafer, in this example. The mask 202 and the wafer 203 are disposed opposed to each other with an interval or gap $d_0$ as illustrated in FIG. 69. First physical optic elements 204 and 204' and second physical optic elements 205 and 205' are provided in portions of the mask 202 and each of these elements is formed by a diffraction grating or zone plate, for example. Condensing lenses 207 and 207' each has a focal length fs.

Two light receiving means 208 and 208' are disposed at the focal point positions of the condensing lenses 207 and 207'. Each light receiving means is formed by a line sensor, PSD or otherwise, and is adapted to detect the position of center of gravity of light incident on the surface thereof.

Signal processing circuit 209 is operable to determine the position of center of gravity of the light upon the surface of the light receiving means 208 (208'), by using a signal therefrom, and also to determine by calculation the gap $d_0$ between the mask 202 and the wafer 203 in the manner which will be described later.

Denoted generally at 210 is an optical pickup which contains, for example, the condensing lens 207, light receiving means 208 and, as desired, the signal processing circuit 209. The optical pickup is movable relatively to the mask 202 and the wafer 203.

The measuring arrangement shown in FIG. 68 and comprising two, upper and lower systems has a symmetrical structure, being symmetric with respect to a straight line spaced by the same distance from the optical axes of the light projection systems illustrated. Since the upper and lower systems have the same structure, the following description will be provided only of the lower system as viewed in the drawing.

In this embodiment, the light 201 (whose wavelength $\lambda = 830$ nm) from a semiconductor laser LD is perpendicularly incident on a point A which is on a first Fresnel zone plate (hereinafter simply "FZP") 204. Diffraction light of a predetermined order or orders, being diffracted at an angle $\theta_1$ from the first FZP 204 is reflected at a point B (C) on the wafer 203 surface. Of the illustrated reflection lights, a reflection light 231 is a light reflected by the wafer 203 when the wafer is disposed at a position P1 which is close to the mask 202. Reflection light 232 is a light reflected by the wafer 203 when the same is displaced by a distance $d_G$ from the position P1.

Subsequently, the reflection light from the wafer 203 is incident on a point D (E) on the surface of a second Fresnel zone plate (hereinafter simply "FZP") 205 which is provided on the first object 202.

The second FZP 205 has such an optical function that the angle of emission of diffraction light emanating therefrom is changeable with the position of incidence of the light thereupon.

The diffraction light (261, 262) of a predetermined order or orders, being diffracted at an angle $\theta_2$ from the second FZP 205, is directed by way of the condensing lens 207 to the surface of the light receiving means 208.

By using the position of the center of gravity of the light (261, 262) upon the light receiving means 208, the gap between the mask 202 and the wafer 203 is detected by calculation.

In this embodiment, each of the first and second Fresnel zone plates 204 and 205 provided on the mask 202 is formed with a preset pitch, and the diffraction angle $\theta_1$ of diffraction light of a predetermined order or orders (e.g., positive and negative first order), being diffracted by the first FZP 204, and the diffraction angle $\theta_2$ of light incident on a predetermined position on the second FZP 205, can be detected preparatorily.

Figure 70:
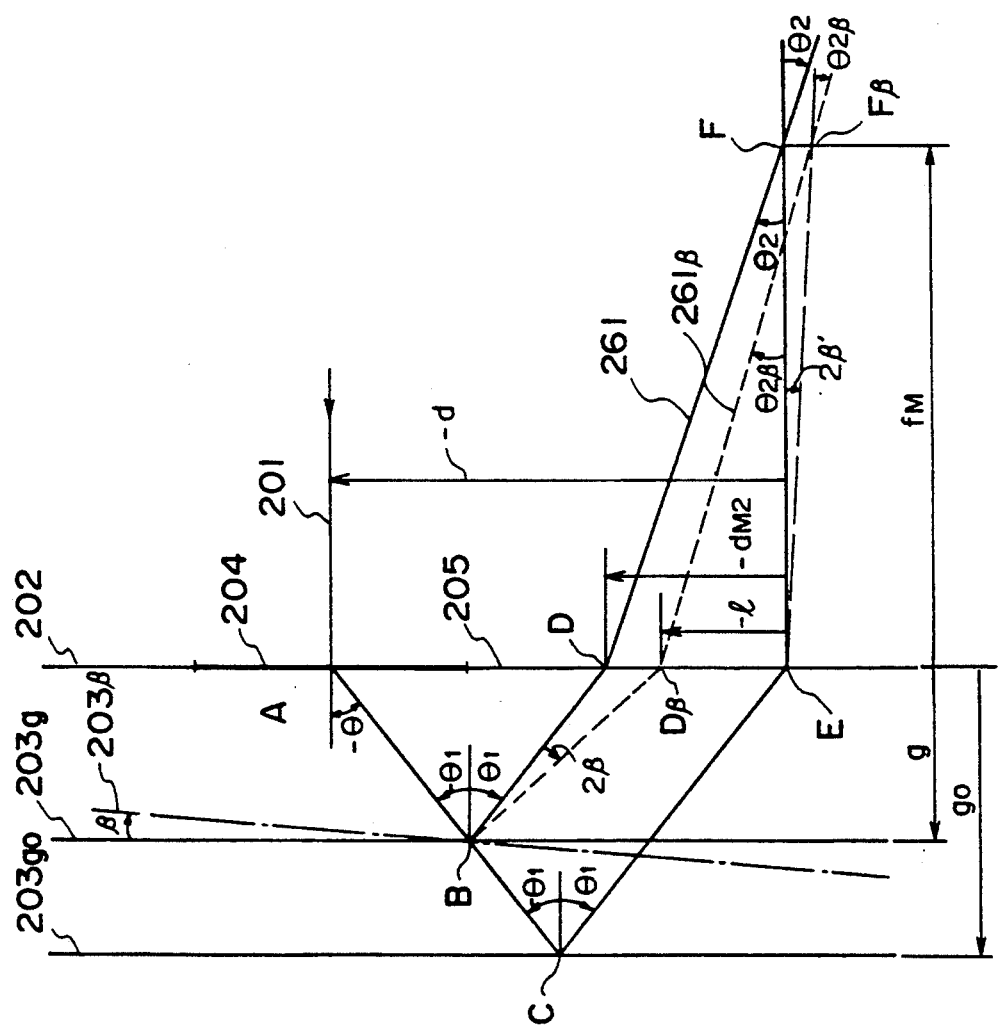
FIG. 70 is a principle view for explicating the manner of measurement made in the 33rd embodiment.

Next, by using the optical path illustration in FIG. 70, the manner of detecting the gap between the mask 202 and the wafer 203 will be explained.

Light 201 is incident on the light entrance side physical optic element 204 on the mask 202, and is diffracted at point A in a direction $-\theta_1$. The optical system is arranged so that, if the wafer $203g_0$ is at the position of a gap $g_0$ from the mask 202, the diffracted light is reflected at point C and the reflected light is again diffracted at point E on the light exit side physical optic element 205 of the mask 202 so that it advances in the direction of the optical axis of the light receiving system. Namely, an interval $-d$ is set between the points E and A so that light passes point F which is at a distance $f_M$.

If the mask 202 and the wafer 203g is spaced by an arbitrarily gap g, the light is reflected at point B, for example. For any value of the gap g, the light is diffracted at point D, for example, on the physical optic element 205 in the manner that the diffracted light 261 surely passes the point F. If, at the point B, the wafer 203g is inclined by $\beta$ so that the light reflected at the point B is diffracted at point $D_\beta$ on the physical optic element 205 so as to be transformed into a light $261_\beta$ that passes point $F_\beta$, then the relations as will be set forth below are satisfied and the angle $\theta_{2\beta}$ of the light emanating from the physical optic element 205 with respect to the optical axis of the light receiving system is determined on the basis of the gaps $g_0$ and g, the emission angle $-\theta_1$ of the light entrance side physical optic element 204, the focal length $f_M$ of the light exit side physical optic element 205 and the inclination $\beta$ of the wafer 203$\beta$.

Assuming the angles and lengths are set as illustrated, then it follows that:

$$F_\beta F + ED_\beta = -f_M \tan \theta_{2\beta} = l - f_M \tan 2\beta' \tag{15}$$

$$D_\beta D = d_{M2} - l = -\{g \tan(\theta_1 + 2\beta) - g \tan\theta_1\} \quad (16)$$

Also, the change in the angle of incidence and emission at the point E due to the inclination is given by:

$$2\beta' = \cos\theta_1 \, 2\beta \quad (17)$$

On the other hand, $$d = -2g_0 \tan\theta_1$$

From this, it follows that:

$$d_{M2} = d + 2g \tan\theta_1 = 2(g - g_0)\tan\theta_1 \quad (18)$$

From equations (15)–(18), $\tan\theta_{2\beta}$ can be given by:

$$\tan\theta_{2\beta} = -\frac{1}{f_M}[2(g - g_0)\tan\theta_1 + \quad (19)$$

$$g\{\tan(\theta_1 + 2\beta) - \tan\theta_1\} - f_M \tan(2\beta\cos\theta_1)]$$

Considering the displacement $S_1$ of the spot on the sensor surface, it follows that:

$$S_1 = f_s \tan\theta_{2\beta} \quad (20)$$

$$= -2\frac{f_s}{f_M}[(g - g_0)\tan\theta_1 + \beta\{g(1 + \tan^2\theta_1) - f_M \cos\theta_1\}]$$

In this equation, $\beta \ll 1$ and $\tan(C\beta) \simeq C\beta$.

From equation (20), it is seen that the displacement $S_1$ of the spot where the wafer is not inclined is:

$$S_1 = 2(f_S/f_M)\Delta g \tan\theta_1$$

wherein $\Delta g \equiv g_0 - g$. Thus, the spot is displaceable on the surface of the light receiving means at a magnification of a gap variation $\Delta g$ multiplied by $2(f_S/f_M)\tan\theta_1$. Assuming now that $f_S = 60$ mm, $f_M = 1$ mm and $\tan\theta_1 = 1$, then the magnification $Q = 60$. Thus, for a unit change of 1 micron in the gap between the mask 202 and the wafer 203, the light on the surface of the light receiving means 208 displaces through 60 microns. Where a PSD having position resolution of 0.3 micron is used as the light receiving means 208, in principle the gap between the mask 202 and the wafer 203 can be measured with a resolution of 0.005 micron.

Regarding the effect of inclination $\beta$ of the wafer, from equation (20) the gap measurement error resulting from the wafer inclination $\beta$, when considered in terms of the amount of gap, namely an error gap $\epsilon g$, can be given by:

$$\epsilon g = \frac{\beta\{g(1 + \tan\theta_1) - f_M \cos\theta_1\}}{\tan\theta_1}$$

In a case of a proximity type exposure apparatus, the maximum inclination $\beta$ will be about $10^{-4}$ rad. Also, usually the gap g is not greater than 100 microns. Therefore, if $\beta = 10^{-4}$ rad and $g = 100$ microns, then it follows that:

$$g = 10^{-4} \times \{100 \times (1 + 1) - 100 \times 1/\sqrt{2}\,\}$$
$$\simeq 0.05 \text{ (micron)}$$

The error resulting from such an inclination can be suppressed by this embodiment of the present invention which is so structured that, as shown in FIG. 68: the optical arrangement comprises two upper and lower systems which are so set that a wafer inclination $\epsilon$ have effects in opposite directions; and that any difference in displacement of the light spots in these systems is detected by a signal processing circuit 209, on the basis of the signals from the two light receiving means 208 and 208', and the spacing is determined on the basis of the displacements of the spots. This will be explained below in more detail.

In the upper system shown in FIG. 68, similar to the foregoing, the displacement $S_2'$ of the spot on the surface of the light receiving means can be expressed as follows:

$$S_1' = -2\frac{f_S}{f_M}[-(g' - g_0)\tan\theta_1 + \beta\{g'(1 + \tan^2\theta_1) - f_M\cos\theta_1\}]$$

Figure 71:
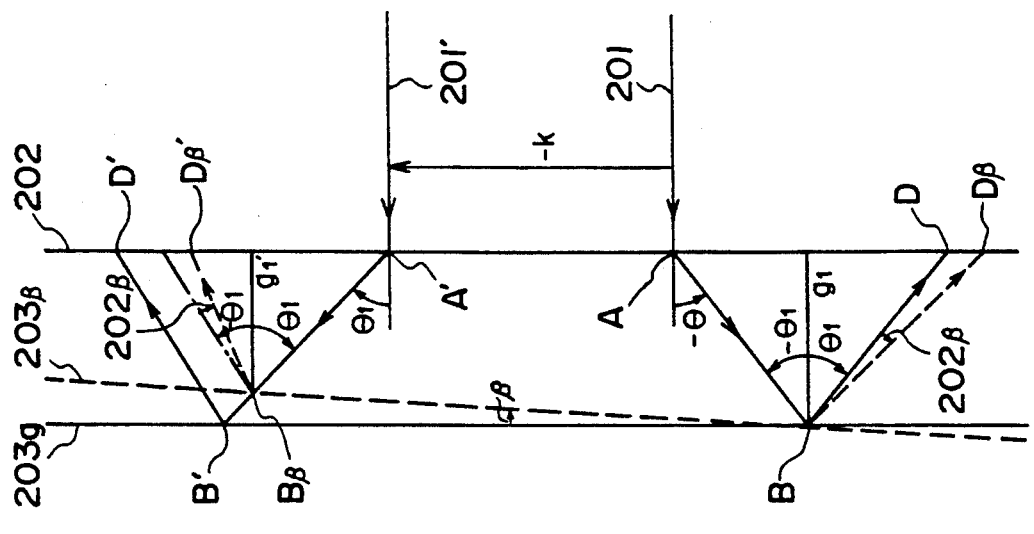
FIG. 71 is a representation explicating the error gap in the 33rd embodiment.

If, as shown in FIG. 71, the lower system is structured so that the position of light incidence is shifted by k and there is an inclination $\beta$ at the gap $g_1$, then the gap difference is given by:

$$g_1' - g_1 = \{g_1 \tan(-\theta_1) + k - g_1' \tan(\theta_1)\}\tan\beta$$

$$\therefore g_1' = \frac{(1 - \tan\beta\tan\theta_1)g_1 + k\tan\beta}{1 + \tan\beta\tan\theta_1}$$

$$\simeq \frac{(1 - \beta\tan\theta_1)g_1 + k\beta}{1 + \beta\tan\theta_1}$$

The difference $\Delta S$ in the spot displacement on the sensor surface can be detected as follows.

$$\Delta S = S_1 - S_1'$$

$$= -2\frac{f_s}{f_M}[\{(g_1 - g_0) + (g_1' - g_0)\}\tan\theta_1 + \beta\{(g_1 - g_1')(1 + \tan^2\theta_1)\}]$$

$$\Delta S = -2\frac{f_s}{f_M}\left[2\left(\frac{g_1 + g_1'}{2} - g_0\right)\tan\theta_1 + \quad (21)\right.$$
$$\left.\beta\left(g_1 - \frac{(1-\beta\tan\theta_1)g_1 + k\beta}{1 + \beta\tan\theta_1}\right)(1 + \tan^2\theta_1)\right]$$

$$= -2\frac{f_s}{f_M}[2(G - g_0)\tan\theta_1 + \beta h(\beta, g_1, k)$$
$$(1 + \tan^2\theta_1)]$$

Wherein $$G = \frac{g_1 + g_1'}{2}$$

$$h(\beta, g, k) = g_1 - \frac{1 - \beta\tan\theta_1 g_1 + k\beta}{1 + \beta\tan\theta_1}$$

$$= \frac{\beta(2g_1 \tan\theta_1 - k)}{1 + \beta\tan\theta_1}$$

Comparing equations (20) with (21), it is seen that in the FIG. 68 embodiment an average gap at two measuring points can be evaluated with a sensitivity twice that attainable in a single-system arrangement. The magnification of spot displacement on the surface of the light receiving means corresponding to a gap variation, namely the sensitivity $\theta$ is x $4f_S/f_M \tan\theta_1$. If, as in the foregoing case, $f_S=30$ mm, $f_M=1$ mm and $\tan\theta_1=1$, then $\theta = x\ 120$. Thus, in principle the spacing between the mask 202 and the wafer 203 can be measured with a resolution of 0.0025 micron. From equation (21), the effect of the wafer inclination $\beta$ (i.e. the error gap $\epsilon'g$) is given by:

$$\epsilon_g' = \frac{\beta^2(2g_1 \tan\theta_1 - k)(1 + \tan^2\theta_1)}{2\tan\theta_1 (1 + \beta\tan\theta_1)}$$

Assuming now that $\beta = 10^{-4}$ rad and g=100 microns, as in the foregoing, it follows that:

$$\epsilon_g' = \frac{10^{-8} \times (2 \times 100 \times 1 - k) \times (1 + 1)}{2 \times 1 \times (1 + 10^{-4})}$$

$$\simeq (200 - k) \times 10^{-8}$$

If k=1000 microns, then $$\epsilon_g' = -0.000008\ (micron)$$

Thus, it is seen that the value is sufficiently small so that it can be disregarded. The difference in displacement of the spots formed by such a two-system optical arrangement corresponds to the variation in the spacing between the mask and the wafer, but it is not substantially affected by the inclination of the wafer. Therefore, by detecting the difference in spot displacement, it becomes possible to measure the gap variation at high precision.

Figures 72A, 72B:
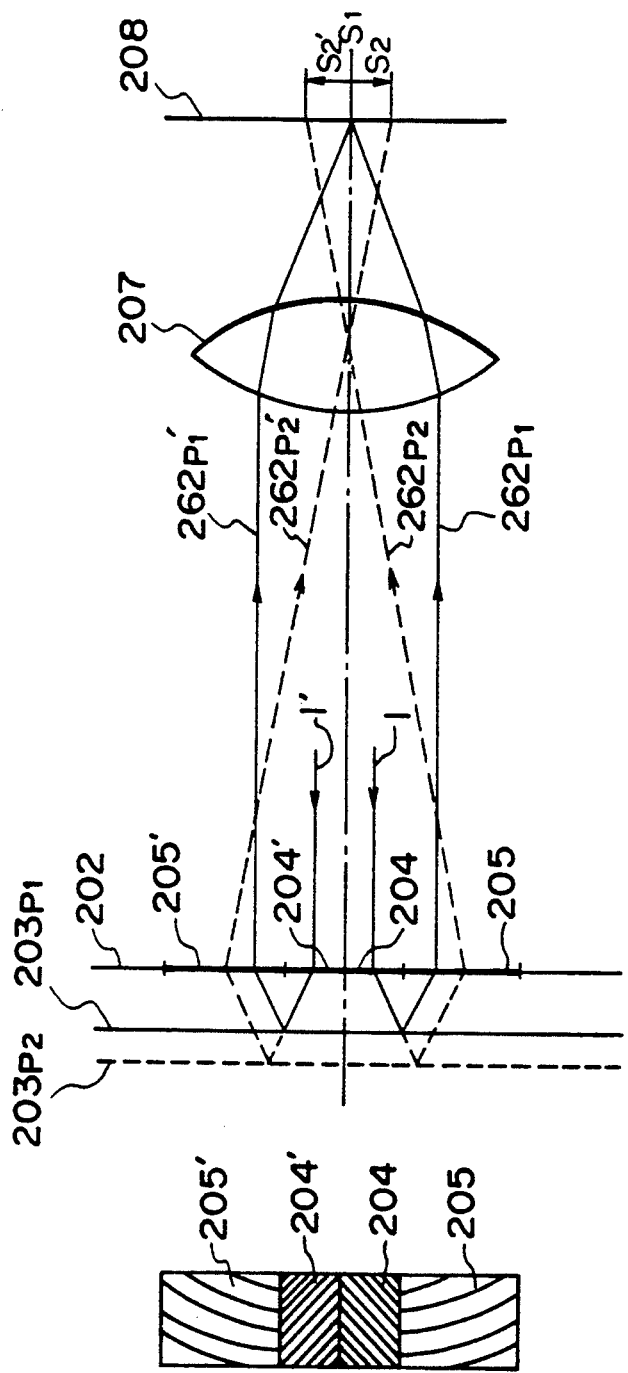
FIGS. 72A and 72B are representations, respectively, exemplifying the disposition of marks and an arrangement of a major portion of a 34th embodiment.

FIGS. 72A and 72B illustrate a 34th embodiment of the present invention, wherein FIG. 72A schematically shows disposition of physical optic elements on a mask while FIG. 72B is a representation schematically showing a general optical arrangement. Some components are used in common for two systems. More specifically, physical optic elements on a light entrance side (entrance side marks) 204 and 204' are juxtaposed, and lights 201 and 201' from the same light projecting system are projected upon these light entrance side marks 204 and 204'. Those lights $262_{P1}$, $262_{P2}$, $262_{P1'}$ and $262_{P2'}$ emanating from light exit side physical optic elements (exit side marks) 205 and 205' are received by a condensing lens 207 and are detected by a light receiving means 208. For measurement of the spacing between the mask 202 and the wafer 203 which is either at a gap position $P_1$ and at a gap position $P_2$, this embodiment is so set that, at the position $P_1$ at which the gap measuring range is minimum, these two systems form light spots at the same position on the detecting surface 208. For the position $P_2$, due to the variation in the gap two light spots are formed at displaced positions as denoted by $S_2$ and $S_2'$. Thus, by measuring the interval of these spots, substantially the same measurement as in the 33rd embodiment is attainable.

Figures 73A, 73B:
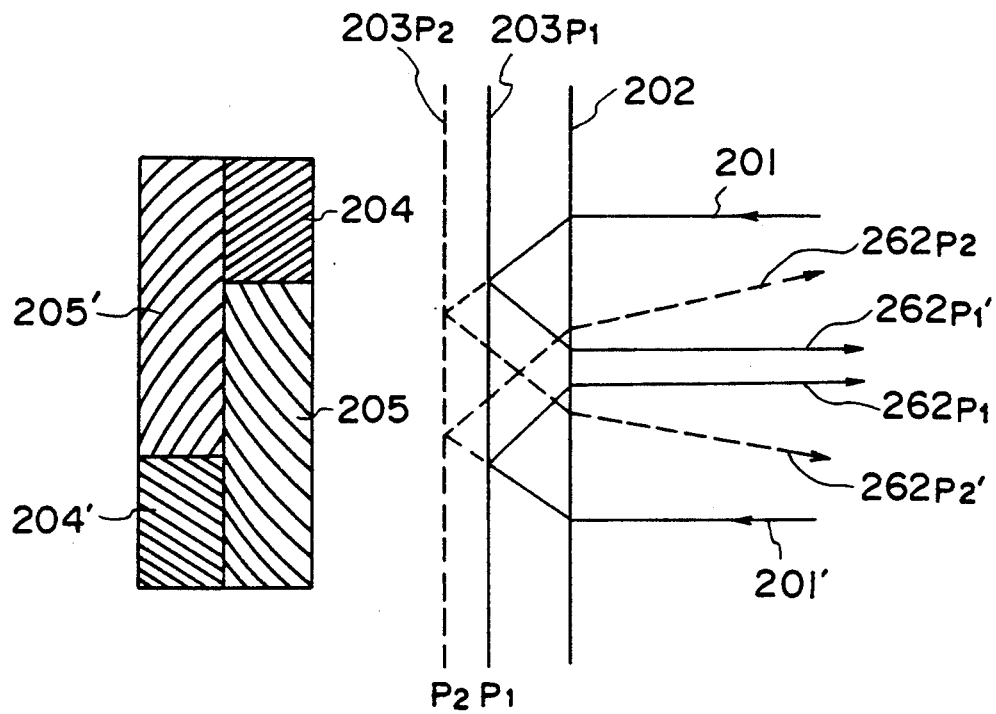
FIGS. 73A and 73B are representations, respectively, exemplifying the disposition of marks and an arrangement of a major portion of a 35th embodiment.

FIGS. 73A and 73B illustrate a 35th embodiment of the present invention, wherein FIG. 73A schematically shows disposition of alignment marks on a mask, while FIG. 37B is a representation schematically illustrating optical paths as being projected upon a plane which is perpendicular to the mask surface and a light receiving surface.

Those marks of two systems are disposed and juxtaposed in a direction perpendicular to a direction in which beams are displaceable with a gap variation. The structure of a measuring system, the measurement sensitivity and so on are essentially the same as those in the foregoing embodiment.

Figures 74, 75:
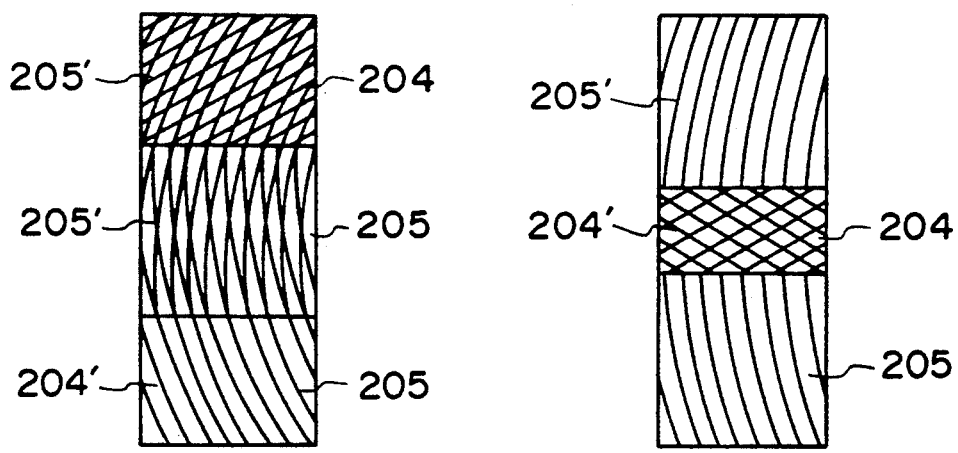
FIG. 74 exemplifies the disposition of marks in a 36th embodiment.
FIG. 75 exemplifies the disposition of marks in a 37th embodiment.

FIG. 74 is a representation of a 36th embodiment of the present invention, wherein marks of two systems are superposed one upon another.

FIG. 75 is a representation of a 37th embodiment of the present invention, wherein only light entrance side marks 204 and 204' are superposed one upon another.

Figure 76A:
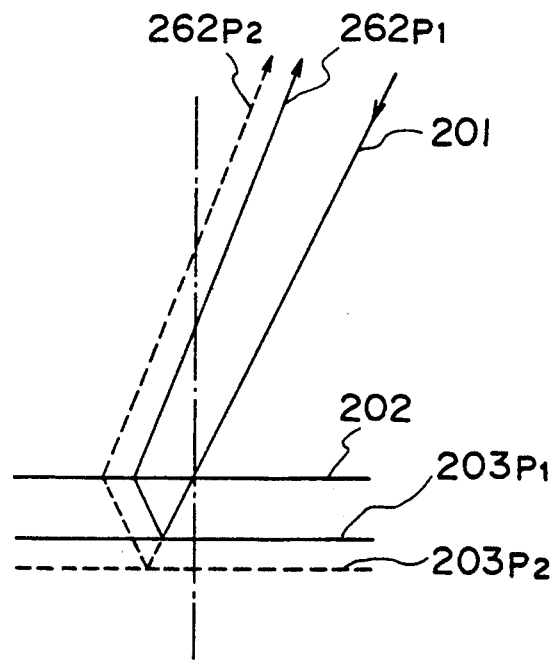
FIGS. 76A–76C are representations, respectively, exemplifying the optical paths and disposition of marks in a 38th embodiment.
Figures 76B, 76C:
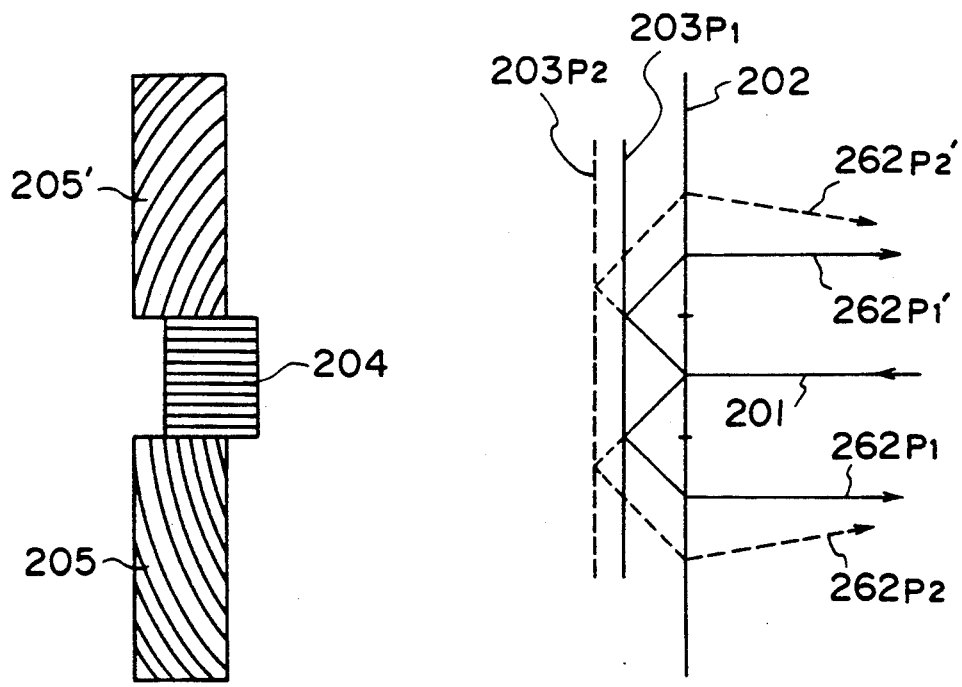

FIGS. 76A-76C illustrate a 38th embodiment of the present invention, wherein a light entrance side mark 204 is formed by a straight grating parallel to a light receiving surface. Positive and negative first order diffraction lights are diffracted in directions which are symmetrical with each other with respect to the light receiving surface, so that the diffraction lights are directed to light exit side marks 205 and 205', respectively. Light paths projected in the light incidence plane are shown in FIG. 76A, and light paths projected in a plane which is perpendicular to both the mask surface and the light receiving surface, are shown in FIG. 76B. FIG. 76C illustrates mark disposition.

Figures 77A, 77B:
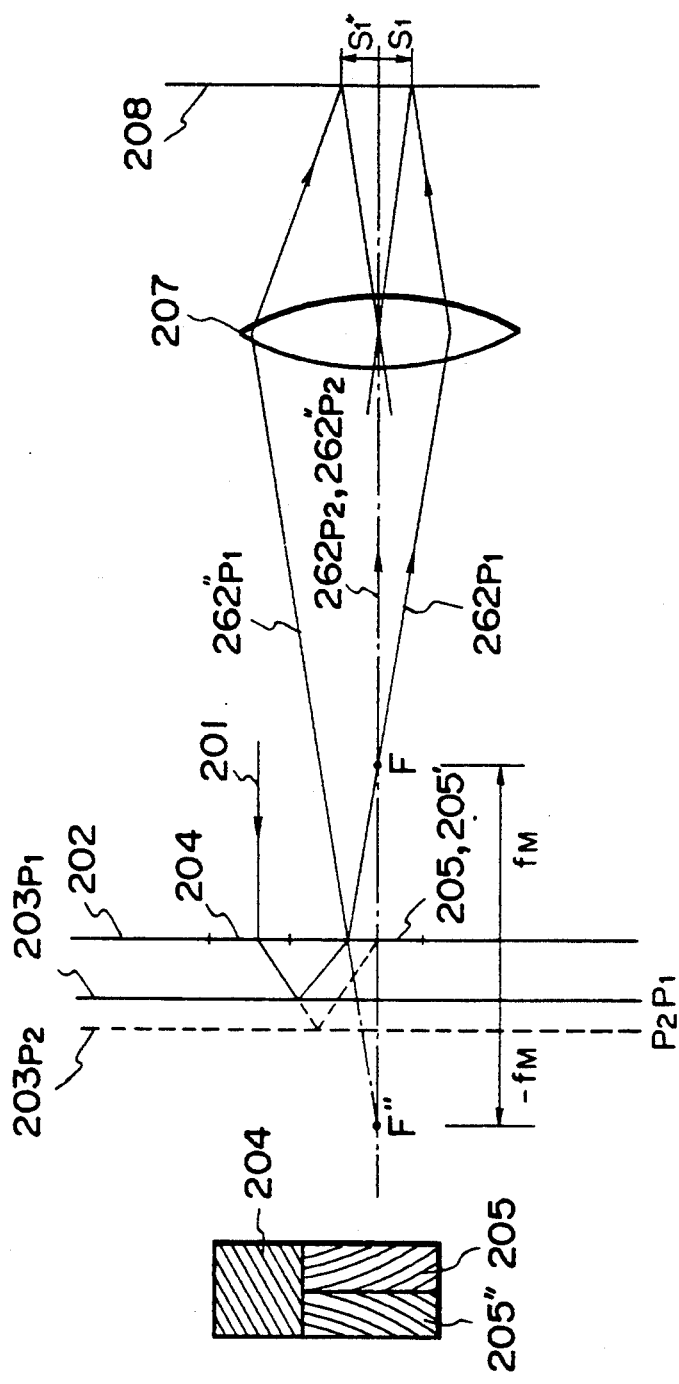
FIGS. 77A and 77B are representations exemplifying disposition of marks and an arrangement of a major portion of a 39th embodiment.

FIGS. 77A and 77B are representations of a 39th embodiment of the present invention, wherein FIG. 77A schematically shows mark disposition while FIG. 77B schematically illustrates light paths. In this embodiment, projected light 1 is diffracted by a light entrance side mark 204 and then is reflected by a wafer 203, thereafter the reflected light is separated into two diffraction lights 262 and 262" by means of light exit side marks 205 and 205" provided on a mask 202, and the separated lights are focused by a light receiving lens 207. From any difference in position of these light spots, i.e. $S_1 - S_1''$, and by using a sensor 208, the gap between a mask 202 and a wafer 203 is measured. In this embodiment, the light exit side mark 205 is designed so that the center of the light emanating from the mask 202 goes to a light receiving system and passes a point F which is at a distance $f_M$ from the mask 202, as in the foregoing example, whereas the other light exit side mark 205" is designed so that the center ray of the light emanating from the mask 202 advances divergently as if it is diverged from a point F" which is at the same distance from the mask 202 to the wafer side.

Figure 78:
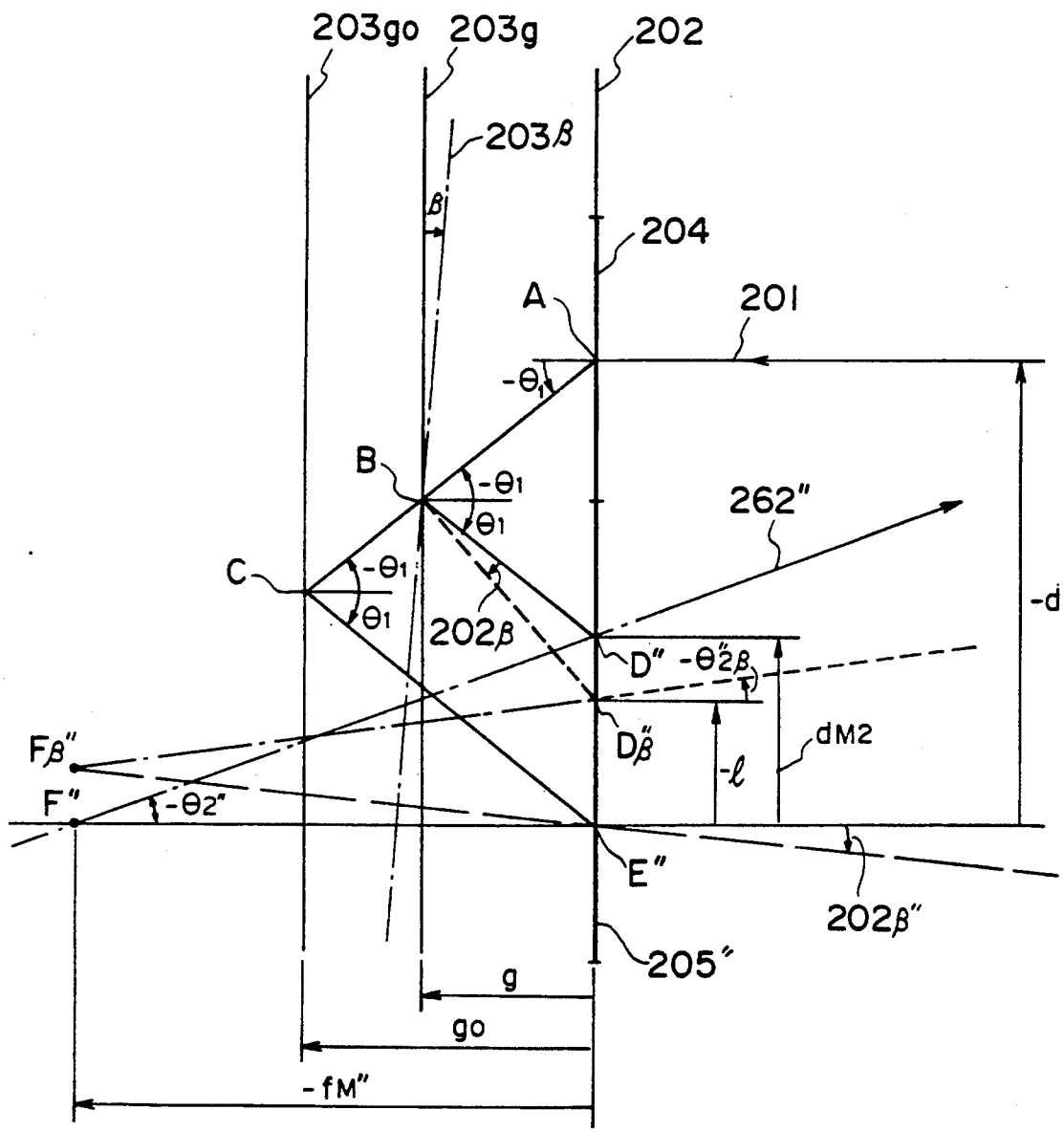
FIG. 78 is a representation for explicating the principle of the 39th embodiment.

Referring now to FIG. 78, a description will be provided of the gap between the mask 202 and the wafer 203 and the motion of a light spot on the surface of a light receiving means, in the latter system, as well as the inclination of the wafer.

Projected light 201 is incident on the light entrance side physical optic element 204 and is diffracted at point A in a direction $-\theta_1$. If, at this time, a wafer $203g_0$ is at the position of a gap $g_0$, the diffracted light is reflected at point C and then is again diffracted at point E on the light exit side physical optic element 205' provided on the mask 202, the diffracted light advancing in the direction of the optical axis of the light receiving system.

Where the point of diffraction on the light exit side physical optic element 205", when the wafer 203 is displaced to a gap g position, is denoted by D", the result is that the light is diffracted in a direction of a straight line that passes a point F" which is on the optical axis of the light receiving system (i.e. in a direction inclined by $-\theta_2''$ with respect to the optical axis).

If in that case, the wafer surface $203g$ is inclined by $\beta$, then the point of diffraction on the light exit side physical optic element 205" is at $D_\beta''$, with the result that the light is diffracted in a direction of a straight line that passes a point $F_\beta''$ (i.e., in a direction inclined by $-\theta_{2\beta''}$ with respect to the optical axis).

Those parameters shown in FIG. 78 are in such relations that can be expressed by the following equations:

$$\overline{F_\beta'' F''} + \overline{E'' D_\beta''} = -f_M'' \tan\theta_{2\beta''} \quad (22)$$
$$= l - f_M'' \tan 2\beta''$$

$$\overline{D_\beta'' D''} = dM_2 - l \quad (23)$$
$$= -\{g\tan(\theta_1 + 2\beta) - g\tan\theta_1\}$$

Also, the change in the angle of incidence at the point E, resulting from the wafer inclination, can be given by:

$$2\beta'' \cos\theta_1 2\beta \quad (24)$$

In one direction. $d = -2g_0 \tan\theta_1$. Therefore, it follows that:

$$dM_2 = d + 2g \tan\theta_1 = 2(g - g_0) \tan\theta_1 \quad (25)$$

From equations (22)–(25), $\tan\theta_{2\beta''}$ can be given by the following equation:

$$\tan\theta_{2\beta''} = -\frac{1}{f_M''} [2(g - g_0)\tan\theta_1 + g\{\tan(\theta_1 + 2\beta) - \tan\theta_1\} - f_M'' \tan(2\beta\cos\theta_1)] \quad (26)$$

Considering the displacement $S_1''$ of the spot on the sensor surface and if
$\beta \ll 1$ and
$\tan(C\beta) \simeq C\beta$, then $$S_1'' = f_S \tan\theta_{2\beta''} \quad (27)$$
$$= -2\frac{f_S}{f_M''} [(g - g_0)\tan\theta_2 + \beta\{g(1 + \tan^2\theta_1) - f_M'' \cos\theta_1\}]$$

If the two systems are set so that in equation (27) the relation $f_M'' = -f_M$ is satisfied, then $$S_1'' = 2\frac{f_S}{f_M} [(g - g_0)\tan\theta_1 + \beta\{g(1 + \tan^2\theta_1) + f_M\cos\theta_1\}] \quad (28)$$

From equations (20) and (28), the difference in displacement upon the sensor surface of the light receiving system, namely $S_1 - S_1''$ can be detected as follows:

$$S_1 - S_1'' = -2\frac{f_S}{f_M} [(g - g_0)\tan\theta_1 + \beta\{g(1 + \tan^2\theta_1) - f_M\cos\theta_1\}] \quad (29)$$
$$-2\frac{f_S}{f_M} [(g - g_0)\tan\theta_1 + \beta\{g(1 + \tan^2\theta_1) + f_M\cos\theta_1\}]$$
$$= -2\frac{f_S}{f_M} [2(g - g_0)\tan\theta_1 + 2\beta g(1 + \tan^2\theta_1)]$$

If there is no wafer inclination $\beta$, equation (29) can be rewritten as follows:

$$S_1 - S_1'' = 4(f_S/f_M)\Delta g \tan\theta_1$$

wherein $\Delta g \equiv g_0 - g$. Thus, the spot is displaceable on the sensor surface at a magnification of gap variation $\Delta g$ multiplied by $4(f_S/f_M)\tan\theta_1$. This means that the sensitivity is twice higher than that as attainable with a single-system arrangement.

Next, the effect of the wafer inclination $\beta$ is considered. If an error $\epsilon\beta''$ in equation (29) due to the inclination $\beta$ is converted into an amount of gap, $$\epsilon\beta'' = \frac{\beta g(1 + \tan^2\theta_1)}{\tan\theta_2}$$

If $\beta = 10^{-4}$ rad, $g = 100$ microns and $\tan\theta_1 = 1$, then $$\epsilon\beta'' = 10^{-4} \times 100 \times 2 = 0.02 \text{ (micron)}$$

This is sufficiently small and can be disregarded.

Figure 80A:
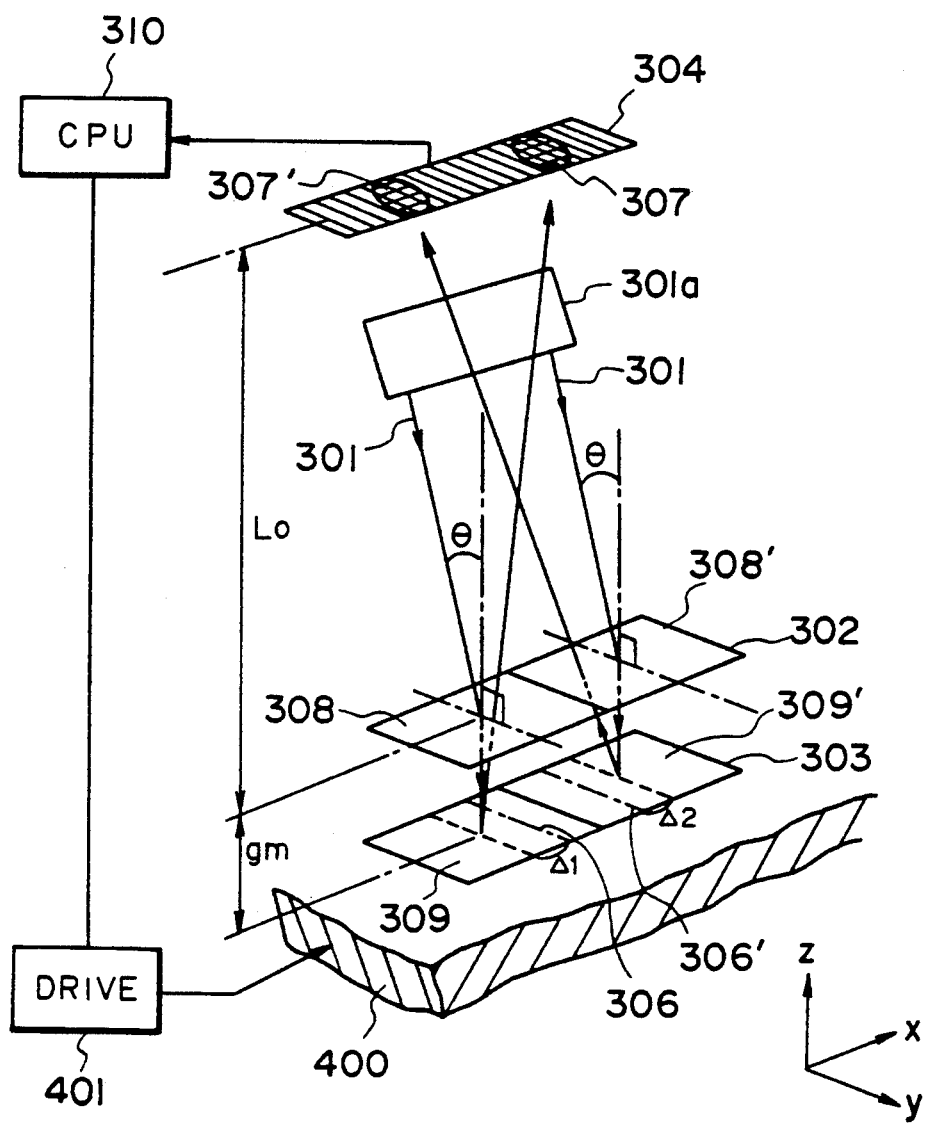
FIG. 80A is a schematic view showing a major portion of the 40th embodiment.

FIGS. 79A and 79B are schematic illustrations of an optical arrangement of a 40th embodiment wherein the invention is applied to a device for measuring a spacing between a mask and a wafer in a semiconductor manufacturing exposure apparatus. FIG. 80A schematically shows the structure of that device.

In these figures, denoted at 301 is a light supplied from a light source 301a such as, for example, a He-Ne laser, a semiconductor laser or a light emitting diode (LED). First object 302 is a mask, for example, and a second object 303 is a wafer, for example. The mask and the wafer are disposed opposed to each other with a spacing gm. Physical optic elements 308 and 308' are provided in a portion of the mask 302 surface, while physical optic elements 309 and 309' are provided in a portion of the wafer 303 surface. Each of these physical optic elements 308 and 308'; 309 and 309' is formed by a Fresnel zone plate (hereinafter simply "FZP"), for example, and adapted to diffract light so as to converge or diverge the same. In the drawings, for simplicity, the mask 302 and the wafer 303 are illustrated as being formed only by the Fresnel zone plates 308 and 308'; 309 and 309', respectively. Denoted at 304 is light receiving means; denoted at 310, a central processing unit (CPU) for measuring the spacing between the mask 302 and the wafer 303 in response to reception of signals from the light receiving means 304, and for producing instruction signals in accordance with the result of measurement; denoted at 400, a stage for supporting and conveying the wafer 303; and denoted at 401, a stage driver for driving the stage 400 in a direction of the spacing between the mask and the wafer (i.e. z direction) in response to the instruction signal from the CPU 310.

The light receiving means 304 is placed at a position spaced from the wafer 303 by a distance $L_0$.

FIGS. 79A and 79B show details of reflectively diffracted lights from the wafer 303 in FIG. 80A, and illustrate, for convenience in explanation, the wafer 303 as a transmission type diffracting element which is equivalent to reflection type element.

Sensor 304 comprises a line sensor, area sensor, PSD or otherwise and is operable to detect, for example, the position of the center of gravity of incident light, in the sensor surface, and the shape of light spots.

The term "center of gravity of light" means such a point that, when in the cross-section of the light a position vector of each point in the section is multiplied by the light intensity of that point and the thus obtained products are integrated over the entire section, the integrated value has a "zero vector".

As an alternative, the position of such a point at which the light intensity distribution has a peak may be detected and used.

The CPU 310 uses the signals from the light receiving means 304 to detect, for example, the position of the center of gravity of light incident on the surface of the light receiving means 304 and/or the shape of light spots thereupon, thereby to determine by calculation the spacing gm between the mask 302 and the wafer 303 in the manner which will be described later.

The light receiving means 304 (and the CPU 310, if necessary) is movable relative to the mask 302 and the wafer 303.

In this embodiment, light 301 (whose wavelength λ=8300 Angstroms) from a semiconductor laser is incident upon a Fresnel zone plate on the mask 302 surface, at an angle θ within the y-z plane with respect to the normal of the mask surface and in the form of a plane wave. FIGS. 79A and 79B each shows details of diffraction of rays in FIG. 80, as viewed in a direction (y direction) perpendicular to the lengthwise direction of the light receiving means 304, and illustrates the Fresnel zone plate 309 (309') of the wafer 303 as being a transmissively diffracting element which is equivalent to a reflectively diffracting type. Actually those rays shown in the right-hand side of the wafer 303 in the drawing are emitted in an opposite direction in the drawing with respect to the z-direction component.

In FIG. 80A, the distance between spots 307 and 307' (the interval between the centers of gravities of these spots 307 and 307') bears the information concerning the surface spacing gm. Thus, the light receiving means 304 measures the distance between the spots 307 and 307', and CPU detects the spacing gm. The principle will be described later. In FIGS. 79A and 79B, the Fresnel zone plates 308 and 308' on the mask 302 have their focal point positions at points F$_1$ and F$_2$, respectively. Each zone plate is so patterned that it has a diffraction function, which may be equivalent to that of a concave lens, for diverging an incident light with an origin of divergency being coincident with that focal point, and for producing first order diffraction light. Also, each FZP 309 or 309' provided on the wafer 303 is patterned so that the first order diffraction light impinging on the wafer 303 surface is reflectively diffracted thereby to form a spot at a predetermined position on the detecting means 304 which is spaced from the wafer by a distance L$_0$+gm. Conversely, the detecting means 304 is disposed at the position at which the light being diffracted in this manner by the FZP 308, 308'; 309, 309' is focused. Actually, before the light from the FZP 309 (309') reaches the detecting means 304, the light having been reflectively diffracted from the wafer 303 passes through the mask 302 and then it reaches the detecting means 304. Through the mask 302, the light passes as being what is called a "zero-th order direct transmission light" not being diffracted.

The gap setting in this embodiment may be made in the following procedure.

In a first example, a signal representing the interval between the centers of gravities of two lights upon the detecting surface of the light receiving means 304, corresponding to an error ΔZ in the gap between two objects, is produced and, in the CPU 310 and from the signal concerning the interval between the centers of gravities, the gap error ΔZ concerning the two objects is detected. Then, by using the stage driver 401, the stage 400 is moved by an amount corresponding to the positional deviation ΔZ.

In a second example, by using the CPU 310 and by using signals from the light receiving means 304, such a direction that cancels the gap error ΔZ is detected. In that direction, the stage 400 is moved by the stage driver 401. These operations are repeated until the error ΔZ comes into a tolerable range.

Figure 80B:
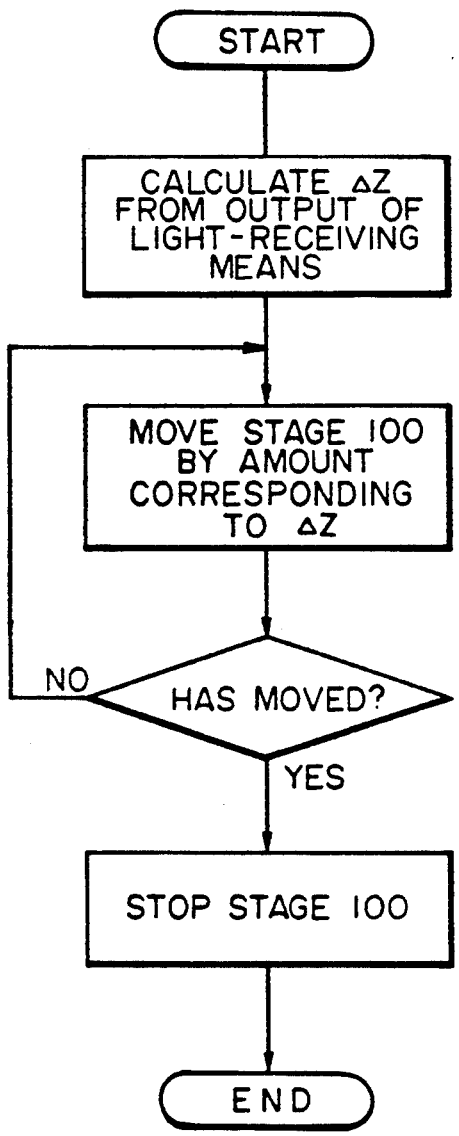
FIGS. 80B and 80C are flow charts, each showing an alignment procedure made in the FIG. 80A embodiment.
Figure 80C:
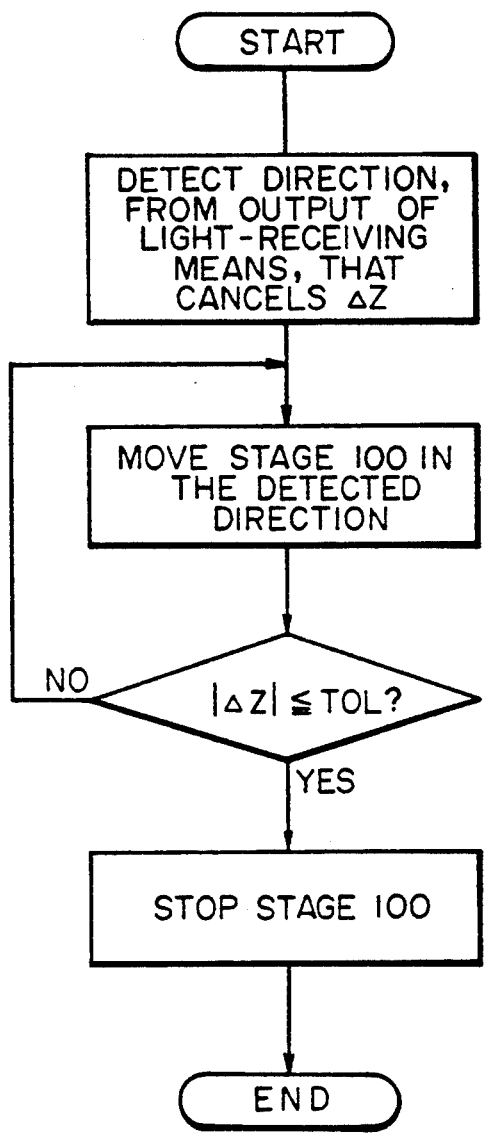

The above-described alignment procedures are illustrated in flow charts of FIGS. 80B and 80C.

The principle of measurement of a surface spacing gm, in a device structured as described above, will now be explained in greater detail, with reference to FIGS. 79A–80A. It is assumed in FIGS. 79A and 79B that the FZP 308 on the mask 302 has an optical axis 305 while the FZP 309 has an optical axis 306 and that these optical axes are relatively deviated in the x direction by Δ$_1$. Also it is assumed that the FZP 308' has an optical axis 305' while the FZP 309' has an optical axis 306' and that similarly these optical axes are relatively deviated in the x direction by Δ$_2$, the direction of deviation being such as illustrated in FIGS. 79A and 79B. Further, f$_{M1}$ denotes the distance between the point F$_1$ and the mask 302 (the focal length of the FZP 308 as a concave lens), while f$_{M2}$ denotes the distance between the point F$_2$ and the mask 302 (the focal length of the FZP 308' as a concave lens).

It is further assumed in the case that the spots 307 and 307' which can be defined by diffraction by the patterns (FZP) 308 and 308' on the mask 302 and the patterns (FZP) 309 and 309' on the wafer 303, are formed at positions which are shifted from the optical axes 305 and 305' of the FZP 308 and 308', respectively, by amounts g$_1$ and g$_2$, respectively. The patterns 309 and 309' of the wafer have been designed each to produce first order diffraction light by which the point F$_1$ (F$_2$) and the position 307 (307') are brought into an optically conjugate relationship. In that case, the following relations are satisfied:

$$g_1 = \frac{f_{M1} + L_0 + 2g_m}{f_{M1} + g_m} \Delta_1 \qquad (30)$$

$$g_2 = \frac{f_{M2} + L_0 + 2g_m}{f_{M2} + g_m} \Delta_2 \qquad (31)$$

The directional relationship of the displacements g$_1$ and g$_2$ with respect to the optical axes 305 and 305' is such as illustrated in FIGS. 79A and 79B. If the spacing gm between the mask 302 and the wafer 303 is constant and when, in that state, the mask and the wafer are relatively deviated along the x-y plane, these displacements can be expressed by those equations similar to equations (30) and (31) but in which a deviation δ is added to the values of Δ$_1$ and Δ$_2$ in equations (30) and (31). If the wafer is deviated by an amount δ upwardly as viewed in FIG. 79A or 79B, the displacements g$_1$' and g$_2$' of the spots 307 and 307' from the optical axes 305 and 305' (which are in the same directions as of the displacements g$_1$ and g$_2$), can be expressed as follows:

$$g_1' = \frac{f_{M1} + L_0 + 2g_m}{f_{M1} + g_m}(\Delta_1 - \delta) = g_1 - \frac{f_{M1} + L_0 + 2g_m}{f_{M1} + g_m}\delta \qquad (32)$$

-continued $$g_2' = \frac{f_{M2} + L_0 + 2g_m}{f_{M2} + g_m}(\Delta_2 + \delta) = g_2 + \frac{f_{M2} + L_0 + 2g_m}{f_{M2} + g_m}\delta \quad (33)$$

Namely, the spot on the detecting means 304 formed by the light converged by the Fresnel zone plates 308 and 309, displaces in a direction reducing $g_1$ (i.e., upwardly in FIG. 79A) by an amount $(f_{M1}+L_0+2g_m)/(f_{M1}+g_m)\delta$. On the other hand, the spot on the detecting means 304 as formed by the light converged by the Fresnel zone plates 308' and 309', displaces in the direction increasing $g_2$ (i.e., upwardly in FIG. 79B) by an amount $(f_{M2}+L_0+2g_m)/(f_{M2}+g_m)\delta$. Therefore, by adjusting each FZP so as to satisfy $f_{M1}=f_{M2}$, the distance between the spots 307 and 307' is unchangeable even if deviation $\delta$ occurs, as seen from equations (32) and (33). If the relation $f_{M1}=f_{M2}$ is retained, any tilt (inclination) of the wafer 303 simply causes displacements of the spots 307 and 307' in the same direction and by substantially the same amount. As a result, the distance between the spots 307 and 307' is unchanged.

On the other hand, as seen from equations (30) and (31), any change in the surface spacing gm results in corresponding changes in the values $g_1$ and $g_2$. For example, if $L_0$ is larger than $f_{M1}$ and $f_{M2}$, an increase in gm reduces $g_1$ and $g_2$. A decrease in gm increases $g_1$ and $g_2$. Thus, the distance between the spots 307 and 307' changes with gm. This means that the measurement of the distance between the spots 307 and 307' on the detecting means 304 assures detection of correct information concerning the surface spacing between a mask and a wafer, without being affected by any displacement of the mask and the wafer in their planes or any inclination thereof. The spacing gm between the mask 302 and the wafer 303 and the interval $l_1$ between the spots 307 and 307' are in the following relationship:

$$l_1 = \left| \frac{(f_{M1} + L_0 + 2g_m)}{f_{M1} + g_m}(\Delta_1 + \Delta_2) - l_M \right| \quad (34)$$

wherein $l_M$ is the distance between the optical axes of the FZP 308 and the FZP 308' and $f_{M1}=f_{M2}$, in this example.

Numerical examples are set forth below.

If $L_0=18345.94$ microns and $f_{M1}=f_{M2}=114.535$ microns, then the relationship between the spacing gm and "$g_1/\Delta_1$" and "$g_2/\Delta_2$" is such as follows:

| gm | $g_1/\Delta_1$ | $g_2/\Delta_2$ |
|---|---|---|
| 61.5 microns | 105.567 | 105.567 |
| 71.5 microns | 100.0 | 100.0 |
| 81.5 microns | 95.0 | 95.0 |

If, $\Delta_1=\Delta_2=10$ microns,

| gm | $g_1, g_2$ |
|---|---|
| 61.5 microns | 1055.67 microns |
| 71.5 microns | 1000.0 microns |
| 81.5 microns | 950.0 microns |

Thus, if the gap changes by 10 microns, from 71.5 microns to 61.5 microns, the interval between the spots 307 and 307' changes by 111.34 microns ($=1055.67\times2-1000\times2$). Namely, a gap variation of 1 micron causes a change of 11.13 microns of the spot interval. If one-dimensional line sensor or a PSD is used as the detecting means 304 and if the change in the interval between the spots 307 and 307' can be detected with a resolution of 1 micron, for example, any change in the surface spacing between the mask 302 and the wafer 303 can be detected with a resolution of 0.09 micron.

Where each parameter in equation (34) concerning the relationship between the spacing of the mask 302 and the wafer 303 and the distance between the spots 307 and 307', is predetected, the surface spacing between the mask 302 and the wafer 303 can be easily determined from a measured value concerning the interval between the spots 307 and 307' and on the basis of the equation.

Figure 81:
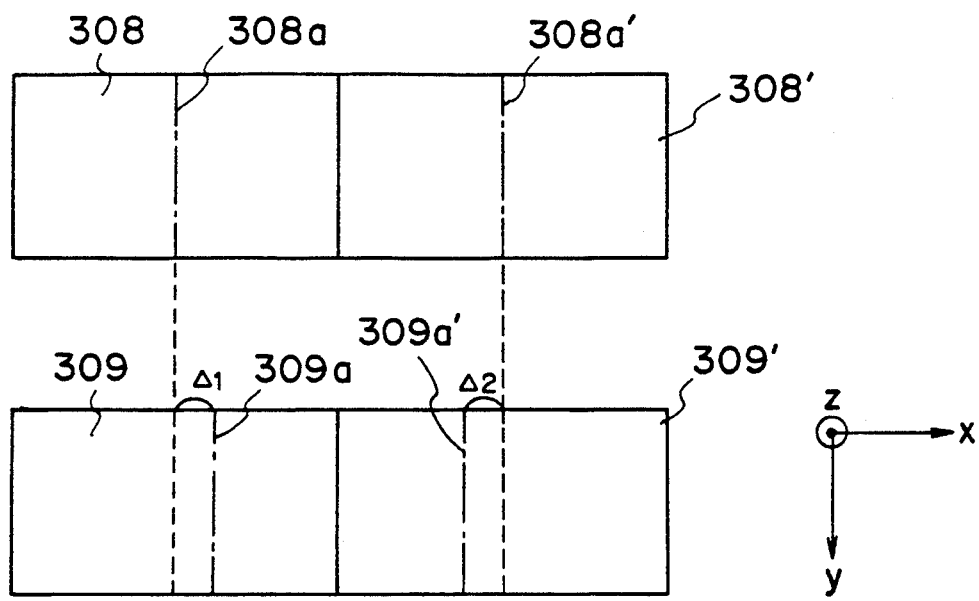
FIG. 81 is a schematic view exemplifying the disposition of Fresnel zone plate (FZP) in the FIG. 80A embodiment.

The relationship between the optical axes of the FZP patterns on the mask and the wafer in FIG. 80A, as viewed from the above of the mask surface and the wafer surface, is illustrated in FIG. 81. In this figure, for facilitating understanding, the FZP members 308 and 308' and the FZP members 309 and 309' are illustrated as being juxtaposed in the y direction. Actually, they are superposed one upon another with respect to the direction perpendicular to the sheet of the drawing (i.e. in the z direction). Reference numerals 308a, 308'a, 309a and 309'a denote those lines that are parallel to the y axis and that contain the optical axis of each FZP.

Figure 82A:
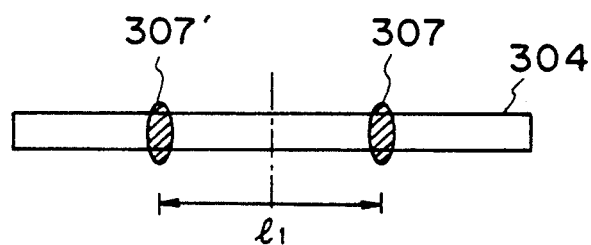
FIG. 82A exemplifies the relationship of two spots as defined in the FIG. 80A embodiment.

The relationship between the spots 307 and 307' as projected on the light receiving means 304 in FIG. 80 is illustrated schematically in FIG. 82A. In the case where, as illustrated, the light receiving means 304 is formed by one line sensor and where the interval of two spots 307 and 307' formed on this line sensor 304 is directly measured, each parameter in equation (34) that determines the relationship between the mask-to-wafer spacing gm and the spot interval $l_1$ may be set so that the spot interval does not come equal to zero for a certain range of the mask-to-wafer spacing which can be normally adopted. By doing so, for one value of $l_1$, always only one value of gm can be determined.

Figure 82B:
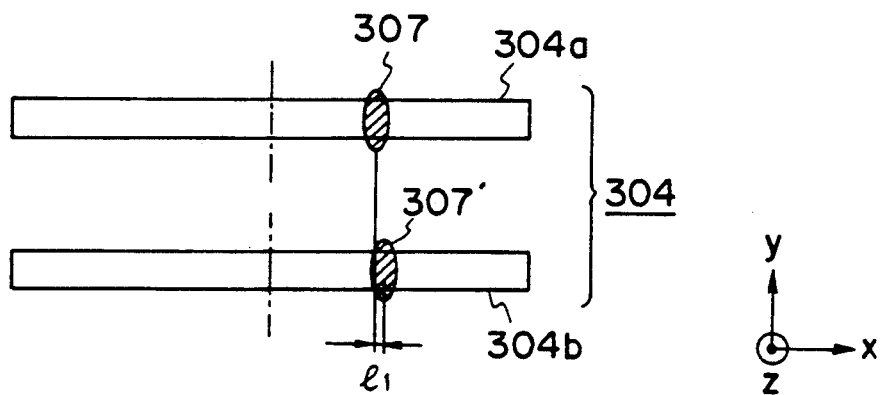
FIG. 82B exemplifies the relationship of two spots defined in accordance with a 41st embodiment.

FIG. 82B illustrates the relationship between spots 307 and 307' being projected upon light receiving means 304, in accordance with a 41st embodiment of the present invention. As illustrated, two line sensors 304a and 304b may be provided at positions relatively shifted in the y direction and the spacing between a mask 302 and a wafer 303 may be detected by forming spots 304a and 304b on these two line sensors and by detecting the interval $l_1$ between the two spots with respect to the x direction. In that case, even if the arrangement is modified so that, when the mask 302 and the wafer 303 are disposed exactly at a set spacing, the x-direction component interval $l_1$ comes equal to zero, whether or not the mask-to-wafer spacing is larger or smaller than the set spacing can be easily discriminated by discriminating which side, of the left and right sides as viewed in the drawing, the spots 307 and 307' are formed on. Clearly, the principle of this alternative that two light spots overlay one upon another when no gap error is present can be applied to the mask-to-wafer alignment in the embodiments described before.

Since each of the FZP members 308, 308', 309 and 309' shown in FIG. 80A has a lens function with respect to both the x and y directions, any relative movement of the mask 302 and the wafer 303 in the y direction causes displacements of the spots 307 and 307' in the widthwise direction of the line sensor 304 by a corresponding amount. In consideration of this, preferably the line sensor 304 has a sufficient width to ensure that the spots 307 and 307' surely lie on the sensor surface even if a possible maximum y-direction deviation occurs between the mask 302 and the wafer 303. In place of such a line sensor, an area sensor having a sufficient width in the y direction may be used to detect the spots 307 and 307'. It is sufficient that each FZP on a mask or wafer is formed by a diffraction pattern having a power (refracting power) at least in one direction (x direction in the embodiment). The power in the y direction may be omitted in the FIG. 80A example.

Figure 83:
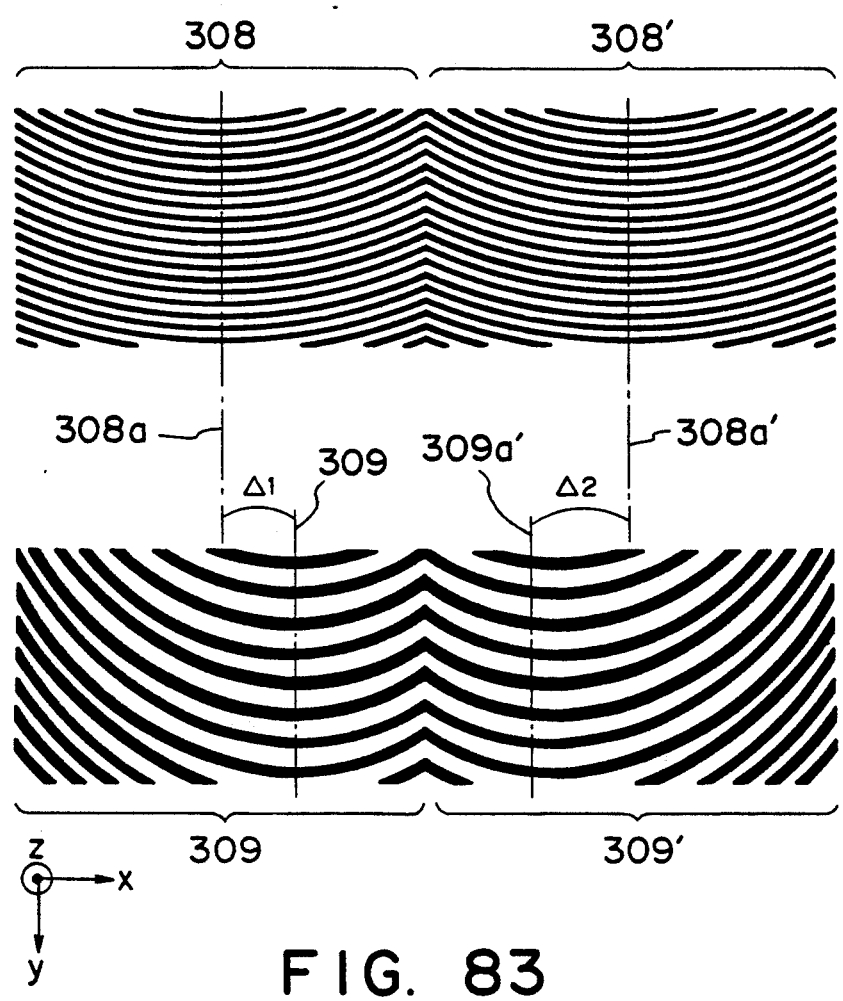
FIG. 83 exemplifies patterns of Fresnel zone plates usable in the FIG. 80A embodiment.

FIG. 83 illustrates an example of an FZP pattern to be provided on a mask and a wafer, in an occasion where the pattern has a power only in the alignment direction (x direction) in the FIG. 80A example but it has no power in a direction (y direction) perpendicular to the alignment direction, and where the incidence angle $\theta$ is set to 17.5 degrees.

Also, the manner of dividing such an area on a mask or wafer in which patterns are to be set, is not limited to a specific one. Only required is that the relationship between optical axes, as determined by the power arrangement of the patterns, is clearly set.

Figure 84:
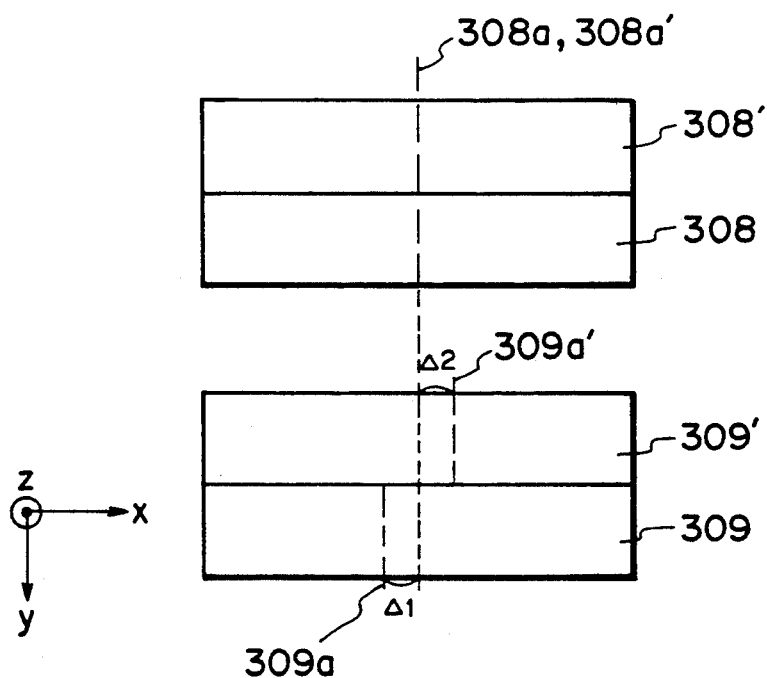
FIG. 84 exemplifies the disposition of Fresnel zone plates in a 42nd embodiment.

FIG. 84 illustrates a 42nd embodiment and shows another example of area division, different from that shown in FIG. 81. In this embodiment, FZP members 308 and 308' and FZP members 309 and 309' are juxtaposed in the y direction. The FZP members 308 and 308' have their optical axes at the same position with respect to the x direction. The FZP members 309 and 309' have their optical axes deviated in the x direction from that position by amounts $\Delta_1$ and $\Delta_2$. Even if the direction of juxtaposition is changed as illustrated, substantially the same effects as in the foregoing embodiment is attainable only by adjusting the angle of incidence of light as well as the refraction angle of the diffraction light by the pattern, so as to assure that the diffraction light is focused upon the light receiving means 304.

Figure 85A:
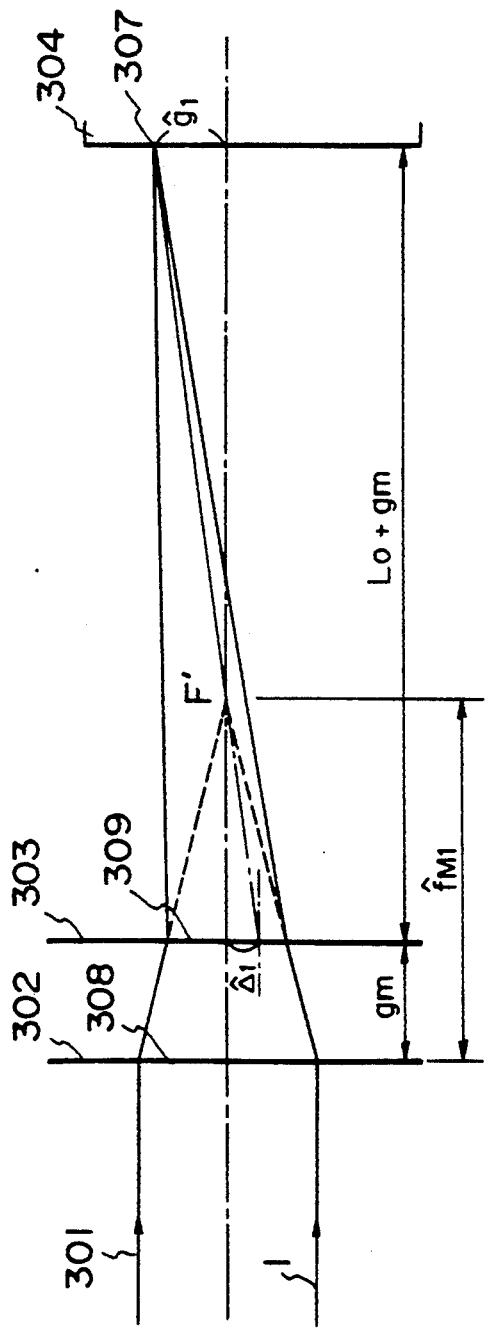
FIGS. 85A and 85B are principle views of a 43rd embodiment.
Figure 85B:
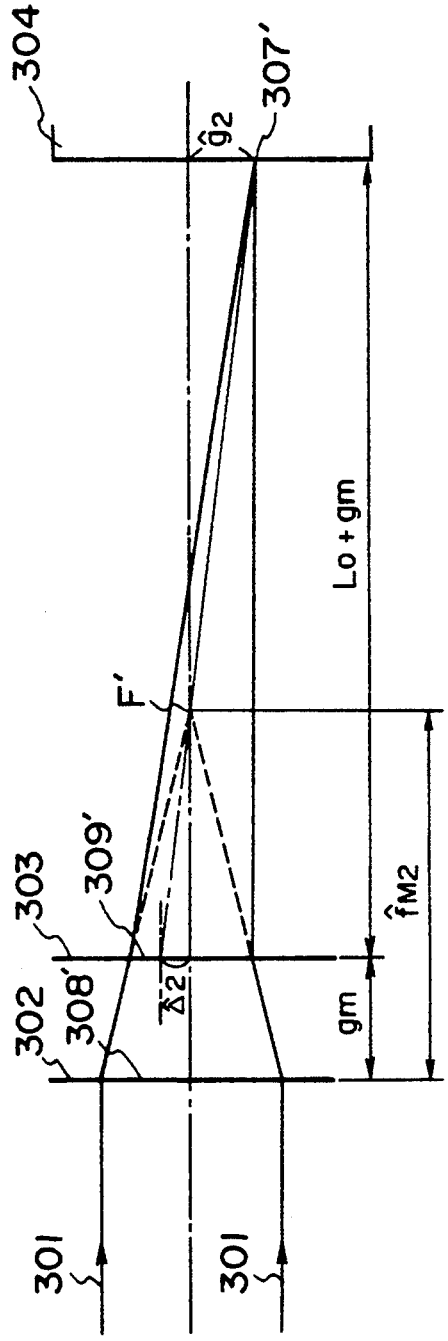

As for the power (refracting power) setting for the FZP members on the mask and wafer, it is not always necessary to use a combination of powers like those of a concave lens and a convex lens, as shown in FIGS. 79A and 79B. A combination of powers like those of a convex lens and a concave lens, such as illustrated in FIGS. 85A and 85B (43rd embodiment), may be used.

Similarly to FIGS. 79A and 79B, in the embodiment of FIGS. 85A and 85B the deviations $\hat{g}_1$ and $\hat{g}_2$ of spots 307 and 307' from optical axes 305 and 305' can be expressed as follows:

$$\hat{g}_1 = \frac{L_0 + 2g_m - \hat{f}_{M1}}{\hat{f}_{M1} - g_m} \cdot \hat{\Delta}_1 \tag{35}$$

$$\hat{g}_2 = \frac{L_0 + 2g_m - \hat{f}_{M2}}{\hat{f}_{M2} - g_m} \cdot \hat{\Delta}_2 \tag{36}$$

wherein $\hat{f}_{M1}$ and $\hat{f}_{M2}$ are focal lengths of the FZP members on the mask, gm is a surface spacing between the mask and the wafer, and $\hat{\Delta}_1$ and $\hat{\Delta}_2$ are deviations of the optical axes of the wafer FZP members 309 and 309' to the optical axes of the mask FZP members 308 and 308'. In that case, as in the case of FIGS. 79A and 79B, the surface spacing between the mask and the wafer can be detected by measuring the interval between the spots 307 and 307' and this can be done regardless of any relative deviation of the mask and the wafer in the x-y plane or any tilt of the wafer.

Described above are those examples in which two lights, which are displaceable with their interval being changeable with a change in the spacing between a mask and a wafer but with their interval being unchangeable with a relative deviation of the mask and the wafer along an x-y plane or with a wafer tilt, are formed by two sets of FZP members, having different optical-axis deviations between the mask and the wafer. Another example in which these two lights are formed by imparting two FZP members, on the mask side, with different light refracting functions for refracting light in different directions, will now be explained.

Figure 86A:
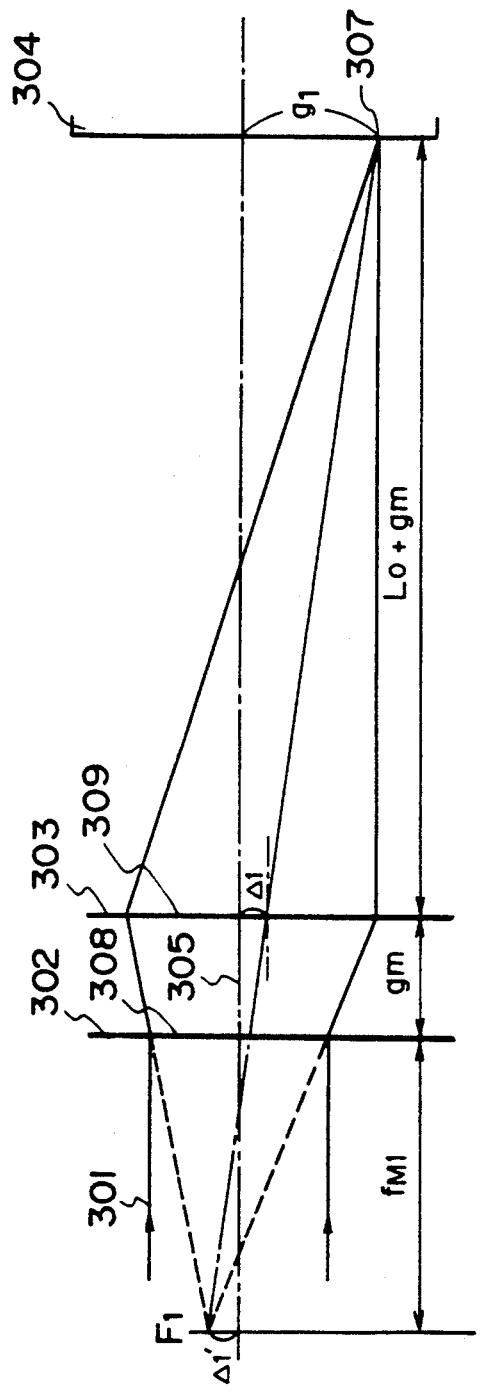
FIGS. 86A and 86B are principle views of a 44th embodiment.
Figure 86B:
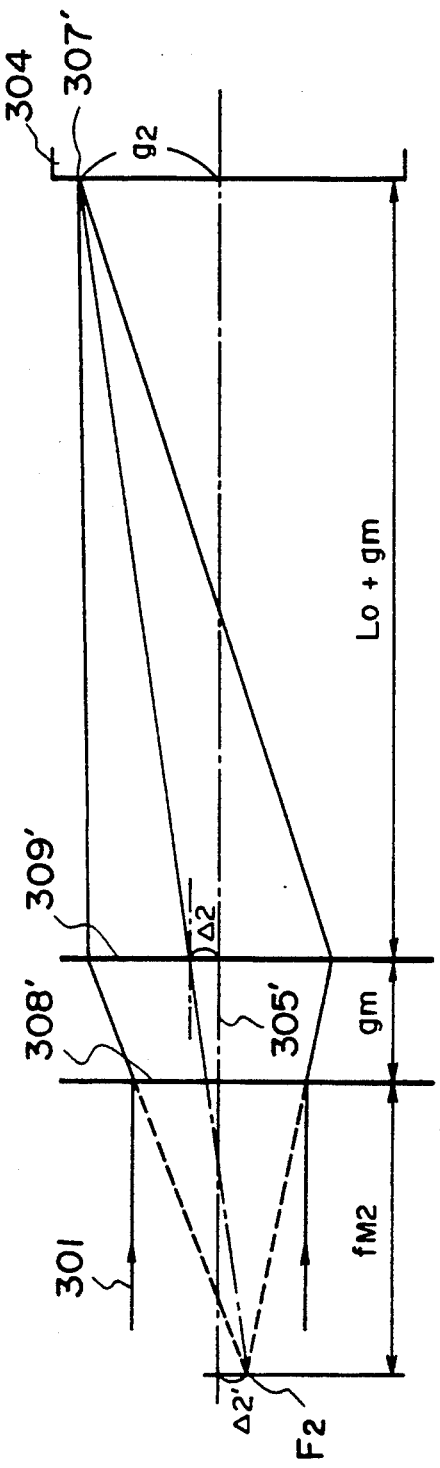

FIGS. 86A and 86B illustrate optical paths in a 44th embodiment in which FZP members 308 and 308' of a mask have different refraction angles. In these Figures, lights incident on the FZP members 308 and 308' emanate therefrom as divergent lights having their origins of divergency defined at focal points $F_1$ and $F_2$ which are spaced from optical axes 305 and 305' by amounts $\Delta_1'$ and $\Delta_2'$, respectively. These lights are incident on FZP members 309 and 309' having their optical axes deviated from those of the FZP members 308 and 308', respectively, by amounts $\Delta_1$ and $\Delta_2$, respectively, whereby they are focused upon light receiving means 304 to form spots 307 and 307', respectively.

The distances $g_1$ and $g_2$ of the spots 307 and 307' formed by the FZP members of the mask and the wafer, from the axes of patterns of the FZP members 308 and 308' are given by the following equations:

$$g_1 = \frac{L_0 + g_m}{f_{M1} - g_m}(\Delta_1' + \Delta_1) + \Delta_1 \tag{37}$$

$$g_2 = \frac{L_0 + g_m}{f_{M2} - g_m}(\Delta_2' + \Delta_2) + \Delta_2 \tag{38}$$

If, in equations (37) and (38), a deviation $\delta$ is added to the values of $\Delta_1$ and $\Delta_2$, those deviations $g_1'$ and $g_2'$ of the spots 307 and 307' from the optical axes 305 and 305' can be expressed as follows:

$$\begin{aligned} g_1' &= \frac{L_0 + g_m}{f_{M1} - g_m}(\Delta_1' + \Delta_1 - \delta) + \Delta_1 - \delta \\ &= g_1 - \frac{L_0 + g_m}{f_{M1} - g_m}\delta - \delta \end{aligned} \tag{39}$$

$$\begin{aligned} g_2' &= \frac{L_0 + g_m}{f_{M2} - g_m}(\Delta_2' + \Delta_2 - \delta) + \Delta_2 - \delta \\ &= g_2 - \frac{L_0 + g_m}{f_{M2} - g_m}\delta - \delta \end{aligned} \tag{40}$$

If $f_{M1} = f_{M2}$, the distance between the spots and 307' does not depend on a relative deviation of the mask and the wafer in the x-y plane, as in the embodiments described above. Also, this distance is unchangeable with any inclination of the wafer. Therefore, by measuring the distance between the spots 307 and 307' as in the foregoing embodiments, the spacing between the mask and the wafer can be measured without being affected by the relative deviation in the x-y plane and the wafer inclination. While in the present embodiment the FZP members of the mask and the wafer have a power combination of "concave and convex", this may be a combination of "convex and concave" as in the foregoing embodiment. As seen from equations (37)-(40), substantially the same effect is attainable even if the axis deviations $\Delta_1$ and $\Delta_2$ of the FZP members of the mask and the wafer each is equal to zero.

Figure 87:
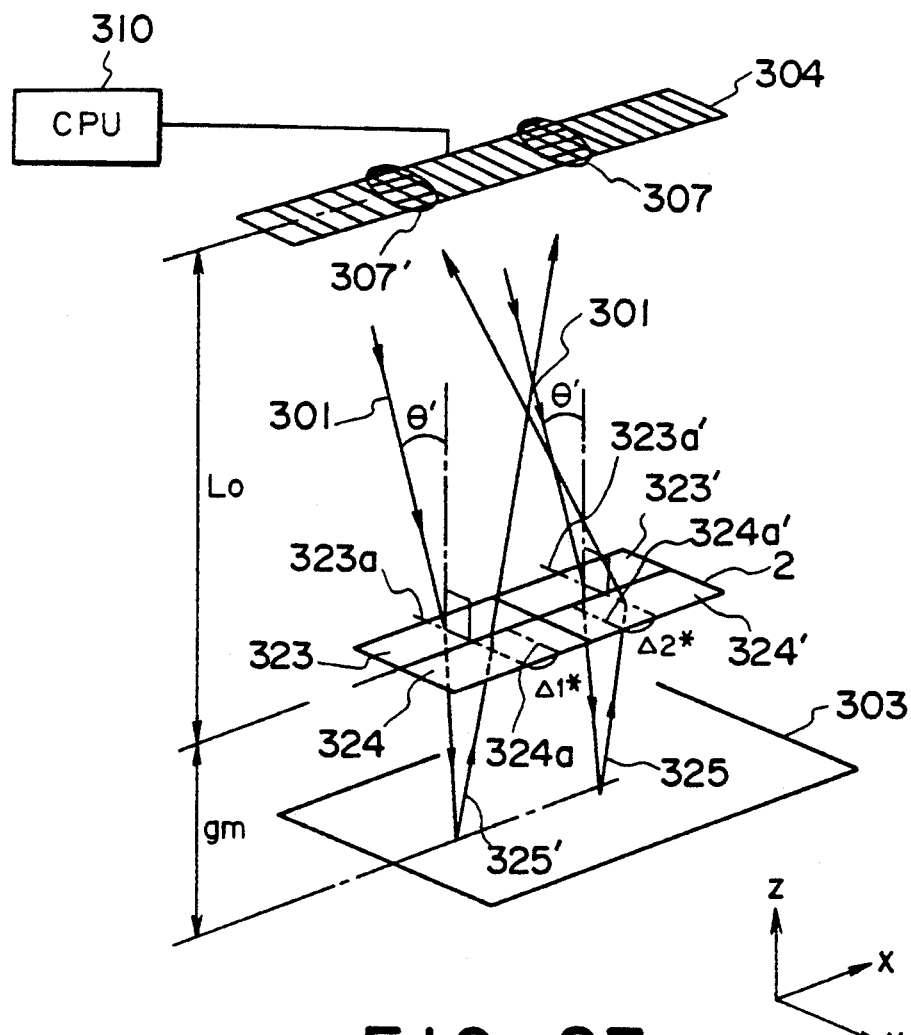
FIG. 87 is a schematic view showing a major portion of a 45th embodiment.
Figure 88:
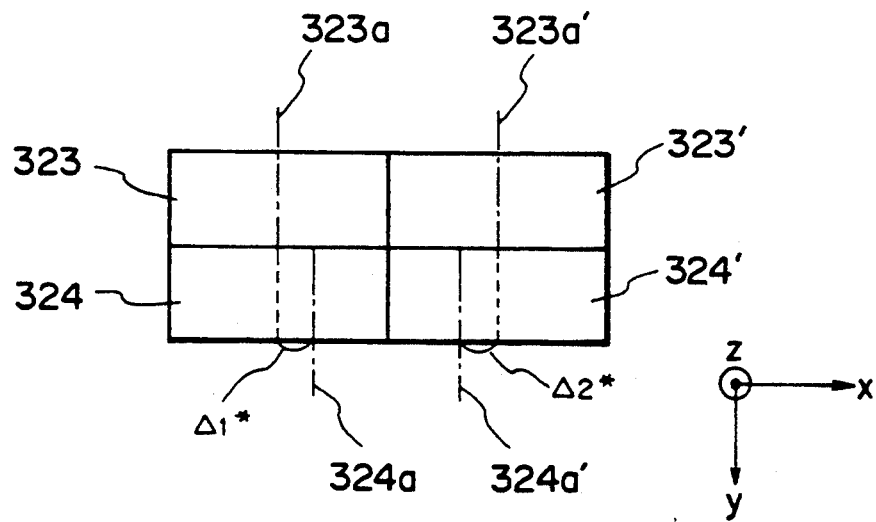
FIG. 88 exemplifies the disposition of Fresnel zone plates in the 45th embodiment.

In some embodiments described above, both of a mask and a wafer are provided with FZP members. A description will now be provided of a 45th embodiment in which only a mask is provided with FZP members while a wafer is formed with a specular reflection surface not patterned. The structure of such a device is exemplified in FIG. 87. The relationship between the setting of a pattern area on a mask and optical axes of FZP members in the case of FIG. 87, is illustrated in FIG. 88.

Denoted at 323 and 323' are FZP members at light entrance side; denoted at 323a and 323a', those lines parallel to the y axis and containing optical axes of the light entrance side FZP members 323 and 323'; and denoted at 324a and 324a', those lines parallel to the y axis and containing optical axes of light exit side FZP members 324 and 324' provided on the mask 302, for diffracting again lights 325 and 325' having been reflected at the zero-th order from a wafer 303. As illustrated, the optical axes of the light entrance side FZP members 323 and 323' are deviated from those of the light exit side FZP members 324 and 324' in the x direction by amounts $\Delta_1{}^*$ and $\Delta_1{}^*$, respectively. The situation in FIG. 87 is explicated in optical path views of FIGS. 89A and 89B, with the regular reflection by the wafer being replaced by and illustrated by transmitted light rays. In these figures, the distances $g_1{}^*$ and $g_2{}^*$ of the spot positions 320 and 320' from the optical axes 321 and 321', respectively, of the mask FZP members on the light entrance side can be expressed as follows:

$$g_1{}^* = \frac{L_0 + f_{M1}{}^* + 2 \cdot g_m}{f_{M1}{}^* + 2 \cdot g_m} \cdot \Delta_1{}^* \quad (41)$$

$$g_2{}^* = \frac{L_0 + f_{M2}{}^* + 2 \cdot g_m}{f_{M2}{}^* + 2 \cdot g_m} \cdot \Delta_2{}^* \quad (42)$$

wherein $f_{M1}{}^*$ and $f_{M2}{}^*$ are focal lengths of the FZP members 323 and 323', respectively. It is seen from the relations given by equations (41) and (42), that in this embodiment, similar to the foregoing embodiments, the spacing gm between the mask 302 and the wafer 303 can be measured by detecting the distance between the spots 320 and 320', without being affected by any positional deviation in the x-y plane and any wafer inclination.

Figure 90:
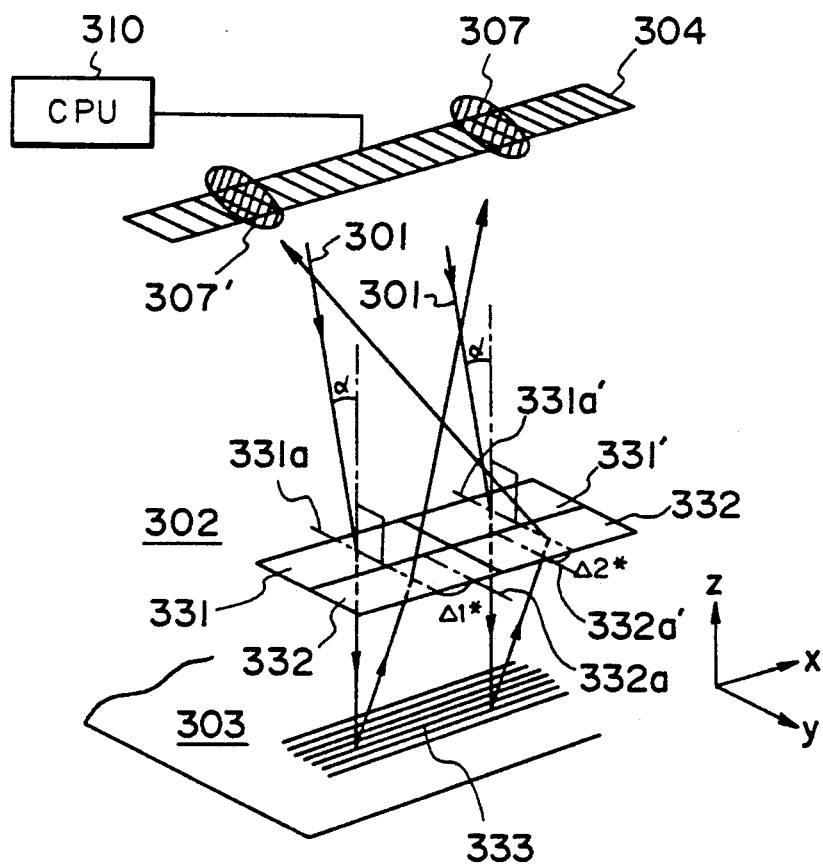
FIG. 90 is a schematic view showing a major portion of a 46th embodiment.
Figure 91:
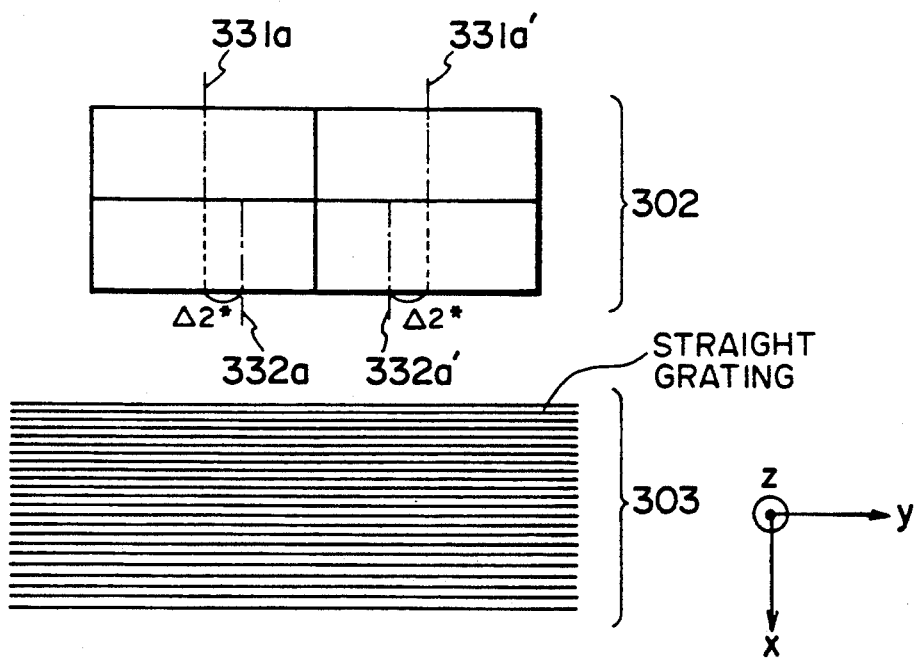
FIG. 91 exemplifies the disposition of Fresnel zone plates in the 46th embodiment.

While the embodiment shown in FIGS. 87-89B uses a zero-th order regular reflection from a wafer, description will now be made of a 46th embodiment shown in FIG. 90 in which a wafer 303 is formed with a straight grating 333 so that, on the wafer 303, the direction of diffraction can be changed. FZP members 331, 331', 332 and 332' as illustrated are provided so as to focus, on a light receiving means 304, those lights having been diffracted by the straight grating 333. Except for this point, they are similar to the FZP members 321, 321', 322 and 322' shown in FIG. 87, and those lines 331a, 331a', 332a and 332a' parallel to the y axis and containing the optical axes of these members are relatively deviated in the x direction by amounts $\Delta_1{}^*$ and $\Delta_2{}^*$, as illustrated. Details of the relationship of the pattern areas on the mask and the wafer with the optical axes in the FIG. 90 example are explicated in FIG. 91. Similar to FIG. 81, FIG. 91 illustrates the mask 302 and the wafer 303 as viewed from the above, with the mask 302 and the wafer 303 being relatively shifted in the x direction for facilitating understanding. Substantially the same effect as in the FIG. 87 embodiment is attainable also in this embodiment.

While in the foregoing the invention has been described with reference to cases of proximity exposure which is used in x-ray lithography or otherwise, the following description will be provided of an example wherein the invention is applied to a reduction type optical stepper or a stepper using an excimer laser beam.

Figure 92:
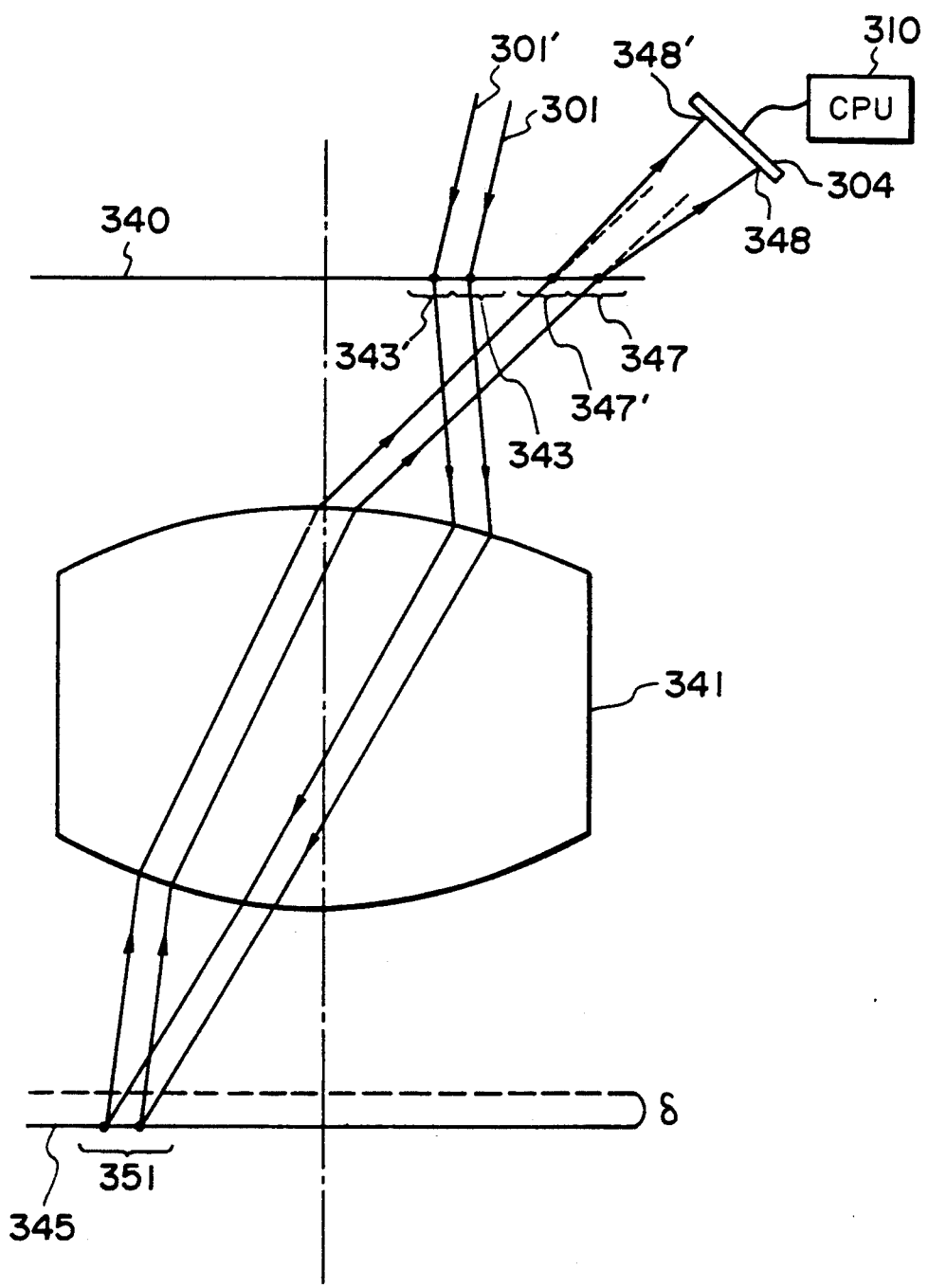
FIG. 92 is a schematic view showing a major portion of a 47th embodiment.

FIG. 92 is a schematic view of a 47th embodiment wherein the invention is applied to an optical stepper or a reduction stepper using an excimer laser. Denoted at 340 is a reticle; at 345, a wafer; denoted at 341, a projection optical system; and denoted at 343, 343', 347 and 347', FZP members provided on the reticle. In this example, a straight grid 351 is provided on a wafer, for changing the angle of emission of light 301. The interval between spots 348 and 348' is changeable in accordance with a variation δ in the position of the wafer 345 which is displaceable toward and away from the reticle. Except for the provision of the projection optical system 341 between the reticle 340 and the wafer 345, in principle the present embodiment is the same as the FIG. 90 embodiment and, therefore, substantially the same effect as in that embodiment is attainable.

Figure 93:
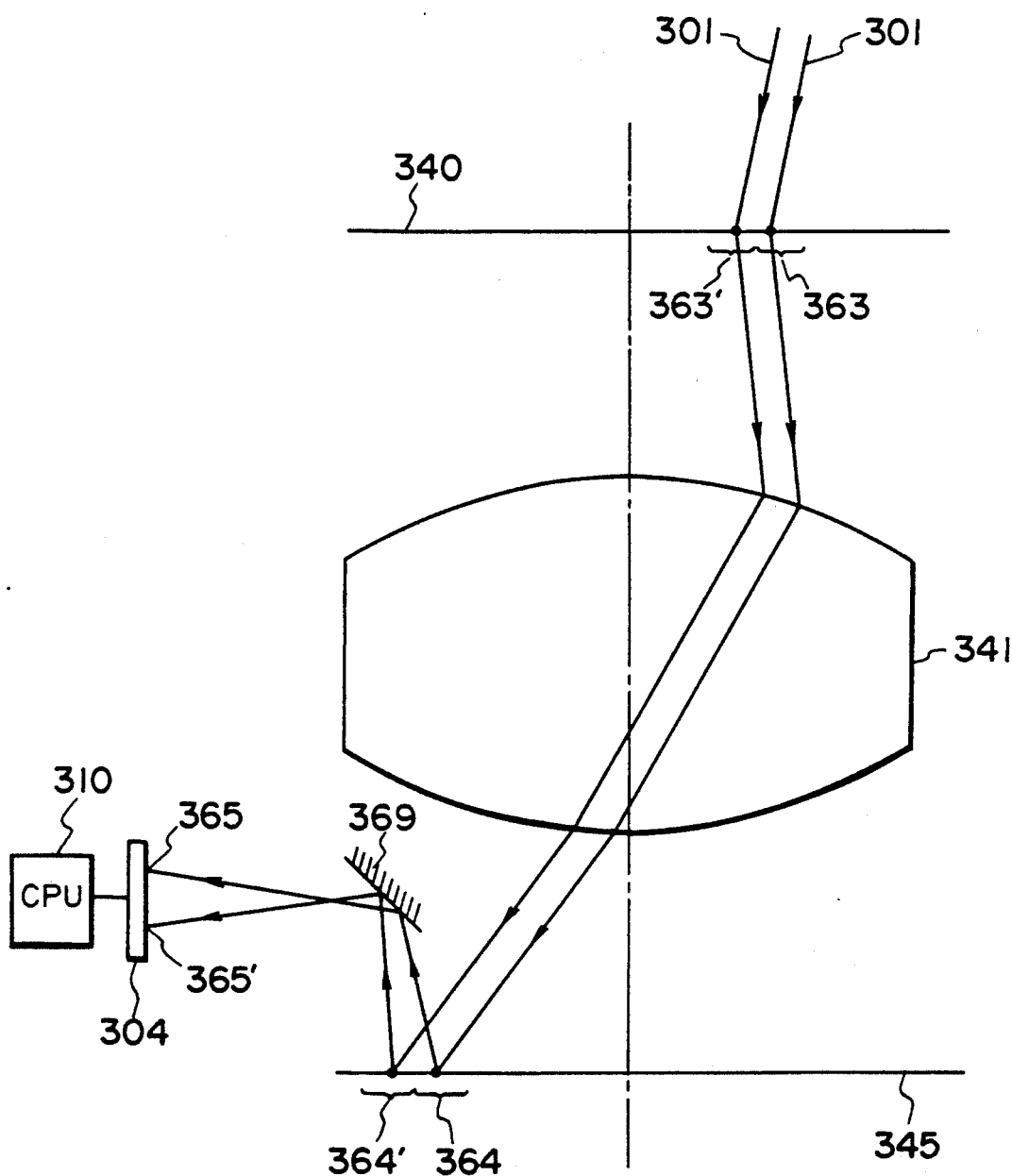
FIG. 93 is a schematic view showing a major portion of a 48th embodiment.

FIG. 93 is a schematic view of a 48th embodiment in which the invention is applied to a stepper, like the FIG. 92 embodiment. Denoted at 363 and 363' are FZP members on a reticle, and denoted at 364 and 364' are FZP members on a wafer. By measuring the interval between light spots 365 and 365' formed on a detecting means 304, any deviation of a wafer 368 to an imaging lens 361 with respect to the direction of an optical axis thereof, namely, the spacing thereof to the reticle 360 can be measured. This is in principle the same as that in the FIG. 80A embodiment.

Figure 94:
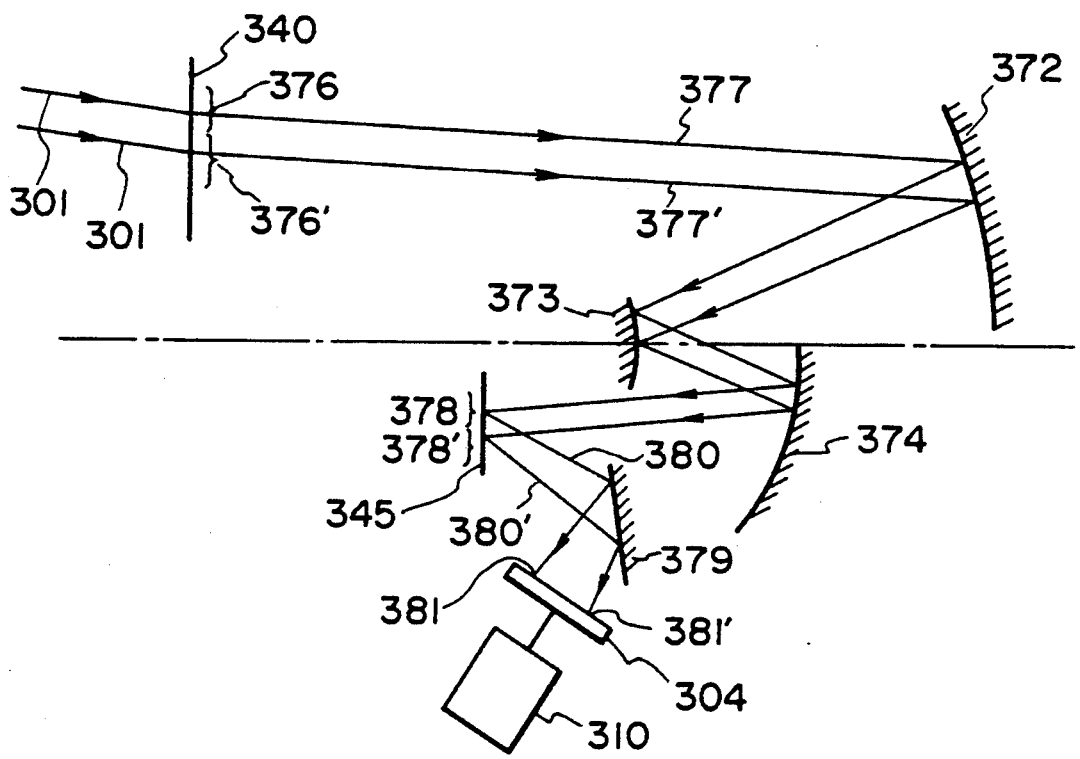
FIG. 94 is a schematic view showing a major portion of a 49th embodiment.

FIG. 94 is a schematic view of a 49th embodiment which is an example of the application of the invention to a mirror reduction type stepper. Reticle 340 and a wafer 345 are in an optically conjugate (imaging) relationship with respect to three groups of mirrors 372, 373 and 374. Denoted at 376 and 376' are FZP pattern areas on the reticle, while denoted at 378 and 378' are FZP pattern areas on the wafer. Light receiving means 304 operates to measure the interval between spots 381 and 381' and, by this, any deviation of the wafer in the direction of the optical axis is detected. This is in principle the same as the FIG. 80A embodiment, too.

In the foregoing, the FZP members of the mask and the wafer have been explained, in terms of lenses, as being a combination of a convex lens and a concave lens or a combination of a concave lens and a convex lens. However, provided that appropriate spots can be formed on a detecting means, a combination of two convex lenses or a combination of two concave lenses, in terms of lenses, may be used. Such a spot or spots having a slight expansion may be used, provided that the center of gravity thereof can be detected.

Figure 95:
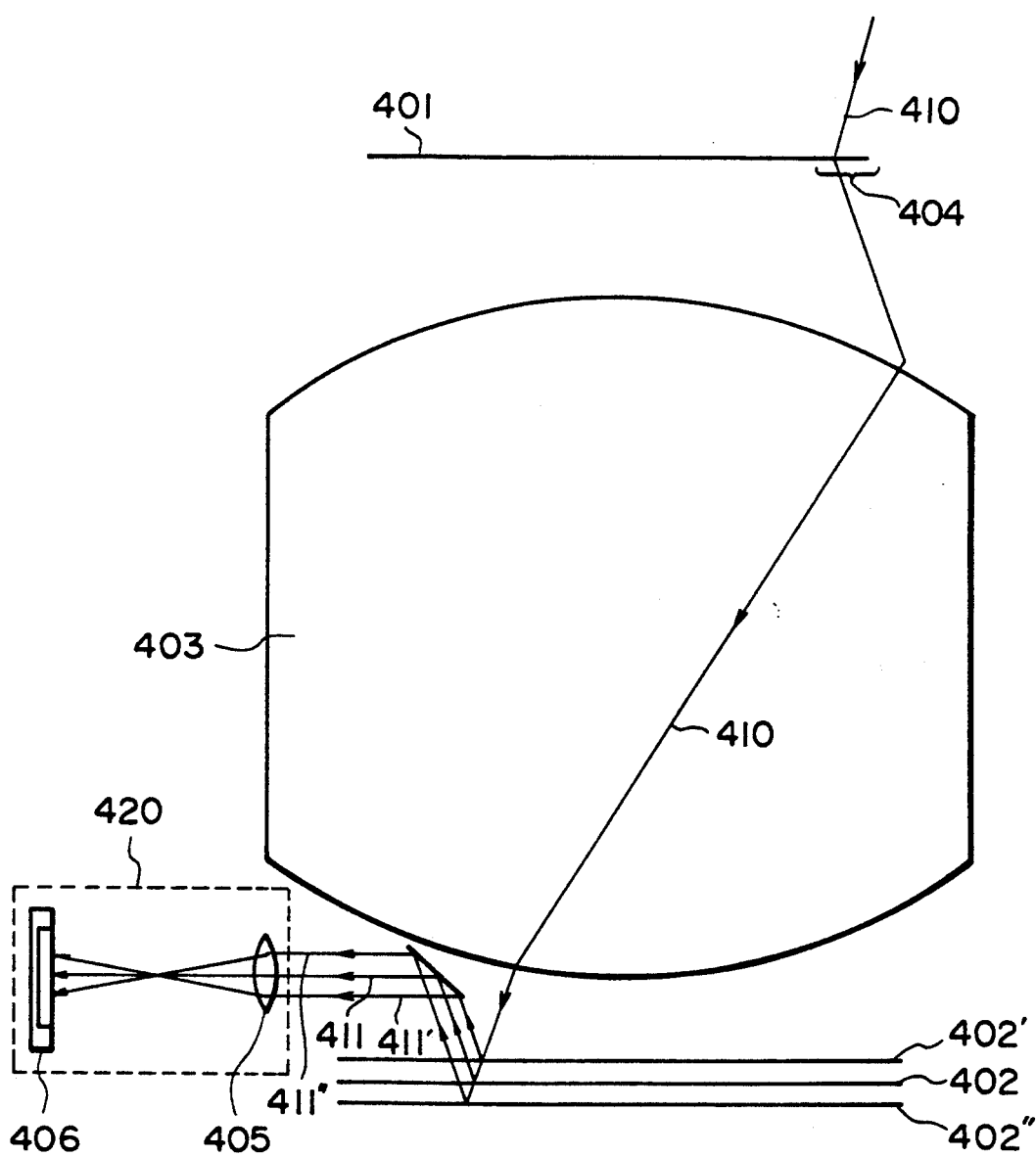
FIG. 95 is a schematic side view of a major portion of a semiconductor device manufacturing exposure apparatus according to a 50th embodiment of the present invention.

FIG. 95 illustrates in a schematic view an optical arrangement of a 50th embodiment of the present invention, wherein the invention is applied to a reduction projection type exposure apparatus which is adapted to use a ultraviolet light as a radiation energy for exposure.

Denoted in FIG. 95 at 401 is a mask or reticle; denoted at 402, a wafer; and denoted at 403, a reduction projection optical system for projecting a pattern of the mask 401 upon the wafer 402 in a reduced scale. The wafer when it is at the position denoted at 402 is placed exactly at the focus position of the projection optical system 403. On the other hand, the wafer when it is at such position as denoted 402' or 402" in FIG. 95 is displaced from the focus position 402 such that an image of the mask 401 pattern is defocused on the wafer.

Denoted at 404 is a diffraction grating which is formed in a portion of the mask 401 and which includes linear patterns of regular intervals. Denoted denoted at 405 is a light receiving lens; and denoted at 406, a photoelectric converting device such as a CCD sensor, for example. Reference numeral 410 denotes a light used for the detection of the wafer position in the direction of the optical axis of the projection optical system 403. Reference numerals 411, 411' and 411" depict lights reflected from the wafer surface when the wafer is at the positions denoted at 402, 402' and 402", respectively.

Figure 96:
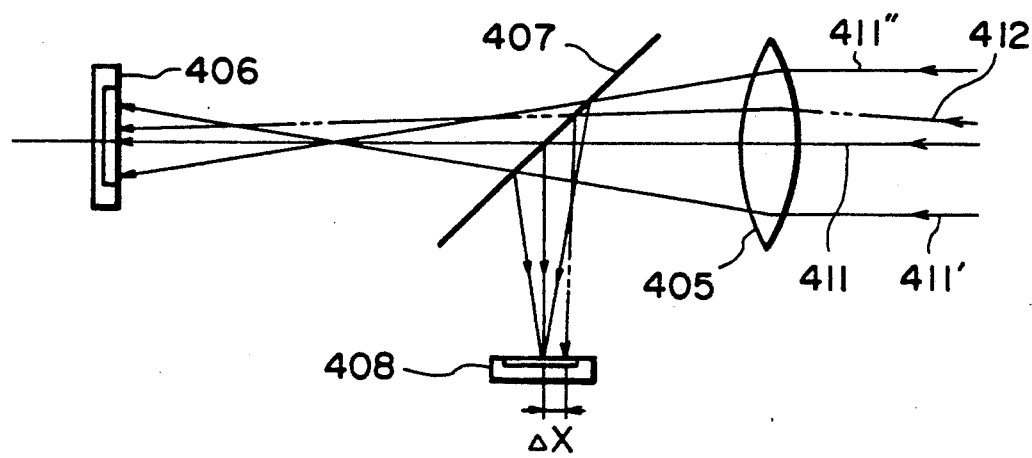
FIG. 96 is a schematic representation illustrating a sensing means used in the 50th embodiment.

Denoted generally at 420 is a sensing means details of which are illustrated in FIG. 96.

In operation, light 410 projected from an unshown light source upon the mask 401 is diffracted by the diffraction grating 404 in a predetermined direction and, after passing the projection optical system 403, the diffraction light impinges on the wafer at a predetermined angle of incidence. The light reflected by the wafer at this time goes along a path which is shiftable by parallel displacement with a change in the wafer position in the direction of the optical axis of the projection optical system 403, as seen in FIG. 95. The reflected light is directed to the outside region of the projection optical system 403 by means of a reflection mirror, and then is projected upon the photoelectric converting means 406 with the shift of the position of incidence of the light due to the parallel displacement of the light path being magnified by the lens 405.

Where the wafer is at the focus position 402, the reflected light from the wafer will be incident at a predetermined reference position on the sensor 406. On the other hand, if the wafer is at any defocus position, the reflected light from the wafer will be collected at a position shifted from the reference position. The amount of shift in that case is substantially proportional to the amount of the shift of the wafer position. Thus, by measuring the amount of shift of the position of the light incident of the photoelectric converting device 406 from the reference position, the amount of shift of the wafer position (i.e. the amount of defocus) can be detected. The reference position can be easily determined in preparation by trial printing of a wafer or wafers, for example. Alternatively, since the focus position of a used projection optical system can be determined at a predetermined distance from the end face of the projection lens system, for example, the reference position may be determined first by bringing a wafer to the position of the predetermined distance by using a suitable wafer position detecting means and second by determining the position of the wafer-reflected light incident in that occasion upon the sensor 406 as the reference position.

If in the structure described above the wafer has a surface inclination or the wafer as a whole inclines, the light spot on the photoelectric converting device 406 displaces accordingly. However, the effect of such inclination can be avoided by the present embodiment. To achieve this, the sensing means 420 is arranged such as illustrated in FIG. 96. More specifically, there are provided a half mirror 407 and an additional photoelectric converting device 408 such as a PSD sensor or a CCD sensor which is of a type that the position of incidence of a light thereupon can be discriminated. The photoelectric converting device 408 is disposed at a focal point position of the lens 405 (more exactly, at a position which is optically equivalent to the focal point position).

In the system shown in FIG. 96 and provided that the wafer does not have an inclination, if the light 411 from the wafer shifts by parallel displacement due to a change in the wafer position, as depicted at 411' or 411", the light impinges always at the same point on the photoelectric converting element 408 surface. If however the wafer is inclined, the angle of the reflected light 411 from the wafer changes as depicted at 412, for example, such that the position of incidence of the wafer-reflected light upon the photoelectric converting device 408 shifts by an amount $\Delta x$ which can be determined by the following equation:

$$\Delta x = \Delta \alpha \times f_1$$

wherein $\Delta \alpha$ is the amount (rd) of change in angle and $f_1$ is the focal length of the lens 405. By using this $\Delta x$, the position of light upon the position detecting photoelectric converting device 406 can be correctly compensated.

More specifically, since $\Delta x$ is proportional to $\Delta x'$ which represents the amount of shift of the light 411 incident upon the photoelectric converting device 406 as resulting from the same inclination of the wafer, a true value $S_0$ can be detected first by detecting in preparation a constant k of proportion regarding that proportional relationship, that is, $\Delta x' = k \cdot \Delta x$, and second by subtracting $k \cdot \Delta x$ from the amount $S_1$ of the displacement of the light upon the photoelectric converting device 406. Namely:

$$S_0 = S_1 - k \cdot \Delta x$$

From the detected value $S_0$, it is possible to correctly detect an amount of defocus without being affected by the inclination.

While the invention has been described with reference to the structures disclosed herein, it is not confined to the details set forth and this application is intended to cover such modifications or changes as may come within the purposes of the improvements or the scope of the following claims.

What is claimed is:

1. A device for detecting the positional relationship between a mask and a wafer in a predetermined direction, said device comprising:

light source means for emitting light toward the mask or the wafer;

first detecting means having a first light receiving surface, for detecting the position of incidence of a first light, upon said first light receiving surface, having been emitted rom said light source means and having been deflected by the mask and having been reflectively deflected by the wafer toward said first light receiving surface, wherein the position of the incidence of the first light upon said first light receiving surface is changeable with a change in the positional relationship between the mask and the wafer in said predetermined direction;

second detecting means having a second light receiving surface, for detecting the position of incidence of a second light, upon said second light receiving surface, having been emitted from said light source mans and having been reflectively deflected by the wafer to said second light receiving surface, wherein the state of the position of incidence of the second light resulting rom a change in the positional relationship between the mask and the wafer, in said predetermined direction differs from that of the first light; and means for detecting the positional relationship between the mask and the wafer in said predetermined direction, on the basis of the detection by said first and second detecting means, whereby the positional relationship between the mask and the wafer is detected without being affected by a change in an inclination component between the mask and the wafer.

2. A device according to claim 1, wherein said positional relationship detecting means detects the positional relationship between the mask and the wafer in a direction perpendicular to a direction in which the mask and the wafer are spaced from each other.

3. A device according to claim 1, wherein the position of incidence of the second light is unchangeable with a change in the positional relationship between the mask and the wafer in said predetermined direction.

4. A device according to claim 3, wherein the mask and the wafer are provided with diffraction gratings by which the first light is diffracted and wherein the second light is reflected by the wafer.

5. A device according to claim 1, wherein the position of incidence of the second light is changeable with a change in the positional relationship between the mask and the wafer in said predetermined direction and wherein the position of incidence of the second light changes by an amount corresponding to a multiple of the amount of change in the position of incidence of the first light.

6. A device according to claim 1, wherein the position of incidence of the second light is changeable with a change in the positional relationship between the mask and the wafer in said predetermined direction and wherein the position of incidence of the second light changes in a direction opposite to a direction of change in the position of incidence of the first light.

7. A device according to claim 6, further comprising:
third detecting means having a third light receiving surface, for detecting the position of incidence of a third light, upon said third light receiving surface, having been emitted from said light source and having been deflected by the mask and the wafer to said third light receiving surface, wherein the position of incidence of the third light is changeable with a change in the positional relationship between the mask and the wafer in said predetermined direction;

fourth detecting means having a fourth light receiving surface, for detecting the position of incidence of a fourth light upon said fourth light receiving surface, having been emitted from said light source mans and having been deflected by the mask and the wafer to said fourth light receiving surface, wherein the position of incidence of the fourth light being changeable with a change in the positional relationship between the mask and the wafer in said predetermined direction and wherein the position of incidence of the fourth light changes in a direction opposite to a direction of change in the position of the incidence of the third light;

wherein when the mask and the wafer are in a positional relationship the first light and the second light are incident on the same position, wherein when the mask and the wafer are in a second positional relationship different from the first positional relationship the third and fourth lights are incident on the same position, and wherein said positional relationship detecting means detects the amount and direction of a relative positional deviation between the mask and the wafer on the basis of the detection by said first, second, third, and fourth detecting means.

8. A device according to claim 1, wherein said positional relationship detecting means detects the spacing between the mask and the wafer.

9. A mark arrangement usable for detecting positional relationship between a first and second objects, comprising:

a first mark provided on the first object, having a function for diffracting in a first direction a first light incident thereupon;

a second mark provided on the second object, having a function for diffracting in a second direction the first light having been diffracted in the first direction by said first mark, wherein the position of incidence upon a predetermined plane of the first light having been diffracted by the second mark is changeable with a change in the relative position of said first and second marks; and a third mark provided on the first object, having a function for diffracting in a third direction a second light incident thereupon, wherein the second light diffracted by said third mark is directed by way of the second object in a fourth direction and wherein the state of the position of incidence upon a predetermined plane of the second light, diffracted by said third mark, resulting from a change in the relative position of said first and second marks, differs from that in the first light;

wherein the positional relationship between the first and second objects can be detected without being affected by any inclination therebetween, by detecting the position of incidence of the first and second lights.

10. A mark arrangement according to claim 9, wherein said first and third marks are formed in the same region.

11. A mark arrangement according to claim 9, wherein each of the first and third marks are divided into sections and wherein the sections of said first and third marks are arrayed alternately.

12. A device for measuring an interval between a first object and a second object, said device comprising:
light source means for projecting a light to the first object;

a light receiving optical system for receiving the light projected by said light source means and deflected by the first and second objects, said light receiving optical system having means for separating the received light;

first light detecting means for receiving a first one of lights as separated by said separating means, said first light detecting means receiving the first light at a site at which the position of the first light incident thereat is changeable with a change in the interval between the first and second objects, and said first light detecting means being operable to detect the position of incidence of the received light; and second light detecting means for receiving a second one of the lights separated by said separating means, said second light detecting means receiving the second light at a site at which the position of the second light incident thereat is not changeable with a change in the interval between the first and second objects, and said second light detecting means being operable to detect the position of incidence of the received light;

wherein the interval between the first and second object is measured on the basis of the detection by said first and second light detecting means.

13. A pattern transfer system comprising:
an alignment system for aligning a mask and a wafer; and
an exposure system for transferring a mask pattern to the wafer by exposure;
wherein said alignment system comprises:
light source means for emitting light to illuminate the mask or the wafer;
first detecting means having a first light receiving surface, for detecting the position of incidence of the first light beam upon said first light receiving surface, having been emitted from said light source means and having been deflected by the mask and having been reflectively deflected by the wafer toward said first light receiving surface, wherein the position of the incidence of the first light beam upon said first light receiving surface is changeable with a change in the positional relationship between the mask and the wafer in a predetermined direction;
second detecting means having a second light receiving surface, for detecting the position of incidence of a second light beam, upon said second light receiving surface, having been emitted from said light source means and having been reflectively deflected by the wafer to said second light receiving surface, wherein the state of the position of incidence of the second light beam resulting from a change in the positional relationship between the mask and the wafer, in said predetermined direction differs from that of the first light beam; and
means for detecting the positional relationship between the mask and the wafer in said predetermined direction, on the basis of the detection by said first and second detecting means, whereby the positional relationship between the mask and the wafer is detected without being affected by a change in an inclination component between the mask and the wafer.

14. A semiconductor device manufacturing method comprising the steps of:
preparing a mask and a wafer;
emitting light to illuminate the mask or the wafer from light source means;
detecting the position of incidence of a first light beam, upon a first light receiving surface, having been emitted from the light source means and having been deflected by the mask and having been reflectively deflected by the wafer toward the first light receiving surface, wherein the position of the incidence of the first light beam upon the first light receiving surface is changeable with a change in the positional relationship between the mask and the wafer in a predetermined direction;
detecting the position of incidence of a second light beam, upon a second light receiving surface, having been emitted from the light source means and having been reflectively deflected by the wafer to the second light receiving surface, wherein the state of the position of incidence of the second light beam resulting from a change in the positional relationship between the mask and the wafer, in said predetermined direction differs from that of the first light beam;
detecting the positional relationship between the mask and the wafer in the predetermined direction, on the basis of the detection in said detecting steps, whereby the positional relationship between the mask and the wafer is detected without being affected by a change in an inclination component between the mask and the wafer; and
transferring a mask pattern of the mask to the wafer.

15. A semiconductor device manufactured by a method which comprises the steps of:
preparing a mask and a wafer;
emitting light to illuminate the mask or the wafer from light source means;
detecting the position of incidence of a first light beam, upon a first light receiving surface, having been emitted from the light source means and having been deflected by the mask and having been reflectively deflected by the wafer toward the first light receiving surface, wherein the position of the incidence of the first light beam upon the first light receiving surface is changeable with a change in the positional relationship between the mask and the wafer in a predetermined direction;
detecting the position of incidence of a second light beam, upon a second light receiving surface, having been emitted from the light source means and having been reflectively deflected by the wafer to the second light receiving surface, wherein the state of the position of incidence of the second light beam resulting from a change in the positional relationship between the mask and the wafer, in the predetermined direction differs from that of the first light beam;
detecting the positional relationship between the mask and the wafer in the predetermined direction, on the basis of the detection in said detecting steps, whereby the positional relationship between the mask and the wafer is detected without being affected by a change in an inclination component between the mask and the wafer; and
transferring a mask pattern of the mask to the wafer.

* * * * *

UNITED STATES PATENT AND TRADEMARK OFFICE
CERTIFICATE OF CORRECTION

PATENT NO. : 5,327,221
DATED : July 5, 1994
INVENTOR(S) : Kenji Saitoh, et al.

It is certified that error appears in the above-indentified patent and that said Letters Patent is hereby corrected as shown below:

COLUMN 2

Line 5, "relative" should read --relative to--.

COLUMN 3

Line 67, "principle" should read --principal--.

COLUMN 4

Line 42, "principle" should read --principal--.

COLUMN 5

Line 30, close-up right margin.
Line 36, "principle" should read --principal--.
Line 39, "principle" should read --principal--.
Line 42, "principle" should read --principal--.
Line 52, "principle" should read --principal--.

COLUMN 6

Line 6, "principle" should read --principal--.
Line 9, "principle" should read --principal--.
Line 16, "principle" should read --principal--.
Line 23, "principle" should read --principal--.
Line 45, "principle" should read --principal--.
Line 63, "principle" should read --principal--.
Line 65, "principle" should read --principal--.

UNITED STATES PATENT AND TRADEMARK OFFICE
CERTIFICATE OF CORRECTION

PATENT NO. : 5,327,221
DATED : July 5, 1994
INVENTOR(S) : Kenji Saitoh, et al.

It is certified that error appears in the above-indentified patent and that said Letters Patent is hereby corrected as shown below:

COLUMN 7

Line 3, "principle" should read --principal--.

COLUMN 18

Line 18, "tee" should read --the--.

COLUMN 22

Line 14, "an" should read --and--.
Line 25, "example" should read --example,--.

COLUMN 23

Line 64, "Figures," should read --figures,--.

COLUMN 25

Line 19, "thee" should read --there--.

COLUMN 26

Line 4, "Figures" should read --figures--.
Line 8, "Figures" should read --figures--.
Line 27, "Figures" should read --figures--.

COLUMN 29

Line 59, delete "a".

UNITED STATES PATENT AND TRADEMARK OFFICE
CERTIFICATE OF CORRECTION

PATENT NO. : 5,327,221  
DATED : July 5, 1994  
INVENTOR(S) : Kenji Saitoh, et al.

Page 3 of 6

It is certified that error appears in the above-indentified patent and that said Letters Patent is hereby corrected as shown below:

COLUMN 33

Line 30, "displaces" should read --displaced--.

COLUMN 34

Line 26, "spond respectively" should read --spond, respectively,--.
    Line 26, delete "a".

COLUMN 38

Line 55, "equation" should read --equation that--.

COLUMN 40

Line 42, "amount" should read --amount of--.

COLUMN 42

Line 34, "Figure," should read --figure,--.

CCLUMN 43

Line 39, "distance" should read --distance of--.

COLUMN 44

Line 58, "distance" should read --distance of--.

COLUMN 47

Line 27, "has" should read --have--.

UNITED STATES PATENT AND TRADEMARK OFFICE
CERTIFICATE OF CORRECTION

PATENT NO. : 5,327,221
DATED : July 5, 1994
INVENTOR(S) : Kenji Saitoh, et al.

It is certified that error appears in the above-indentified patent and that said Letters Patent is hereby corrected as shown below:

COLUMN 48

Line 10, "(width-" should read --width- --.
Line 27, "amount" should read --amount of--.

COLUMN 49

Line 52, "and" should read --and,--.

COLUMN 52

Line 13, "distance" should read --distance of--.

COLUMN 54

Line 34, "Figure" should read --figure--.

COLUMN 57

Line 66, "can" should read --can be--.

COLUMN 60

Line 29, "descried" should read --described--.

COLUMN 61

Line 54, "5 o 6" should read --5 or 6--.

COLUMN 62

Line 59, "This" should read --The--.

UNITED STATES PATENT AND TRADEMARK OFFICE
CERTIFICATE OF CORRECTION

PATENT NO. : 5,327,221
DATED : July 5, 1994
INVENTOR(S) : Kenji Saitoh, et al.

Page 5 of 6

It is certified that error appears in the above-indentified patent and that said Letters Patent is hereby corrected as shown below:

COLUMN 63

Figure 57:
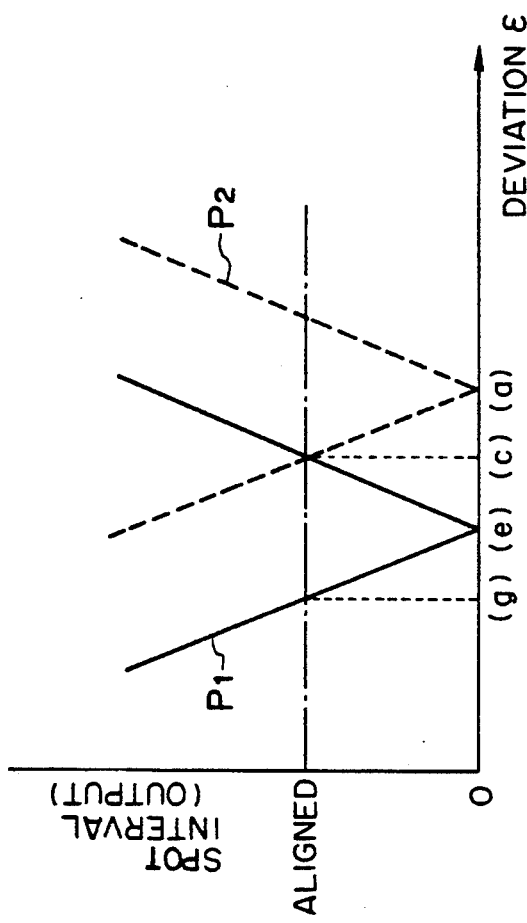
FIG. 57 is a graph showing the relationship between a relative deviation and an interval of spots upon the detecting portion, in the 28th embodiment.

Line 56, "FIG. 5." should read --FIG. 57.--.
Line 65, "can" should read --can be--.

COLUMN 70

Line 64, "5/($d_B$/2)" should read -- 5/($d_G$/2)--.

COLUMN 74

Line 5, "$\epsilon$" should read --$\beta$--.
Line 35, "follows." should read --follows:--.

COLUMN 77

Line 19, "direction." should read --direction,--.

COLUMN 84

Line 56, "spots" should read --spots 307--.

COLUMN 85

Line 26, "$\Delta_1^*$ and $\Delta_1^*$" should read --$\Delta_1^*$ and $\Delta_2^*$--.

COLUMN 87

Line 10, "denoted" (second occurrence) should be deleted.

COLUMN 88

Line 61, "rom" should read --from--.

UNITED STATES PATENT AND TRADEMARK OFFICE
CERTIFICATE OF CORRECTION

PATENT NO. : 5,327,221
DATED : July 5, 1994
INVENTOR(S) : Kenji Saitoh, et al.

It is certified that error appears in the above-indentified patent and that said Letters Patent is hereby corrected as shown below:

<u>COLUMN 89</u>

Line 5, "mans" should read --means--.
　　　Line 8, "rom" should read --from--.
　　　Line 63, "mans" should read --means--.

<u>COLUMN 90</u>

Line 20, delete "a".

Signed and Sealed this

Twenty-fourth Day of January, 1995

Attest:

BRUCE LEHMAN

Attesting Officer　　　Commissioner of Patents and Trademarks